US012777925B2

(12) United States Patent
Tanaka et al.

(10) Patent No.: US 12,777,925 B2
(45) Date of Patent: Oct. 27, 2026

(54) SEMICONDUCTOR DEVICE, SEMICONDUCTOR MODULE, MOTOR DRIVE DEVICE, AND VEHICLE

(71) Applicant: ROHM CO., LTD., Kyoto (JP)

(72) Inventors: Bungo Tanaka, Kyoto (JP); Keiji Wada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 612 days.

(21) Appl. No.: 18/027,382

(22) PCT Filed: Sep. 6, 2021

(86) PCT No.: PCT/JP2021/032599

§ 371 (c)(1),
(2) Date: Mar. 21, 2023

(87) PCT Pub. No.: WO2022/065007

PCT Pub. Date: Mar. 31, 2022

(65) Prior Publication Data

US 2023/0411281 A1 Dec. 21, 2023

(30) Foreign Application Priority Data

Sep. 23, 2020 (JP) ................................ 2020-158854
Sep. 23, 2020 (JP) ................................ 2020-158855

(Continued)

(51) Int. Cl.

*H10W 20/40* (2026.01)
*H02P 23/00* (2016.01)

(Continued)

(52) U.S. Cl.

CPC ......... *H10W 20/497* (2026.01); *H10W 20/47* (2026.01); *H10W 90/00* (2026.01);

(Continued)

(58) Field of Classification Search

CPC ........... H01L 23/5227; H01L 23/49575; H01L 23/53295; H01L 24/05; H01L 24/06;

(Continued)

(56) References Cited

U.S. PATENT DOCUMENTS

2006/0263727 A1* 11/2006 Lee .................... H01L 23/3114 430/394
2014/0175602 A1 6/2014 Funaya et al.

(Continued)

FOREIGN PATENT DOCUMENTS

JP 2009043835 A 2/2009
JP 2011-007580 A 1/2011

(Continued)

OTHER PUBLICATIONS

Notice of Reasons for Refusal dated Apr. 10, 2025 in corresponding Japanese patent application No. 2022-551836 (7 pages; with English translation).

(Continued)

*Primary Examiner* — Benjamin Tzu-Hung Liu
(74) *Attorney, Agent, or Firm* — XSENSUS LLP

(57) ABSTRACT

A semiconductor device includes a semiconductor layer that has a principal surface, a first conductive layer that is formed on the principal surface of the semiconductor layer, a first insulating portion that is formed on the principal surface of the semiconductor layer so as to cover the first conductive layer and that includes a first insulating layer of at least three or more layers, a second insulating portion that is formed on the first insulating portion, that has a dielectric constant differing from a dielectric constant of the first insulating layer, and that includes a second insulating layer not included in the first insulating portion, and a second conductive layer that is formed on the second insulating portion, that faces the first conductive layer through the first insu- (Continued)

A1(12)

lating portion and the second insulating portion, and that is connected to a potential differing from a potential of the first conductive layer.

15 Claims, 77 Drawing Sheets

(30) Foreign Application Priority Data

| | | | |
|---|---|---|---|
| Sep. 23, 2020 | (JP) | ................................ | 2020-158856 |
| Sep. 23, 2020 | (JP) | ................................ | 2020-158857 |
| Sep. 23, 2020 | (JP) | ................................ | 2020-158858 |

(51) Int. Cl.

| | |
|---|---|
| ***H10W 20/47*** | (2026.01) |
| ***H10W 72/00*** | (2026.01) |
| ***H10W 72/50*** | (2026.01) |
| ***H10W 72/90*** | (2026.01) |
| ***H10W 90/00*** | (2026.01) |

(52) U.S. Cl.

CPC ........... *H10W 90/811* (2026.01); *H02P 23/00* (2013.01); *H10W 72/019* (2026.01); *H10W 72/01935* (2026.01); *H10W 72/01938* (2026.01); *H10W 72/5445* (2026.01); *H10W 72/923* (2026.01); *H10W 72/932* (2026.01); *H10W 72/934* (2026.01); *H10W 72/9415* (2026.01); *H10W 72/9445* (2026.01); *H10W 72/952* (2026.01); *H10W 90/753* (2026.01); *H10W 90/756* (2026.01)

(58) Field of Classification Search

CPC ......... H01L 25/18; H01L 24/03; H01L 24/48; H01L 24/49; H01L 2224/0345; H01L 2224/0346; H01L 2224/0391; H01L 2224/03914; H01L 2224/05018; H01L 2224/05147; H01L 2224/05166; H01L 2224/05184; H01L 2224/05554; H01L 2224/05567; H01L 2224/05647; H01L 2224/06152; H01L 2224/48091; H01L 2224/48137; H01L 2224/48245; H01L 2224/49175; H02P 23/00; H10W 20/497; H10W 20/47; H10W 90/00; H10W 90/811; H10W 72/019; H10W 72/01935; H10W 72/01938; H10W 72/5445; H10W 72/923; H10W 72/932; H10W 72/934; H10W 72/9415; H10W 72/9445; H10W 72/952; H10W 90/753; H10W 90/756

See application file for complete search history.

(56) References Cited

U.S. PATENT DOCUMENTS

| | | | | |
|---|---|---|---|---|
| 2015/0137314 | A1* | 5/2015 | Osada ................. | H01F 27/2804 257/531 |
| 2017/0287624 | A1 | 10/2017 | Osada et al. | |
| 2018/0061662 | A1* | 3/2018 | Funaya .................. | H10D 88/00 |
| 2021/0043361 | A1 | 2/2021 | Osada | |

FOREIGN PATENT DOCUMENTS

| | | | |
|---|---|---|---|
| JP | 2014-123671 | A | 7/2014 |
| JP | 2016-028407 | A | 2/2016 |
| WO | 2014155478 | A1 | 10/2014 |
| WO | 2020/183867 | A1 | 9/2020 |

OTHER PUBLICATIONS

Notice of Reasons for Refusal dated Jun. 12, 2025 issued in corresponding Japanese patent application No. 2022-551836 (10 pages; with English translation).

International Search Report and Written Opinion mailed on Nov. 22, 2021, received for PCT Application PCT/JP2021/032599, filed on Sep. 6, 2021, 11 pages including English Translation.

German Office Action issued May 23, 2023, in corresponding German Patent Application No. 11 2021 004 413.3, 17pp.

Notice of Reasons for Refusal dated Apr. 23, 2026 in corresponding Japanese patent applications No. 2025-151187 (8 pages; with English translation).

* cited by examiner

| Terminal number | Terminal name | Terminal number | Terminal name |
|---|---|---|---|
| 1 | NC | 11 | GND1 |
| 2 | VEE2 | 12 | IN |
| 3 | GND2 | 13 | RST |
| 4 | OCP/DESATIN | 14 | FLT |
| 5 | OUT | 15 | OCPOUT |
| 6 | VCC2 | 16 | ERRIN |
| 7 | CLAMP | 17 | VCC1 |
| 8 | PROOUT | 18 | NC |
| 9 | VEE2 | 19 | NC |
| 10 | NC | 20 | GND1 |

※NC:Non Connection

FIG. 15

| Item | Symbol | Standard value | Unit | Condition |
|---|---|---|---|---|
| Entirety | | | | |
| Input-side circuit current | $I_{CC1}$ | 0.65 | mA | |
| Output-side circuit current | $I_{CC2}$ | 1.8 | mA | |
| Logic | | | | |
| Logic H level input voltage | $V_{INH}$ | 3.5-5.5 | V | |
| Logic L level input voltage | $V_{INL}$ | 0-1.5 | V | |
| Logic H level input current | $I_{INH}$ | 100 | μA | Input = 5V |
| Logic L level input current | $I_{INL}$ | 0 | μA | Input = 0V |
| Open drain output L voltage | $V_{ODL}$ | 0.18 | V | Input current = 5mA |
| Output | | | | |
| Output source-side on-resistance | $R_{ONOUTH}$ | 3.6 | Ω | $I_{OUT}$=-100mA |
| Output sink-side on-resistance | $R_{ONOUTL}$ | 1.8 | Ω | $I_{OUT}$=100mA |
| CLAMP source-side on-resistance | $R_{ONCLAMPH}$ | 2.8 | Ω | $I_{CLAMP}$=-100mA |
| CLAMP sink-side on-resistance | $R_{ONCLAMPL}$ | 1.5 | Ω | $I_{CLAMP}$=100mA |
| CLAMP H reference voltage | $V_{CLAMPH}$ | 2.0 | V | |
| CLAMP L reference voltage | $V_{CLAMPL}$ | 2.0 | V | |
| PROOUT on-resistance | $R_{ONPROOUTL}$ | 1.5 | Ω | $I_{PROOUT}$=100mA |
| Tum ON Time | $t_{PON}$ | 60 | ns | |
| Tum OFF Time | $t_{POFF}$ | 60 | ns | |
| Propagation distortion | $t_{PDIST}$ | 0 | ns | |
| Rise Time | $t_{RISE}$ | 30 | ns | |
| Fall Time | $t_{FALL}$ | 30 | ns | |
| Protective function | | | | |
| Input-side UVLO OFF voltage | $V_{UVLO1H}$ | 4.0 | V | |
| Input-side UVLO ON voltage | $V_{UVLO1L}$ | 3.8 | V | |
| Output-side UVLO OFF voltage | $V_{UVLO2H}$ | 12.0 | V | |
| Output-side UVLO ON voltage | $V_{UVLO2L}$ | 11.0 | V | |
| Watchdog timer mask time | $t_{WDMASK}$ | 10 | μs | |
| Overcurrent detection voltage | $V_{OCDET}$ | 4 | V | |
| Overcurrent protection automatic restoration time | $T_{OCPRLS}$ | 10 | ms | |
| ERR detection voltage | $V_{ERRDET}$ | 1.2 | V | |
| ERR detection hysteresis | $V_{ERRHYS}$ | 0.10 | V | |

SEMICONDUCTOR DEVICE, SEMICONDUCTOR MODULE, MOTOR DRIVE DEVICE, AND VEHICLE

CROSS-REFERENCE TO RELATED APPLICATIONS

The present application is based on PCT filing PCT/JP2021/032599, filed Sep. 6, 2021, which claims priority to Japanese Patent Application No. 2020-158854, filed in the Japan Patent Office on Sep. 23, 2020, Japanese Patent Application No. 2020-158855, filed in the Japan Patent Office on Sep. 23, 2020, Japanese Patent Application No. 2020-158856, filed in the Japan Patent Office on Sep. 23, 2020, Japanese Patent Application No. 2020-158857, filed in the Japan Patent Office on Sep. 23, 2020, and Japanese Patent Application No. 2020-158858, filed in the Japan Patent Office on Sep. 23, 2020, the entire disclosures of these applications are incorporated herein by reference.

TECHNICAL FIELD

The present disclosure relates to a semiconductor device, a semiconductor module including a semiconductor device, a motor drive device including a semiconductor module, and a vehicle including a motor drive device.

BACKGROUND ART

For example, Patent Literature 1 discloses an integrated circuit that includes a power source, a constant current source that is supplied with electric power by means of the power source and that has an output terminal connected to an anode of a temperature-sensitive diode, a PWM comparator that has a non-inverting input terminal, to which a voltage of the anode of the temperature-sensitive diode is applied, and an inverting input terminal, to which a carrier signal (triangular wave signal) output by a carrier generation circuit is applied, and a photocoupler that is an insulating means that is connected to an output terminal of the PWM comparator and that transmits a signal from either one of a high voltage system and a low voltage system to the other one while insulating the high voltage system and the low voltage system from each other.

CITATION LIST

Patent Literature

Patent Literature 1: Japanese Patent Application Publication No. 2011-7580

SUMMARY OF INVENTION

Solution to Problem

A semiconductor device according to a preferred embodiment of the present disclosure includes a semiconductor layer that has a principal surface, a first conductive layer that is formed on the principal surface of the semiconductor layer, a first insulating portion that is formed on the principal surface of the semiconductor layer so as to cover the first conductive layer and that includes a first insulating layer of at least three or more layers, a second insulating portion that is formed on the first insulating portion, that has a dielectric constant differing from a dielectric constant of the first insulating layer, and that includes a second insulating layer not included in the first insulating portion, and a second conductive layer that is formed on the second insulating portion, that faces the first conductive layer through the first insulating portion and the second insulating portion, and that is connected to a potential differing from a potential of the first conductive layer.

BRIEF DESCRIPTION OF DRAWINGS

FIG. 15 is an example of an electrical-characteristic table of the semiconductor module 1.

DESCRIPTION OF EMBODIMENTS

Preferred embodiments of the present disclosure will be hereinafter described in detail with reference to the accompanying drawings.

[Structure of Semiconductor Module]

A structure of a semiconductor module 1 will be described with reference to FIG. 1 to FIG. 9. For descriptive convenience, the up-down direction in a plan view is defined as a first direction X, and the left-right direction perpendicular to the first direction X in the plan view is defined as a second direction Y. The first direction X and the second direction Y are both perpendicular to the thickness direction of the semiconductor module 1.

Figure 1:
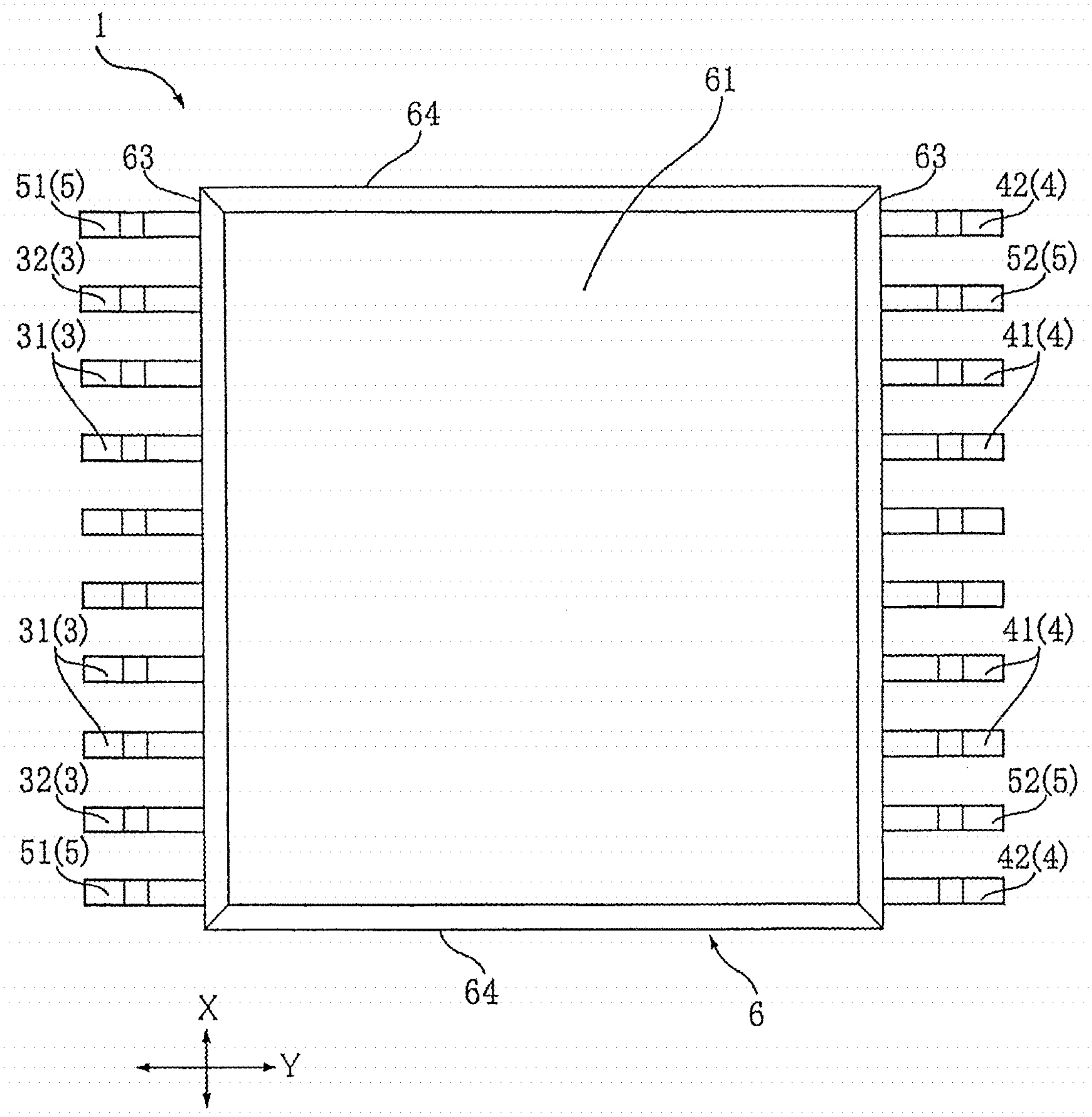
FIG. 1 is a plan view showing a semiconductor module according to a preferred embodiment of the present disclosure.
Figure 2:
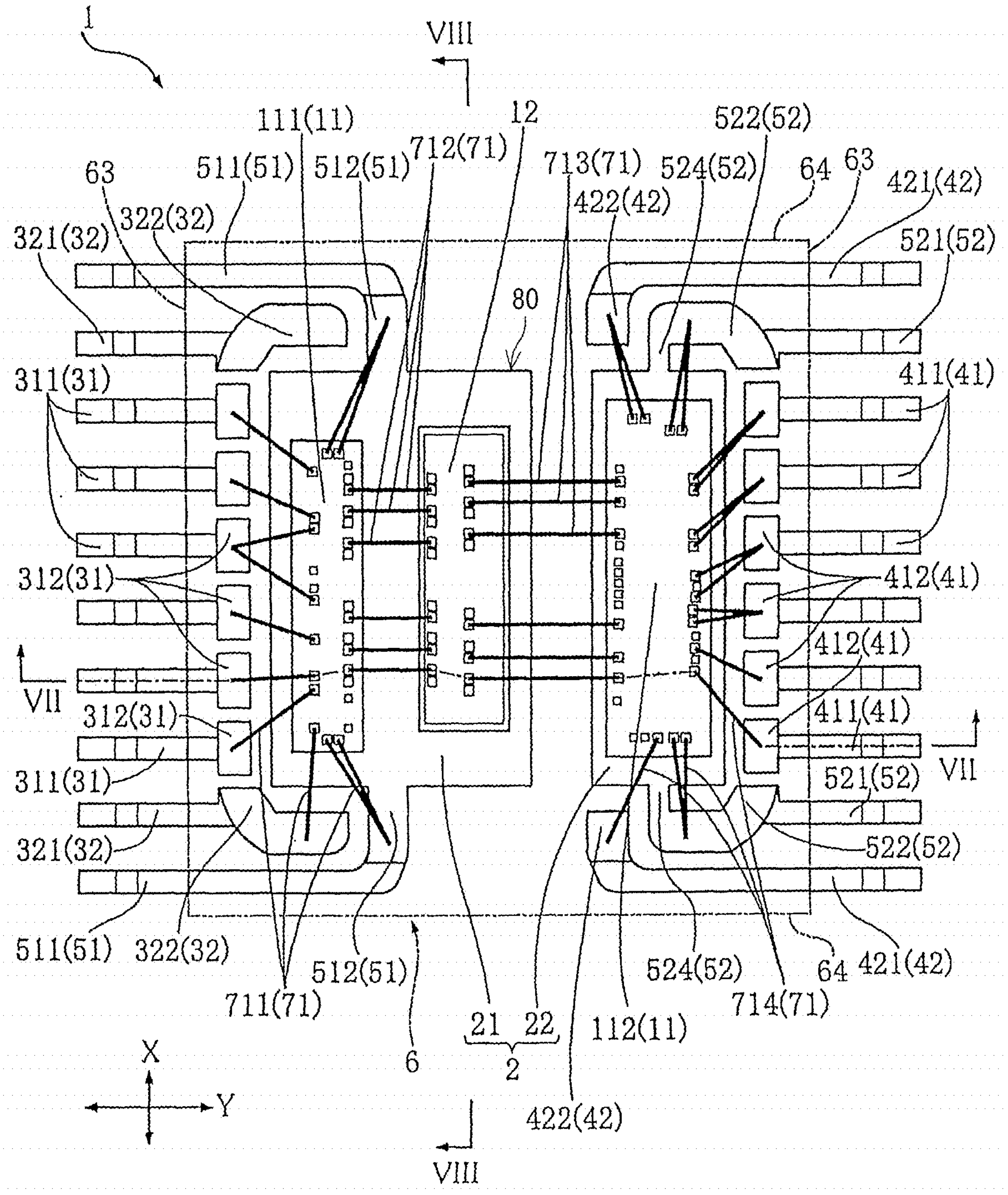
FIG. 2 is a plan view showing the semiconductor module of FIG. 1 (sealing resin is omitted).
Figure 3:
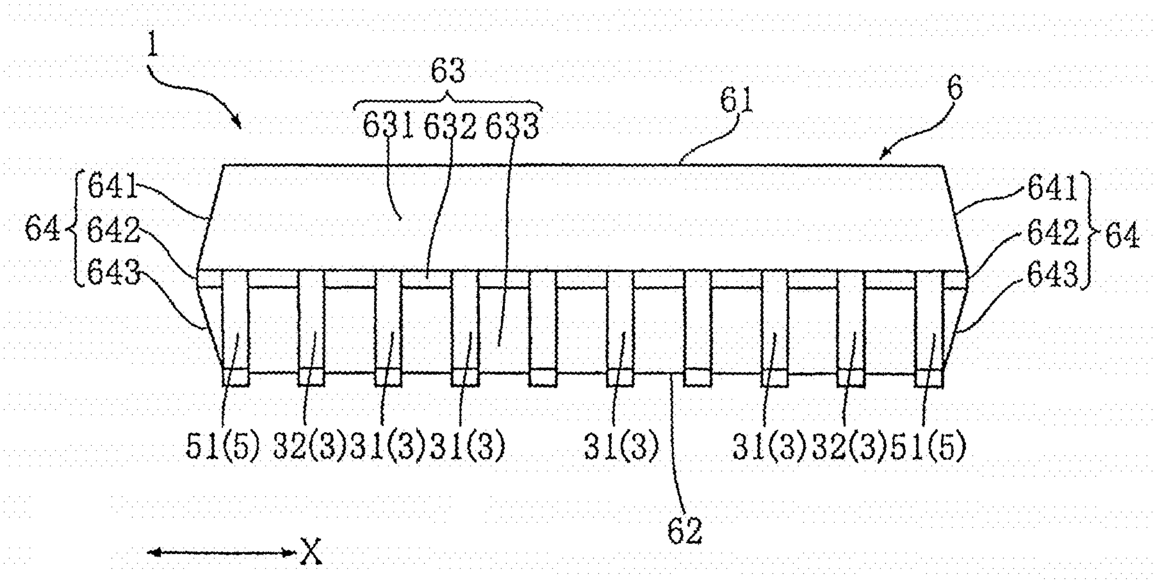
FIG. 3 is a left side view showing the semiconductor module of FIG. 1.
Figure 4:
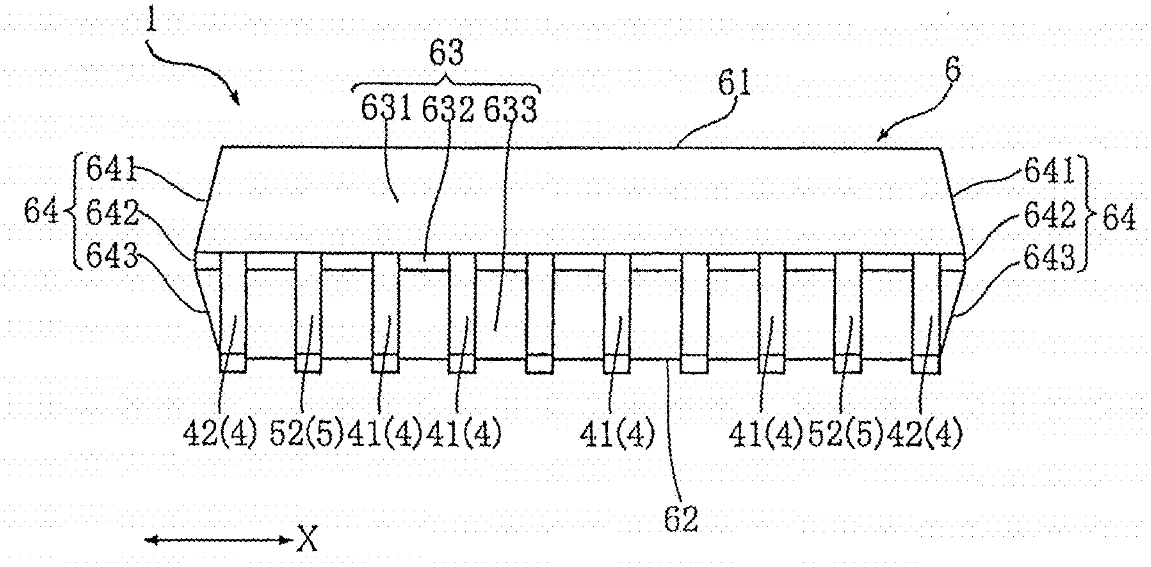
FIG. 4 is a right side view showing the semiconductor module of FIG. 1.
Figure 5:
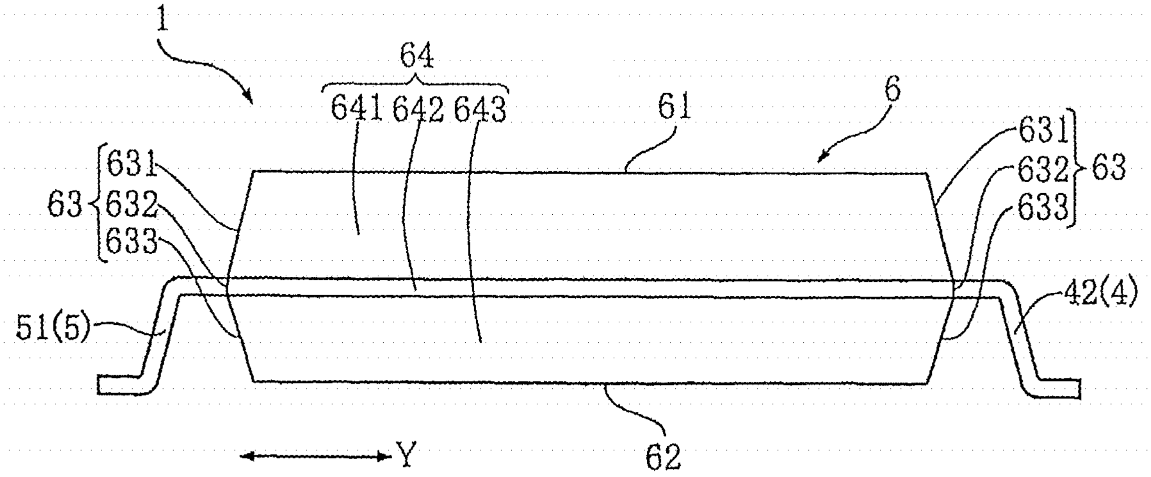
FIG. 5 is a front view showing the semiconductor module of FIG. 1.
Figure 6:
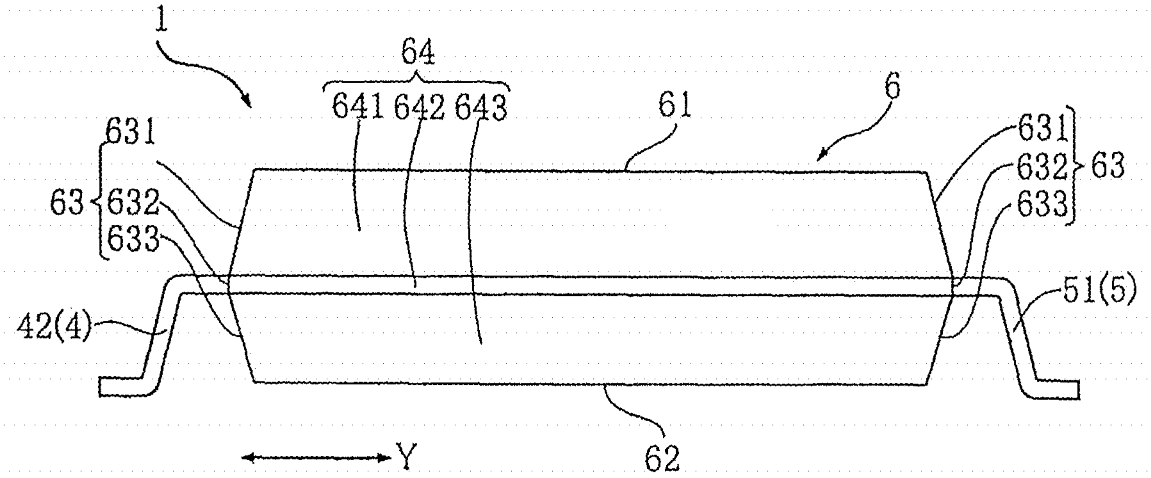
FIG. 6 is a rear view showing the semiconductor module of FIG. 1.
Figure 7:
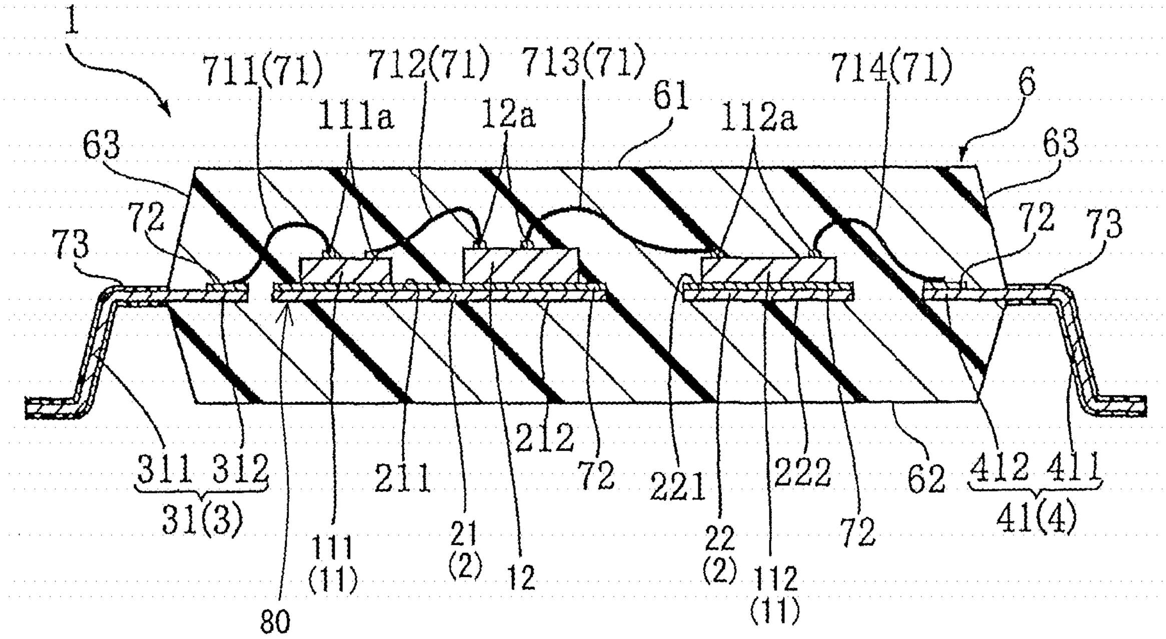
FIG. 7 is a view showing a cross section along line VII-VII of FIG. 2.
Figure 8:
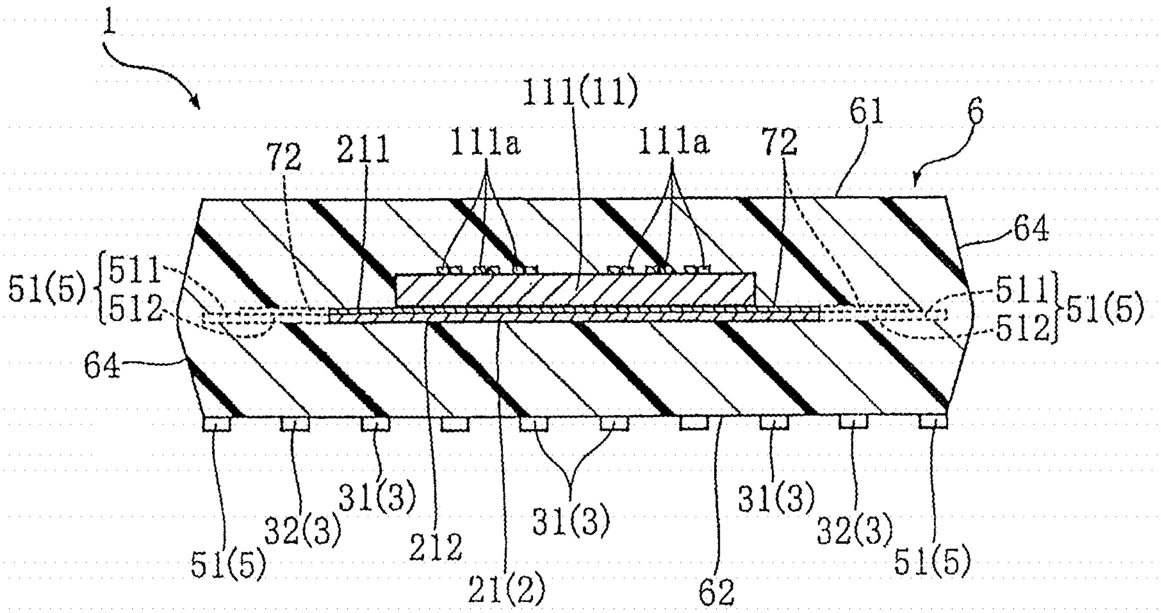
FIG. 8 is a view showing a cross section along line VIII-VIII of FIG. 2.

FIG. 1 is a plan view showing the semiconductor module 1. FIG. 2 is a plan view in which a sealing resin 6 described later is omitted from FIG. 1 for convenience of understanding. FIG. 3 is a left side view showing the semiconductor module 1. FIG. 4 is a right side view showing the semiconductor module 1. FIG. 5 is a front view showing the semiconductor module 1. FIG. 6 is a rear view showing the semiconductor module 1. FIG. 7 is a cross-sectional view along line (alternate long and short dashed line) VII-VII of FIG. 2. FIG. 8 is a cross-sectional view along line VIII-VIII of FIG. 2. In FIG. 2, the sealing resin 6 is shown by an imaginary line (alternate long and two short dashed line). In FIG. 7 and FIG. 8, the sealing resin 6 is shown without being omitted.

The semiconductor module 1 is surface-mounted on a circuit board of an inverter device of, for example, an electric vehicle or a hybrid vehicle, and its package type is SOP. Without being limited to SOP, the semiconductor module 1 may employ QFN (Quad For Non Lead Package), DFP (Dual Flat Package), DIP (Dual Inline Package), QFP (Quad Flat Package), SIP (Single Inline Package), or SOJ (Small Outline J-leaded Package), or may employ various package types similar to the aforementioned package types.

The semiconductor module 1 is composed of a semiconductor element 11, an insulating element 12, a conductive support member 80, a sealing resin 6, a bonding wire 71, an interior plated layer 72, and an exterior plated layer 73. In this embodiment, the semiconductor module 1 has a rectangular shape in a plan view.

The semiconductor element 11 and the insulating element 12 are elements used to allow the semiconductor module 1 to function. The semiconductor element 11 includes a control element 111 and a drive element 112. The control element 111 has a circuit that transforms a control signal input from, for example, an ECU into a PWM control signal, a transmitting circuit that transmits the PWM control signal to the drive element 112, and a receiving circuit that receives an electric signal sent from the drive element 112. The drive element 112 has a receiving circuit that receives the PWM control signal, a circuit (gate driver) that performs a switching operation of a power semiconductor device, such as IGBT, based on the PWM signal, and a transmitting circuit that transmits an electric signal to the control element 111. For example, an output signal from a temperature sensor installed near a motor can be mentioned as the electric signal.

The insulating element 12 is an element that transmits the PWM control signal or other electric signals in an insulated state. The drive element 112 needs a voltage higher than the control element 111, and therefore a great potential difference occurs between the control element 111 and the drive element 112, and therefore the insulating element 12 is needed. In detail, for example, in an inverter device of an electric vehicle or a hybrid vehicle, a power-supply voltage supplied to the control element 111 is 5 V, 3.3 V, etc., based on a ground potential as a reference.

On the other hand, a voltage of, for example, 600 V or more is transiently applied to the drive element 112 in comparison with the ground potential of the control element 111. In more detail, a half bridge circuit in which a low side switching element and a high side switching element are connected in a totem-pole manner is generally used in a motor driver circuit in an inverter device of, for example, a hybrid vehicle.

In an insulating gate driver, a switch that is turned on at an arbitrary point of time is only either one of a low side switching element and a high side switching element. In a high voltage system, a source of the low side switching element and a reference potential of the insulating gate driver that drives this switching element are connected to the ground potential, and therefore a gate-to-source voltage operates on the basis of the ground potential. On the other hand, a source of the high side switching element and a reference potential of the insulating gate driver that drives this switching element are connected to an output node of the half bridge circuit. The potential of the output node of the half bridge circuit changes depending on whether the low side switching element or the high side switching element is turned on, and therefore the reference potential of the insulating gate driver that drives the high side switching element changes. When the high side switching element is in an ON state, this reference potential becomes a voltage (for example, 600 V or more) equivalent to a voltage applied to a drain of the high side switching element.

If the semiconductor module 1 is used as the insulating gate driver that drives the high side switching element, the drive element 112 and the control element 111 are divided in ground potential from each other in order to secure insulating properties, and therefore a voltage of 600 V or more is transiently applied to the drive element 112 in comparison with the ground potential of the control element 111. Therefore, particularly in the insulating gate driver that drives the switching element on the high side, a voltage of 600 V or more is transiently applied to the drive element 112 in comparison with the ground potential of the control element 111. The ground potential of the drive element 112 may be common to the aforementioned external element (power transistor).

In this embodiment, the insulating element 12 is a coupled-inductor type insulating element. The coupled-inductor type insulating element transmits an electric signal in an insulated state by inductively connecting two inductors (coils). The insulating element 12 has a substrate made of Si. An inductor made of Cu is formed on the substrate. The inductor includes a transmitting-side inductor and a receiving-side inductor, and these inductors are stacked in the thickness direction of the insulating element 12. A dielectric layer made of $SiO_2$, etc., is interposed between the transmitting-side inductor and the receiving-side inductor. The transmitting-side inductor and the receiving-side inductor are electrically insulated from each other by the dielectric layer. A detailed structure of the insulating element 12 will be described later.

The insulating element 12 is placed between the control element 111 and the drive element 112 in the second direction Y as shown in FIG. 2. In this embodiment, the control element 111, the drive element 112, and the insulating element 12 are each formed in a rectangular shape having its long side in the first direction X in a plan view. The control element 111 and the insulating element 12 are mounted on a first die pad 21 of a die pad 2 described later. Additionally, the drive element 112 is mounted on a second die pad 22 of the die pad 2 described later. A plurality of pads 111*a* are formed on an upper surface of the control element 111 (upper surface of the control element 111 shown in FIG. 7). Similarly, a plurality of pads 112*a* are formed on an upper surface of the drive element 112 (upper surface of the drive element 112 shown in FIG. 7), and a plurality of pads 12*a* are formed on an upper surface of the insulating element 12 (upper surface of the insulating element 12 shown in FIG. 7), respectively.

The conductive support member 80 is a member that mounts the semiconductor element 11 and the insulating element 12 in the semiconductor module 1, and is a member that forms a conductive path of the semiconductor element 11 and the insulating element 12 and the circuit board of the inverter device. The conductive support member 80 is made of, for example, an alloy including Cu. The conductive support member 80 is formed of a lead frame 81 described later. The conductive support member 80 includes the die pad 2, a plurality of first terminals 3, a plurality of second terminals 4, and a support terminal 5.

The die pad 2 is a member that mounts the semiconductor element 11 and the insulating element 12. The die pad 2 includes the first die pad 21 and the second die pad 22. The first die pad 21 and the second die pad 22 are disposed at a distance from each other in the second direction Y as shown in FIG. 2. In this embodiment, the area of the first die pad 21 is larger than the area of the second die pad 22. Additionally, in this embodiment, the first die pad 21 and the second die pad 22 are each formed in a rectangular shape having its long side in the first direction X in a plan view. The first die pad 21 and the second die pad 22 are both flat as shown in FIG. 7 and FIG. 8.

The first die pad 21 has a first die-pad upper surface 211 and a first die-pad lower surface 212 as shown in FIG. 7 and FIG. 8. The first die-pad upper surface 211 and the first die-pad lower surface 212 face mutually-opposite sides. In this embodiment, the interior plated layer 72 is formed on the first die-pad upper surface 211. The control element 111 and the insulating element 12 are each mounted on the interior plated layer 72 formed on the first die-pad upper surface 211 by die bonding with a bonding layer (not shown). Additionally, the first die-pad lower surface 212 is wholly contiguous to the sealing resin 6.

The second die pad 22 has a second die-pad upper surface 221 and a second die-pad lower surface 222 as shown in FIG. 7. The second die-pad upper surface 221 and the second die-pad lower surface 222 face mutually-opposite sides. In this embodiment, the interior plated layer 72 is formed on the second die-pad upper surface 221. The drive element 112 is mounted on the interior plated layer 72 formed on the second die-pad upper surface 221 by die bonding with a bonding layer (not shown). Additionally, the second die-pad lower surface 222 is wholly contiguous to the sealing resin 6.

The sealing resin 6 is interposed between the first die pad 21 and the second die pad 22 in the second direction Y as shown in FIG. 2 and FIG. 7. In this embodiment, the sealing resin 6 is made of, for example, a black epoxy resin having electric insulating properties as described later. Therefore, the first die pad 21 and the second die pad 22 are electrically insulated from each other by the insulating element 12 and the sealing resin 6.

The first terminals 3 are members each of which forms a conductive path of the semiconductor module 1 and the circuit board by being joined to the circuit board of the inverter device. The first terminals 3 are arranged along the first direction X as shown in FIG. 1 and FIG. 3. Additionally, the first terminals 3 are each exposed so as to extend in the second direction Y from one of two resin first side surfaces 63 of the sealing resin 6 described later. The first terminals 3 include a plurality of first intermediate terminals 31 and a pair of first side terminals 32.

The first intermediate terminals 31 are arranged so as to be interposed between the pair of first side terminals 32 in the first direction X as shown in FIG. 2 and FIG. 3. Each of the first intermediate terminals 31 has a lead portion 311 and a pad portion 312.

The lead portion 311 is a rectangular portion extending along the second direction Y, and has its part that is exposed from the aforementioned one of the two resin first side surfaces 63 and that is subjected to a bending process in a gull-wing manner as shown in FIG. 5 and FIG. 6. Additionally, the lead portion 311 is formed so that the exterior plated layer 73 covers the exposed part as shown in FIG. 7. A part, on which the exterior plated layer 73 is not formed, of the lead portion 311 is covered with the sealing resin 6. The pad portion 312 is a rectangular portion that is connected to the lead portion 311 and that is wider than the lead portion 311 in the first direction X. In this embodiment, the interior plated layer 72 is formed on an upper surface of the pad portion 312 as shown in FIG. 7. The pad portion 312 is wholly covered with the sealing resin 6. Additionally, the pad portion 312 is flat.

The pair of first side terminals 32 are disposed on both sides of the first intermediate terminals 31 in the first direction X as shown in FIG. 2 and FIG. 3. Each of the pair of first side terminals 32 has a lead portion 321 and a pad portion 322.

The lead portion 321 is a rectangular portion extending along the second direction Y, and has its part that is exposed from the aforementioned one of the two resin first side surfaces 63 and that is subjected to a bending process in a gull-wing manner as shown in FIG. 5 and FIG. 6. Additionally, the lead portion 321 is formed so that the exterior plated layer 73 covers the exposed part in the same way as the lead portion 311 of first intermediate terminal 31. A part, on which the exterior plated layer 73 is not formed, of the lead portion 321 is covered with the sealing resin 6. The pad portion 322 is a portion that is connected to the lead portion 321 and that is wider than the lead portion 321 in the first direction X. In this embodiment, the interior plated layer 72 is formed on an upper surface of the pad portion 322 (surface facing the same direction as a direction faced by the first die-pad upper surface 211 in FIG. 7) in the same way as the pad portion 312 of the first intermediate terminal 31. The pad portion 322 is wholly covered with the sealing resin 6. Additionally, the pad portion 322 is flat.

The second terminals 4 are members each of which forms a conductive path of the semiconductor module 1 and the circuit board by being joined to the circuit board of the inverter device in the same way as the first terminals 3. The second terminals 4 are arranged along the first direction X as shown in FIG. 1 and FIG. 4. Additionally, the second terminals 4 are placed on the side opposite to the first terminals 3 with the semiconductor element 11 between the second terminals 4 and the first terminals 3 in the second direction Y as shown in FIG. 2. The second terminals 4 are each exposed so as to extend in the second direction Y from the other resin first side surface 63 of the sealing resin 6 described later. The second terminals 4 include a plurality of second, intermediate terminals 41 and a pair of second side terminals 42.

The second intermediate terminals 41 are arranged so as to be interposed between the pair of second side terminals 42 in the first direction X as shown in FIG. 2 and FIG. 4. Additionally, the second intermediate terminals 41 are arranged so as to be interposed between a pair of second support terminals 52 of the support terminal described later in the first direction X. Each of the second intermediate terminals 41 has a lead portion 411 and a pad portion 412.

The lead portion 411 is a rectangular portion extending along the second direction Y, and has its part that is exposed from the other resin first side surface 63 and that is subjected to a bending process in a gull-wing manner as shown in FIG. 5 and FIG. 6. Additionally, the lead portion 411 is formed so that the exterior plated layer 73 covers the exposed part as shown in FIG. 7. A part, on which the exterior plated layer 73 is not formed, of the lead portion 411 is covered with the sealing resin 6. The pad portion 412 is a rectangular portion that is connected to the lead portion 411 and that is wider than the lead portion 411 in the first direction X. In this embodiment, the interior plated layer 72 is formed on an upper surface of the pad portion 412 (upper surface of the pad portion 412 shown in FIG. 7) as shown in FIG. 7. The pad portion 412 is wholly covered with the sealing resin 6. Additionally, the pad portion 412 is flat. In this embodiment, the shape of the second terminal 4 is the same as the shape of the first terminal 3.

The pair of second side terminals 42 are disposed on both sides of the second side terminals 42 in the first direction X as shown in FIG. 2 and FIG. 4. Each of the pair of second side terminals 42 has a lead portion 421 and a pad portion 422.

The lead portion 421 is a rectangular portion extending along the second direction Y, and has its part that is exposed from the other resin first side surface 63 and that is subjected to a bending process in a gull-wing manner as shown in FIG. 5 and FIG. 6. Additionally, the lead portion 421 is formed so that the exterior plated layer 73 covers the exposed part in the same way as the lead portion 411 of the second intermediate terminal 41. A part, on which the exterior plated layer 73 is not formed, of the lead portion 421 is covered with the sealing resin 6. Additionally, the length of the part of the lead portion 421 covered with the sealing resin 6 is longer than the length of the part of the lead portion 411 of the second intermediate terminal 41. The pad portion 422 is a portion that is connected to the lead portion 421 and that extends in the first direction X. An end portion of the pad portion 422 is at a distance from the second die pad 22 as shown in FIG. 2. In this embodiment, the interior plated layer 72 is formed on an upper surface of the pad portion 422 (surface facing the same direction as a direction faced by the second die-pad upper surface 221 in FIG. 7) in the same way as the pad portion 412 of the second intermediate terminal 41. The pad portion 422 is wholly covered with the sealing resin 6. Additionally, the pad portion 422 is flat.

The support terminal 5 is connected to the die pad 2. The support terminal 5 is a member that supports the die pad 2 and that forms a conductive path of the semiconductor module 1 and the circuit board of the inverter device by being joined to the circuit board in the same way as the first terminals 3 and the second terminals 4. The support terminal 5 includes a constituent composed of a pair of members, and further includes a pair of first support terminals 51 and a pair of second support terminals 52. The pair of first support terminals 51 are disposed at a distance from each other in the first direction X, and are connected to both ends of the first die pad 21 as shown in FIG. 2. Additionally, the pair of second support terminals 52 are disposed at a distance from each other in the first direction X, and are connected to both ends of the second die pad 22.

The pair of first support terminals 51 are disposed on both sides of the first terminals 3 in the first direction X as shown in FIG. 2 and FIG. 3. Additionally, the pair of first support terminals 51 are each exposed so as to extend in the second direction Y from the aforementioned one of the two resin first side surfaces 63 from which the first terminals 3 are exposed. Each of the pair of first support terminals 51 has a lead portion 511 and a pad portion 512.

The lead portion 511 is a rectangular portion extending along the second direction Y, and has its part that is exposed from the aforementioned one of the two resin first side surfaces 63 and that is subjected to a bending process in a gull-wing manner as shown in FIG. 5 and FIG. 6. Additionally, the lead portion 511 is formed so that the exterior plated layer 73 covers the exposed part in the same way as the lead portion 311 of the first intermediate terminal 31. A part, on which the exterior plated layer 73 is not formed, of the lead portion 511 is covered with the sealing resin 6. Additionally, the length of the part of the lead portion 511 covered with the sealing resin 6 is longer than the length of the part of the lead portion 311 of the first intermediate terminal 3 or of the part of the lead portion 311 of the first side terminal 32. The pad portion 512 is a portion that is connected to the lead portion 511 and that extends in the first direction X. An end portion of the pad portion 512 is connected to the first die pad 21 as shown in FIG. 2. In this embodiment, the interior plated layer 72 is formed on an upper surface of the pad portion 512 in the same way as the pad portion 312 of the first intermediate terminal 31 as shown in FIG. 8. The pad portion 512 is wholly covered with the sealing resin 6. Additionally, the pad portion 512 is flat.

The second intermediate terminals 41 are arranged inside the pair of second support terminals 52 in the first direction X as shown in FIG. 2 and FIG. 4. Additionally, the second side terminals 42 are each disposed outside the pair of second support terminals 52 in the first direction X. Therefore, the second terminal 4 is disposed on both sides of each of the pair of second support terminals 52. The pair of second support terminals 52 are each exposed so as to extend in the second direction Y from the other resin first side surface 63 from which the second terminals 4 are exposed. Each of the pair of second support terminals 52 has a lead portion 521, a pad portion 522, and a connection portion 524.

The lead portion 521 is a rectangular portion extending along the second direction Y, and has its part that is exposed from the other resin first side surface 63 and that is subjected to a bending process in a gull-wing manner as shown in FIG. 5 and FIG. 6. Additionally, the lead portion 521 is formed so that the exterior plated layer 73 covers the exposed part in the same way as the lead portion 411 of the second intermediate terminal 41. A part, on which the exterior plated layer 73 is not formed, of the lead portion 521 is covered with the sealing resin 6. The pad portion 522 is a portion that is connected to the lead portion 521 and that is wider than the lead portion 521 in the first direction X. The pad portion 522 extends in the second direction Y. In this embodiment, the interior plated layer 72 is formed on an upper surface of the pad portion 522 (surface facing the same direction as a direction faced by the second die-pad upper surface 221 in FIG. 7) in the same way as the pad portion 412 of the second intermediate terminal 41. The pad portion 522 is wholly covered with the sealing resin 6. Additionally, the pad portion 522 is flat. The connection portion 524 is a portion that is connected to the pad portion 522 and that extends in the first direction X. An end portion of the connection portion 524 is connected to the second die pad 22 as shown in FIG. 2. In this embodiment, the interior plated layer 72 is formed on an upper surface of the connection portion 524 (surface facing the same direction as a direction faced by the upper surface of the pad portion 522) in the same way as the pad portion 522. The connection portion 524 is wholly covered with the sealing resin 6.

Figure 9:
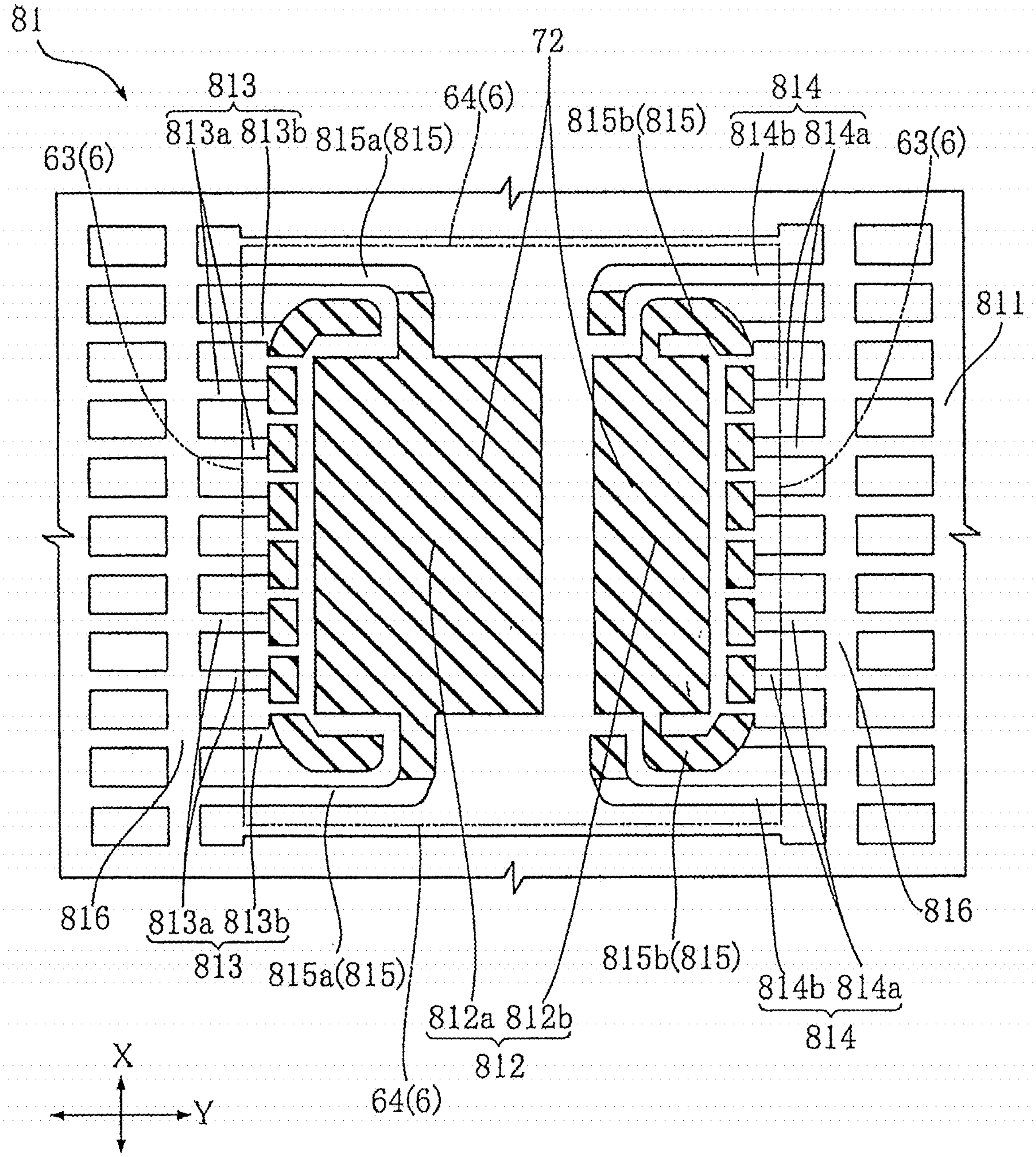
FIG. 9 is a plan view showing a lead frame of the semiconductor module of FIG. 1.

FIG. 9 is a plan view showing the lead frame 81 of the semiconductor module 1. In FIG. 9, a region in which the sealing resin 6 is formed is shown by an imaginary line (an alternate long and two short dashed line). Additionally, a region in which the interior plated layer 72 is formed is shown by a shaded portion.

The conductive support member 80 mentioned above is formed of the lead frame 81. In a process of manufacturing the semiconductor module 1, the die pad 2, the first terminals 3, the second terminals 4, and the support terminal 5 are each formed of the same lead frame 81. The lead frame 81 is made of, for example, an alloy including Cu. The lead frame 81 has an outer frame 811, an island portion 812, a plurality of first leads 813, a plurality of second leads 814, a support lead 815, and a dam-bar 816. Among these components, the outer frame 811 and the dam-bar 816 do not compose the semiconductor module 1. The lead frame 81 will be hereinafter described with reference to FIG. 9.

The outer frame 811 is a member formed so as to surround the island portion 812, the first leads 813, the second leads 814, the support lead 815, and the dam-bar 816. The first leads 813, the second leads 814, and the support lead 815 are respectively connected along the first direction X of the outer frame 811. Additionally, the dam-bar 816 is connected along the second direction Y of the outer frame 811.

The island portion 812 is a rectangular member whose long side is in the first direction X in a plan view. The island portion 812 corresponds to the die pad 2. The island portion 812 is supported by the outer frame 811 through the support lead 815. The island portion 812 includes a first island portion 812*a* and a second island portion 812*b*. The first island portion 812*a* corresponds to the first die pad 21, and the second island portion 812*b* corresponds to the second die pad 22, respectively. The first island portion 812*a* and the second island portion 812*b* are disposed at a distance from each other.

The first leads 813 are members that are arranged along the first direction X and that extend in the second direction Y. The first leads 813 correspond to the first terminals 3. An end of each of the first leads 813 is connected to the outer frame 811. The first leads 813 include a plurality of first intermediate leads 813*a* and a pair of first side leads 813*b*. The first intermediate lead 813*a* corresponds to the first intermediate terminal 31, and the first side lead 813*b* correspond to the first side terminal 32, respectively.

The second leads 814 are members that are arranged along the first direction X and that extend in the second direction Y. Additionally, the second leads 814 are placed on an opposite side across the island portion 812 in the second direction Y. The second leads 814 correspond to the second terminals 4. An end of each of the second leads 814 is connected to the outer frame 811. The second leads 814 include a plurality of second intermediate leads 814*a* and a pair of second side leads 814*b*. The second intermediate lead 814*a* corresponds to the second intermediate terminal 41, and the second side lead 814*b* corresponds to the second side terminal 42, respectively.

The support lead 815 is a member that extends in the second direction Y, and one end of which is connected to the outer frame 811, and the other end of which is connected to the island portion 812. The support lead 815 corresponds to the support terminal 5. The support lead 815 includes a pair of first support leads 815*a* and a pair of second support leads 815*b*. The first support lead 815*a* corresponds to the first support terminal 51, and the second support lead 815*b* corresponds to the second support terminal 52, respectively. The pair of first support leads 815*a* are disposed at a distance from each other in the first direction X and are connected to both ends of the first island portion 812*a*. Additionally, the pair of second support leads 815*b* are disposed at a distance from each other in the first direction X, and are connected to both ends of the second island portion 812*b*.

The dam-bar 816 is a pair of members that extend in the first direction X and both ends of which are connected to the outer frame 811. The dam-bar 816 fulfills a function to respectively support the first leads 813, the second leads 814, and the support lead 815 in the first direction X and to check a molten synthetic resin in the forming process of the sealing resin 6. One dam-bar 816 is connected to the first intermediate leads 813*a*, the pair of first side leads 813*b*, and the pair of first support leads 815*a*. Additionally, the other dam-bar 816 is connected to the second intermediate leads 814*a*, the pair of second side leads 814*b*, and the pair of second support leads 815*b*.

The sealing resin 6 is made of, for example, a black epoxy resin having electric insulating properties. The sealing resin 6 covers a part of the first terminals 3, a part of the second terminals 4, a part of the support terminal 5, the semiconductor element 11, the insulating element 12, the die pad 2, the bonding wire 71, and the interior plated layer 72. The sealing resin 6 is formed by transfer molding that uses a mold. The sealing resin 6 has a resin upper surface 61, a resin lower surface 62, a pair of resin first side surfaces 63, and a pair of resin second side surfaces 64.

The resin upper surface 61 is a surface facing the upward side as shown in FIG. 3 to FIG. 6. Additionally, the resin lower surface 62 is a surface facing the downward side. The resin upper surface 61 and the resin lower surface 62 face mutually-opposite sides. The resin upper surface 61 and the resin lower surface 62 are both flat.

The pair of resin first side surfaces 63 are formed at a distance from each other in the second direction Y as shown in FIG. 1 and FIG. 2. The pair of resin first side surfaces 63 face mutually-opposite sides. In this embodiment, the first terminals 3 and the pair of first support terminals 51 are exposed from one of the resin first side surfaces 63, respectively. Additionally, the second terminals 4 and the pair of second support terminals 52 are exposed from the other resin first side surface 63, respectively.

Each of the pair of resin first side surfaces 63 has a resin first side surface upper portion 631, a resin first side surface central portion 632, and a resin first side surface lower portion 633 as shown in FIG. 3 to FIG. 6. The resin first side surface upper portion 631 is a portion an upper end of which is connected to the resin upper surface 61 and a lower end of which is connected to the resin first side surface central portion 632. The resin first side surface upper portion 631 is inclined so that its upper end is placed on the internal side of the semiconductor module 1.

The resin first side surface central portion 632 is a portion an upper end of which is connected to the resin first side surface upper portion 631 and a lower end of which is connected to the resin first side surface lower portion 633 as shown in FIG. 3 to FIG. 6. The resin first side surface central portion 632 is perpendicular to the resin upper surface 61 and the resin lower surface 62. The first terminals 3 and the pair of first support terminals 51 are exposed from one of the resin first side surface central portions 632, respectively. The second terminals 4 and the pair of second support terminals 52 are exposed from the other resin first side surface central portion 632, respectively.

The resin first side surface lower portion 633 is a portion an upper end of which is connected to the resin first side surface central portion 632 and a lower end of which is connected to the resin lower surface 62 as shown in FIG. 3 to FIG. 6. The resin first side surface lower portion 633 is inclined so that its lower end is placed on the internal side of the semiconductor module 1.

The pair of resin second side surfaces 64 are formed at a distance from each other in the first direction X as shown in FIG. 1 and FIG. 2. The pair of resin second side surfaces 64 face mutually-opposite sides. In this embodiment, the conductive support member 80 is not exposed from the pair of resin second side surfaces 64 as shown in FIG. 2, FIG. 5, and FIG. 6. Each of the pair of resin second side surfaces 64 has a resin second side surface upper portion 641, a resin second side surface central portion 642, and a resin second side surface lower portion 643.

The resin second side surface upper portion 641 is a portion an upper end of which is connected to the resin upper surface 61 and a lower end of which is connected to the resin second side surface central portion 642 as shown in FIG. 3 to FIG. 6. The resin second side surface upper portion 641 is inclined so that its upper end is placed on the internal side of the semiconductor module 1.

The resin second side surface central portion 642 is a portion an upper end of which is connected to the resin second side surface upper portion 641 and a lower end of which is connected to the resin second side surface lower portion 643 as shown in FIG. 3 to FIG. 6. The resin second side surface central portion 642 is perpendicular to the resin upper surface 61 and the resin lower surface 62, perpendicularly intersects the resin first side surface central portion 632. In this embodiment, the height of the resin second side surface central portion 642 and the height of the resin first side surface central portion 632 are substantially equal to each other in the thickness direction of the semiconductor module 1.

The resin second side surface lower portion 643 is a portion an upper end of which is connected to the resin second side surface central portion 642 and a lower end of which is connected to the resin lower surface 62 as shown in FIG. 3 to FIG. 6. The resin second side surface lower portion 643 is inclined so that its lower end is placed on the internal side of the semiconductor module 1.

The bonding wires 71 form a conductive path used to allow the semiconductor element 11 and the insulating element 12 to fulfill a predetermined function together with the aforementioned first terminals 3, the second terminals 4, and the support terminal 5 inside the semiconductor module 1. The bonding wires 71 include a plurality of first bonding wires 711, a plurality of second bonding wires 712, a plurality of third bonding wires 713, and a plurality of fourth bonding wires 714.

The first bonding wires 711 form a conductive path of the control element 111, the first terminals 3, and the pair of first support terminals 51 as shown in FIG. 2. The control element 111 is electrically conducted to at least one or more first terminals 3 and the first support terminal 51 by means of the first bonding wires 711. The first bonding wires 711 are each bonded to the pad 111*a* of the control element 111, the pad portion 312 of the first intermediate terminal 31, the pad portion 322 of the first side terminal 32, or the pad portion 512 of the first support terminal 51.

The second bonding wires 712 form a conductive path of the insulating element 12 and the control element 111 as shown in FIG. 2. The insulating element 12 and the control element 111 are electrically conducted to each other by means of the second bonding wires 712. The second bonding wires 712 are each bonded to the pad 12*a* of the insulating element 12 and the pad 111*a* of the control element 111. In this embodiment, the second bonding wires 712 are disposed along the second direction Y.

The third bonding wires 713 form a conductive path of the insulating element 12 and the drive element 112 as shown in FIG. 2. The insulating element 12 and the drive element 112 are electrically conducted to each other by means of the third bonding wires 713. The third bonding wires 713 are each bonded to the pad 12*a* of the insulating element 12 and the pad 112*a* of the drive element 112. In this embodiment, the third bonding wires 713 are disposed along the second direction Y.

The fourth bonding wires 714 form a conductive path of the drive element 112, the second terminals 4, and the pair of second support terminals 52 as shown in FIG. 2. The drive element 112 is electrically conducted to at least one or more second terminals 4 and the second support terminal 52 by means of the fourth bonding wires 714. The fourth bonding wires 714 are each bonded to the pad 112*a* of the drive element 112, the pad portion 412 of the second intermediate terminal 41, the pad portion 422 of the second side terminal 42, or the pad portion 522 of the second support terminal 52.

[Operation of Motor Drive Device]

Figure 10:
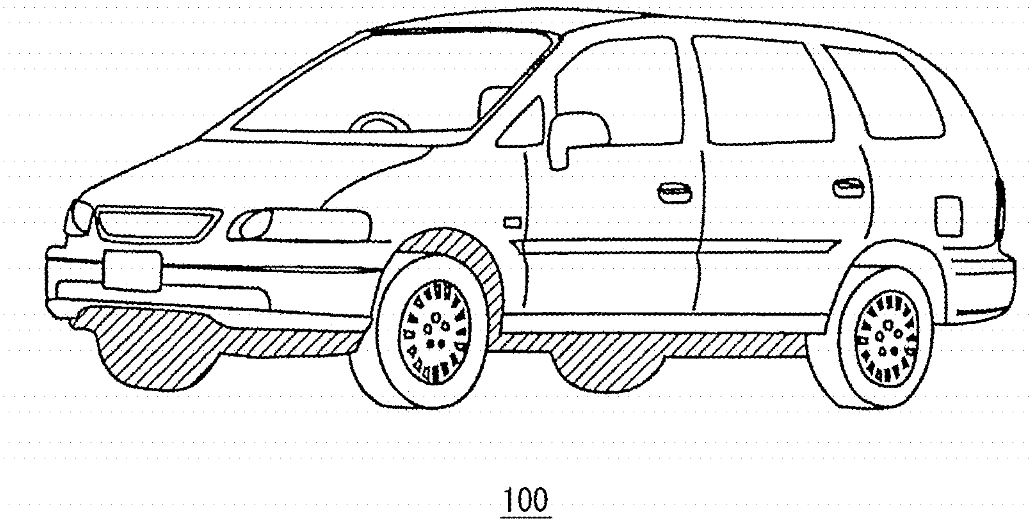
FIG. 10 is a schematic view of a vehicle according to one preferred embodiment of the present disclosure.
Figure 11:
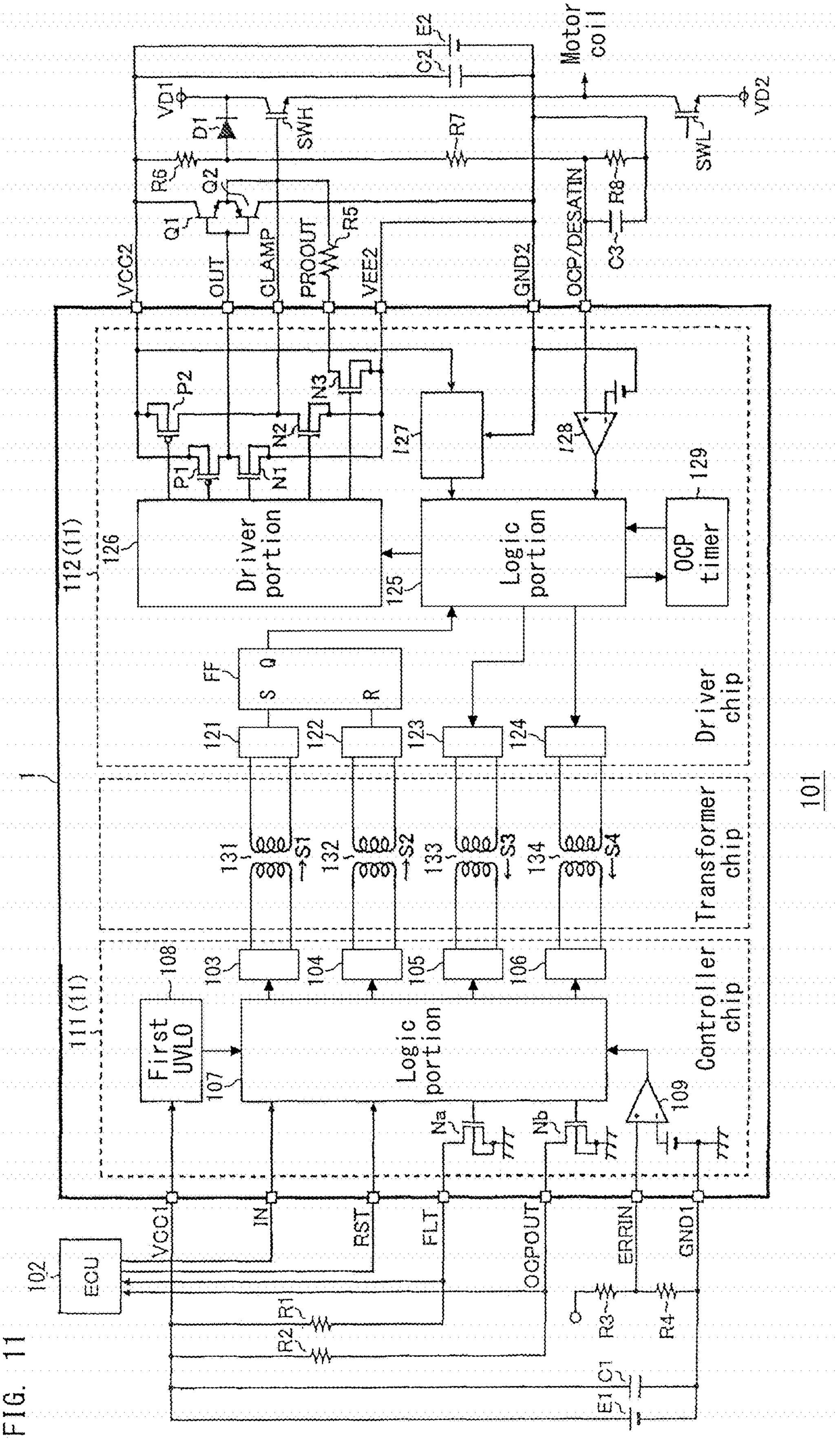
FIG. 11 is a block diagram showing a configuration example of a motor drive device according to one preferred embodiment of the present disclosure.

Next, as an example, a detailed description will be given of a configuration in which the semiconductor module 1 is applied to a motor drive device 101 mounted on a hybrid vehicle (vehicle 100 shown in FIG. 10). FIG. 11 is a block diagram showing a configuration example of the motor drive device 101 using a semiconductor device according to the present disclosure.

The motor drive device 101 includes a high side switch SWH, a low side switch SWL, the semiconductor module 1 (switch controller) that is a control means for the high side switch SWH, an engine control unit 102 (hereinafter, referred to as ECU [Engine Control Unit] 102), DC voltage sources E1 and E2, an npn type bipolar transistor Q1, a pnp type bipolar transistor Q2, capacitors C1 to C3, resistors R1 to R8, and a diode D1.

The semiconductor module 1 is formed by sealing the control element 111 (first semiconductor chip), the drive element 112 (second semiconductor chip), and the insulating element 12 with the sealing resin 6 as described above.

In the semiconductor module 1, an input-to-output dielectric withstand voltage may be, for example, 600 V or more. Additionally, UVLO may be built into the semiconductor module 1. Additionally, a watch dog timer function may be built into the semiconductor module 1. Additionally, an overcurrent protection function (automatic restoration type) may be built into the semiconductor module 1. Additionally, a slow-off function performed when the overcurrent protection operates may be built into the semiconductor module 1. Additionally, an external-error detecting function (ERRIN) may be built into the semiconductor module 1. Additionally, an abnormal-state output function (FLT, OCPOUT) may be built into the semiconductor module 1. Additionally, an active-mirror clamp function may be built into the semiconductor module 1. Additionally, a short-circuit clamp function may be built into the semiconductor module 1.

The control element 111 may be a controller chip in which controllers that are driven by receiving a supply of a first power-supply voltage VCC1 (5 [V], 3.3 [V], etc., based on a GND1 as a reference) from the DC voltage source E1 and that generate switch control signals S1 and S2 on the basis of an input signal IN are integrated. A generation function through an output function of switch control signals S1 and S2, a transformer transmission defect monitoring function (input-output logic monitoring function of an input signal IN), an error-state output function, a UVLO function, and an external-error input signal processing function can be mentioned as a main function of the control element 111. It suffices to design the withstand voltage of the control element 111 at an appropriate withstand voltage (for example, 7 [V] withstand voltage) in consideration of the first power-supply voltage VCC1 (based on a GND1 as a reference).

The drive element 112 may be a driver chip in which drivers that are driven by receiving a supply of a second power-supply voltage VCC2 (10 to 30 [V] based on a GND2 as a reference) from the DC voltage source E2 and that perform the drive control of the high side switch SWH an end of which receives the application of a high voltage of 600 [V] or more on the basis of switch control signals S1 and S2 input from the control element 111 through the insulating element 12 are integrated. A generation function through an output function of an output signal OUT, an overcurrent/overvoltage protection function, and a UVLO function can be mentioned as a main function of the drive element 112. It suffices to design the withstand voltage of the drive element 112 at an appropriate withstand voltage (for example, 40 [V] withstand voltage) in consideration of the second power-supply voltage VCC2 (based on a GND2 as a reference).

The insulating element 12 may be a transformer chip in which transformers that transfer switch control signals S1 and S2, a watchdog signal S3, and a driver abnormal signal S4 while insulating the control element 111 and the drive element 112 from each other in a direct-current manner are integrated.

The semiconductor module 1 is a configuration that independently has the insulating element 12 on which only transformers are mounted separately from the control element 111 in which controllers are integrated or the drive element 112 in which drivers are integrated as described above.

This configuration makes it possible to eliminate the use of a dedicated high withstand voltage process (several [kV] withstand voltages) and to reduce production costs because both the control element 111 and the drive element 112 can be produced through a general low withstand voltage process (not less than several [V] withstand voltages and not more than tens of [V] withstand voltages).

Additionally, both the control element 111 and the drive element 112 can be produced through a proven already-existing process and are not required to take a reliability test, and therefore it is possible to contribute to the shortening of a development period of time and the reduction of development costs.

Additionally, even if DC insulating elements (for example, photocoupler, capacitor, etc.) other than the transformer are used, it is possible to carry out easy measures by converting only the insulating element 12, and therefore the controller chip and the driver chip are not required to be additionally redeveloped, hence making it possible to contribute to the shortening of a development period of time and the reduction of development costs.

The ECU 102 is a means for totally performing electrical control in an engine operation and a motor operation, and is a microcontroller that exchanges various signals (IN, RST, FLT, OCPOUT) between the semiconductor module 1 and the ECU 102.

The high side switch SWH and the low side switch SWL are respectively connected to a space between an application end of a first motor drive voltage VD1 and an end of a motor coil and a space between an application end of a second motor drive voltage VD2 and an end of a motor coil, and are means for performing supply control of a motor drive current in accordance with on/off control of these side switches. In the motor drive device 101, an insulated gate bipolar transistor (IGBT [Insulated Gate Bipolar Transistor])

is used as the high side switch SWH and as the low side switch SWL, and yet, without being limited to this, a MOS [Metal Oxide Semiconductor] field-effect transistor using a SiC [Silicon Carbide] semiconductor or a MOS field-effect transistor using a Si semiconductor may also be adopted. Particularly, the MOS field-effect transistor using the SiC semiconductor is smaller in power consumption and is higher in heat-resistant temperature than the MOS field-effect transistor using the Si semiconductor, and therefore this transistor is suitable to be installed in a hybrid vehicle.

Next, an internal configuration of the semiconductor module 1 will be described in detail.

The control element 111 may include a first transmission portion 103, a second transmission portion 104, a first reception portion 105, a second reception portion 106, a logic portion 107, a first undervoltage lockout portion 108 (hereinafter, referred to as a first UVLO [Under-Voltage Lock-Out] portion 108), an external-error detection portion (comparator for external-error detection) 109, and N-channel type MOS field-effect transistors Na and Nb.

The drive element 112 may include a third reception portion 121, a fourth reception portion 122, a third transmission portion 123, a fourth transmission portion 124, a logic portion 125, a driver portion 126, a second undervoltage lockout portion 127 (hereinafter, referred to as a second UVLO portion 127), an overcurrent detection portion (comparator for overcurrent detection) 128, an OCP [Over Current Protection] timer 129, P-channel type MOS field-effect transistors P1 and P2, N-channel type MOS field-effect transistors N1 to N3, and an SR flipflop FF.

The insulating element 12 may include a first transformer 131, a second transformer 132, a third transformer 133, and a fourth transformer 134.

The first transmission portion 103 is a means for transmitting a switch control signal S1 input from the logic portion 107 to the third reception portion 121 through the first transformer 131. The second transmission portion 104 is a means for transmitting a switch control signal S2 input from the logic portion 107 to the fourth reception portion 122 through the second transformer 132. The first reception portion 105 is a means for receiving a watchdog signal S3 input from the third transmission portion 123 through the third transformer 133 and then transmitting the watchdog signal S3 to the logic portion 107. The fourth reception portion 122 is a means for receiving a driver abnormal signal S4 input from the fourth transmission portion 124 through the fourth transformer 134 and then transmitting the driver abnormal signal S4 to the logic portion 107.

The logic portion 107 is a means for exchanging various signals (IN, RST, FLT, OCPOUT) between the ECU 102 and the logic portion 107, and is a means for exchanging various signals (S1 to S4) between the drive element 112 and the logic portion 107 by use of the first transmission portion 103, the second transmission portion 104, the first reception portion 105, and the second reception portion 106.

When the input signal IN is a high level, the logic portion 107 generates switch control signals S1 and S2 so as to bring the output signal OUT into a high level, and, on the contrary, when the input signal IN is a low level, the logic portion 107 generates switch control signals S1 and S2 so as to bring the output signal OUT into a low level. More specifically, the logic portion 107 detects a positive edge of the input signal IN (leading edge from a low level to a high level), and erects a pulse in the switch control signal S1, whereas the logic portion 107 detects a negative edge of the input signal IN (trailing edge from a high level to a low level), and erects a pulse in the switch control signal S2.

Additionally, when the reset signal RST is a low level, the logic portion 107 generates switch control signals S1 and S2 so as to disable the generating operation of the output signal OUT, i.e., so as to fix the output signal OUT at a low level, and, on the contrary, when the reset signal RST is a high level, the logic portion 107 generates switch control signals S1 and S2 so as to enable the generating operation of the output signal OUT, i.e., so as to bring the output signal OUT into a logic level according to the input signal IN. If the reset signal RST is kept at a low level during a predetermined time (for example, 500 [ns]), the logic portion 107 generates switch control signals S1 and S2 so as to return the protective operation by means of the overcurrent detection portion 128.

Additionally, when the semiconductor module 1 is in a normal state, the logic portion 107 turns the transistor Na off, and makes the first state signal FLT open (pull-up state by the resistor R1), whereas, when the semiconductor module 1 is in an abnormal state (when a low-voltage defect on the control element 111 side, a transformer transmission defect of the switch control signals S1 and S2, or an ERRIN signal defect is detected), the logic portion 107 turns the transistor Na on, and brings the first state signal FLT into a low level. This configuration enables the ECU 102 to comprehend the state of the semiconductor module 1 by monitoring the first state signal FLT. With respect to the low-voltage defect on the control element 111 side, it suffices to make a determination on the basis of a detection result in the first UVLO portion 108, and, with respect to the transformer transmission defect of the switch control signals S1 and S2, it suffices to make a determination on the basis of a comparison result of both the input signal IN (switch control signals S1 and S2) and the watchdog signal S3. Additionally, with respect to the ERRIN signal defect, it suffices to make a determination on the basis of an output result of the external-error detection portion 109.

Additionally, when the semiconductor module 1 is in a normal state, the logic portion 107 turns the transistor Nb off, and makes the second state signal OCPOUT open (pull-up state by the resistor R2), whereas, when the semiconductor module 1 is in an abnormal state (when a low-voltage defect on the drive element 112 side or an overcurrent of a motor drive current flowing through the high side switch SWH is detected), the logic portion 107 turns the transistor Nb on, and brings the second state signal OCPOUT into a low level. This configuration enables the ECU 102 to comprehend the state of the semiconductor module 1 by monitoring the second state signal OCPOUT. With respect to the low-voltage defect on the drive element 112 side or the overcurrent of a motor drive current flowing through the high side switch SWH, it suffices to make a determination on the basis of a driver abnormal signal S4.

The first UVLO portion 108 is a means for monitoring whether the first power-supply voltage VCC1 is in a low-voltage state and then transmitting a monitoring result obtained here to the logic portion 107.

The external-error detection portion 109 is a means for making a comparison between a voltage input from a connection node of resistors R3 and R4 to an ERRIN terminal (divided voltage obtained by resistively dividing a to-be-monitored analog voltage) and a predetermined threshold voltage and then transmitting a comparison result obtained here to the logic portion 107.

The third reception portion 121 is a means for receiving a switch control signal S1 input from the first transmission portion 103 through the first transformer 131 and then transmitting the signal to a set input end (S) of the SR flipflop FF. The fourth reception portion 122 is a means for receiving a switch control signal S2 input from the second transmission portion 104 through the second transformer 132 and then transmitting the signal to a reset input end (R) of the SR flipflop FF. The third transmission portion 123 is a means for transmitting a watchdog signal S3 input from the logic portion 125 to the first reception portion 105 through the third transformer 133. The fourth transmission portion 124 is a means for transmitting a driver abnormal signal S4 input from the logic portion 125 to the second reception portion 106 through the fourth transformer 134.

The SR flipflop FF sets an output signal at a high level while using a pulse edge of a switch control signal S1 input into the set input end (S) as a trigger, and resets an output signal at a low level while using a pulse edge of a switch control signal S2 input into the reset input end (R) as a trigger. In other words, the output signal mentioned above becomes the same signal as an input signal IN input from the ECU 102 into the logic portion 107. The output signal mentioned above is sent from an output end (Q) of the SR flipflop FF to the logic portion 125.

The logic portion 125 generates a driving signal of the driver portion 126 on the basis of the output signal of the SR flipflop FF (same signal as the input signal IN).

Additionally, when the fact that a low-voltage defect or an overcurrent has occurred is determined on the basis of a detection result in the second UVLO portion 127 and in the overcurrent detection portion 128, the logic portion 125 transmits a determination to that effect to the driver portion 126 by use of an anomaly detection signal, and also transmits it to the logic portion 107 by use of a driver abnormal signal S4. This configuration enables the driver portion 126 to swiftly perform a protective operation even if a defect has occurred in the drive element 112, and enables the logic portion 107 to perform a defect imparting operation (low-level transition of the second state signal OCPOUT) toward the ECU 102. The logic portion 125 has a function to perform automatic restoration from an overcurrent protective operation at a point of time when a predetermined time has elapsed after performing the overcurrent protective operation.

Additionally, the logic portion 125 outputs an output signal of the SR flipflop FF to the third transmission portion 123 as a watchdog signal S3 without change. If a configuration in which a watchdog signal S3 is replied from the drive element 112 to the control element 111 is employed in this way, it is possible to determine the presence or absence of a transformer transmission defect by making a comparison between an input signal IN input into the control element 111 and a watchdog signal S3 replied from the drive element 112 thereto in the logic portion 107.

The driver portion 126 is a means for performing on/off control of the transistors P1 and N1 on the basis of a driving signal input from the logic portion 125 and then outputting an output signal OUT from a connection node of the transistors P1 and N1. The output signal OUT is input into the high side switch SWH through a driving circuit consisting of the transistors Q1 and Q2. The driving circuit mentioned above is a means for adjusting the rise/fall time (slew rate) of an output signal OUT in order to give the driving ability of the high side switch SWH to the output signal OUT. When the output signal OUT is at a high level, the high side switch SWH is turned on, and, on the contrary, when the output signal OUT is at a low level, the high side switch SWH is turned off.

The driver portion 126 has the function (active-mirror clamp function) of turning the transistor N2 on so as to absorb an electric charge (mirror current) from the gate of the high side switch SWH through a CLAMP terminal when the voltage level of the output signal OUT (based on a GND2 as a reference) becomes a low level. The thus formed configuration makes it possible to swiftly lower the gate potential of the high side switch SWH to a low level through the transistor N2 without relying on the slew rate set by the driving circuit mentioned above when the high side switch SWH is turned off.

Additionally, the driver portion 126 has the function of turning the transistor P2 on (short-circuit clamp function) so as to clamp the gate of the high side switch SWH to the power-supply voltage VCC2 through the CLAMP terminal when the voltage level of the output signal OUT (based on a GND2 as a reference) becomes a high level. The thus formed configuration makes it possible to prevent the gate potential of the high side switch SWH from rising to a potential higher than the power-supply voltage VCC2 when the high side switch SWH is turned on.

Additionally, the driver portion 126 has the function (slow-off function) of turning any of the transistors P1, P2, N1, and N2 off and, on the other hand, turning the transistor N3 on if it is determined that a protective operation is required to be performed on the basis of an anomaly detection signal input from the logic portion 125. The thus-performed switch control makes it possible to, when the protective operation is performed, pull out an electric charge from the gate of the high side switch SWH through a resistor R5 more gradually than when a normal operation is performed. The thus formed configuration makes it possible to suppress a surge generated by the counter electromotive force of a motor coil because a motor current can avoid being instantaneously shut off when the protective operation is performed. The fall time at the protective operation can be arbitrarily adjusted by appropriately selecting the resistance value of the resistor R5.

The second UVLO portion 127 is a means for monitoring whether the second power-supply voltage VCC2 is in a low-voltage state and then transmitting a monitoring result obtained here to the logic portion 125.

The overcurrent detection portion 128 is a means for making a comparison between a voltage input from a connection node of resistors R7 and R8 to an OCP/DESATIN terminal (divided voltage obtained by resistively dividing an anode voltage of the diode D1) and a predetermined threshold voltage and then transmitting a comparison result obtained here to the logic portion 125. A collector-to-emitter voltage of the insulated gate bipolar transistor used as a high side switch SWH becomes higher in proportion to an increase in motor drive current flowing through the high side switch SWH. Therefore, the anode voltage of the diode D1 becomes higher, and, consequently, a voltage input into the OCP/DESATIN terminal becomes higher in proportion to an increase in motor drive current flowing through the high side switch SWH. Therefore, the overcurrent detection portion 128 determines that the motor drive current flowing through the high side switch SWH is in an overcurrent state when the voltage (based on a GND2 as a reference) input into the OCP/DESATIN reaches a predetermined threshold value (for example, 0.5 [V]).

In this configuration example, a method (voltage detection method) of detecting a motor drive current by detecting a collector-to-emitter voltage of the insulated gate bipolar transistor used as the high side switch SWH has been described as an adoption configuration example, and yet, detection method of a motor drive current is not limited to this, and for example, a method (current detection method)

of generating a voltage signal while allowing a motor drive current (or a mirror current showing behavior similar thereto) flowing through the high side switch SWH to flow to a sense resistor and then inputting this voltage signal into the OCP/DESATIN terminal may also be adopted.

The OCP timer 129 is a means for counting a lapsed time after performing an overcurrent protective operation.

The first transformer 131 is a DC (direct-current) insulating element that transmits a switch control signal S1 from the control element 111 to the drive element 112. The second transformer 132 is a DC insulating element that transmits a switch control signal S2 from the control element 111 to the drive element 112. The third transformer 133 is a DC insulating element that transmits a watchdog signal S3 from the drive element 112 to the control element 111. The fourth transformer 134 is a DC insulating element that transmits a driver abnormal signal S4 from the drive element 112 to the control element 111.

As thus described, if the configuration is formed so as to exchange not only the switch control signals S1 and S2 but also the watchdog signal S3 and the driver abnormal signal S4 between the control element 111 and the drive element 112, it is possible to appropriately realize not only the on/off control of the high side switch SWH but also various protective functions.

Figure 12:
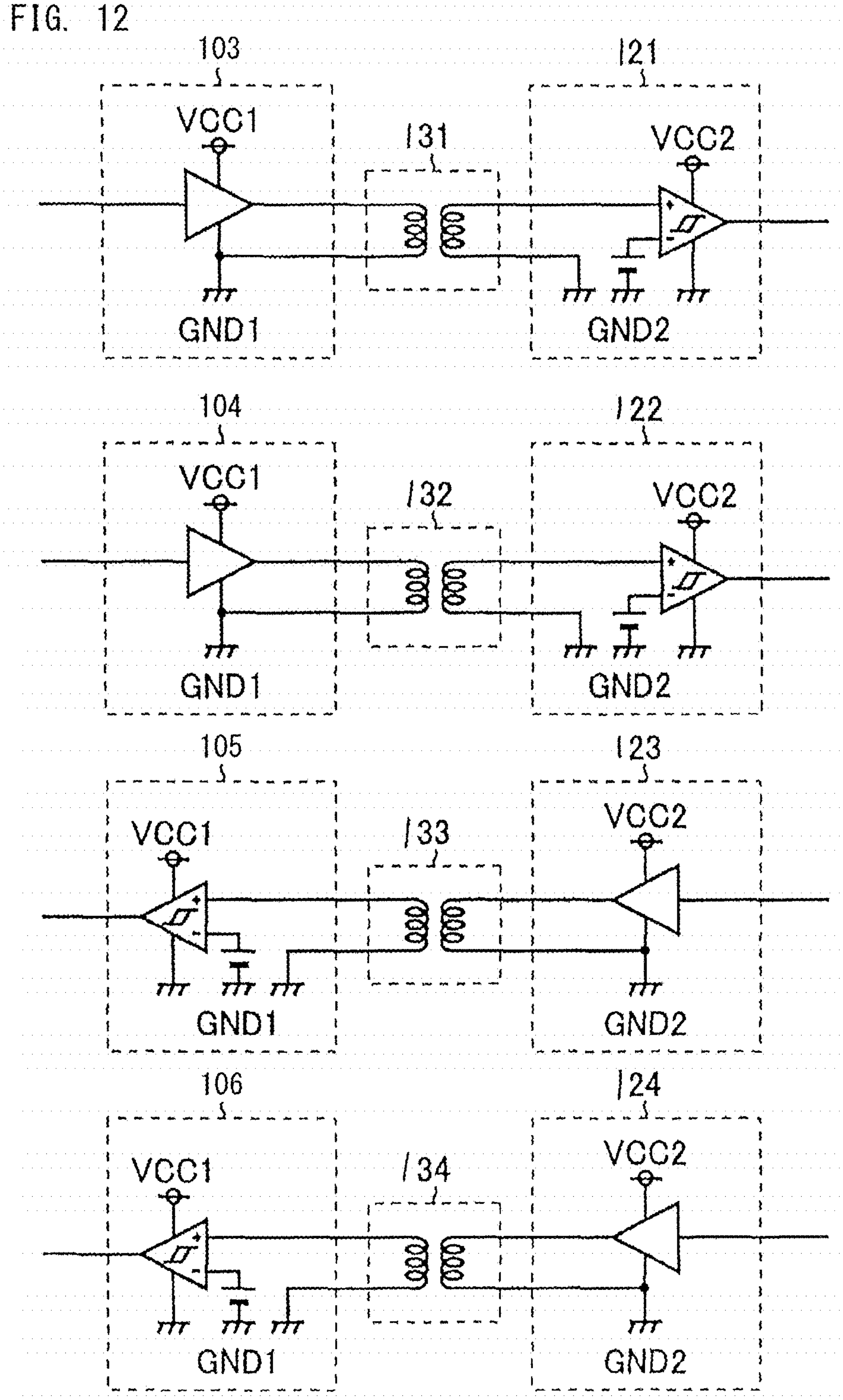
FIG. 12 is a detailed view of a transmitting/receiving circuit portion through a transformer.

FIG. 12 is a detailed view of transmitting/receiving circuit portions through the transformers 131 to 134. The first transmission portion 103, the second transmission portion 104, the first reception portion 105, and the second reception portion 106 provided on the control element 111 side are all driven by a VCC1-to-GND1 power-supply voltage, and the third reception portion 121, the fourth reception portion 122, the third transmission portion 123, and the fourth transmission portion 124 provided on the drive element 112 side are all driven by a VCC2-to-GND2 power-supply voltage as shown in FIG. 12.

This configuration makes it possible to eliminate the use of a dedicated high withstand voltage process (several [kV] withstand voltages) and to reduce production costs because both the control element 111 and the drive element 112 can be produced through a general low withstand voltage process (not less than several [V] withstand voltages and not more than tens of [V] withstand voltages) as described above.

With respect to each of the first reception portion 105, the second reception portion 106, the third reception portion 121, and the fourth reception portion 122, a configuration using the comparator having hysteresis characteristics has been described in FIG. 12, and yet the presence or absence of the hysteresis characteristics is arbitrary.

Next, the details of functions of the semiconductor module 1 will be panoptically described.

[UVLO1 (Malfunction Prevention Function when Controller-Side Voltage is Low)]

When the controller-side power-supply voltage (VCC1-to-GND1 voltage) becomes equal to or less than a predetermined lower threshold voltage $V_{UVLO1L}$, the semiconductor module 1 turns the high side switch SWH off, and brings an FLT terminal into a low level. On the other hand, when the controller-side power-supply voltage (VCC1-to-GND1 voltage) becomes equal to or more than a predetermined upper threshold voltage $V_{UVLO1H}$, the semiconductor module 1 starts a normal operation, and brings the FLT terminal into open (high level).

[UVLO2 (Malfunction Prevention Function when Driver-Side Voltage is Low)]

When the driver-side power-supply voltage (VCC2-to-GND2 voltage) becomes equal to or less than a predetermined lower threshold voltage $V_{UVLO2L}$, the semiconductor module 1 turns the high side switch SWH off, and brings an OCPOUT terminal into a low level. On the other hand, when the driver-side power-supply voltage (VCC2-to-GND2 voltage) becomes equal to or more than a predetermined upper threshold voltage $V_{UVLO2H}$, if the semiconductor module 1 starts a normal operation, and bring the OCPOUT terminal into open (high level).

[Analog Error Input]

When an input voltage into the ERRIN terminal becomes equal to or more than a predetermined threshold voltage $V_{ERRDET}$, the semiconductor module 1 turns the high side switch SWH off, and brings the FLT terminal into a low level. The thus formed configuration makes it possible to utilize the semiconductor module 1 for, for example, the overvoltage protective operation of a motor power source because an appropriate protective operation can be performed while additionally monitoring a defect that occurs in peripheral circuits of the semiconductor module 1. It suffices to give predetermined hysteresis ($V_{ERRHYS}$) to the threshold voltage $_{ERRDET}$ mentioned above.

[Overcurrent Protection]

When an input voltage into the OCP/DESATIN terminal becomes equal to or more than a predetermined threshold voltage $V_{OCDET}$ (to GND2), the semiconductor module 1 turns the high side switch SWH off, and brings the OCPOUT terminal into a low level.

[Overcurrent Protection Automatic Restoration]

When a fixed time ($t_{OCPRLS}$) elapses after performing the overcurrent protective operation, the semiconductor module 1 is automatically restored, and brings the OCPOUT terminal into open (high level). The restoration time may be fixedly set inside the semiconductor module 1, or may be adjustable from outside the device.

[Watchdog Timer]

The semiconductor module 1 makes a comparison between an input signal IN input from the ECU 102 into the control element 111 and a watchdog signal S3 fed back to the control element 111 from the drive element 112, and, if both signals discord in logic from each other, the semiconductor module 1 turns the high side switch SWH off, and brings the FLT terminal into a low level.

[Slow-Off when Protective Operation is Performed]

When an overcurrent protective operation is performed, the semiconductor module 1 brings the PROOUT terminal into a low level, and brings the OUT terminal into open. This control enables the high side switch SWH to slowly become off. The slew rate when being off can be arbitrarily adjusted by appropriately selecting the resistance value of the external resistor R5.

[Active Mirror Clamp]

When the gate potential of the high side switch SWH becomes equal to or less than a predetermined threshold voltage $V_{AMC}$, the semiconductor module 1 brings the CLAMP terminal into L. This control enables the high side switch SWH to reliably become off.

[Short Circuit Clamp]

When an applied voltage of the CLAMP terminal becomes equal to or more than VCC2-$V_{SCC}$, the semiconductor module 1 brings the CLAMP terminal into a high level. This control prevents the gate potential of the high side switch SWH from becoming higher than the second power-supply voltage VCC2.

Figures 13, 14:
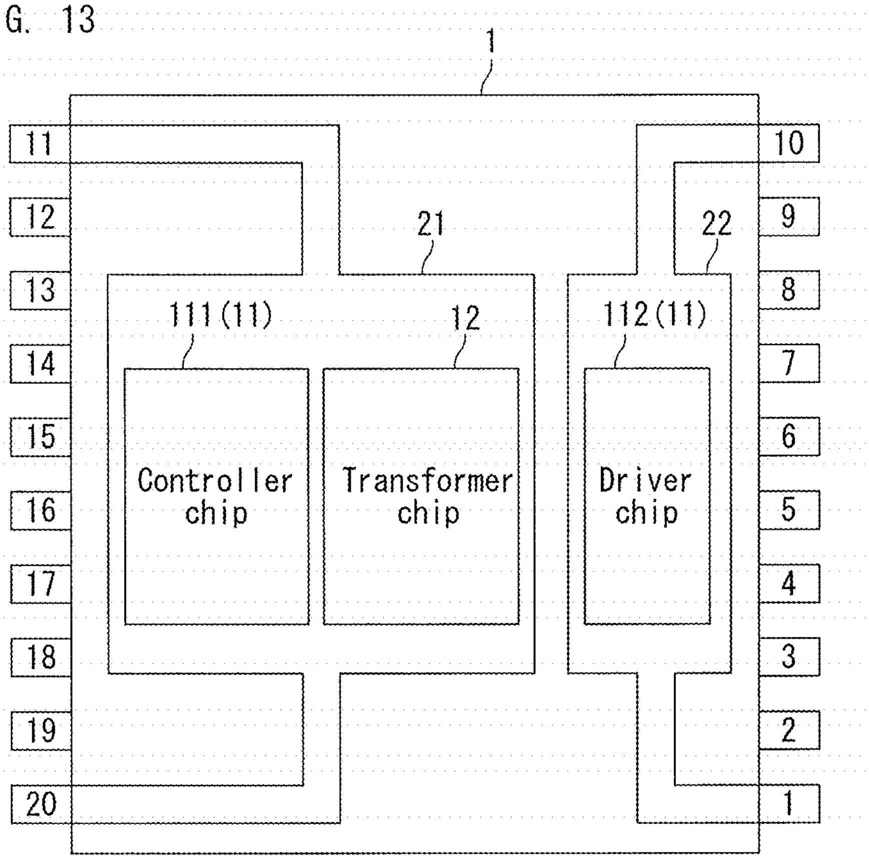
FIG. 13 is a schematic view showing an example of a terminal disposition of a semiconductor module and a chip arrangement in a sealing resin.
FIG. 14 is an example of a descriptive table of an external terminal of the semiconductor module.

FIG. 13 is a schematic view showing an example of a terminal disposition of the semiconductor module 1 and a chip arrangement in the sealing resin.

In the semiconductor module 1, the package is an object in which a plurality of pins are respectively arranged at two sides facing each other as shown in FIG. 13. The control element 111, the drive element 112, and the insulating element 12 are arranged perpendicularly to an array direction of the pins (lateral direction of the plane of paper) as described above.

The adoption of this chip arrangement makes it possible to arrange the pins 11 to 20 connected to the control element 111 and the pins 1 to 10 connected to the drive element 112 so as to be distributed into the two sides facing each other, hence making it possible to prevent a short circuit between the pins 11 to 20 and the pins 1 to while keeping a pin-to-pin interval at a minimum distance. The pins 11 to 20 correspond to the first terminal 3 of FIG. 1, and the pins 1 to 10 correspond to the second terminal 4 of FIG. 1. A chip arrangement whose package type is SOP has been mentioned here as an example, and yet the chip arrangement can be appropriately changed if package types other than SOP are adopted.

Additionally, in the semiconductor module 1 of this configuration example, the control element 111 and the insulating element 12 are mounted on the first die pad 21 as described above and the drive element 112 is mounted on the second die pad 22 as described above as shown in FIG. 13. The thus formed configuration makes it possible to use power supply systems in a state of being divided from each other in such a manner that the first die pad 21 is a low-voltage-side island (fixed to GND1) whereas the second die pad 22 is a high-voltage-side island (fixed to VEE2). The first die pad 21 and the second die pad 22 are each made of a non-magnetic material (for example, copper), and yet a magnetic material (for example, iron) may also be used.

FIG. 14 is an example of a descriptive table of external terminals. Pin 1 (NC) is a non-connection terminal. Pin 2 (VEE2) is a negative power terminal (for example, minimum: −15 V). Pin 3 (GND2) is a GND terminal, and is connected to an emitter of an insulated gate bipolar transistor Tr1 in the outside of the semiconductor module 1. Pin 4 (OCP/DESATIN) is an overcurrent detection terminal. Pin 5 (OUT) is an output terminal. Pin 6 (VCC2) is a positive power terminal (for example, maximum: 30 V). Pin 7 (CLAMP) is a clamp terminal. Pin 8 (PROOUT) is a slow-off output terminal. Pin 9 (VEE2) is a negative power terminal. Pin 10 (NC) is a non-connection terminal. Pin 11 (GND1) is a GND terminal. Pin 12 (IN) is a control input terminal. Pin 13 (RST) is a reset input terminal. Pin 14 (FLT) is an output terminal of a first state signal (abnormal state detection signal on the controller-chip side). Pin 15 (OCPOUT) is an output terminal of a second state signal (abnormal state detection signal on the driver chip side). Pin 16 (ERRIN) is an error detection terminal. Pin 17 (VCC1) is a power terminal (for example, 5 V or 3.3 V, etc.). Pin 18 (NC) and pin 19 (NC) are non-connection terminals, respectively. Pin 20 (GND1) is a GND terminal.

FIG. 15 is an example of an electrical-characteristic table of the semiconductor module 1. Numerical values in this table are provided on the condition that Ta=25° C., VCC1=5 V, VCC2=20 V, and VEE2=−8 V, unless specified otherwise.

Next, a configuration and an operation of a signal transmission device 200 included in the motor drive device 101 will be described in more detail. The overall configuration and the operation of the motor drive device 101 in which the signal transmission device 200 is mounted have already been described with reference to FIG. 11 to FIG. 15 mentioned above, and therefore a duplicated description is hereinafter omitted, and the configuration and the operation of the signal transmission device 200 will be emphatically described.

First Preferred Embodiment of Signal Transmission Device 200

Figure 16:
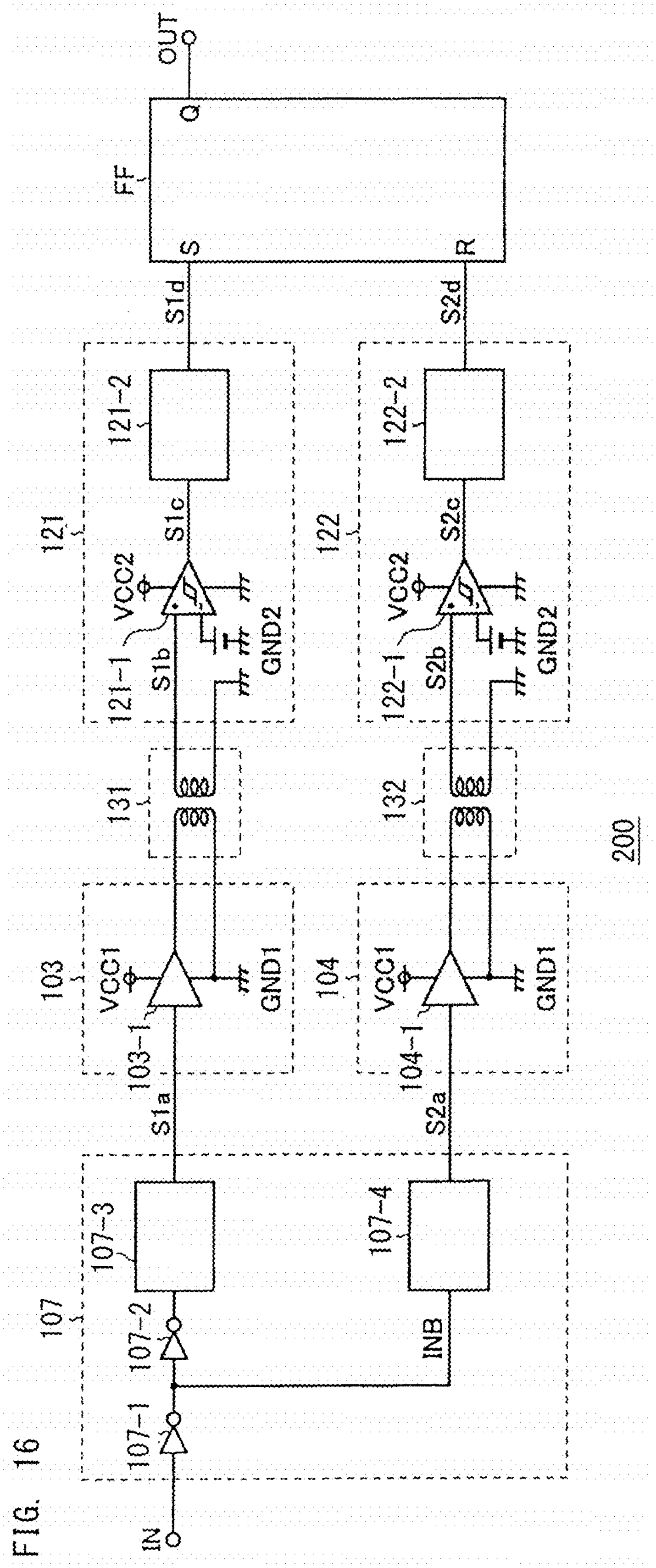
FIG. 16 is a circuit block diagram showing a first preferred embodiment of a signal transmission device.

FIG. 16 is a circuit block diagram showing a first preferred embodiment of the signal transmission device 200.

The signal transmission device 200 of the present preferred embodiment includes the logic portion 107, the first transmission portion 103, the second transmission portion 104, the first transformer 131, the second transformer 132, the third reception portion 121, the fourth reception portion 122, and the SR flipflop FF as circuit blocks that transmit switch control signals S1 and S2 from a primary side circuit to a secondary side circuit in a state in which the ground voltage GND1 of the primary side circuit and the ground voltage GND2 of the secondary side circuit are insulated from each other. Each of these circuit blocks has been already shown in FIG. 11 and FIG. 12, and the best use of inventiveness is made for the configuration of the logic portion 107 and of the third and fourth reception portions 121 and 122 in order to avoid a malfunction caused by a noise or the like in the signal transmission device 200. Hereinafter, its characteristic configuration part will be emphatically described.

The logic portion 107 includes inverters 107-1, 107-2, a first pulse generation portion 107-3, and a second pulse generation portion 107-4.

An input end of the inverter 107-1 is connected to an input end of an input signal IN. An output end of the inverter 107-1 is connected to an input end of the inverter 107-2, and is also connected to an input end of the second pulse generation portion 107-4. An output end of the inverter 107-2 is connected to an input end of the first pulse generation portion 107-3.

The first pulse generation portion 107-3 allows a first transformer driving signal S1*a* to generate N pulses (however, N≥2) in accordance with a positive edge of an input signal IN input through the inverters 107-2 and 107-3. The first transformer driving signal S1*a* is output to a primary-side coil of the first transformer 131 through a buffer 103-1 that forms the first transmission portion 103.

The second pulse generation portion 107-4 allows a second transformer driving signal S2*a* to generate N pulses (however, N≥2) in accordance with a positive edge of an inverted input signal INB input from the inverter 107-2 (i.e., negative edge of an input signal IN). The second transformer driving signal S2*a* is output to a primary-side coil of the second transformer 132 through a buffer 104-1 that forms the second transmission portion 104.

As thus described, in the signal transmission device 200 of the first preferred embodiment, the logic portion 107 functions as a transformer driving-signal generation portion that allows the first transformer driving signal S1*a* to consecutively generate N pulses in accordance with a positive edge in which the input signal IN changes from a low level to a high level and that allows the second transformer driving signal S2*a* to consecutively generate N pulses in accordance with a negative edge in which the input IN signal changes from a high level to a low level.

The first transformer 131 allows a secondary-side coil to generate a first induced signal S1*b* in accordance with a first transformer driving signal S1*a* input into the primary-side coil.

The second transformer 132 allows the secondary-side coil to generate a second induced signal S2*b* in accordance with a second transformer driving signal S2*a* input into the primary-side coil.

The third reception portion 121 has a first comparator 121-1 that compares the first induced signal S1*b* and a predetermined threshold voltage and that generates a first comparison signal S1*c* and a first pulse detection portion 121-2 that detects that N pulses have been consecutively generated in the first comparison signal S1*c* and that allows a first detection signal 1*d* to generate a pulse.

The fourth reception portion 122 has a second comparator 122-1 that compares the second induced signal S2*b* and a predetermined threshold voltage and that generates a second comparison signal S2*c* and a second pulse detection portion 122-2 that detects that N pulses have been consecutively generated in the second comparison signal 2*c* and that allows a second detection signal 2*d* to generate a pulse.

The SR flipflop FF changes an output signal OUT from a low level to a high level in accordance with the pulse generated by the first detection signal S1*d* input into the set input end (S), and changes an output signal OUT from a high level to a low level in accordance with the pulse generated by the second detection signal S2*d* input into the reset input end (R).

In other words, the switch control signal S1 described above is transmitted from the logic portion 107 to the SR flipflop FF while taking various signal aspects, i.e., the first transformer driving signal S1*a*, the first induced signal S1*b*, the first comparison signal S1*c*, and the first detection signal S1*d*. Likewise, the switch control signal S2 described above is transmitted from the logic portion 107 to the SR flipflop FF while taking various signal aspects, i.e., the second transformer driving signal S2*a*, the second induced signal S2*b*, the second comparison signal S2*c*, and the second detection signal S2*d*.

[Structure of Semiconductor Device]

Next, a structure of the insulating element 12 mounted in the semiconductor module 1 will be described in more detail. In the following description, semiconductor devices A1 to A4, semiconductor devices B1 to B4, semiconductor devices C1 to C4, semiconductor devices D1 and D2, semiconductor devices E1 and E2, and semiconductor devices F1 to F5 are each mentioned as an example of the structure of the insulating element 12, and yet the structure of the insulating element 12 is not limited to these structures.

<Structures of Semiconductor Devices A1 to A4>

First Preferred Embodiment

Figure 17:
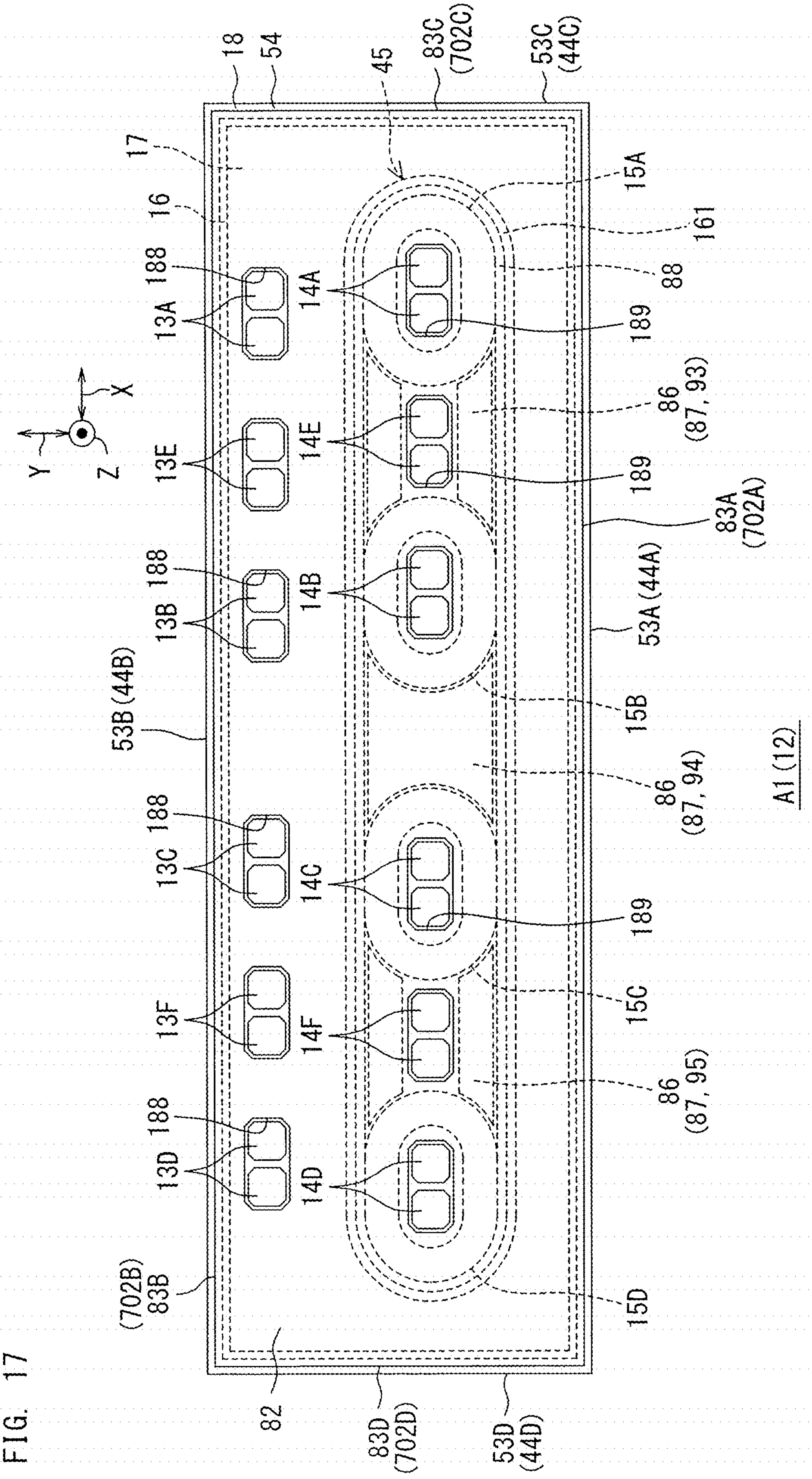
FIG. 17 is a schematic plan view of a semiconductor device according to one preferred embodiment of the present disclosure.
Figure 18:
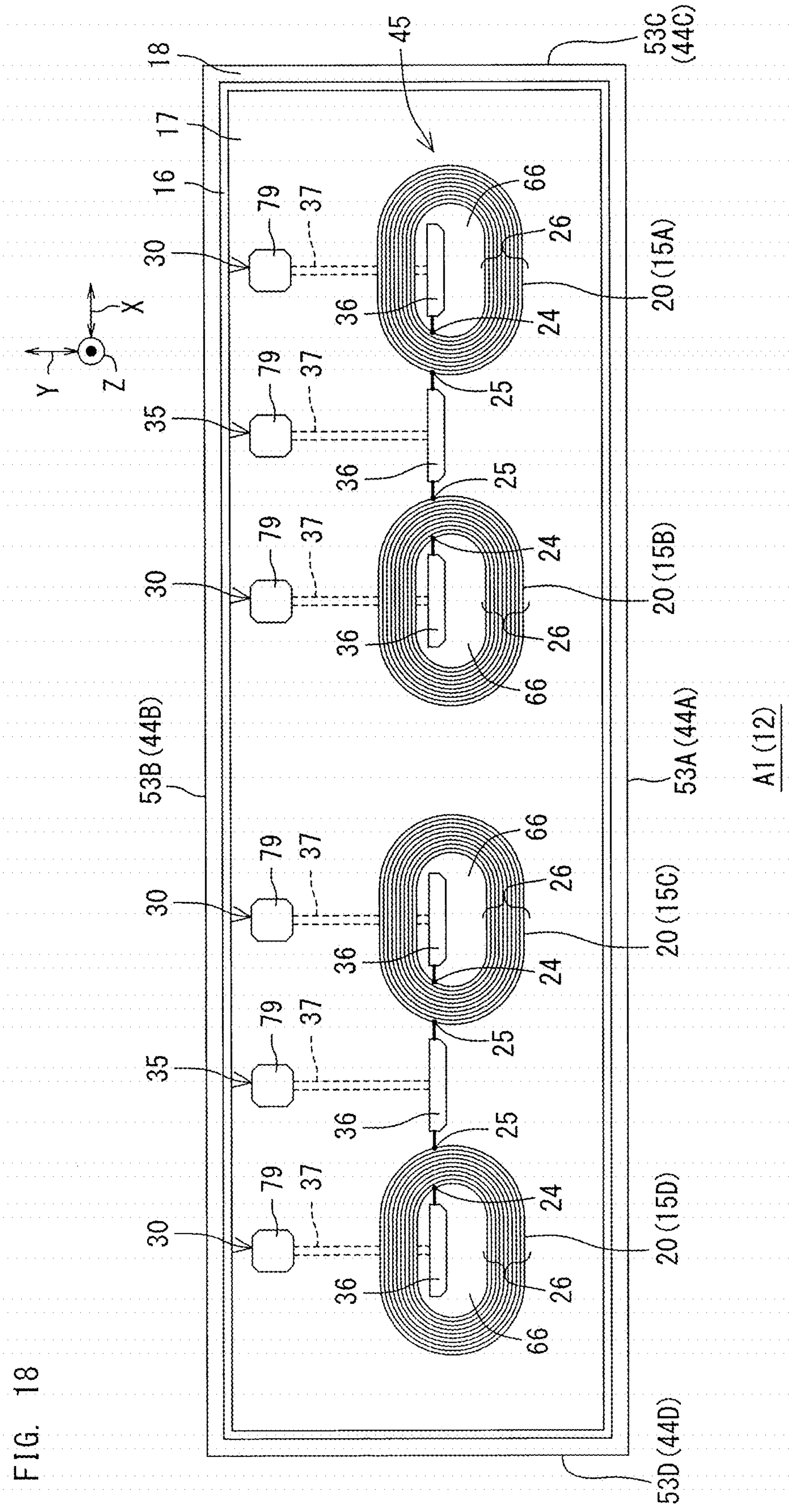
FIG. 18 is a plan view showing a layer in which a low potential coil is formed in the semiconductor device of FIG. 17.
Figure 19:
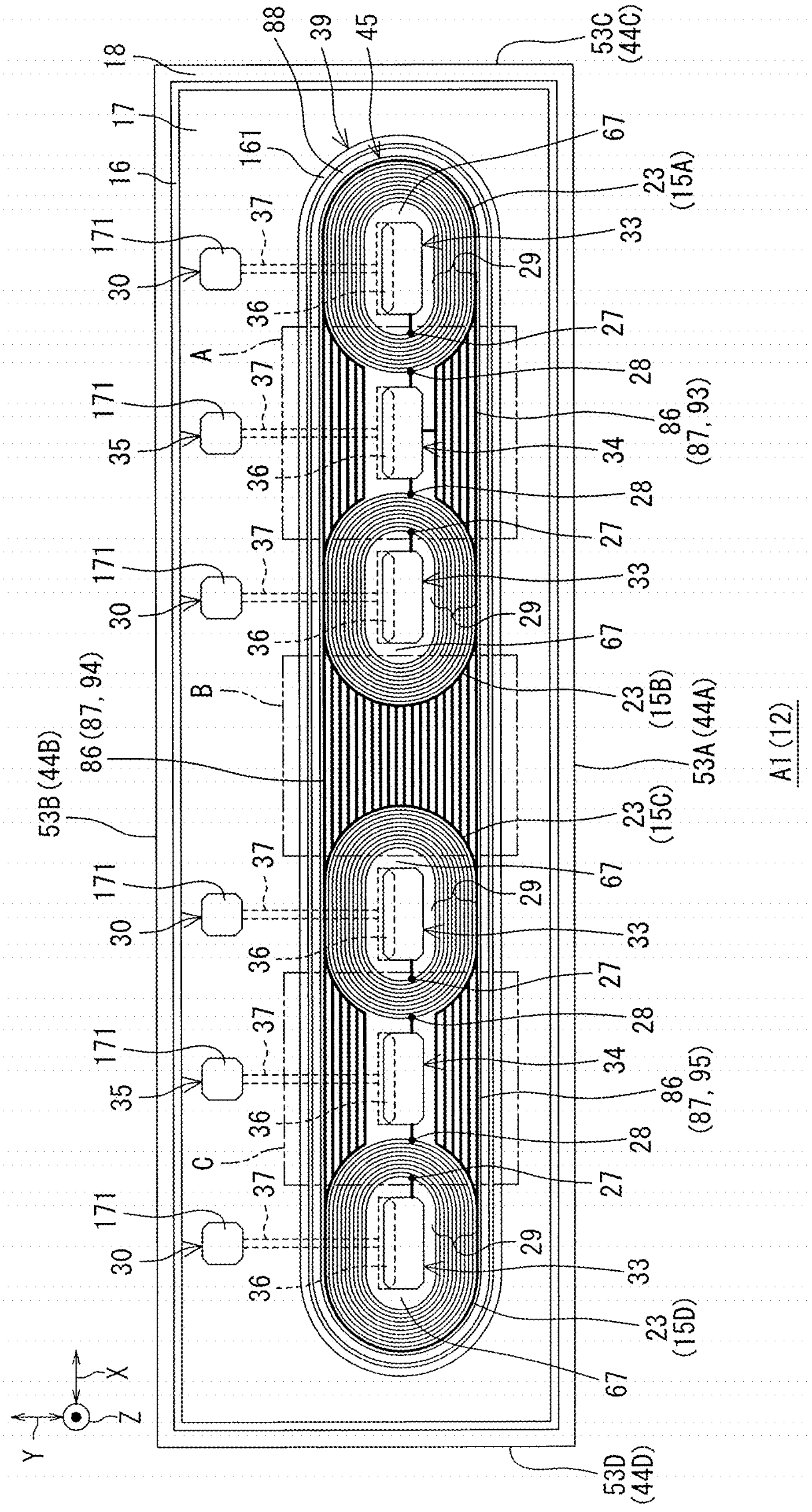
FIG. 19 is a plan view showing a layer in which a high potential coil is formed in the semiconductor device of FIG. 17.
Figure 20:
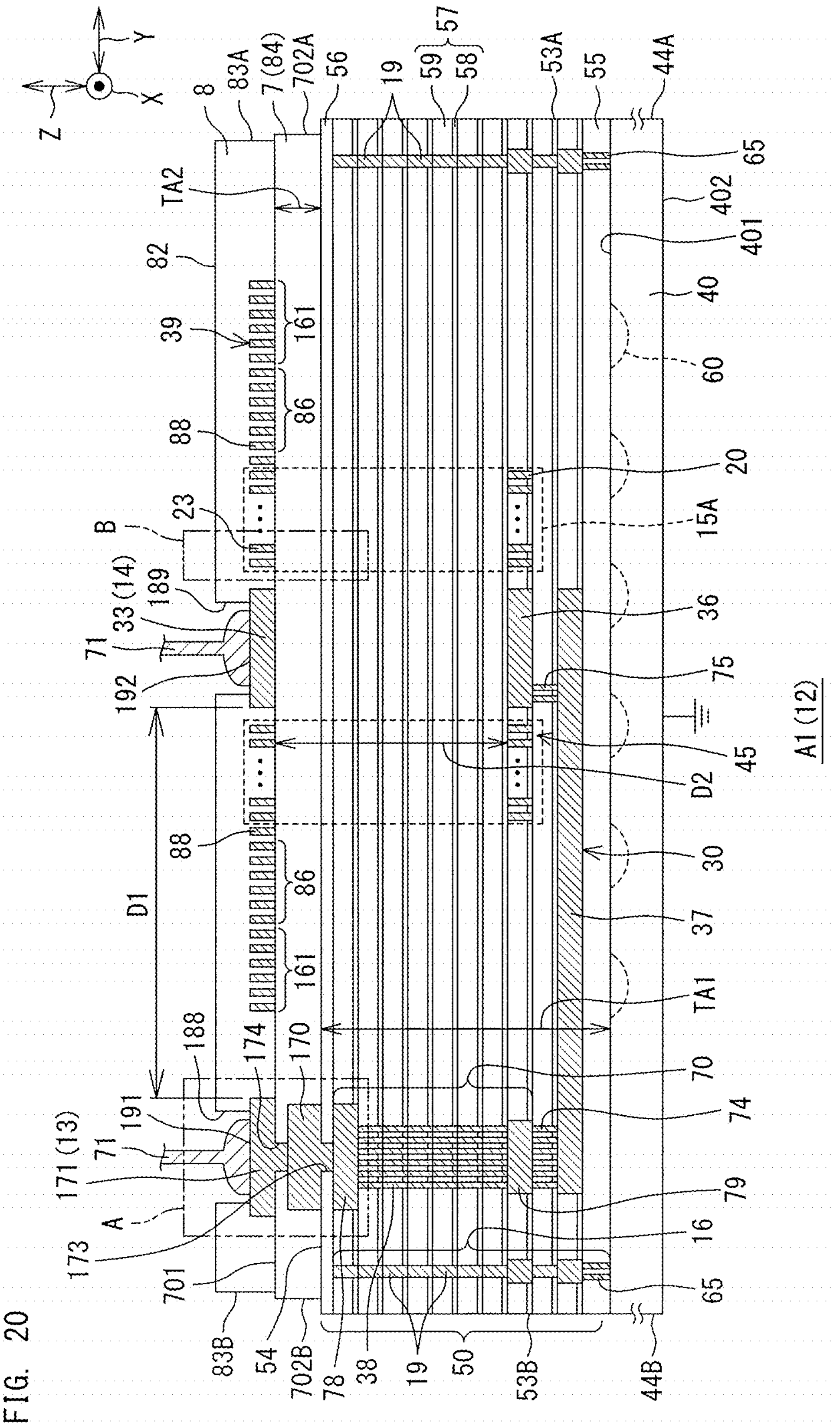
FIG. 20 is a schematic cross-sectional view of the semiconductor device of FIG. 17.
Figure 21:
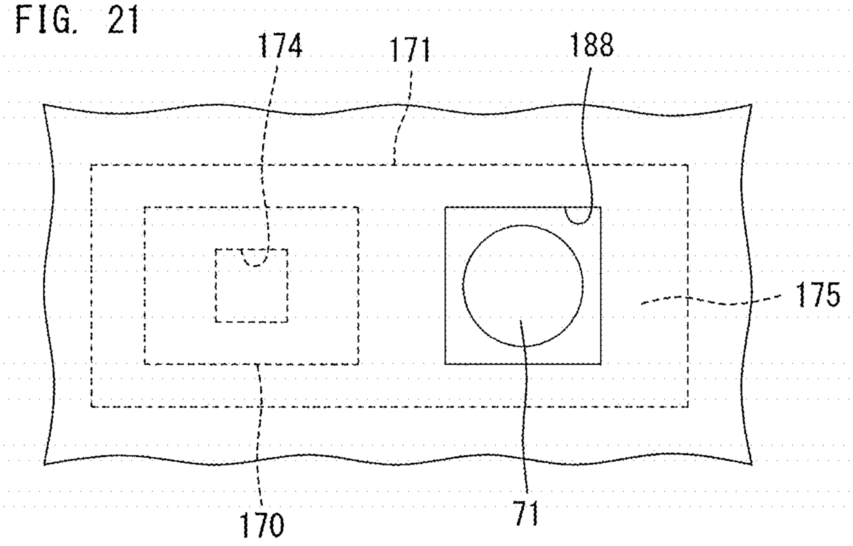
FIG. 21 is an enlarged view of a main part of the semiconductor device of FIG. 17.
Figure 22:
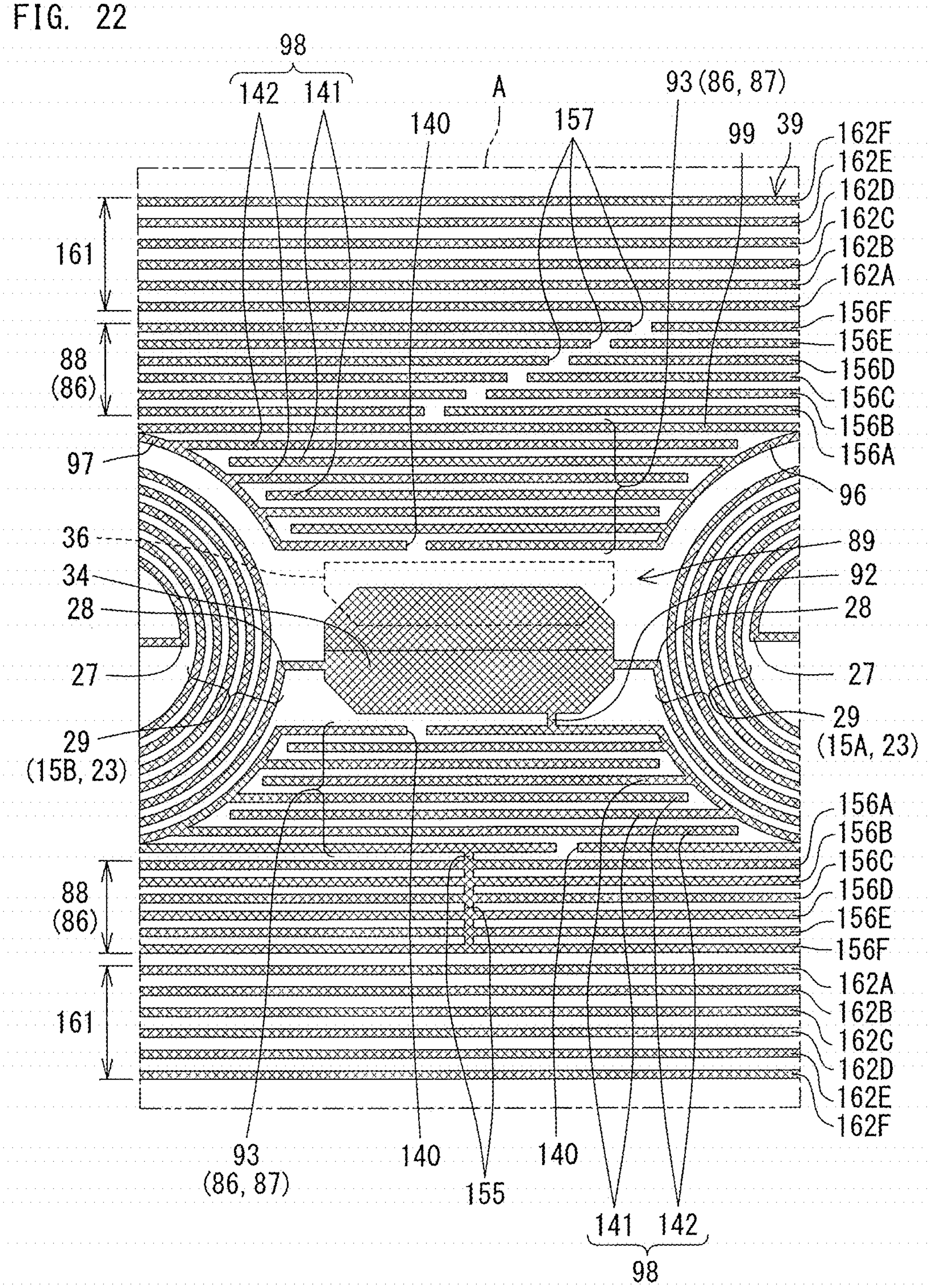
FIG. 22 is an enlarged view of a region A of FIG. 19.
Figure 23:
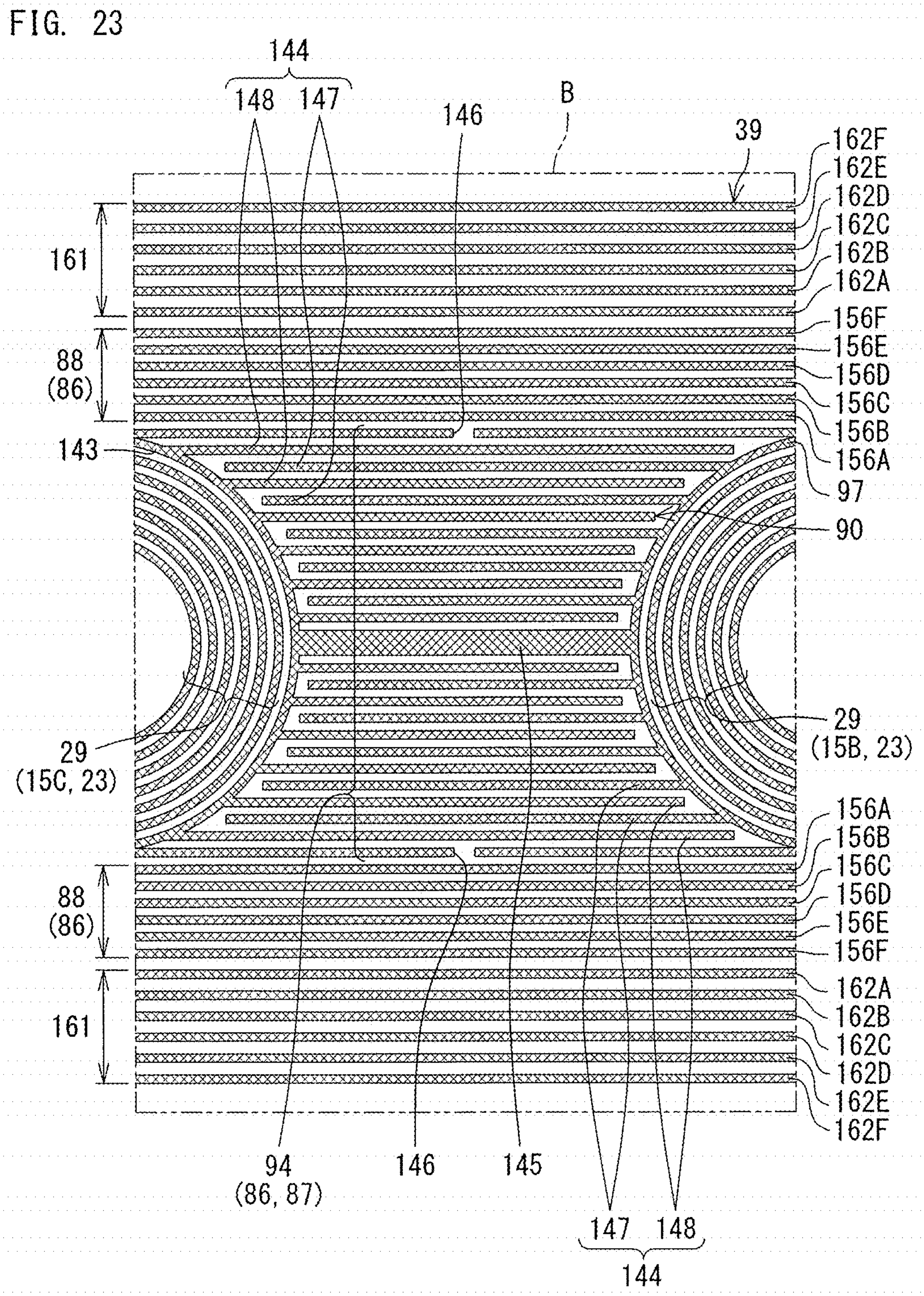
FIG. 23 is an enlarged view of a region B of FIG. 19.
Figure 24:
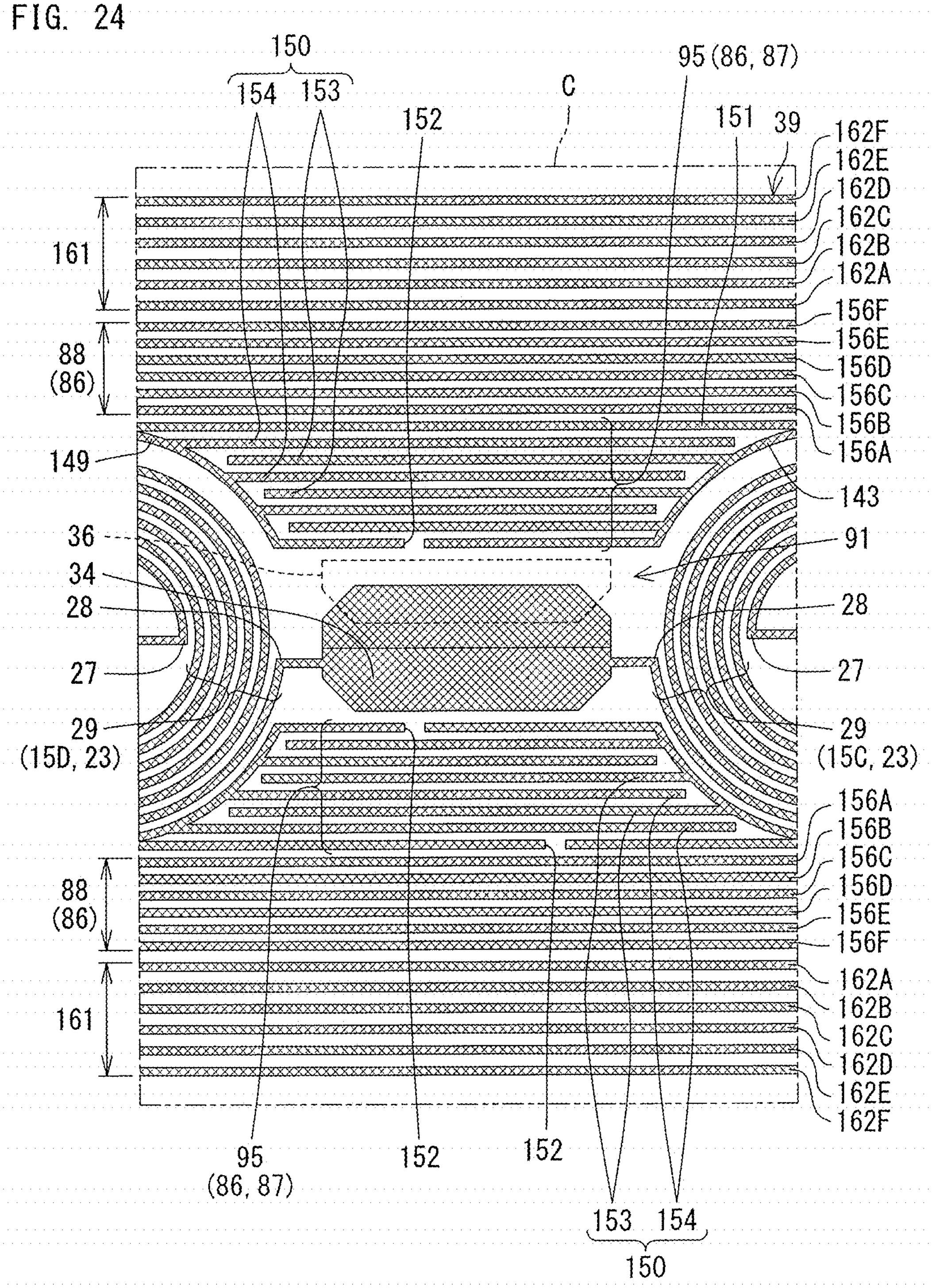
FIG. 24 is an enlarged view of a region C of FIG. 19.

FIG. 17 is a schematic plan view of a semiconductor device A1 according to a preferred embodiment of the present disclosure. FIG. 18 is a plan view showing a layer on which a low potential coil 20 is formed in the semiconductor device A1 of FIG. 17. FIG. 19 is a plan view showing a layer on which a high potential coil 23 is formed in the semiconductor device A1 of FIG. 17. FIG. 20 is a schematic cross-sectional view of the semiconductor device A1 of FIG. 17. FIG. 21 is an enlarged view of a main part of the semiconductor device A1 of FIG. 17. FIG. 22 is an enlarged view of a region A of FIG. 19. FIG. 23 is an enlarged view of a region B of FIG. 19. FIG. 24 is an enlarged view of a region C of FIG. 19.

Referring to FIG. 17 to FIG. 20, the semiconductor device A1 includes a rectangular parallelepiped shaped semiconductor chip 40. The semiconductor chip 40 includes at least one among silicon, a wide bandgap semiconductor, and a compound semiconductor.

The wide bandgap semiconductor is made of a semiconductor exceeding the bandgap of silicon (about 1.12 eV). Preferably, the bandgap of the wide bandgap semiconductor is 2.0 eV or more. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 40 includes a silicon-made semiconductor substrate. The semiconductor chip 40 may be an epitaxial substrate having a laminated structure including a silicon-made semiconductor substrate and a silicon-made epitaxial layer. The conductivity type of the semiconductor substrate may be an n type or may be a p type. The epitaxial layer may be an n type or may be a p type. Additionally, the semiconductor chip 40 may be fixed to the ground potential.

The semiconductor chip 40 has a first principal surface 401 on one side, a second principal surface 402 on the other side, and chip sidewalls 44A to 44D that connect the first principal surface 401 and the second principal surface 402. The first and second principal surfaces 401 and 402 are each formed in a quadrangular shape (in this embodiment, rectangular shape) in a plan view seen from their normal directions Z (hereinafter, referred to simply as a "plan view").

The chip sidewalls 44A to 44D include a first chip sidewall 44A, a second chip sidewall 44B, a third chip sidewall 44C, and a fourth chip sidewall 44D. Each of the first and second chip sidewalls 44A and 44B forms a long side of the semiconductor chip 40. The first and second chip sidewalls 44A and 44B extend along the first direction X, and face each other in the second direction Y. Each of the third and fourth chip sidewalls 44C and 44D forms a short side of the semiconductor chip 40. The third and fourth chip sidewalls 44C and 44D extend in the second direction Y, and face each other in the first direction X. The chip sidewalls 44A to 44D are each constituted of a ground surface.

The semiconductor device A1 includes a first insulating portion 50, a second insulating portion 7, and a protective layer 8 that are formed in this order on the first principal surface 401 of the semiconductor chip 40.

The first insulating portion 50 has an insulating principal surface 54 and insulating sidewalls 53A to 53D. The insulating principal surface 54 is formed in a quadrangular shape (in this embodiment, rectangular shape) that matches the first principal surface 401 in a plan view. The insulating principal surface 54 extends in parallel with the first principal surface 401.

The insulating sidewalls 53A to 53D include a first insulating sidewall 53A, a second insulating sidewall 53B, a third insulating sidewall 53C, and a fourth insulating sidewall 53D. The insulating sidewalls 53A to 53D extend from a peripheral edge of the insulating principal surface 54 toward the semiconductor chip 40, and are continuous with the chip sidewalls 44A to 44D. In detail, the insulating sidewalls 53A to 53D are formed so as to be flush with the chip sidewalls 44A to 44D. The insulating sidewalls 53A to 53D form ground surfaces flush with the chip sidewalls 44A to 44D, respectively.

The second insulating portion 7 is formed on the insulating principal surface 54, and has an insulating principal surface 701 and insulating sidewalls 702A to 702D. The insulating principal surface 701 is formed in a quadrangular shape (in this embodiment, rectangular shape) that matches the first principal surface 401 in a plan view. The insulating principal surface 701 extends in parallel with the first principal surface 401.

The insulating sidewalls 702A to 702D include a first insulating sidewall 702A, a second insulating sidewall 702B, a third insulating sidewall 702C, and a fourth insulating sidewall 702D. The insulating sidewalls 702A to 702D extend from a peripheral edge of the insulating principal surface 701 toward the semiconductor chip 40. In detail, the insulating sidewalls 702A to 702D are formed on an inward side with respect to the insulating sidewalls 53A to 53D. Hence, a level difference is formed between the insulating sidewalls 702A to 702D and the insulating sidewalls 53A to 53D.

The protective layer 8 is formed on the insulating principal surface 701, and has a protective principal surface 82 and protective sidewalls 83A to 83D. The protective principal surface 82 is formed in a quadrangular shape (in this embodiment, rectangular shape) so as to match the first principal surface 401 in a plan view. The protective principal surface 82 extends in parallel with the first principal surface 401.

The protective sidewalls 83A to 83D include a first protective sidewall 83A, a second protective sidewall 83B, a third protective sidewall 83C, and a fourth protective sidewall 83D. The protective sidewalls 83A to 83D extend from a peripheral edge of the protective principal surface 82 toward the semiconductor chip 40. In detail, the protective sidewalls 83A to 83D are formed on an inward side with respect to the insulating sidewalls 702A to 702D. Hence, a level difference is formed between the protective sidewalls 83A to 83D and the insulating sidewalls 702A to 702D.

The first insulating portion 50 is formed of a multilayer insulating laminated structure including an undermost insulating layer 55, an uppermost insulating layer 56, and a plurality of (in this embodiment, ten) interlayer insulating layers 57. The undermost insulating layer 55 is an insulating layer that directly covers the first principal surface 401. The uppermost insulating layer 56 is an insulating layer that forms the insulating principal surface 54. The interlayer insulating layers 57 are insulating layers interposed between the undermost insulating layer 55 and the uppermost insulating layer 56. In this embodiment, the undermost insulating layer 55 has a single layer structure including silicon oxide. In this embodiment, the uppermost insulating layer 56 has a single layer structure including silicon nitride. The thickness of the undermost insulating layer 55 may be not less than 0.5 μm and not more than 3 μm (for example, about 1 μm), and the thickness of the uppermost insulating layer 56 may be not less than 0.2 μm and not more than 4 μm (for example, about 1 μm).

Each of the interlayer insulating layers 57 has a laminated structure including a first insulating layer 58 on the undermost insulating layer 55 side and a second insulating layer 59 on the uppermost insulating layer 56 side. The first insulating layer 58 may be made of an inorganic insulating layer, and may include, for example, silicon nitride. The first insulating layer 58 is formed as an etching stopper layer with respect to the second insulating layer 59. The thickness of the first insulating layer 58 may be not less than 0.1 μm and not more than 1 μm (for example, about 0.3 μm).

The second insulating layer 59 is formed on the first insulating layer 58. The second insulating layer 59 includes an insulating material differing from that of the first insulating layer 58. The second insulating layer 59 is made of an inorganic insulating layer differing from the first insulating layer 58, and may include, for example, silicon oxide. The thickness of the second insulating layer 59 may be not less than 1 μm and not more than 3 μm (for example, about 2 μm). Preferably, the thickness of the second insulating layer 59 exceeds the thickness of the first insulating layer 58.

Additionally, the first insulating layer 58 may be a compressive stress film, and the second insulating layer 59 may be a tensile stress film. In other words, the interlayer insulating layer 57 may be a structure in which a compressive stress film and a tensile stress film are repeatedly laminated. This makes it possible to form the first insulating portion 50 while canceling a stress in a lamination interface of the interlayer insulating layer 57. As a result, it is possible to prevent the occurrence of large warping deformation in a semiconductor wafer that serves as a base material of the semiconductor chip 40 in a manufacturing process of the semiconductor device A1. The compressive stress film may be, for example, a silicon oxide film, and the tensile stress film may be, for example, a silicon nitride film.

The total thickness TA1 of the first insulating portion 50 may be not less than 5 μm and not more than 50 μm. The total thickness TA1 of the first insulating portion 50 and the number of laminated layers of the interlayer insulating layer 57 are arbitrary, and are adjusted in accordance with a dielectric withstand voltage (dielectric breakdown resistance) to be realized. Additionally, the insulating material of the undermost insulating layer 55, the insulating material of the uppermost insulating layer 56, and the insulating material of the interlayer insulating layer 57 are arbitrary, and are not limited to a specific insulating material.

The second insulating portion 7 is made of an insulating material having a dielectric constant differing from that of the first insulating layer 58 and differing from that of the second insulating layer 59, and has a layer structure including, for example, an organic insulating layer 84. The second insulating portion 7 consists of the single layer of the organic insulating layer 84 in this embodiment, and yet the second insulating portion 7 may have a laminated structure of a plurality of organic insulating layers. For example, a polyimide film, a phenol resin film, an epoxy resin film, etc., can be mentioned as the organic insulating layer 84. The total thickness TA2 of the second insulating portion 7 may be not less than 2 μm and not more than 100 μm. The total thickness TA2 of the second insulating portion 7 is arbitrary, and is adjusted in accordance with a dielectric withstand voltage (dielectric breakdown resistance) to be realized.

The semiconductor device A1 includes a first functional device 45. The first functional device 45 includes a single or a plurality of (in this embodiment, a plurality of) transformers 15. In other words, the semiconductor device A1 is formed of a multichannel type device including the transformers 15. The transformers 15 are formed at an inward portion of a laminated structure of the first and second insulating portions 50 and 7 at a distance from the insulating sidewalls 53A to 53D. The transformers 15 are formed at a distance from each other in the first direction X.

In detail, the transformers 15 include a first transformer 15A, a second transformer 15B, a third transformer 15C, and a fourth transformer 15D that are formed in this order from the insulating sidewall 53C side toward the insulating sidewall 53D side in a plan view. The first transformer 15A, the second transformer 15B, the third transformer 15C, and the fourth transformer 15D may correspond to the first transformer 131, the second transformer 132, the third transformer 133, and the fourth transformer 134 of FIG. 11, respectively. The transformers 15A to 15D each have the same structure. A structure of the first transformer 15A will be hereinafter described as an example. A description of structures of the second transformer 15B, the third transformer 15C, and the fourth transformer 15D is omitted on the condition that a description of the structure of the first transformer 15A is correspondingly applied.

Referring to FIG. 17 to FIG. 20, the first transformer 15A includes a low potential coil 20 and a high potential coil 23. The low potential coil 20 is formed in the first insulating portion 50. The high potential coil 23 is formed on the second insulating portion 7 so as to face the low potential coil 20 in the normal direction Z. In this embodiment, the low potential coil 20 is formed in a region (i.e., in the interlayer insulating layers 57) interposed between the undermost insulating layer 55 and the uppermost insulating layer 56. The high potential coil 23 is formed at the insulating principal surface 701 of the second insulating portion 7. In other words, the high potential coil 23 faces the semiconductor chip 40 with the low potential coil 20 between the high potential coil 23 and the semiconductor chip 40. Disposition places of the low potential coil 20 and the high potential coil 23 are arbitrary. Additionally, the high potential coil 23 is merely required to face the low potential coil 20 with at least three or more interlayer insulating layers 57 and the second insulating portion 7 between the high potential coil 23 and the low potential coil 20.

A distance D2 between the low potential coil 20 and the high potential coil 23 (i.e., the number of laminated layers of the interlayer insulating layer 57 and the thickness of the second insulating portion 7) is appropriately adjusted in accordance with a dielectric withstand voltage or an electric field strength between the low potential coil 20 and the high potential coil 23. In this embodiment, the low potential coil 20 is formed at the interlayer insulating layer 57 that is a third layer in order from the undermost insulating layer 55 side. On the other hand, the high potential coil 23 is formed at an insulating principal surface of the second insulating portion 7. Therefore, the interlayer insulating layer 57, which is equivalent to seven layers, and the second insulating portion 7 are interposed between the low potential coil 20 and the high potential coil 23.

The low potential coil 20 is buried while penetrating through the first and second insulating layers 58 and 59 in the interlayer insulating layer 57. The low potential coil 20 includes a first inner end 24, a first outer end 25, and a first helical portion 26 that is helically routed around between the first inner end 24 and the first outer end 25 as shown in FIG. 18. The first helical portion 26 is helically routed around while extending in an elliptical shape (oval shape) in a plan view. A part, which forms an innermost peripheral edge, of the first helical portion 26 demarcates a first inner region 66 having an elliptical shape in a plan view.

The number of winding turns of the first helical portion 26 may be not less than 3 and not more than 30. The width of the first helical portion 26 may be not less than 0.1 μm and not more than 10 μm. Preferably, the width of the first helical portion 26 is not less than 1 μm and not more than 3 μm. The width of the first helical portion 26 is defined by a width in the direction perpendicular to the helical direction. A first winding pitch of the first helical portion 26 may be not less than 0.1 μm and not more than 20 μm. Preferably, the first winding pitch is not less than 1 μm and not more than 10 μm. The first winding pitch is defined by a distance between two parts, which adjoin each other in the direction perpendicular to the helical direction, of the first helical portion 26.

The wound shape of the first helical portion 26 or the planar shape of the first inner region 66 is arbitrary, and is not limited to the form shown in FIG. 18, etc. The first helical portion 26 may be wound in a polygonal shape, such as a triangular shape or a quadrangular shape, or in a circular shape in a plan view. The first inner region 66 may be demarcated so as to be a polygonal shape, such as a triangular shape or a quadrangular shape, or so as to be a circular shape in a plan view in accordance with the wound shape of the first helical portion 26.

The low potential coil 20 may include at least one among titanium, titanium nitride, copper, aluminum, and tungsten. The low potential coil 20 may have a laminated structure including a barrier layer and a main body layer. The barrier layer demarcates a recessed space in the interlayer insulating layer 57. The main body layer is buried in the recessed space demarcated by the barrier layer. The barrier layer may include at least one of titanium and titanium nitride. The main body layer may include at least one among copper, aluminum, and tungsten.

The high potential coil 23 is formed so as to be erected from the insulating principal surface 701 of the second insulating portion 7 to the side opposite to the first insulating portion 50. The high potential coil 23 is covered with the protective layer 8 from its top portion side. The high potential coil 23 includes a second inner end 27, a second outer end 28, and a second helical portion 29 helically routed around between the second inner end 27 and the second outer end 28 as shown in FIG. 19. The second helical portion 29 is helically routed around while extending in an elliptical shape (oval shape) in a plan view. In this embodiment, a part, which forms an innermost peripheral edge, of the second helical portion 29 demarcates a second inner region 67 having an elliptical shape in a plan view. The second inner region 67 of the second helical portion 29 faces the first inner region 66 of the first helical portion 26 in the normal direction Z.

The number of winding turns of the second helical portion 29 may be not less than 3 and not more than 30. The number of winding turns of the second helical portion 29 with respect to the number of winding turns of the first helical portion 26 is adjusted in accordance with a voltage value to be increased. Preferably, the number of winding turns of the second helical portion 29 exceeds the number of winding turns of the first helical portion 26. Of course, the number of winding turns of the second helical portion 29 may be less than the number of winding turns of the first helical portion 26, or may be equal to the number of winding turns of the first helical portion 26.

The width of the second helical portion 29 may be not less than 0.1 μm and not more than 10 μm. Preferably, the width of the second helical portion 29 is not less than 1 μm and not more than 10 μm. The width of the second helical portion 29 is defined by a width in the direction perpendicular to the helical direction. Preferably, the width of the second helical portion 29 is equal to the width of the first helical portion 26.

A second winding pitch of the second helical portion 29 may be not less than 0.1 μm and not more than 20 μm. Preferably, the second winding pitch is not less than 1 μm and not more than 10 μm. The second winding pitch is defined by a distance between two parts, which adjoin each other in the direction perpendicular to the helical direction, of the second helical portion 29. Preferably, the second winding pitch is equal to the first winding pitch of the first helical portion 26.

The wound shape of the second helical portion 29 or the planar shape of the second inner region 67 is arbitrary, and is not limited to the form shown in FIG. 19, etc. The second helical portion 29 may be wound in a polygonal shape, such as a triangular shape or a quadrangular shape, or in a circular shape in a plan view. The second inner region 67 may be demarcated so as to be a polygonal shape, such as a triangular shape or a quadrangular shape, or so as to be a circular shape in a plan view in accordance with the wound shape of the second helical portion 29. Additionally, a part of the protective layer 8 enters a gap of the second helical portion 29.

The high potential coil 23 may include at least one among titanium, titanium nitride, copper, aluminum, and tungsten. The high potential coil 23 may have a laminated structure including a barrier layer and a main body layer. The barrier layer is formed in a flat shape along the insulating principal surface 701 of the second insulating portion 7. The main body layer is laminated on the barrier layer. The barrier layer may include at least one of titanium and titanium nitride. The main body layer may include at least one among copper, aluminum, and tungsten.

Referring to FIG. 17, the semiconductor device A1 includes a plurality of (in this embodiment, twelve) low potential terminals 13 and a plurality of (in this embodiment, twelve) high potential terminals 14. The low potential terminals 13 are each electrically connected to the low potential coil 20 of corresponding transformers 15A to 15D. The high potential terminals 14 are each electrically connected to the high potential coil 23 of corresponding transformers 15A to 15D.

The low potential terminals 13 are formed on the insulating principal surface 701 of the second insulating portion 7. In detail, the low potential terminals 13 are formed in a region on the insulating sidewall 53B side at a distance in the second direction Y from the transformers 15A to 15D, and are arranged at a distance from each other in the first direction X.

The low potential terminals 13 include a first low potential terminal 13A, a second low potential terminal 13B, a third low potential terminal 13C, a fourth low potential terminal 13D, a fifth low potential terminal 13E, and a sixth low potential terminal 13F. In this embodiment, the low potential terminals 13A to 13F are each formed as two low potential terminals. The number of the low potential terminals 13A to 13F is arbitrary.

The first low potential terminal 13A faces the first transformer 15A in the second direction Y in a plan view. The second low potential terminal 13B faces the second transformer 15B in the second direction Y in a plan view. The third low potential terminal 13C faces the third transformer 15C in the second direction Y in a plan view. The fourth low potential terminal 13D faces the fourth transformer 15D in the second direction Y in a plan view. The fifth low potential terminal 13E is formed in a region between the first low potential terminal 13A and the second low potential terminal 13B in a plan view. The sixth low potential terminal 13F is formed in a region between the third low potential terminal 13C and the fourth low potential terminal 13D in a plan view.

The first low potential terminal 13A is electrically connected to the first inner end 24 of the first transformer 15A (low potential coil 20). The second low potential terminal 13B is electrically connected to the first inner end 24 of the second transformer 15B (low potential coil 20). The third low potential terminal 13C is electrically connected to the first inner end 24 of the third transformer 15C (low potential coil 20). The fourth low potential terminal 13D is electrically connected to the first inner end 24 of the fourth transformer 15D (low potential coil 20).

The fifth low potential terminal 13E is electrically connected to the first outer end 25 of the first transformer 15A (low potential coil 20) and to the first outer end 25 of the second transformer 15B (low potential coil 20). The sixth low potential terminal 13F is electrically connected to the first outer end 25 of the third transformer 15C (low potential coil 20) and to the first outer end 25 of the fourth transformer 15D (low potential coil 20).

In other words, the low potential terminals 13A to 13D connected to the first inner end 24 of each of the transformers 15A to 15D are disposed closer to each of the transformers 15A to 15D than to the low potential terminals 13E and 13F connected to the first outer end 25 of each of the transformers 15A to 15D. For example, the first low potential terminal 13A connected to the first inner end 24 of the first transformer 15A is disposed closer to the first transformer 15A than to the fifth low potential terminal 13E connected to the first outer end 25 of the first transformer 15A. The same applies to a disposition relationship of the second and fifth low potential terminals 13B and 13E with respect to the second transformer 15B, a disposition relationship of the third and sixth low potential terminals 13C and 13F with respect to the third transformer 15C, and a disposition relationship of the fourth and sixth low potential terminals 13D and 13F with respect to the fourth transformer 15D.

The high potential terminals 14 are formed on the insulating principal surface 701 of the second insulating portion 7 at a distance from the low potential terminals 13. In detail, the high potential terminals 14 are formed in a region on the insulating sidewall 53A side at a distance in the second direction Y from the low potential terminals 13, and are arranged at a distance from each other in the first direction X.

The high potential terminals 14 are each formed in a region in proximity to corresponding transformers 15A to 15D in a plan view. That the high potential terminal 14 is in proximity to the transformers 15A to 15D means that the distance between the high potential terminal 14 and the transformer 15 is less than the distance between the low potential terminal 13 and the high potential terminal 14 in a plan view.

In detail, the high potential terminals 14 are formed at a distance along the first direction X so as to face the transformers 15A to 15D along the first direction X in a plan view. In more detail, the high potential terminals 14 are formed at a distance along the first direction X so as to be placed in the second inner region 67 of the high potential coil 23 and in a region between adjoining high potential coils 23 in a plan view. Hence, the high potential terminals 14 are arranged side by side with the transformers 15A to 15D in a line in the first direction X in a plan view.

The high potential terminals 14 include a first high potential terminal 14A, a second high potential terminal 14B, a third high potential terminal 14C, a fourth high potential terminal 14D, a fifth high potential terminal 14E, and a sixth high potential terminal 14F. In this embodiment, the high potential terminals 14A to 14F are each formed as two high potential terminals. The number of the high potential terminals 14A to 14F is arbitrary.

The first high potential terminal 14A is formed in the second inner region 67 of the first transformer 15A (high potential coil 23) in a plan view. The second high potential terminal 14B is formed in the second inner region 67 of the second transformer 15B (high potential coil 23) in a plan view. The third high potential terminal 14C is formed in the second inner region 67 of the third transformer 15C (high potential coil 23) in a plan view. The fourth high potential terminal 14D is formed in the second inner region 67 of the fourth transformer 15D (high potential coil 23) in a plan view. The fifth high potential terminal 14E is formed in a region between the first transformer 15A and the second transformer 15B in a plan view. The sixth high potential terminal 14F is formed in a region between the third transformer 15C and the fourth transformer 15D in a plan view.

The first high potential terminal 14A is electrically connected to the second inner end 27 of the first transformer 15A (high potential coil 23). The second high potential terminal 14B is electrically connected to the second inner end 27 of the second transformer 15B (high potential coil 23). The third high potential terminal 14C is electrically connected to the second inner end 27 of the third transformer 15C (high potential coil 23). The fourth high potential terminal 14D is electrically connected to the second inner end 27 of the fourth transformer 15D (high potential coil 23).

The fifth high potential terminal 14E is electrically connected to the second outer end 28 of the first transformer 15A (high potential coil 23) and the second outer end 28 of the second transformer 15B (high potential coil 23). The sixth high potential terminal 14F is electrically connected to the second outer end 28 of the third transformer 15C (high potential coil 23) and the second outer end 28 of the fourth transformer 15D (high potential coil 23).

Referring to FIG. 18 and FIG. 19, the semiconductor device A1 includes a first low potential wiring 30, a second low potential wiring 35, a first high potential wiring 33, and a second high potential wiring 34. In this embodiment, a plurality of first low potential wirings 30, a plurality of second low potential wirings 35, a plurality of first high potential wirings 33, and a plurality of second high potential wirings 34 are formed.

The first low potential wiring 30 and the second low potential wiring 35 fix the low potential coil 20 of the first transformer 15A and the low potential coil 20 of the second transformer 15B to the same potential. Additionally, the first low potential wiring 30 and the second low potential wiring 35 fix the low potential coil 20 of the third transformer 15C and the low potential coil 20 of the fourth transformer 15D to the same potential. In this embodiment, the first low potential wiring 30 and the second low potential wiring 35 fix all of the low potential coils 20 of the transformers 15A to 15D to the same potential.

The first high potential wiring 33 and the second high potential wirings 34 fix the high potential coil 23 of the first transformer 15A and the high potential coil 23 of the second transformer 15B to the same potential. Additionally, the first high potential wiring 33 and the second high potential wirings 34 fix the high potential coil 23 of the third transformer 15C and the high potential coil 23 of the fourth transformer 15D to the same potential. In this embodiment, the first high potential wiring 33 and the second high potential wirings 34 fix all of the high potential coils 23 of the transformers 15A to 15D to the same potential.

The first low potential wirings 30 are each electrically connected to corresponding low potential terminals 13A to 13D and to the first inner ends 24 of corresponding transformers 15A to 15D (low potential coils 20). The first low potential wirings 30 have the same structure. A structure of the first low potential wiring 30 connected to the first low potential terminal 13A and to the first transformer 15A will be hereinafter described as an example. A description of structures of other first low potential wirings 30 is omitted on the condition that a description of the structure of the first low potential wiring 30 connected to the first transformer 15A is correspondingly applied.

The first low potential wiring 30 includes a penetrating wiring 70, a low potential connection wiring 36, a lead-out wiring 37, a first connection plug electrode 74, and a second connection plug electrode 75. These energization members are formed in the first insulating portion 50. In other words, these are formed closer to the first insulating portion 50 than to a boundary portion between the first insulating portion 50 and the second insulating portion 7. Additionally, the first low potential wiring 30 includes a first low potential pad wiring 170 and a second low potential pad wiring 171. The first low potential pad wiring 170 and the second low potential pad wiring 171 are formed closer to the second insulating portion 7 than to the boundary portion between the first insulating portion 50 and the second insulating portion 7.

Preferably, the penetrating wiring 70, the low potential connection wiring 36, the lead-out wiring 37, the first connection plug electrode 74, and the second connection plug electrode 75 are each made of the same conductive material as the low potential coil 20, etc. In other words, preferably, each of the penetrating wiring 70, the low potential connection wiring 36, the lead-out wiring 37, the first connection plug electrode 74, and the second connection plug electrode 75 includes a barrier layer and a main body layer in the same way as the low potential coil 20, etc.

On the other hand, preferably, the first low potential pad wiring 170 and the second low potential pad wiring 171 are each made of the same conductive material as the high potential coil 23. In other words, preferably, each of the first low potential pad wiring 170 and the second low potential pad wiring 171 includes a barrier layer and a main body layer in the same way as the high potential coil 23, etc.

The penetrating wiring 70 penetrates through the interlayer insulating layers 57 in the first insulating portion 50, and is formed in a pillar shape extending along the normal direction Z. In this embodiment, the penetrating wiring 70 is formed in a region between the undermost insulating layer 55 and the uppermost insulating layer 56 in the first insulating portion 50. The penetrating wiring 70 has an upper end portion on the uppermost insulating layer 56 side and a lower end portion on the undermost insulating layer 55 side. The upper end portion of the penetrating wiring 70 is covered with the uppermost insulating layer 56, is partially exposed from a penetrating hole 173 formed in the uppermost insulating layer 56. The lower end portion of the penetrating wiring 70 is formed at the interlayer insulating layer 57 that is the same as the low potential coil 20.

In this embodiment, the penetrating wiring 70 includes a first electrode layer 78, a second electrode layer 79, and a plurality of wiring plug electrodes 38. In the penetrating wiring 70, the first electrode layer 78, the second electrode layer 79, and the wiring plug electrode 38 are each made of the same conductive material as the low potential coil 20, etc. In other words, each of the first electrode layer 78, the second electrode layer 79, and the wiring plug electrode 38 includes a barrier layer and a main body layer in the same way as the low potential coil 20, etc.

The first electrode layer 78 forms an upper end portion of the penetrating wiring 70. The second electrode layer 79 forms a lower end portion of the penetrating wiring 70. The first electrode layer 78 is formed in an island shape, and faces the low potential terminal 13 (first low potential terminal 13A) in the normal direction Z. The second electrode layer 79 is formed in an island shape, and faces the first electrode layer 78 in the normal direction Z.

The wiring plug electrodes 38 are buried in the interlayer insulating layers 57, respectively, placed in a region between the first electrode layer 78 and the second electrode layer 79. The wiring plug electrodes 38 are stacked from the undermost insulating layer 55 toward the uppermost insulating layer 56 so as to be electrically connected, and electrically connect the first electrode layer 78 and the second electrode layer 79. Each of the wiring plug electrodes 38 has a plane area less than the plane area of the first electrode layer 78 and less than the plane area of the second electrode layer 79.

The number of laminated layers of the wiring plug electrodes 38 coincides with the number of laminated layers of the interlayer insulating layers 57. The number of the wiring plug electrodes 38 buried in each of the interlayer insulating layers 57 is arbitrary although six wiring plug electrodes 38 are buried in each of the interlayer insulating layers 57 in this embodiment. Of course, a single or a plurality of wiring plug electrodes 38 that penetrates through the interlayer insulating layers 57 may be formed.

The low potential connection wiring 36 is formed in the first inner region 66 of the first transformer 15A (low potential coil 20) in the same interlayer insulating layer 57 as the low potential coil 20. The low potential connection wiring 36 is formed in an island shape, and faces the high potential terminal 14 (first high potential terminal 14A) in the normal direction Z. Preferably, the low potential connection wiring 36 has a plane area exceeding the plane area of the wiring plug electrode 38. The low potential connection wiring 36 is electrically connected to the first inner end 24 of the low potential coil 20.

The lead-out wiring 37 is formed in a region between the semiconductor chip 40 and the penetrating wiring 70 in the interlayer insulating layer 57. In this embodiment, the lead-out wiring 37 is formed in the interlayer insulating layer 57 that is a first layer in order from the undermost insulating layer 55. The lead-out wiring 37 includes a first end portion on one side, a second end portion on the other side, and a wiring portion connecting the first and second end portions. The first end portion of the lead-out wiring 37 is placed in a region between the semiconductor chip 40 and the lower end portion of the penetrating wiring 70. The second end portion of the lead-out wiring 37 is placed in a region between the semiconductor chip 40 and the low potential connection wiring 36. The wiring portion extends along the first principal surface 401 of the semiconductor chip 40, and extends in a belt shape in a region between the first and second end portions.

The first connection plug electrode 74 is formed in a region between the penetrating wiring 70 and the lead-out wiring 37 in the interlayer insulating layer 57, and is electrically connected to the penetrating wiring 70 and the first end portion of the lead-out wiring 37. The second connection plug electrode 75 is formed in a region between the low potential connection wiring 36 and the lead-out wiring 37 in the interlayer insulating layer 57, and is electrically connected to the low potential connection wiring 36 and the second end portion of the lead-out wiring 37.

The first low potential pad wiring 170 is formed on the insulating principal surface 54 of the first insulating portion 50. The first low potential pad wiring 170 is formed in an island shape on the first insulating portion 50 as shown in FIG. 21. The first low potential pad wiring 170 has its part connected to the penetrating wiring 70 through the penetrating hole 173, and has a peripheral edge portion that surrounds the penetrating hole 173 and that faces the first electrode layer 78 with the uppermost insulating layer 56 between the first electrode layer 78 and the peripheral edge portion in the normal direction Z. Additionally, the first low potential pad wiring 170 is formed in the second insulating portion 7 by being covered with the second insulating portion 7. Additionally, the first low potential pad wiring 170 may be referred to as a first low potential pad electrode layer because the first low potential pad wiring 170 is formed in an island shape.

The second low potential pad wiring 171 is formed on the insulating principal surface 701 of the second insulating portion 7. In other words, the second low potential pad wiring 171 is formed at the same layer as the high potential coil 23 in this embodiment. The second low potential pad wiring 171 may form the low potential terminal 13 mentioned above. The second low potential pad wiring 171 is connected to the first low potential pad wiring 170 through a penetrating hole 174 formed in the second insulating portion 7. The second low potential pad wiring 171 has a width wider than the first low potential pad wiring 170 as shown in FIG. 21. Additionally, the second low potential pad wiring 171 has a lead-out portion 175 that is led out from the penetrating hole 174 to a region not overlapping with the penetrating hole 174 as shown in FIG. 21. The second low potential pad wiring 171 is formed in the protective layer 8 by being covered with the protective layer 8.

The first low potential pad wiring 170 and the second low potential pad wiring 171 may be referred to collectively as a low potential wiring that is electrically connected to the low potential coil 20 and that extends so as to penetrate through the second insulating portion 7 in the thickness direction.

The second low potential wirings 35 are each electrically connected to corresponding low potential terminals 13E and 13F and to the first outer end 25 of the low potential coil 20 of corresponding transformers 15A to 15D as shown in FIG. 18. The second low potential wirings 35 each have the same structure as the first low potential wiring 30.

Referring to FIG. 19, the first high potential wirings 33 are each electrically connected to corresponding high potential terminals 14A to 14D and to the second inner end 27 of corresponding transformers 15A to 15D (high potential coil 23). The first high potential wirings 33 each have the same structure. The first high potential wiring 33 may form the high potential terminal 14 mentioned above. A structure of the first high potential wiring 33 connected to the first high potential terminal 14A and to the first transformer 15A will be hereinafter described as an example. A description of structures of other first high potential wirings 33 is omitted on the condition that a description of the structure of the first high potential wiring 33 connected to the first transformer 15A is correspondingly applied.

Preferably, the first high potential wiring 33 is made of the same conductive material as the high potential coil 23. In other words, preferably, the first high potential wirings 33 each include a barrier layer and a main body layer in the same way as the high potential coil 23, etc. The first high potential wiring 33 is formed in the second inner region 67 of the high potential coil 23 on the second insulating portion 7. The first high potential wiring 33 is formed in an island shape, and is electrically connected to the second inner end 27 of the high potential coil 23. The first high potential wiring 33 faces the low potential connection wiring 36 with the second insulating portion 7 and the interlayer insulating layers 57 between the first high potential wiring 33 and the low potential connection wiring 36 in the normal direction Z. Additionally, the first high potential wiring 33 may be referred to as a first high potential pad electrode layer because the first high potential wiring 33 is formed in an island shape.

The second high potential wirings 34 are each electrically connected to corresponding high potential terminals 14E and 14F and to the second outer ends 28 of corresponding transformers 15A to 15D (high potential coils 23). The second high potential wirings 34 each have the same structure. The second high potential wirings 34 may form the high potential terminal 14 mentioned above. A structure of the second high potential wiring 34 connected to the fifth high potential terminal 14E and to the first transformer 15A (second transformer 15B) will be hereinafter described as an example. A description of structures of other second high potential wirings 34 is omitted on the condition that a description of the structure of the second high potential wiring 34 connected to the first transformer 15A (second transformer 15B) is correspondingly applied.

The second high potential wiring 34 has the same structure as the first high potential wiring 33 except that the second high potential wirings 34 is electrically connected to the second outer end 28 of the first transformer 15A (high potential coil 23) and to the second outer end 28 of the second transformer 15B (high potential coil 23). In other words, the second high potential wiring 34 is formed in an island shape. The second high potential wiring 34 may be referred to as a second high potential pad electrode layer because the second high potential wiring 34 is formed in an island shape.

The second high potential wiring 34 is formed around the high potential coil 23 on the second insulating portion 7. The second high potential wiring 34 is formed in a region between two adjoining high potential coils 23 in a plan view, and faces the high potential terminal 14 (fifth high potential terminal 14E) in the normal direction Z. The second high potential wiring 34 faces the low potential connection wiring 36 with the second insulating portion 7 and the interlayer insulating layers 57 between the second high potential wiring 34 and the low potential connection wiring 36 in the normal direction Z.

Referring to FIG. 20, preferably, a distance D1 between the low potential terminal 13 and the high potential terminal 14 exceeds the distance D2 between the low potential coil 20 and the high potential coil 23 (D2<D1). Preferably, the distance D1 exceeds the sum of the total thickness TA1 of the first insulating portion 50 and the total thickness TA2 of the second insulating portion 7 (TA1+TA2<D1). The ratio D2/D1 of the distance D2 with respect to the distance D1 may be not less than 0.005 and not more than 0.5. Preferably, the distance D1 is not less than 100 μm and not more than 1000 μm. The distance D2 may be not less than 2 μm and not more than 120 μm. Preferably, the distance D2 is not less than 5 μm and not more than 50 μm. The value of the distance D1 and the value of the distance D2 are arbitrary, and are appropriately adjusted in accordance with a dielectric withstand voltage to be realized.

Referring to FIG. 19, FIG. 20 and FIG. 22 to FIG. 24, the semiconductor device A1 includes a dummy pattern 39 formed on the second insulating portion 7 so as to be placed around the transformers 15A to 15D in a plan view. In FIG. 22 to FIG. 24, the dummy pattern 39 is shown by hatching. The dummy pattern 39 includes a conductor. Preferably, the dummy pattern 39 is made of the same conductive material as the high potential coil 23. In other words, preferably, the dummy patterns 39 each include a barrier layer and a main body layer in the same way as the high potential coil 23, etc.

The dummy pattern 39 is formed with a pattern (discontinuous pattern) differing from that of the high potential coil 23 and that of the low potential coil 20, and is independent of the transformers 15A to 15D. In other words, the dummy pattern 39 does not function as the transformers 15A to 15D. The dummy pattern 39 shields an electric field between the low potential coil 20 and the high potential coil 23 in the transformers 15A to 15D, and is formed as a shield conductor layer that suppresses electric field concentration with respect to the high potential coil 23.

In this embodiment, the dummy pattern 39 is routed around in a dense-line manner so as to partially cover and partially expose a region around a single or a plurality of high potential coils 23 in a plan view. In this embodiment, the dummy pattern 39 is routed around by a line density equal to the line density of the high potential coil 23 per unit area. That the line density of the dummy pattern 39 is equal to the line density of the high potential coil 23 means that the line density of the dummy pattern 39 falls within the range of ±20% of the line density of the high potential coil 23.

Preferably, the dummy pattern 39 is formed in a region in proximity to the high potential coil 23 with respect to the low potential terminal 13 in a plan view. That the dummy pattern 39 is in proximity to the high potential coil 23 in a plan view means that the distance between the dummy pattern 39 and the high potential coil 23 is less than the distance between the dummy pattern 39 and the low potential terminal 13.

The position of the dummy pattern 39 in the normal direction Z is arbitrary, and is adjusted in accordance with the electric field strength to be relaxed. For example, the dummy pattern 39 may be placed in the first insulating portion 50, or may be placed on the second insulating portion 7. Preferably, the dummy pattern 39 is formed in a region in proximity to the high potential coil 23 with respect to the low potential coil 20 in the normal direction Z. That the dummy pattern 39 is in proximity to the high potential coil 23 in the normal direction Z means that the distance between the dummy pattern 39 and the high potential coil 23 is less than the distance between the dummy pattern 39 and the low potential coil 20 in the normal direction Z.

In this case, it is possible to appropriately suppress electric field concentration with respect to the high potential coil 23. It is possible to suppress electric field concentration with respect to the high potential coil 23 more excellently in proportion to a reduction in distance between the dummy pattern 39 and the high potential coil 23 in the normal direction Z. Preferably, the dummy pattern 39 is formed on the second insulating portion 7 that is the same as the high potential coil 23. In this case, it is possible to more appropriately suppress electric field concentration with respect to the high potential coil 23.

Preferably, the dummy pattern 39 is formed around the high potential coils 23 so as to be interposed in a region between the high potential coils 23 adjoining each other in a plan view. In this case, it is possible to suppress undesirable electric field concentration with respect to the high potential coils 23 while utilizing the region between the high potential coils 23 adjoining each other.

Preferably, the dummy pattern 39 is interposed in a region between the low potential terminal 13 and the high potential coil 23 in a plan view. In this case, it is possible to suppress undesirable electrical conduction, which is caused by the electric field concentration of the high potential coil 23, between the low potential terminal 13 and the high potential coil 23. Preferably, the dummy pattern 39 is interposed in a region between the low potential terminal 13 and the high potential terminal 14 in a plan view. In this case, it is possible to suppress undesirable electrical conduction, which is caused by the electric field concentration of the high potential coil 23, between the low potential terminal 13 and the high potential terminal 14.

In this embodiment, the dummy pattern 39 is formed along the high potential coils 23 in a plan view, and is interposed in a region between the high potential coils 23 adjoining each other. Additionally, the dummy pattern 39 entirely surrounds a region including the high potential coils 23 and the high potential terminals 14 in a plan view. Additionally, the dummy pattern 39 is interposed in a region between the low potential terminals 13A to 13F and the high potential coils 23 in a plan view. Additionally, the dummy pattern 39 is interposed in a region between the low potential terminals 13A to 13F and the high potential terminals 14A to 14F in a plan view.

The dummy pattern 39 includes a plurality of dummy patterns differing in electrical state from each other. The dummy pattern 39 includes a high potential dummy pattern 86. The high potential dummy pattern 86 is formed on the second insulating portion 7 so as to be placed around the transformers 15A to 15D in a plan view. The high potential dummy pattern 86 is formed with a pattern (discontinuous pattern) differing from the high potential coil 23 and from the low potential coil 20, and is independent of the transformers 15A to 15D. In other words, the high potential dummy pattern 86 does not function as the transformers 15A to 15D.

In this embodiment, the high potential dummy pattern 86 is routed around in a dense-line manner so as to partially cover and partially expose a region around the high potential coil 23 in a plan view. In this embodiment, the high potential dummy pattern 86 is routed around by a line density equal to the line density of the high potential coil 23 per unit area. That the line density of the high potential dummy pattern 86 is equal to the line density of the high potential coil 23 means that the line density of the high potential dummy pattern 86 falls within the range of ±20% of the line density of the high potential coil 23.

The high potential dummy pattern 86 shields an electric field between the low potential coil 20 and the high potential coil 23 in the transformers 15A to 15D, and suppresses electric field concentration with respect to the high potential coil 23. In detail, the high potential dummy pattern 86 shields the electric field between the low potential coil 20 and the high potential coil 23, and, as a result, keeps an electric field leaking out to the upper side of the high potential coil 23 away from the high potential coil 23. This makes it possible to suppress the electric field concentration of the high potential coil 23 caused by the electric field leaking out to the upper side of the high potential coil 23.

A voltage exceeding a voltage applied to the low potential coil 20 is applied to the high potential dummy pattern 86. This makes it possible to suppress a voltage drop between the high potential coil 23 and the high potential dummy pattern 86, hence making it possible to suppress electric field concentration with respect to the high potential coil 23. Preferably, a voltage applied to the high potential coil 23 is applied to the high potential dummy pattern 86. In other words, preferably, the high potential dummy pattern 86 is fixed to the same potential as the high potential coil 23. This makes it possible to reliably suppress a voltage drop between the high potential coil 23 and the high potential dummy pattern 86, hence making it possible to appropriately suppress electric field concentration with respect to the high potential coil 23.

The position of the high potential dummy pattern 86 in the normal direction Z is arbitrary, and is adjusted in accordance with an electric field strength to be relaxed. For example, the high potential dummy pattern 86 may be placed in the first insulating portion 50, or may be placed on the second insulating portion 7. Preferably, the high potential dummy pattern 86 is formed in a region in proximity to the high potential coil 23 with respect to the low potential coil 20 in the normal direction Z. That the high potential dummy pattern 86 is in proximity to the high potential coil 23 means that the distance between the high potential dummy pattern 86 and the high potential coil 23 is less than the distance between the high potential dummy pattern 86 and the low potential coil 20 in the normal direction Z.

In this case, it is possible to appropriately suppress electric field concentration with respect to the high potential coil 23. It is possible to suppress electric field concentration with respect to the high potential coil 23 more excellently in proportion to a reduction in distance between the high potential dummy pattern 86 and the high potential coil 23 in the normal direction Z. Preferably, the high potential dummy pattern 86 is formed on the second insulating portion 7 that is the same as the high potential coil 23. In this case, it is possible to more appropriately suppress electric field concentration with respect to the high potential coil 23.

Preferably, the high potential dummy pattern 86 is formed in a region in proximity to the high potential coil 23 with respect to the low potential terminal 13 in a plan view. That the high potential dummy pattern 86 is in proximity to the high potential coil 23 in a plan view means that the distance between the high potential dummy pattern 86 and the high potential coil 23 is less than the distance between the high potential dummy pattern 86 and the low potential terminal 13.

Preferably, the high potential dummy pattern 86 is formed around the high potential coils 23 so as to be interposed in a region between the high potential coils 23 adjoining each other in a plan view. In this case, it is possible to suppress undesirable electric field concentration with respect to the high potential coils 23 while utilizing the region between the high potential coils 23 adjoining each other.

Preferably, the high potential dummy pattern 86 is interposed in a region between the low potential terminal 13 and the high potential coil 23 in a plan view. In this case, it is possible to suppress undesirable electrical conduction, which is caused by the electric field concentration of the high potential coil 23, between the low potential terminal 13 and the high potential coil 23. Preferably, the high potential dummy pattern 86 is interposed in a region between the low potential terminal 13 and the high potential terminal 14 in a plan view. In this case, it is possible to suppress undesirable electrical conduction, which is caused by the electric field concentration of the high potential coil 23, between the low potential terminal 13 and the high potential terminal 14.

In this embodiment, the high potential dummy pattern 86 is formed along the high potential coils 23 in a plan view, and is interposed in a region between the high potential coils 23 adjoining each other. Additionally, the high potential dummy pattern 86 entirely surrounds a region including the high potential coils 23 and the high potential terminals 14 in a plan view. Additionally, the high potential dummy pattern 86 is interposed in a region between the low potential terminals 13A to 13F and the high potential coils 23 in a plan view. Additionally, the high potential dummy pattern 86 is interposed in a region between the low potential terminals 13A to 13F and the high potential terminals 14A to 14F in a plan view.

The high potential dummy pattern 86 is routed around the high potential terminals 14E and 14F so as to expose the high potential terminals 14E and 14F in a region between the high potential coils 23 adjoining each other in a plan view.

Preferably, the high potential dummy pattern 86 is formed in a shape with ends. In this case, it is possible to prevent a current loop circuit (closed circuit) of an electric current from being formed in the high potential dummy pattern 86. This makes it possible to suppress a noise caused by an electric current flowing through the high potential dummy pattern 86. As a result, it is possible to suppress undesirable electric field concentration caused by the noise, and, at the same time, it is possible to suppress a change in electrical characteristics of the transformers 15A to 15D.

In detail, the high potential dummy pattern 86 includes a first high potential dummy pattern 87 and a second high potential dummy pattern 88. The first high potential dummy pattern 87 is formed in a region between the transformers 15A to 15D (high potential coils 23) adjoining each other in a plan view. The second high potential dummy pattern 88 is formed in a region existing outside the region between the transformers 15A to 15D (high potential coils 23) adjoining each other in a plan view.

Hereinafter, a region between the first transformer 15A (high potential coil 23) and the second transformer 15B (high potential coil 23) both of which adjoin each other is referred to as a first region 89 (see FIG. 22). Additionally, a region between the second transformer 15B (high potential coil 23) and the third transformer 15C (high potential coil 23) both of which adjoin each other is referred to as a second region 90 (see FIG. 23). Additionally, a region between the third transformer 15C (high potential coil 23) and the fourth transformer 15D (high potential coil 23) both of which adjoin each other is referred to as a third region 91 (see FIG. 24).

In this embodiment, the first high potential dummy pattern 87 is electrically connected to the second high potential wiring 34 (fifth high potential terminal 14E) In detail, the first high potential dummy pattern 87 includes a first connection portion 92 connected to the second high potential wiring 34. The position of the first connection portion 92 is arbitrary. Hence, the first high potential dummy pattern 87 is fixed to the same potential as the high potential coils 23.

In detail, the first high potential dummy pattern 87 includes a first pattern 93 formed in the first region 89, a second pattern 94 formed in the second region 90, and a third pattern 95 formed in the third region 91. This makes it possible to suppress the electric field leaking out to the upper side of the high potential coil 23 and to suppress the electric field concentration with respect to the high potential coils 23 adjoining each other in the first region 89, the second region 90, and the third region 91.

In this embodiment, the first pattern 93, the second pattern 94, and the third pattern 95 are formed integrally with each other, and are fixed to the same potential. The first pattern 93, the second pattern 94, and the third pattern 95 may be divided from each other as long as these are fixed to the same potential.

Referring to FIG. 19 and FIG. 22, the first pattern 93 is connected to the second high potential wiring 34 through the first connection portion 92. The first pattern 93 is routed around in a dense-line manner so as to cover up a part of the first region 89 in a plan view. The first pattern 93 is formed in the first region 89 at a distance from the high potential terminal 14 (fifth high potential terminal 14E) in a plan view. Additionally, the first pattern 93 is formed at a distance from the low potential connection wiring 36 in a plan view, and does not face the low potential connection wiring 36 in the normal direction Z. Hence, the insulation distance between the first pattern 93 and the low potential connection wiring 36 is increased, and the dielectric withstand voltage of the first insulating portion 50 is raised.

The first pattern 93 includes a first outer periphery line 96, a second outer periphery line 97, and a plurality of first intermediate lines 98. The first outer periphery line 96 extends in a belt shape along a periphery of the high potential coil 23 of the first transformer 15A. In this embodiment, the first outer periphery line 96 is formed in a ring shape having an open end in the first region 89 in a plan view. The width of the open end of the first outer periphery line 96 is less than the width in the second direction Y of the high potential coil 23.

The width of the first outer periphery line 96 may be not less than 0.1 μm and not more than 10 μm. Preferably, the width of the first outer periphery line 96 is not less than 1 μm and not more than 5 μm. The width of the first outer periphery line 96 is defined by a width in a direction perpendicular to a direction in which the first outer periphery line 96 extends. Preferably, the width of the first outer periphery line 96 is equal to the width of the high potential coil 23. That the width of the first outer periphery line 96 is equal to the width of the high potential coil 23 means that the width of the first outer periphery line 96 falls within the range of ±20% of the width of the high potential coil 23.

A first pitch between the first outer periphery line 96 and the high potential coil 23 (first transformer 15A) may be not less than 0.1 μm and not more than 20 μm. Preferably, the first pitch is not less than 1 μm and not more than 10 μm. Preferably, the first pitch is equal to the second winding pitch of the high potential coil 23. That the first pitch is equal to the first winding pitch means that the first pitch falls within the range of ±20% of the first winding pitch.

The second outer periphery line 97 extends in a belt shape along a periphery of the high potential coil 23 of the second transformer 15B. In this embodiment, the second outer periphery line 97 is formed in a ring shape having an open end in the first region 89 in a plan view. The width of the open end of the second outer periphery line 97 is less than the width in the second direction Y of the high potential coil 23. The open end of the second outer periphery line 97 faces the open end of the first outer periphery line 96 along the first direction X.

The width of the second outer periphery line 97 may be not less than 0.1 μm and not more than 10 μm. Preferably, the width of the second outer periphery line 97 is not less than 1 μm and not more than 5 μm. The width of the second outer periphery line 97 is defined by the width in a direction perpendicular to a direction in which the second outer periphery line 97 extends. Preferably, the width of the second outer periphery line 97 is equal to the width of the high potential coil 23. That the width of the second outer periphery line 97 is equal to the width of the high potential coil 23 means that the width of the second outer periphery line 97 falls within the range of ±20% of the width of the high potential coil 23.

A second pitch between the second outer periphery line 97 and the high potential coil 23 (second transformer 15B) may be not less than 0.1 μm and not more than 20 μm. Preferably, the second pitch is not less than 1 μm and not more than 10 μm. Preferably, the second pitch is equal to the second winding pitch of the high potential coil 23. That the second pitch is equal to the second winding pitch means that the second pitch falls within the range of ±20% of the second winding pitch.

The first intermediate lines 98 extend in a belt shape in a region between the first outer periphery line 96 and the second outer periphery line 97 in the first region 89. The first intermediate lines 98 include at least one first connection line 99 (in this embodiment, one) that electrically connects the first outer periphery line 96 and the second outer periphery line 97.

Preferably, the first intermediate lines 98 include only one first connection line 99 from the viewpoint of preventing the formation of a current loop circuit. The position of the first connection line 99 is arbitrary. A slit 140 that interrupts the current loop circuit is formed in at least one among the first intermediate lines 98. The position of the slit 140 is appropriately adjusted by a design of the first intermediate lines 98.

Preferably, the first intermediate lines 98 are formed in a belt shape extending along a mutually-facing direction of the high potential coils 23. In this embodiment, the first intermediate lines 98 are each formed in a belt shape extending in the first direction X, and are formed at a distance from each other in the second direction Y. The first intermediate lines 98 are formed in a stripe shape extending in the first direction X as a whole in a plan view.

In detail, the first intermediate lines 98 include a plurality of first lead-out portions 141 and a plurality of second lead-out portions 142. The first lead-out portions 141 are led out in a stripe manner from the first outer periphery line 96 toward the second outer periphery line 97. Forward end portions of the first lead-out portions 141 are formed at a distance from the first outer periphery line 96 toward the second outer periphery line 97 side.

The second lead-out portions 142 are led out in a stripe manner from the second outer periphery line 97 toward the first outer periphery line 96. Forward end portions of the second lead-out portions 142 are formed at a distance from the second outer periphery line 97 toward the first outer periphery line 96 side. In this embodiment, the second lead-out portions 142 are formed at a distance alternately with the first lead-out portions 141 in the second direction Y in a manner of interposing the single first lead-out portion 141 between the second lead-out portions 142.

The second lead-out portions 142 may interpose the plural first lead-out portions 141 therebetween. Additionally, a group including the second lead-out portions 142 may be formed so as to adjoin a group including the first lead-out portions 141. The slit 140, the first lead-out portions 141, and the second lead-out portions 142 suppress the formation of a current loop circuit in the first pattern 93.

The width of the first intermediate line 98 in the second direction Y may be not less than 0.1 μm and not more than 10 μm. Preferably, the width of the first intermediate line 98 is not less than 1 μm and not more than 5 μm. Preferably, the width of the first intermediate line 98 is equal to the width of the high potential coil 23. That the width of the first intermediate line 98 is equal to the width of the high potential coil 23 means that the width of the first intermediate line 98 falls within the range of ±20% of the width of the high potential coil 23.

A third pitch of two first intermediate lines 98 adjoining each other may be not less than 0.1 μm and not more than 20 μm. Preferably, the third pitch is not less than 1 μm and not more than 10 μm. The third pitch is defined by the distance between the first intermediate lines 98 adjoining each other in the second direction Y. Preferably, the third pitches are equal to each other. That the third pitches are equal to each other means that the third pitch falls within the range of ±20% of the third pitch. Preferably, the third pitch is equal to the second winding pitch of the high potential coil 23. That the third pitch is equal to the second winding pitch means that the third pitch falls within the range of ±20% of the second winding pitch.

Referring to FIG. 19 and FIG. 23, the second pattern 94 is electrically connected to the second high potential wiring 34 (high potential terminal 14). In this embodiment, the second pattern 94 is electrically connected to the second high potential wiring 34 (fifth high potential terminal 14E) through the second outer periphery line 97 of the first pattern 93. The second pattern 94 is routed around in a dense-line manner so as to cover up the second region 90.

The second pattern 94 includes the second outer periphery line 97 mentioned above, a third outer periphery line 143, and a plurality of second intermediate lines 144. The third outer periphery line 143 extends in a belt shape along a periphery of the high potential coil 23 of the third transformer 15C. In this embodiment, the third outer periphery line 143 is formed in a ring shape having an open end in the third region 91 in a plan view. The width of the open end of the third outer periphery line 143 is less than the width in the second direction Y of the high potential coil 23 of the third transformer 15C.

The width of the third outer periphery line 143 may be not less than 0.1 μm and not more than 10 μm. Preferably, the width of the third outer periphery line 143 is not less than 1 μm and not more than 5 μm. The width of the third outer periphery line 143 is defined by the width in a direction perpendicular to a direction in which the third outer periphery line 143 extends. Preferably, the width of the third outer periphery line 143 is equal to the width of the high potential coil 23. That the width of the third outer periphery line 143 is equal to the width of the high potential coil 23 means that the width of the third outer periphery line 143 falls within the range of ±20% of the width of the high potential coil 23.

A fourth pitch between the third outer periphery line 143 and the high potential coil 23 (third transformer 15C) may be not less than 0.1 μm and not more than 20 μm. Preferably, the fourth pitch is not less than 1 μm and not more than 10 μm. Preferably, the fourth pitch is equal to the second winding pitch of the high potential coil 23. That the fourth pitch is equal to the second winding pitch means that the fourth pitch falls within the range of ±20% of the second winding pitch.

The second intermediate lines 144 extend in a belt shape in a region between the second outer periphery line 97 and the third outer periphery line 143 in the second region 90. The second intermediate lines 144 include at least one second connection line 145 (in this embodiment, one) that electrically connects the second outer periphery line 97 and the third outer periphery line 143.

Preferably, the second intermediate lines 144 include only one second connection line 145 from the viewpoint of preventing the formation of a current loop circuit. The second connection line 145 may have a width exceeding the width of each of other second intermediate lines 144. The position of the second connection line 145 is arbitrary. A slit 146 that interrupts a current loop circuit is formed in at least one among the second intermediate lines 144. The position of the slit 146 is appropriately adjusted by a design of the second intermediate lines 144.

Preferably, the second intermediate lines 144 are formed in a belt shape extending along the mutually-facing direction of the high potential coils 23. In this embodiment, the second intermediate lines 144 are each formed in a belt shape extending in the first direction X, and are formed at a distance from each other in the second direction Y. The second intermediate lines 144 are formed in a stripe shape extending in the first direction X as a whole in a plan view.

In detail, the second intermediate lines 144 include a plurality of third lead-out portions 147 and a plurality of fourth lead-out portions 148. The third lead-out portions 147 are led out in a stripe manner from the second outer periphery line 97 toward the third outer periphery line 143. Forward end portions of the third lead-out portions 147 are formed at a distance from the third outer periphery line 143 toward the second outer periphery line 97 side.

The fourth lead-out portions 148 are led out in a stripe manner from the third outer periphery line 143 toward the second outer periphery line 97. Forward end portions of the fourth lead-out portions 148 are formed at a distance from the second outer periphery line 97 toward the third outer periphery line 143 side. In this embodiment, the fourth lead-out portions 148 are formed at a distance alternately with the third lead-out portions 147 in the second direction Y in a manner of interposing the single third lead-out portion 147 between the fourth lead-out portions 148.

The fourth lead-out portions 148 may interpose the plural third lead-out portions 147 therebetween. Additionally, a group including the fourth lead-out portions 148 may be formed so as to adjoin a group including the third lead-out portions 147. The slit 146, the third lead-out portions 147, and the fourth lead-out portions 148 suppress the formation of a current loop circuit in the second pattern 94.

The width of the second intermediate line 144 in the second direction Y may be not less than 0.1 μm and not more than 10 μm. Preferably, the width of the second intermediate line 144 is not less than 1 μm and not more than 10 μm. Preferably, the width of the second intermediate line 144 is equal to the width of the high potential coil 23. That the width of the second intermediate line 144 is equal to the width of the high potential coil 23 means that the width of the second intermediate line 144 falls within the range of ±20% of the width of the high potential coil 23.

A fifth pitch of two second intermediate lines 144 adjoining each other may be not less than 0.1 μm and not more than 20 μm. Preferably, the fifth pitch is not less than 1 μm and not more than 10 μm. The fifth pitch is defined by the distance between the second intermediate lines 144 adjoining each other in the second direction Y. Preferably, the fifth pitches are equal to each other. That the fifth pitches are equal to each other means that the fifth pitch falls within the range of ±20% of the fifth pitch. Preferably, the fifth pitch is equal to the second winding pitch of the high potential coil 23. That the fifth pitch is equal to the second winding pitch means that the fifth pitch falls within the range of ±20% of the second winding pitch.

Referring to FIG. 19 and FIG. 24, the third pattern 95 is electrically connected to the second high potential wiring 34. In this embodiment, the third pattern 95 is electrically connected to the second high potential wiring 34 through the second pattern 94 and the first pattern 93. The third pattern 95 is routed around in a dense-line manner so as to cover up a region of a part of the third region 91. The third pattern 95 is formed in the third region 91 at a distance from the high potential terminal 14 (sixth high potential terminal 14F) in a plan view, and does not face the high potential terminal 14 in the normal direction Z.

The third pattern 95 is formed at a distance from the low potential connection wiring 36 in a plan view, and does not face the low potential connection wiring 36 in the normal direction Z. Hence, the insulation distance between the third pattern 95 and the low potential connection wiring 36 is increased in the normal direction Z, and the dielectric withstand voltage of the first insulating portion 50 is raised.

The third pattern 95 includes the third outer periphery line 143 mentioned above, a fourth outer periphery line 149, and a plurality of third intermediate lines 150. The fourth outer periphery line 149 extends in a belt shape along a periphery of the high potential coil 23 of the fourth transformer 15D. In this embodiment, the fourth outer periphery line 149 is formed in a ring shape having an open end in the third region 91 in a plan view. The width of the open end of the fourth outer periphery line 149 is less than the width in the second direction Y of the high potential coil 23 of the fourth transformer 15D. The open end of the fourth outer periphery line 149 faces the open end of the third outer periphery line 143 along the first direction X.

The width of the fourth outer periphery line 149 may be not less than 0.1 μm and not more than 10 μm. Preferably, the width of the fourth outer periphery line 149 is not less than 1 μm and not more than 5 μm. The width of the fourth outer periphery line 149 is defined by a width in a direction perpendicular to a direction in which the fourth outer periphery line 149 extends. Preferably, the width of the fourth outer periphery line 149 is equal to the width of the high potential coil 23. That the width of the fourth outer periphery line 149 is equal to the width of the high potential coil 23 means that the width of the fourth outer periphery line 149 falls within the range of ±20% of the width of the high potential coil 23.

A sixth pitch between the fourth outer periphery line 149 and the high potential coil 23 (fourth transformer 15D) may be not less than 0.1 μm and not more than 20 μm. Preferably, the sixth pitch is not less than 1 μm and not more than 10 μm. The sixth pitch denotes that it is equal to the second winding pitch of the high potential coil 23. That the sixth pitch is equal to the second winding pitch means that the sixth pitch falls within the range of ±20% of the second winding pitch.

The third intermediate lines 150 extend in a belt shape in a region between the third outer periphery line 143 and the fourth outer periphery line 149 in the third region 91. The third intermediate lines 150 include at least one third connection line 151 (in this embodiment, one) that electrically connects the third outer periphery line 143 and the fourth outer periphery line 149.

Preferably, the third intermediate lines 150 include only one third connection line 151 from the viewpoint of preventing the formation of a current loop circuit. The position of the third connection line 151 is arbitrary. A slit 152 that interrupts a current loop circuit is formed in at least one among the third intermediate lines 150. The position of the slit 152 is appropriately adjusted by a design of the third intermediate lines 150.

Preferably, the third intermediate lines 150 are formed in a belt shape extending along the mutually-facing direction of the high potential coils 23. In this embodiment, the third intermediate lines 150 are each formed in a belt shape extending in the first direction X, and are formed at a distance from each other in the second direction Y. The third intermediate lines 150 are formed in a stripe shape as a whole in a plan view.

In this embodiment, the third intermediate lines 150 include a plurality of fifth lead-out portions 153 and a plurality of sixth lead-out portions 154. The fifth lead-out portions 153 are led out in a stripe manner from the third outer periphery line 143 toward the fourth outer periphery line 149. Forward end portions of the fifth lead-out portions 153 are formed at a distance from the fourth outer periphery line 149 toward the third outer periphery line 143 side.

The sixth lead-out portions 154 are led out in a stripe manner from the fourth outer periphery line 149 toward the third outer periphery line 143. Forward end portions of the sixth lead-out portions 154 are formed at a distance from the third outer periphery line 143 toward the fourth outer periphery line 149 side. In this embodiment, the sixth lead-out portions 154 are formed at a distance alternately with the fifth lead-out portion 153 in the second direction Y in a manner of interposing the single fifth lead-out portion 153 between the sixth lead-out portions 154.

The sixth lead-out portions 154 may interpose the plural fifth lead-out portions 153 therebetween. Additionally, a group including the sixth lead-out portions 154 may be formed so as to adjoin a group including the fifth lead-out portions 153. The slit 152, the fifth lead-out portions 153, and the sixth lead-out portions 154 suppress the formation of a current loop circuit in the third pattern 95.

The width of the third intermediate line 150 in the second direction Y may be not less than 0.1 μm and not more than 10 μm. Preferably, the width of the third intermediate line 150 is not less than 1 μm and not more than 5 μm. Preferably, the width of the third intermediate line 150 is equal to the width of the high potential coil 23. That the width of the third intermediate line 150 is equal to the width of the high potential coil 23 means that the width of the third intermediate line 150 falls within the range of ±20% of the width of the high potential coil 23.

A seventh pitch of two third intermediate lines 150 adjoining each other may be not less than 0.1 μm and not more than 20 μm. Preferably, the seventh pitch is not less than 1 μm and not more than 10 μm. The seventh pitch is defined by the distance between the third intermediate lines 150 adjoining each other in the second direction Y. Preferably, the seventh pitches are equal to each other. That the seventh pitches are equal to each other means that the seventh pitch falls within the range of ±20% of the seventh pitch. Preferably, the seventh pitch is equal to the second winding pitch of the high potential coil 23. That the seventh pitch is equal to the second winding pitch means that the seventh pitch falls within the range of ±20% of the second winding pitch.

Referring to FIG. 19, FIG. 20 and FIG. 22 to FIG. 24, the second high potential dummy pattern 88 is electrically connected to the high potential terminal 14 through the first high potential dummy pattern 87 in this embodiment. In detail, the second high potential dummy pattern 88 includes a second connection portion 155 connected to the first high potential dummy pattern 87 (see FIG. 22). The position of the second connection portion 155 is arbitrary. Hence, the second high potential dummy pattern 88 is fixed to the same potential as the high potential coils 23.

The second high potential dummy pattern 88 suppresses the electric field leaking out to the upper side of the high potential coil 23 and suppresses the electric field concentration with respect to the high potential coils 23 in a region outside the first, second, and third regions 89, 90, and 91. In this embodiment, the second high potential dummy pattern 88 entirely surrounds a region including the high potential coils 23 and the high potential terminals 14A to 14F in a plan view. In this embodiment, the second high potential dummy pattern 88 is formed in an oval annular shape (elliptical annular shape) in a plan view.

Hence, the second high potential dummy pattern 88 is interposed in a region between the low potential terminals 13A to 13F and the high potential coils 23 in a plan view. Additionally, the second high potential dummy pattern 88 is interposed in a region between the low potential terminals 13A to 13F and the high potential terminals 14A to 14F in a plan view.

The second high potential dummy pattern 88 includes a plurality of (in this embodiment, six) high potential lines 156A, 156B, 156C, 156D, 156E, and 156F. The number of the high potential lines is adjusted in accordance with an electric field to be relaxed. The high potential lines 156A to 156F are formed in this order at a distance from each other in a direction away from the high potential coils 23.

The high potential lines 156A to 156F entirely surround the high potential coils 23 in a plan view. In detail, the high potential lines 156A to 156F entirely surround a region including the high potential coils 23 and the high potential terminals 14A to 14F in a plan view. In this embodiment, the high potential lines 156A to 156F are formed in an oval annular shape (elliptical annular shape) in a plan view.

The high potential lines 156A to 156F each include a slit 157 that interrupts a current loop circuit as shown in FIG. 22. The position of the slit 157 is appropriately adjusted by a design of the high potential lines 156A to 156F.

The width of each of the high potential lines 156A to 156F may be not less than 0.1 μm and not more than 10 μm. Preferably, the width of each of the high potential lines 156A to 156F is not less than 1 μm and not more than 5 μm. The width of each of the high potential lines 156A to 156F is defined by a width in a direction perpendicular to a direction in which the high potential lines 156A to 156F extend. Preferably, the width of each of the high potential lines 156A to 156F is equal to the width of the high potential coil 23. That the width of each of the high potential lines 156A to 156F is equal to the width of the high potential coil 23 means that the width of each of the high potential lines 156A to 156F falls within the range of ±20% of the width of the high potential coil 23.

An eighth pitch of two high potential lines 156A to 156F adjoining each other may be not less than 0.1 μm and not more than 20 μm. Preferably, the eighth pitch is not less than 1 μm and not more than 10 μm. Preferably, the eighth pitches are equal to each other. That the eighth pitches are equal to each other means that the eighth pitch falls within the range of ±20% of the eighth pitch.

A ninth pitch between the first and second high potential dummy patterns 87 and 88 adjoining each other may be not less than 0.1 μm and not more than 20 μm. Preferably, the ninth pitch is not less than 1 μm and not more than 10 μm. Preferably, the ninth pitch is equal to the second winding pitch of the high potential coil 23. That the ninth pitch is equal to the second winding pitch means that the ninth pitch falls within the range of ±20% of the second winding pitch. The number, the width, the pitch, etc., in the high potential lines 156A to 156F are arbitrary, and are adjusted in accordance with an electric field to be relaxed.

Referring to FIG. 19, FIG. 20, and FIG. 22 to FIG. 24, the dummy pattern 39 includes a floating dummy pattern 161 formed in an electrically floating state so as to be placed around the transformers 15A to 15D in a plan view. The floating dummy pattern 161 is formed with a pattern (discontinuous pattern) differing from the high potential coil 23 and the low potential coil 20, and is independent of the transformers 15A to 15D. In other words, the floating dummy pattern 161 does not function as the transformers 15A to 15D.

In this embodiment, the floating dummy pattern 161 is routed around in a dense-line manner so as to partially cover and partially expose a region around the high potential coil 23 in a plan view. The floating dummy pattern 161 may be formed in a shape with ends, or may be formed in an endless shape.

The floating dummy pattern 161 is routed around by a line density equal to the line density of the high potential coil 23 per unit area. That the line density of the floating dummy pattern 161 is equal to the line density of the high potential coil 23 means that the line density of the floating dummy pattern 161 falls within the range of ±20% of the line density of the high potential coil 23.

Additionally, the floating dummy pattern 161 is routed around by a line density equal to the line density of the high potential dummy pattern 86 per unit area. That the line density of the floating dummy pattern 161 is equal to the line density of the high potential dummy pattern 86 means that the line density of the floating dummy pattern 161 falls within the range of ±20% of the line density of the high potential dummy pattern 86.

The floating dummy pattern 161 shields an electric field between the low potential coil 20 and the high potential coil 23 in the transformers 15A to 15D, and suppresses electric field concentration with respect to the high potential coils 23. In detail, the floating dummy pattern 161 disperses an electric field leaking out to the upper side of the high potential coil 23 in a direction away from the high potential coil 23. This makes it possible to suppress the electric field concentration with respect to the high potential coil 23.

Additionally, the floating dummy pattern 161 disperses an electric field leaking out to the upper side of the high potential coil 23 around the high potential dummy pattern 86 in a direction away from the high potential coil 23 and from the high potential dummy pattern 86. This makes it possible to suppress the electric field concentration with respect to the high potential dummy pattern 86 and makes it possible to appropriately suppress the electric field concentration with respect to the high potential coil 23.

The position of the floating dummy pattern 161 in the normal direction Z is arbitrary, and is adjusted in accordance with an electric field strength to be relaxed. For example, the floating dummy pattern 161 may be placed in the first insulating portion 50, and may be placed on the second insulating portion 7. Preferably, the floating dummy pattern 161 is formed in a region in proximity to the high potential coil 23 with respect to the low potential coil 20 in the normal direction Z. That the floating dummy pattern 161 is in proximity to the high potential coil 23 in the normal direction Z means that the distance between the floating dummy pattern 161 and the high potential coil 23 is less than the distance between the floating dummy pattern 161 and the low potential coil 20 in the normal direction Z.

In this case, it is possible to appropriately suppress the electric field concentration with respect to the high potential coil 23. It is possible to suppress electric field concentration with respect to the high potential coil 23 more excellently in proportion to a reduction in distance between the floating dummy pattern 161 and the high potential coil 23 in the normal direction Z. Preferably, the floating dummy pattern 161 is formed on the second insulating portion 7 that is the same as the high potential coil 23. In this case, it is possible to more appropriately suppress electric field concentration with respect to the high potential coil 23.

Preferably, the floating dummy pattern 161 is interposed in a region between the low potential terminal 13 and the high potential coil 23 in a plan view. In this case, it is possible to suppress undesirable electrical conduction, which is caused by the electric field concentration of the high potential coil 23, between the low potential terminal 13 and the high potential coil 23. Preferably, the floating dummy pattern 161 is interposed in a region between the low potential terminal 13 and the high potential terminal 14 in a plan view. In this case, it is possible to suppress undesirable electrical conduction, which is caused by the electric field concentration of the high potential coil 23, between the low potential terminal 13 and the high potential terminal 14.

In this embodiment, the floating dummy pattern 161 is formed along the high potential coils 23 in a plan view. In detail, the floating dummy pattern 161 entirely surrounds a region including the high potential coils 23 and the high potential terminals 14 in a plan view. In this embodiment, the floating dummy pattern 161 entirely surrounds a region including the high potential coils 23 and the high potential terminals 14 with the high potential dummy pattern 86 (second high potential dummy pattern 88) between the floating dummy patterns 161 in a plan view.

Hence, the floating dummy pattern 161 is interposed in a region between the low potential terminals 13A to 13F and the high potential coils 23 in a plan view. Additionally, the floating dummy pattern 161 is interposed in a region between the low potential terminals 13A to 13F and the high potential terminals 14A to 14F in a plan view.

The number of the floating lines is arbitrary, and is adjusted in accordance with an electric field to be relaxed. In this embodiment, the floating dummy pattern 161 includes a plurality of (in this embodiment, six) floating lines 162A, 162B, 162C, 162D, 162E, and 162F. The floating lines 162A to 162F are formed in this order at a distance from each other in a direction away from the high potential coils 23.

The floating lines 162A to 162F entirely surround the high potential coils 23 in a plan view. In detail, the floating lines 162A to 162F entirely surround a region including the high potential coils 23 and the high potential terminals 14A to 14F with the high potential dummy pattern 86 between the floating lines 162A to 162F in a plan view. In this embodiment, the floating lines 162A to 162F are formed in an oval annular shape (elliptical annular shape) in a plan view.

The width of each of the floating lines 162A to 162F may be not less than 0.1 μm and not more than 10 μm. Preferably, the width of each of the floating lines 162A to 162F is not less than 1 μm and not more than 5 μm. The width of each of the floating lines 162A to 162F is defined by a width in a direction perpendicular to a direction in which the floating lines 162A to 162F extend.

A tenth pitch between two floating lines 162A to 162F adjoining each other may be not less than 0.1 μm and not more than 20 μm. Preferably, the tenth pitch is not less than 1 μm and not more than 10 μm. Preferably, the width of each of the floating lines 162A to 162F is equal to the width of the high potential coil 23. That the width of each of the floating lines 162A to 162F is equal to the width of the high potential coil 23 means that the width of each of the floating lines 162A to 162F falls within the range of ±20% of the width of the high potential coil 23.

An eleventh pitch between the floating dummy pattern 161 and the high potential dummy pattern 86 (second high potential dummy pattern 88) may be not less than 0.1 μm and not more than 20 μm. Preferably, the eleventh pitch is not less than 1 μm and not more than 10 μm. Preferably, the eleventh pitches are equal to each other. That the eleventh pitches are equal to each other means that the eleventh pitch falls within the range of ±20% of the eleventh pitch.

Preferably, the eleventh pitch is equal to the second winding pitch of the high potential coil 23. That the eleventh pitch between the floating lines 162A to 162F is equal to the second winding pitch means that the eleventh pitch falls within the range of ±20% of the second winding pitch. For clarity, an example in which the eleventh pitch exceeds the second winding pitch is shown in FIG. 22 to FIG. 24.

Preferably, a twelfth pitch between the floating dummy pattern 161 and the high potential dummy pattern 86 is equal to the second winding pitch. That the twelfth pitch is equal to the second winding pitch means that the twelfth pitch falls within the range of ±20% of the second winding pitch. The number, the width, the pitch, etc., in the floating lines 162A to 162F are adjusted in accordance with an electric field to be relaxed, and are not limited to specific values.

The dummy pattern 39 may include a low potential dummy pattern to which a voltage (for example, voltage applied to the low potential coil 20) less than a voltage applied to the high potential coil 23 is applied and a ground potential dummy pattern fixed to the ground potential besides the high potential dummy pattern 86 and the floating dummy pattern 161 (not shown). For example, the high potential dummy pattern 86 and the floating dummy pattern 161 may be replaced by the low potential dummy pattern and the ground potential dummy pattern, respectively.

Referring to FIG. 20, the semiconductor device A1 includes a second functional device 60 formed at the first principal surface 401 of the semiconductor chip 40 in a device region 17. The second functional device 60 is formed by utilizing a surface layer portion of the first principal surface 401 of the semiconductor chip 40 and/or a region on the first principal surface 401 of the semiconductor chip 40, and is covered by the first insulating portion 50 (undermost insulating layer 55). In FIG. 20, the second functional device 60 is simplified and shown by the broken line shown in the surface layer portion of the first principal surface 401.

The second functional device 60 is electrically connected to the low potential terminal 13 through a low potential wiring, and is electrically connected to the high potential terminal 14 through a high potential wiring. The second functional device 60 may include at least one among a passive device, a semiconductor rectifying device, and a semiconductor switching device. The second functional device 60 may include a circuit network in which two or more kinds of arbitrary devices among the passive device, the semiconductor rectifying device, and the semiconductor switching device are selectively combined. The circuit network may form a part or all of an integrated circuit.

The passive device may include a semiconductor passive device. The passive device may include either one or both of a resistor and a capacitor. The semiconductor rectifying device may include at least one among a pn junction diode, a PIN diode, a Zener diode, a Schottky barrier diode, and a fast-recovery diode. The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

Referring to FIG. 20, the semiconductor device A1 further includes a seal conductor 16 buried in the first insulating portion 50. The seal conductor 16 is buried in the first insulating portion 50 in the form of a wall at a distance from the insulating sidewalls 53A to 53D in a plan view, and demarcates the first insulating portion 50 into the device region 17 and an outer region 18. The seal conductor 16 suppresses penetration of moisture and penetration of cracks into the device region 17 from the outer region 18.

The device region 17 is a region including the first functional device 45 (transformers 15), the second functional device 60, the low potential terminals 13, the high potential terminals 14, the first low potential wiring 30, the second low potential wiring 35, the first high potential wiring 33, the second high potential wiring 34, and the dummy pattern 39. The outer region 18 is a region outside the device region 17.

The seal conductor 16 is electrically separated from the device region 17. In detail, the seal conductor 16 is electrically separated from the first functional device 45 (transformers 15), the second functional device 60, the low potential terminals 13, the high potential terminals 14, the first low potential wiring 30, the second low potential wiring 35, the first high potential wiring 33, the second high potential wiring 34, and the dummy pattern 39. In more detail, the seal conductor 16 is fixed in an electrically floating state. The seal conductor 16 does not form a current path connected to the device region 17.

The seal conductor 16 is formed in a belt shape along the insulating sidewalls 53 to 53D in a plan view. In this embodiment, the seal conductor 16 is formed in a quadrangular annular shape (in detail, rectangular annular shape) in a plan view. Hence, the seal conductor 16 demarcates the device region 17 having a quadrangular shape (in detail, rectangular shape) in a plan view. Additionally, the seal conductor 16 demarcates the outer region 18 having a quadrangular annular shape (in detail, rectangular annular shape) surrounding the device region 17 in a plan view.

In detail, the seal conductor 16 has an upper end portion on the insulating principal surface 54 side, a lower end portion on the semiconductor chip 40 side, and a wall portion extending in a wall shape between the upper end portion and the lower end portion. In this embodiment, the upper end portion of the seal conductor 16 is formed at a distance from the insulating principal surface 54 toward the semiconductor chip 40 side, and is placed in the first insulating portion 50. In this embodiment, the upper end portion of the seal conductor 16 is covered by the uppermost insulating layer 56. The upper end portion of the seal conductor 16 may be covered by the single or plural interlayer insulating layers 57. The upper end portion of the seal conductor 16 may be exposed from the uppermost insulating layer 56. The lower end portion of the seal conductor 16 is formed at a distance from the semiconductor chip 40 toward the upper end portion side.

As thus described, in this embodiment, the seal conductor 16 is buried in the first insulating portion 50 so as to be placed on the semiconductor chip 40 side with respect to the low potential terminals 13 and the high potential terminals 14. Additionally, in the first insulating portion 50, the seal conductor 16 faces the first functional device 45 (transformers 15), the first low potential wiring 30, the second low potential wiring 35, the first high potential wiring 33, the second high potential wiring 34, and the dummy pattern 39 in a direction parallel to the insulating principal surface 54. In the first insulating portion 50, the seal conductor 16 may face a part of the second functional device 60 in the direction parallel to the insulating principal surface 54.

The seal conductor 16 includes a plurality of seal plug conductors 19 and a single or a plurality of (in this embodiment, a plurality of) seal via conductors 65. The number of the seal via conductors 65 is arbitrary. The seal plug conductor 19, which is an uppermost one among the seal plug conductors 19, forms the upper end portion of the seal conductor 16. The seal via conductors 65 each form the lower end portion of the seal conductor 16. Preferably, the seal plug conductor 19 and the seal via conductor 65 are made of the same conductive material as the low potential coil 20. In other words, preferably, the seal plug conductor 19 and the seal via conductor 65 include a barrier layer and a main body layer in the same way as the low potential coil 20, etc.

The seal plug conductors 19 are buried in the interlayer insulating layers 57, respectively, and are each formed in a quadrangular annular shape (in detail, rectangular annular shape) surrounding the device region 17 in a plan view. The seal plug conductors 19 are stacked from the undermost insulating layer 55 toward the uppermost insulating layer 56 so as to be connected to each other. The number of laminated layers of the seal plug conductors 19 coincides with the number of laminated layers of the interlayer insulating layers 57. Of course, the single or the plural seal plug conductors 19 penetrating through the interlayer insulating layers 57 may be formed.

All of the seal plug conductors 19 are not required to be formed so as to be annular as long as one annular seal conductor 16 is formed by an aggregate of the seal plug conductors 19. For example, at least one of the seal plug conductors 19 may be formed in a shape with ends. Additionally, at least one of the seal plug conductors 19 may be divided into a plurality of belt shape parts with ends. However, preferably, the seal plug conductors 19 are formed in an endless shape (annular shape) in consideration of the risk of penetration of moisture and cracks into the device region 17.

The seal via conductors 65 are each formed in a region between the semiconductor chip 40 and the seal plug conductor 19 in the undermost insulating layer 55. The seal via conductors 65 are connected to the semiconductor chip 40 and are connected to the seal plug conductor 19. Hence, the seal conductor 16 may be fixed to the ground potential through the seal via conductor 65. The seal via conductors 65 have a plane area less than the plane area of the seal plug conductor 19. If the single seal via conductor 65 is formed, the single seal via conductor 65 may have a plane area equal to or larger than the plane area of the seal plug conductor 19.

The width of the seal conductor 16 may be not less than 0.1 μm and not more than 20 μm. Preferably, the width of the seal conductor 16 is not less than 1 μm and not more than 10 μm. The width of the seal conductor 16 is defined by a width in a direction perpendicular to a direction in which the seal conductor 16 extends.

Referring to FIG. 20, the protective layer 8 is formed on the insulating principal surface 701 of the second insulating portion 7 so as to cover the high potential coil 23, the low potential terminal 13, the high potential terminal 14, the dummy pattern 39, and the seal conductor 16. The protective layer 8 may be referred to as a passivation layer. The protective layer 8 protects the second insulating portion 7, the first insulating portion 50, and the semiconductor chip 40 from above the insulating principal surface 701. The protective layer 8 may be made of an organic insulating layer, and may include a photosensitive resin. The protective layer 8 may include at least one among polyimide, polyamide, and polybenzoxazole. In this embodiment, the protective layer 8 includes polyimide. The thickness of the protective layer 8 may be not less than 1 μm and not more than 100 μm.

Preferably, the thickness of the protective layer 8 is equal to or larger than the distance D2 between the low potential coil 20 and the high potential coil 23. In this case, preferably, the thickness of the protective layer 8 is not less than 5 μm and not more than 50 μm. With these structures, it is possible to suppress the thickening of the protective layer 8, and at the same time, it is possible to appropriately raise a dielectric withstand voltage on the high potential coil 23 by means of the protective layer 8.

The protective layer 8 has a plurality of low potential terminal openings 188 that respectively expose the low potential terminals 13. The low potential terminal 13 exposed from the low potential terminal opening 188 may be referred to as a low potential pad 191. A covering layer including at least one of palladium and nickel may be formed on a surface of the low potential pad 191. The low potential terminal opening 188 exposes the lead-out portion 175 of the second low potential pad wiring 171 as shown in FIG. 21. In other words, the low potential terminal opening 188 does not face the penetrating hole 174, and is formed at a position that deviates from the penetrating hole 174 in a plan view. This makes it possible to suppress a connection defect of the bonding wire 71 with respect to the low potential terminal 13. For example, when a conductive material of the second low potential pad wiring 171 is buried in the penetrating hole 174, there is a case in which an upper surface of the second low potential pad wiring 171 that has been buried is concaved at a position coinciding with the penetrating hole 174 depending on the size of the diameter of the penetrating hole 174. However, in this embodiment, the lead-out portion 175 is formed by leading out a part of the second low potential pad wiring 171 onto the flat insulating principal surface 701 of the second insulating portion 7, and this lead-out portion 175 is exposed from the low potential terminal opening 188. As a result, an exposed part of the second low potential pad wiring 171 from the low potential terminal opening 188 becomes flat, hence making it possible to excellently connect the bonding wire 71.

Additionally, the protective layer 8 has a plurality of high potential terminal openings 189 that respectively expose the high potential terminals 14. The high potential terminal 14 exposed from the high potential terminal opening 189 may be referred to as a high potential pad 192. A covering layer including at least one of palladium and nickel may be formed on a surface of the high potential pad 192.

Next, a part of a manufacturing process of the semiconductor device A1 will be described with reference to FIGS. 25A, 25B to FIGS. 32A, 32B. More specifically, among FIGS. 25A, 25B to FIGS. 32A, 32B, drawings in each of which "A" is added to the last digit of a drawing number show a manufacturing process of a region A of FIG. 20, whereas drawings in each of which "B" is added to the last digit of a drawing number show a manufacturing process of a region B of FIG. 20.

In the manufacturing process of the semiconductor device A1, the undermost insulating layer 55 is formed on the semiconductor chip 40 by, for example, a CVD method. Next, the interlayer insulating layer 57 is formed by repeatedly laminating the first and second insulating layers 58 and 59. In the formation step of the interlayer insulating layer 57, two mutually-different inorganic insulating layers 58 and 59 are formed by supplying a raw material gas for the first insulating layer 58 and a raw material gas for the second insulating layer 59 into a chamber of a CVD apparatus while alternately switching. Additionally, the low potential coil 20, the first low potential wiring 30, the second low potential wiring 35, and the seal conductor 16 are formed by selectively etching the insulating layers 55 and 57 and by burying a conductive material in a penetrating hole formed by etching between the formation step of the undermost insulating layer 55 and the formation step of the interlayer insulating layer 57 and after the formation step of each of the interlayer insulating layers 57.

Figure 25A:
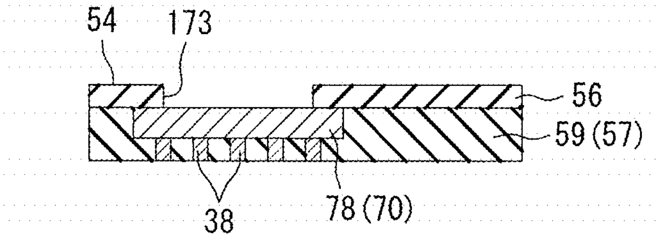
FIG. 25A is a view showing a part of a manufacturing process of the semiconductor device of FIG. 17.
Figure 25B:
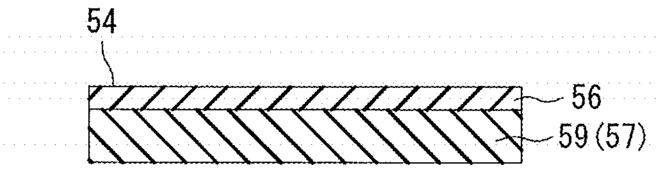
FIG. 25B is a view showing a part of the manufacturing process of the semiconductor device of FIG. 17.

After completing the formation of the top interlayer insulating layer 57, the uppermost insulating layer 56 is formed so as to cover the interlayer insulating layer 57 as shown in FIG. 25A and FIG. 25B. Next, the uppermost insulating layer 56 is selectively etched, and, as a result, the penetrating hole 173 that exposes the penetrating wiring 70 is formed.

Figure 26A:
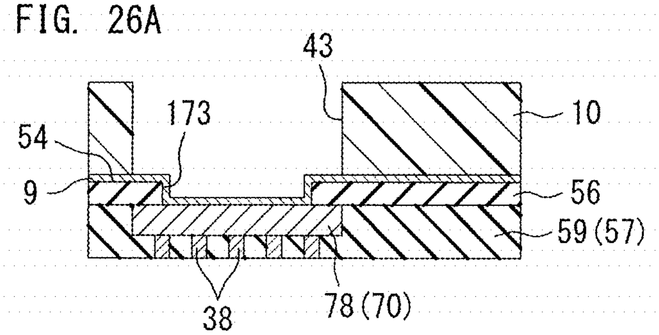
FIG. 26A is a view showing a step subsequent to the step of FIG. 25A.
Figure 26B:
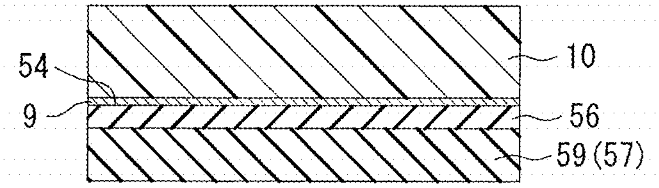
FIG. 26B is a view showing a step subsequent to the step of FIG. 25B.

Next, a seed layer 9 is formed on the uppermost insulating layer 56 by, for example, a sputtering method as shown in FIG. 26A and FIG. 26B. The seed layer 9 is a base conductive layer for the plating growth of the first low potential pad wiring 170, and is formed on an upper surface (insulating principal surface 54) of the uppermost insulating layer 56 and on the penetrating wiring 70 exposed to the penetrating hole 173. The seed layer 9 may be, for example, Cu/Ti, Cu/TiW, etc. The thickness of the seed layer 9 may be, for example, not less than 0.05 μm and not more than 2 μm. Next, a resist film 10 is formed on the seed layer 9. Next, an opening 43 that exposes a part, in which the first low potential pad wiring 170 is to be formed, of the seed layer 9 is formed by selectively exposing and developing the resist film 10.

Figure 27A:
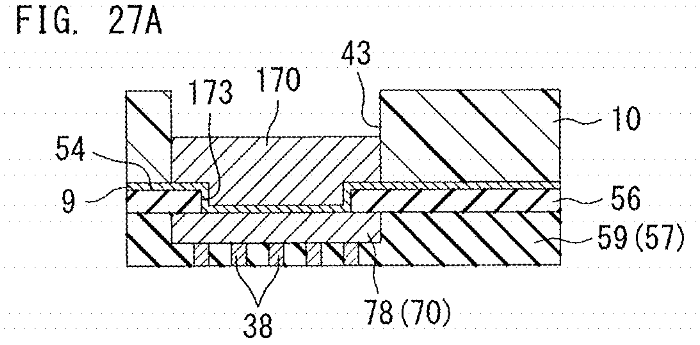
FIG. 27A is a view showing a step subsequent to the step of FIG. 26A.
Figure 27B:
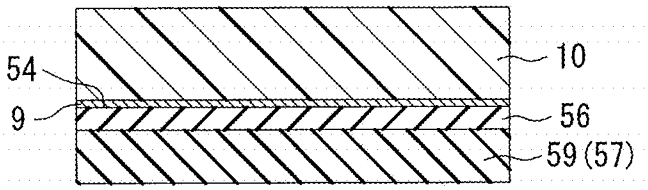
FIG. 27B is a view showing a step subsequent to the step of FIG. 26B.

Next, a conductive material for the first low potential pad wiring 170 is subjected to plating growth from the seed layer 9 exposed from the opening 43 as shown in FIG. 27A and FIG. 27B. In this embodiment, Cu is subjected to plating growth from the seed layer 9. Hence, the first low potential pad wiring 170 is formed in the opening 43.

Figure 28A:
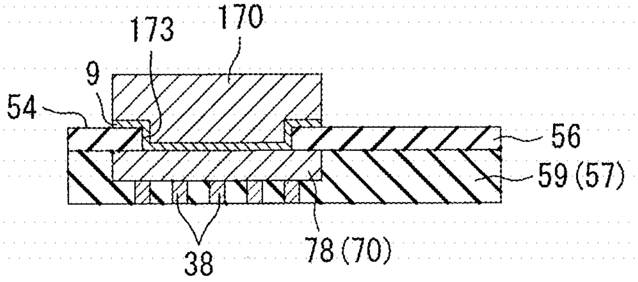
FIG. 28A is a view showing a step subsequent to the step of FIG. 27A.
Figure 28B:
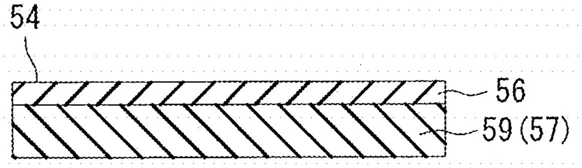
FIG. 28B is a view showing a step subsequent to the step of FIG. 27B.

Next, the resist film 10 is removed as shown in FIG. 28A and FIG. 28B. After removing the resist film 10, a part, which is covered with the resist film 10, of the seed layer 9 (part exposed from the first low potential pad wiring 170) is removed.

Figure 29A:
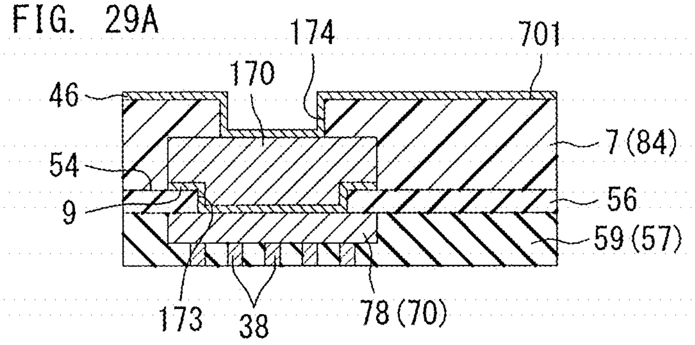
FIG. 29A is a view showing a step subsequent to the step of FIG. 28A.
Figure 29B:
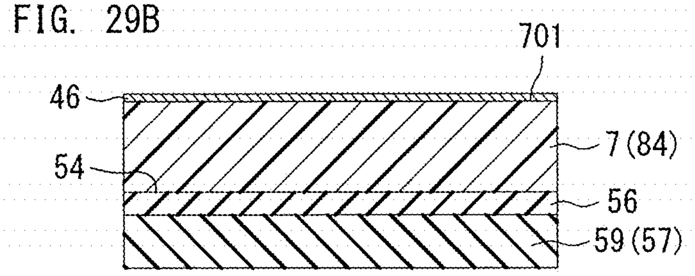
FIG. 29B is a view showing a step subsequent to the step of FIG. 28B.

Next, the second insulating portion 7 (organic insulating layer 84) is formed on the uppermost insulating layer 56 so as to cover the first low potential pad wiring 170 as shown in FIG. 29A and FIG. 29B. It is possible to apply a known formation method of a resin film to the formation of the second insulating portion 7. The second insulating portion 7 may be formed by, for example, a spin coating method. Next, the penetrating hole 174 that exposes the first low potential pad wiring 170 is formed by selectively removing the second insulating portion 7 according to, for example, a photolithography technique. Next, a seed layer 46 is formed on the second insulating portion 7 by, for example, the sputtering method. The seed layer 46 is a base conductive layer for the plating growth of the second low potential pad wiring 171 and the high potential coil 23, and is formed on the insulating principal surface 701 of the second insulating portion 7 and on the first low potential pad wiring 170 exposed to the penetrating hole 174. The seed layer 46 may be, for example, Cu/Ti, Cu/TiW, etc. The thickness of the seed layer 46 may be, for example, not less than 0.05 μm and not more than 2 μm.

Figure 30A:
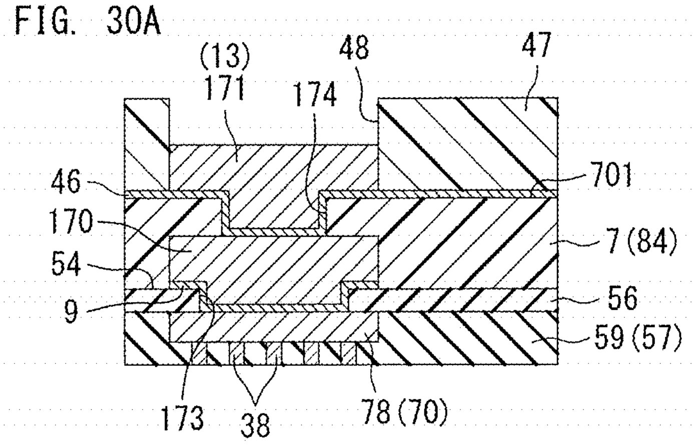
FIG. 30A is a view showing a step subsequent to the step of FIG. 29A.
Figure 30B:
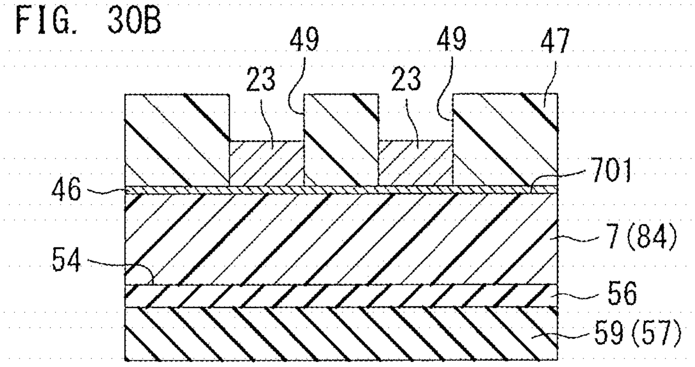
FIG. 30B is a view showing a step subsequent to the step of FIG. 29B.

Next, a resist film 47 is formed on the seed layer 46 as shown in FIG. 30A and FIG. 30B. Next, an opening 48 that exposes a part, in which the second low potential pad wiring 171 is to be formed, of the seed layer 46 and an opening 49 that exposes a part, in which the high potential coil 23 of the seed layer 46 is to be formed, of the seed layer 46 are formed by selectively exposing and developing the resist film 47. Next, a conductive material for the second low potential pad wiring 171 and for the high potential coil 23 is subjected to plating growth from the seed layer 46 exposed from the openings 48 and 49. In this embodiment, Cu is subjected to plating growth from the seed layer 46. Hence, the second low potential pad wiring 171 is formed in the opening 48, and the high potential coil 23 is formed in the opening 49.

The first high potential wiring 33, the second high potential wiring 34, and the dummy pattern 39 may be likewise formed in the same step as the second low potential pad wiring 171 and the high potential coil 23 (not shown in FIG. 30A and FIG. 30B).

Figure 31A:
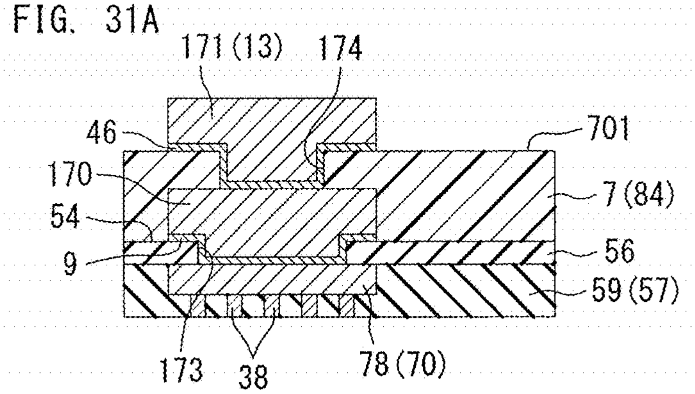
FIG. 31A is a view showing a step subsequent to the step of FIG. 30A.
Figure 31B:
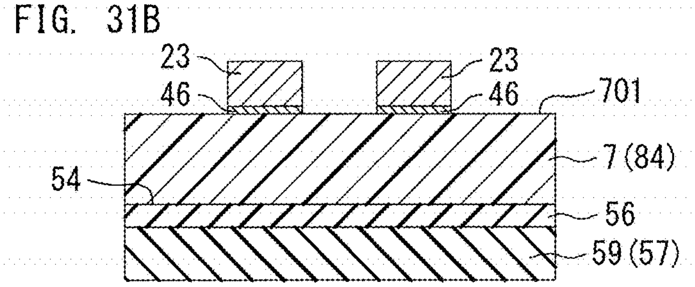
FIG. 31B is a view showing a step subsequent to the step of FIG. 30B.

Next, the resist film 47 is removed as shown in FIG. 31A and FIG. 31B. After removing the resist film 47, a part, which is covered with the resist film 47, of the seed layer 46 (part exposed from the second low potential pad wiring 171 and from the high potential coil 23) is removed.

Figure 32A:
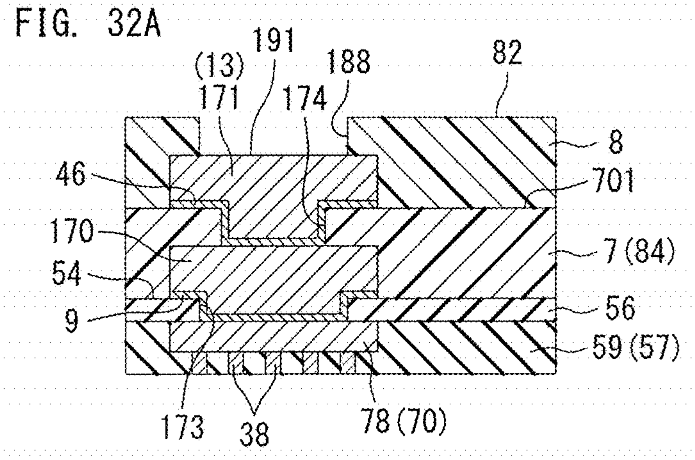
FIG. 32A is a view showing a step subsequent to the step of FIG. 31A.
Figure 32B:
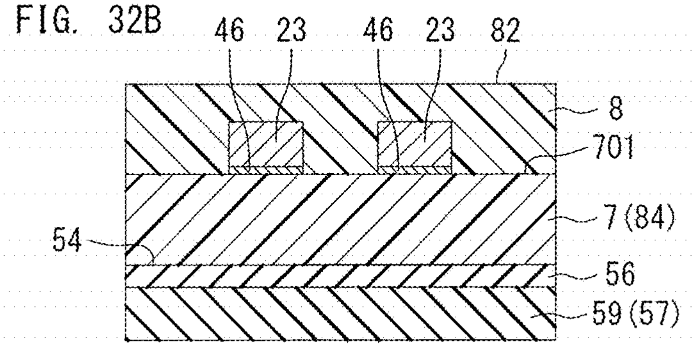
FIG. 32B is a view showing a step subsequent to the step of FIG. 31B.

Next, the protective layer 8 is formed on the insulating principal surface 701 of the second insulating portion 7 so as to cover the second low potential pad wiring 171 and the high potential coil 23 as shown in FIG. 32A and FIG. 32B. It is possible to apply a known formation method of a resin film to the formation of the protective layer 8. The protective layer 8 may be formed by, for example, the spin coating method. Next, the low potential terminal opening 188 that exposes a part of the second low potential pad wiring 171 as the low potential pad 191 is formed by selectively removing the protective layer 8 according to, for example, the photolithography technique. It is possible to manufacture the semiconductor device A1 through the above-mentioned steps.

As described above, with this semiconductor device A1, the second insulating portion 7 made of the organic insulating layer 84 is formed between the low potential coil 20 and the high potential coil 23 in addition to the first insulating portion 50 having a laminated structure consisting of the inorganic insulating layers 58 and 59. Therefore, it is possible to achieve a dielectric withstand voltage between the low potential coil 20 and the high potential coil 23 by means of the thickening of the second insulating portion 7. If the organic insulating layer 84 is used, it is possible to thicken the second insulating portion 7 with only one kind of organic insulating material (resin material) without forming a laminated structure consisting of several kinds of mutually-different insulating materials, such as the inorganic insulating layers 58 and 59. It is possible to easily achieve thickening by the spin coating method as shown in, for example, FIG. 29A and FIG. 29B. As a result, it is possible to make a lead time shorter and make costs lower than in a case in which the first insulating portion 50 is thickly formed.

In the description above, the seal conductor 16 is connected to the semiconductor chip 40 through the seal via conductor 65, and is fixed to the ground potential. On the other hand, the seal conductor 16 is not necessarily required to be fixed to the ground potential by excluding the seal via conductor 65 as shown in FIG. 33.

Figure 33:
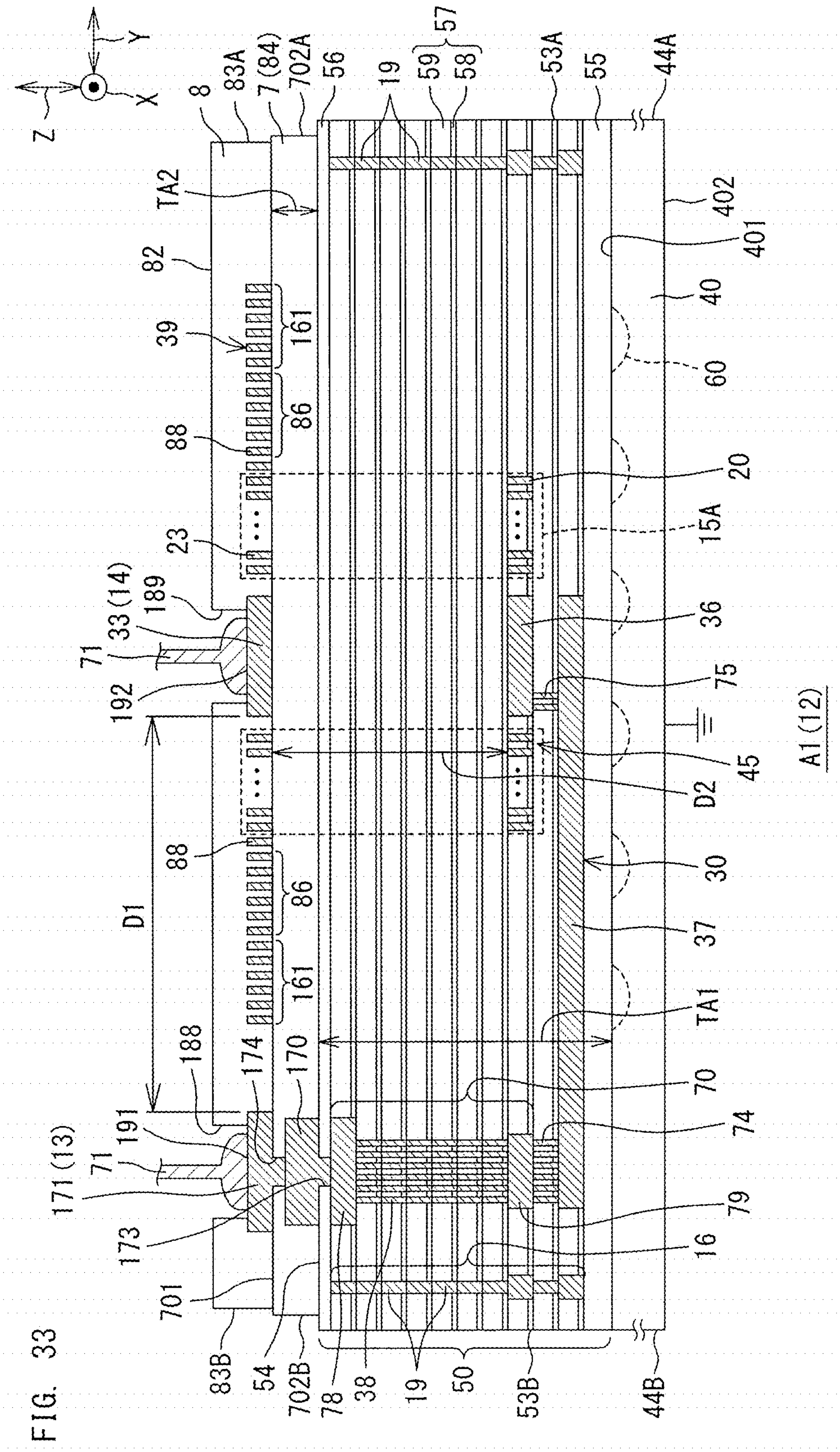
FIG. 33 is a schematic cross-sectional view of a semiconductor device according to one preferred embodiment of the present disclosure.

Additionally, an upper corner portion of the second insulating portion 7 formed by allowing the insulating principal surface 701 of the second insulating portion 7 and the insulating sidewalls 702A to 702D to intersect each other may have a certain angle as shown in FIG. 20 and FIG. 33 or may be formed in a round shape so as to be curved in a cross-sectional view. Additionally, the entirety of the insulating principal surface 701 may be formed in a curved surface shape that swells to the side opposite to the semiconductor chip 40.

Additionally, the second insulating portion 7 may have a laminated structure consisting of a plurality of organic insulating layers. In this case, the organic insulating layers may be made of mutually-identical organic insulating materials, or may be made of mutually-different organic insulating materials.

Second Preferred Embodiment

Figure 34:
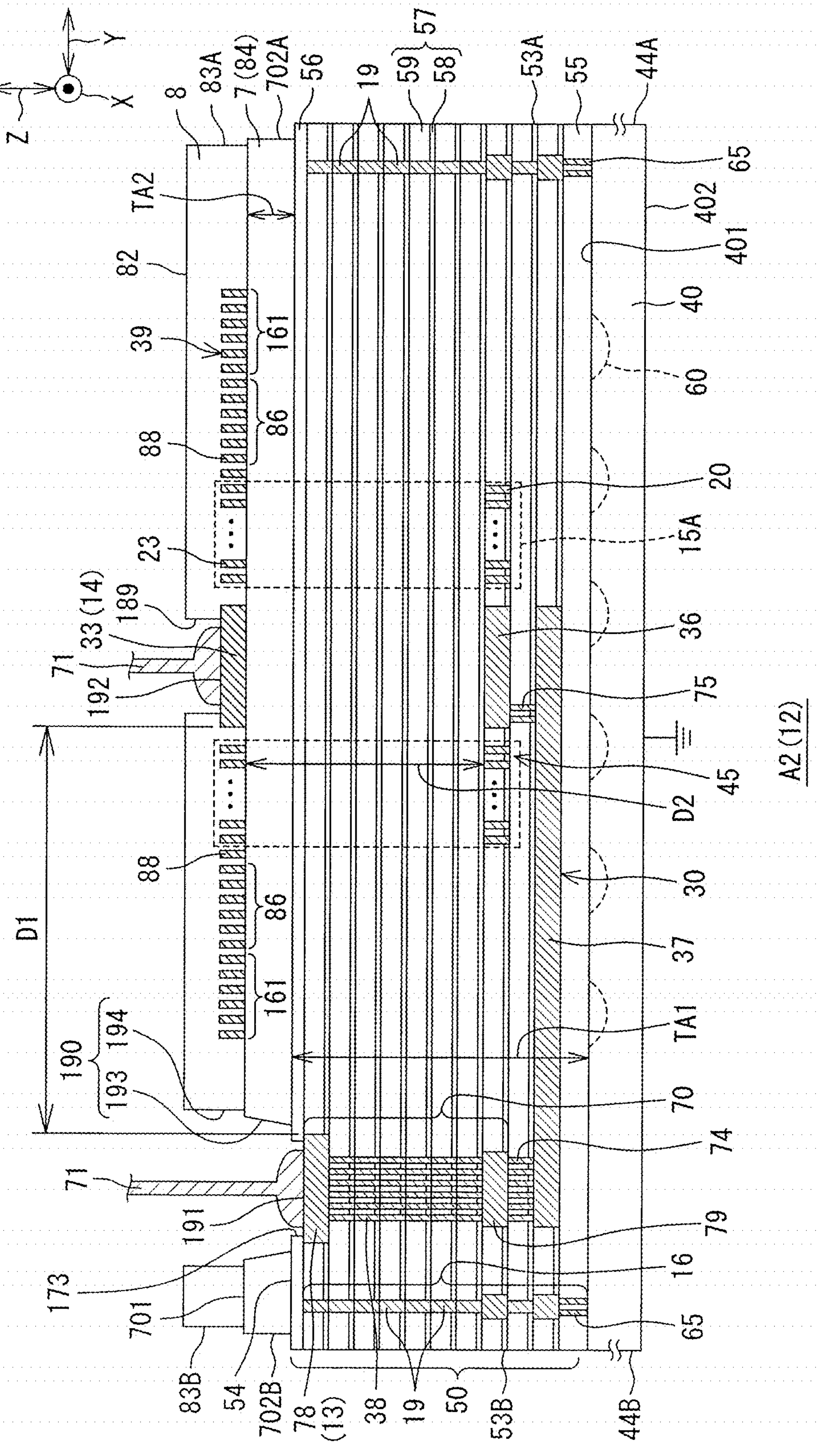
FIG. 34 is a schematic cross-sectional view of a semiconductor device according to one preferred embodiment of the present disclosure.

FIG. 34 is a schematic cross-sectional view of a semiconductor device A2 according to a preferred embodiment of the present disclosure. The same reference sign is hereinafter assigned to a constituent equivalent to the constituent mentioned with respect to the aforementioned semiconductor device A1, and a description of this constituent is omitted.

In the semiconductor device A2, a part of the first low potential wiring 30 functions as the low potential terminal 13 of the semiconductor device A2. More specifically, the penetrating wiring 70 (first electrode layer 78) is exposed as the low potential pad 191. A low potential terminal opening 190 that exposes the low potential pad 191 is formed so as to penetrate through the protective layer 8 and through the second insulating portion 7. The low potential terminal opening 190 may include a first portion 193 formed at the second insulating portion 7 and a second portion 194 formed at the protective layer 8. The second portion 194 is formed with a width larger than the first portion 193. Hence, a level difference is formed between the first portion 193 and the second portion 194. Additionally, the first portion 193 may be formed in a tapered shape in a cross-sectional view whose width becomes smaller in proportion to an approach to the low potential pad 191. On the other hand, the second portion 194 may have a substantially constant width toward the low potential pad 191.

Additionally, the first portion 193 of the low potential terminal opening 190 is formed with a width larger than the penetrating hole 173 of the uppermost insulating layer 56. Hence, a level difference may be formed between the first portion 193 of the low potential terminal opening 190 and the penetrating hole 173.

As described above, with this semiconductor device A2, the second insulating portion 7 made of the organic insulating layer 84 is formed between the low potential coil 20 and the high potential coil 23 in addition to the first insulating portion 50 having a laminated structure consisting of the inorganic insulating layers 58 and 59 in the same way as the semiconductor device A1. Therefore, it is possible to achieve a dielectric withstand voltage between the low potential coil 20 and the high potential coil 23 by means of the thickening of the second insulating portion 7. As a result, it is possible to make a lead time shorter and make costs lower than in a case in which the first insulating portion 50 is thickly formed.

Additionally, the first low potential pad wiring 170 and the second low potential pad wiring 171 are not formed, and the bonding wire 71 is directly connected to the first low potential wiring 30. Therefore, it is possible to exclude the formation step of the first low potential pad wiring 170 and the second low potential pad wiring 171 (FIG. 26A, 26B to FIG. 31A, 31B), hence making it possible to further shorten the lead time.

Figure 35:
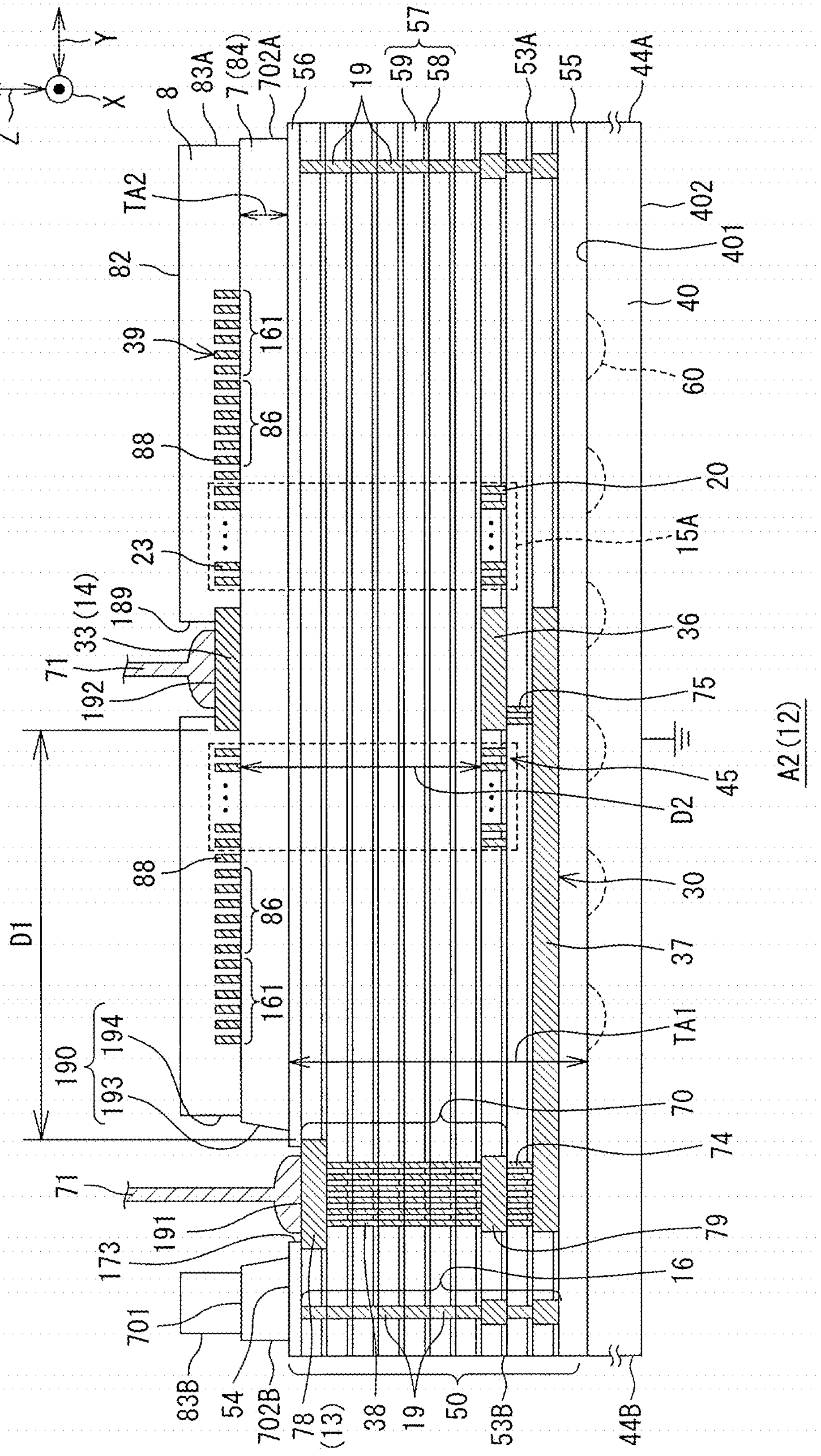
FIG. 35 is a schematic cross-sectional view of a semiconductor device according to one preferred embodiment of the present disclosure.

In the description above, the seal conductor 16 is connected to the semiconductor chip 40 through the seal via conductor 65, and is fixed to the ground potential. On the other hand, the seal conductor 16 is not necessarily required to be fixed to the ground potential by excluding the seal via conductor 65 as shown in FIG. 35.

Third Preferred Embodiment

Figure 36:
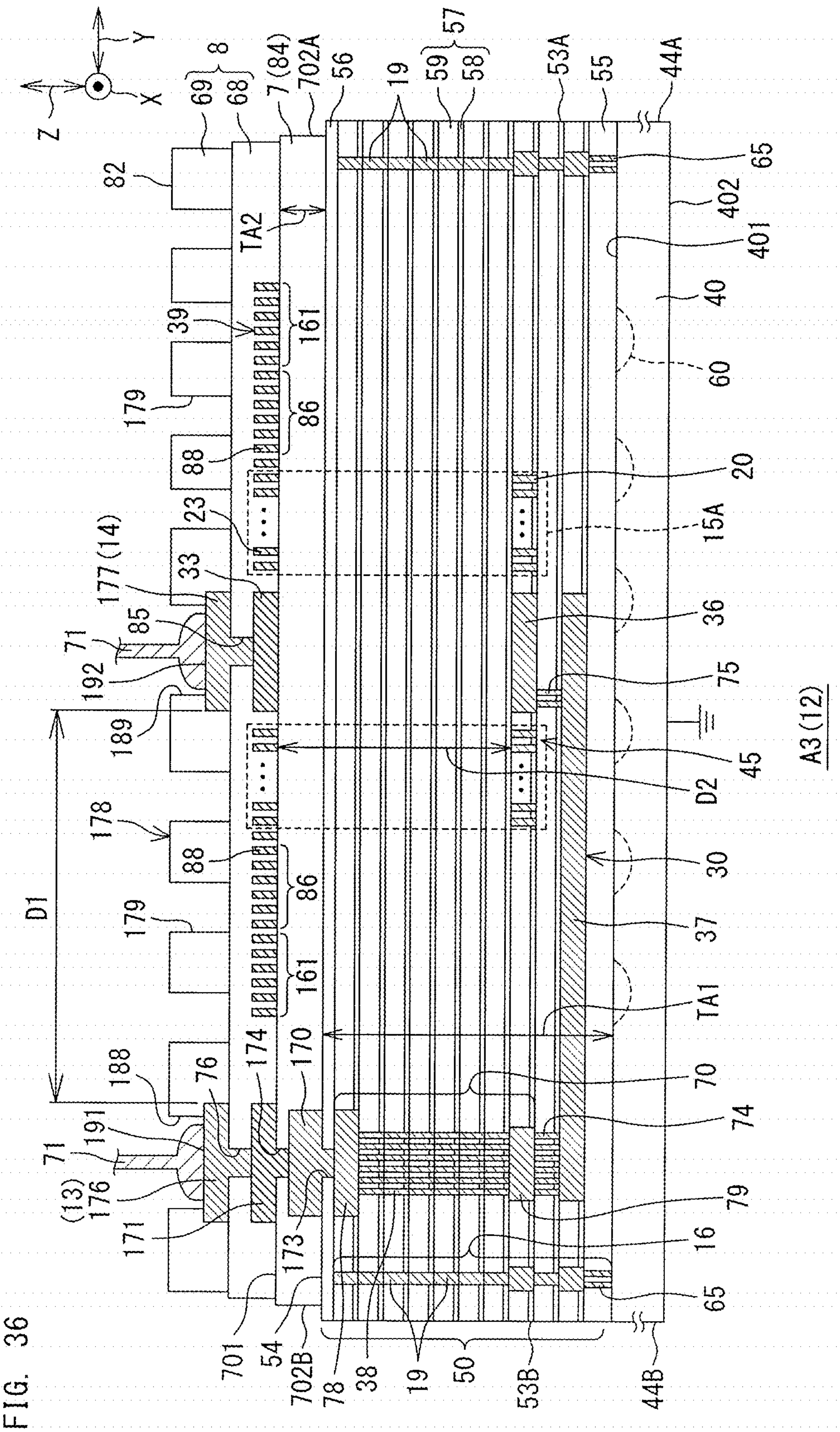
FIG. 36 is a schematic cross-sectional view of a semiconductor device according to one preferred embodiment of the present disclosure.

FIG. 36 is a schematic cross-sectional view of a semiconductor device A3 according to a preferred embodiment of the present disclosure. The same reference sign is hereinafter assigned to a constituent equivalent to the constituent mentioned with respect to the aforementioned semiconductor device A1, and a description of this constituent is omitted.

In the semiconductor device A3, the protective layer 8 includes a first protective layer 68 and a second protective layer 69. The protective layer 68 is formed on the insulating principal surface 701 of the second insulating portion 7 so as to cover the high potential coil 23, the second low potential pad wiring 171, the first high potential wiring 33, the dummy pattern 39, and the seal conductor 16. The second protective layer 69 is laminated on the first protective layer 68.

The first protective layer 68 and the second protective layer 69 may be made of mutually-identical organic insulating layers, or may be made of mutually-different kinds of organic insulating layers. For example, the first protective layer 68 may include at least one among polyimide, polyamide, and polybenzoxazole, and the second protective layer 69 may be made of the same organic insulating material as the first protective layer 68 or may be made of an organic insulating material differing in kind from the first protective layer 68 among the organic insulating materials mentioned above.

Additionally, the thickness of the first protective layer 68 and the thickness of the second protective layer 69 may be equal to each other, or may be different from each other. Preferably, the thickness of the second protective layer 69 is larger than the thickness of the first protective layer 68 in this embodiment. It is possible to deepen a concave portion 179 described later by thickening the second protective layer 69, hence making it possible to further increase a creepage distance between the high potential terminal 14 and the low potential terminal 13. For example, the thickness of the first protective layer 68 may be not less than 1 μm and not more than 100 μm, and the thickness of the second protective layer 69 may be not less than 1 μm and not more than 100 μm.

A third low potential pad wiring 176 and a high potential pad wiring 177 are formed at the principal surface of the first protective layer 68. Preferably, the third low potential pad wiring 176 and the high potential pad wiring 177 are each made of the same conductive material as the high potential coil 23. In other words, preferably, the third low potential pad wiring 176 and the high potential pad wiring 177 each include a barrier layer and a main body layer in the same way as the high potential coil 23, etc.

The third low potential pad wiring 176 is formed at the principal surface of the first protective layer 68. In other words, in this embodiment, the third low potential pad wiring 176 is formed at a layer higher than the high potential coil 23. Additionally, the third low potential pad wiring 176 is formed in the second protective layer 69 by being covered with the second protective layer 69. The third low potential pad wiring 176 may form the low potential terminal 13 mentioned above. The third low potential pad wiring 176 is connected to the second low potential pad wiring 171 through a penetrating hole 76 formed in the first protective layer 68.

The high potential pad wiring 177 is formed at the principal surface of the first protective layer 68. In other words, in this embodiment, the high potential pad wiring 177 is formed at a layer higher than the high potential coil 23. Additionally, the high potential pad wiring 177 is formed in the second protective layer 69 by being covered with the second protective layer 69. The high potential pad wiring 177 may form the high potential terminal 14 mentioned above. The high potential pad wiring 177 is connected to the first high potential wiring 33 through a penetrating hole 85 formed in the first protective layer 68.

The third low potential pad wiring 176 and the high potential pad wiring 177 may be each formed in an island shape, and may each have a lead-out portion (not shown)

that is led out from the penetrating holes 76 and 85 to a region not coinciding with the penetrating holes 76 and 85 in the same way as the second low potential pad wiring 171 shown in FIG. 21.

The protective layer 8 has the low potential terminal openings 188 that respectively expose the third low potential pad wirings 176 (low potential terminals 13). The low potential terminal 13 exposed from the low potential terminal opening 188 may be referred to as the low potential pad 191.

Additionally, the protective layer 8 has the high potential terminal openings 189 that respectively expose the high potential pad wirings 177 (high potential terminals 14). The high potential terminal 14 exposed from the high potential terminal opening 189 may be referred to as the high potential pad 192.

Additionally, the protective layer 8 has an uneven structure 178 in a region between the low potential terminal opening 188 and the high potential terminal opening 189. The uneven structure 178 includes a plurality of concave portions 179 hollowed toward the second insulating portion 7 from the protective principal surface 82 of the protective layer 8. The uneven structure 178 increases a creepage distance along the protective principal surface 82 of the protective layer 8. Therefore, the uneven structure 178 suppresses the occurrence of a creeping discharge along the protective principal surface 82 of the protective layer 8. In this embodiment, the concave portions 179 penetrates through the second protective layer 69 and expose the principal surface of the first protective layer 68, and have a side surface formed with the second protective layer 69 from its upper end to its lower end and a bottom surface formed with the first protective layer 68. On the other hand, the concave portions 179 penetrates through the second protective layer 69, and its bottom portion may reach a position between both ends in the thickness direction of the first protective layer 68. In this case, the side surface of the concave portions 179 may have an upper portion that is formed with the second protective layer 69 and a lower portion that is formed with the first protective layer 68. Additionally, the uneven structure 178 may be formed so as to surround the high potential coil 23 in a plan view (not shown).

As described above, with this semiconductor device A3, the second insulating portion 7 made of the organic insulating layer 84 is formed between the low potential coil 20 and the high potential coil 23 in addition to the first insulating portion 50 having a laminated structure consisting of the inorganic insulating layers 58 and 59 in the same way as the semiconductor device A1. Therefore, it is possible to achieve a dielectric withstand voltage between the low potential coil 20 and the high potential coil 23 by means of the thickening of the second insulating portion 7. As a result, it is possible to make a lead time shorter and make costs lower than in a case in which the first insulating portion 50 is thickly formed.

Additionally, the uneven structure 178 is formed in the protective layer 8. This makes it possible to increase the creepage distance along the protective principal surface 82 of the protective layer 8 between the high potential terminal 14 and the low potential terminal 13, and makes it possible to increase the insulation distance between the high potential terminal 14 and the low potential terminal 13. Therefore, it is possible to suppress the occurrence of a creeping discharge in a region between the high potential terminal 14 and the low potential terminal 13, hence making it possible to suppress the breakage or the deterioration of the protective layer 8 between the high potential terminal 14 and the low potential terminal 13. As a result, it is possible to suppress a short circuit between the high potential terminal 14 and the low potential terminal 13, hence making it possible to suppress an additional breakage or an additional deterioration of the protective layer 8 caused by the short circuit.

Figure 37:
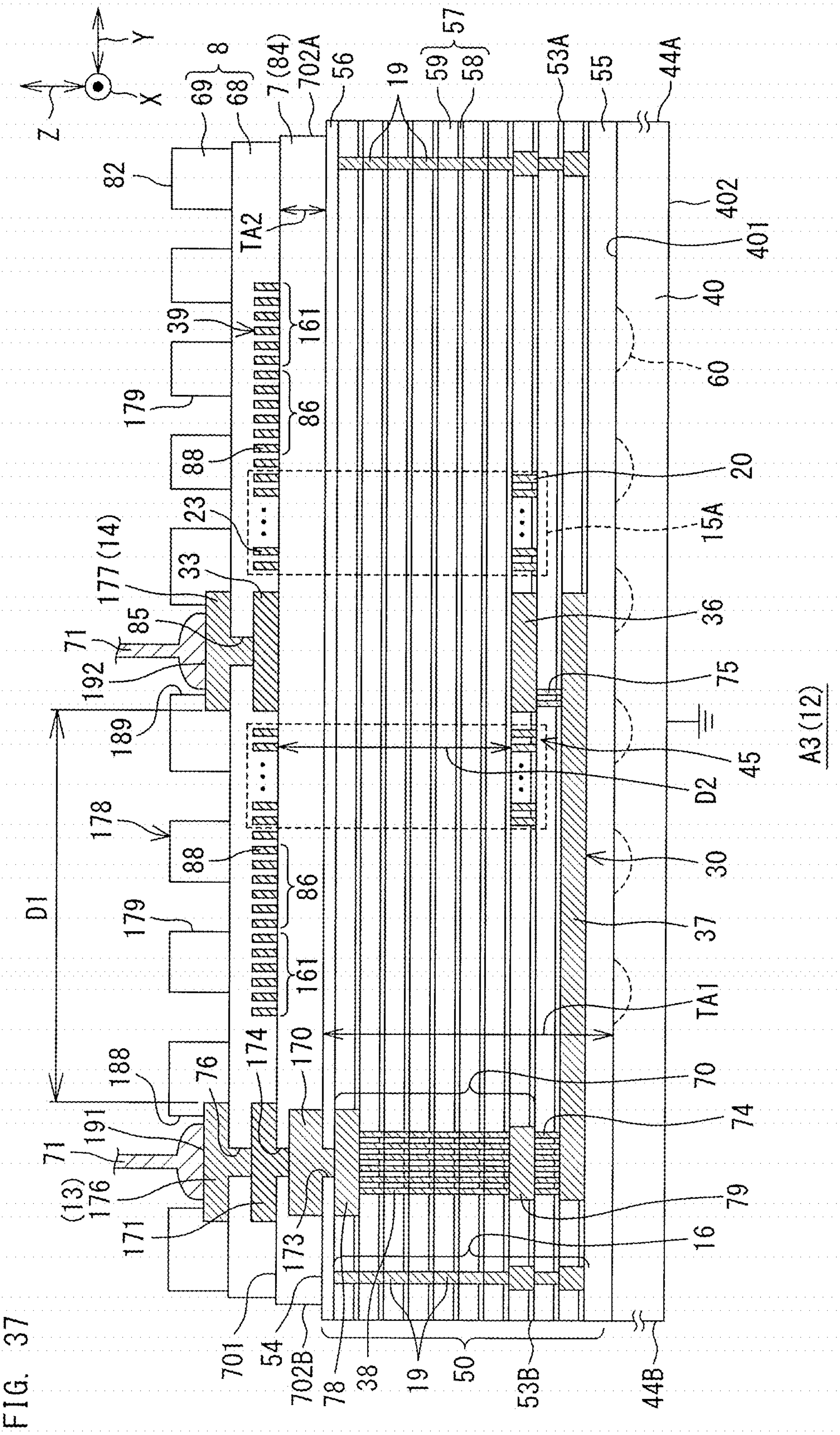
FIG. 37 is a schematic cross-sectional view of a semiconductor device according to one preferred embodiment of the present disclosure.

In the description above, the seal conductor 16 is connected to the semiconductor chip 40 through the seal via conductor 65, and is fixed to the ground potential. On the other hand, the seal conductor 16 is not necessarily required to be fixed to the ground potential by excluding the seal via conductor 65 as shown in FIG. 37.

Fourth Preferred Embodiment

Figure 38:
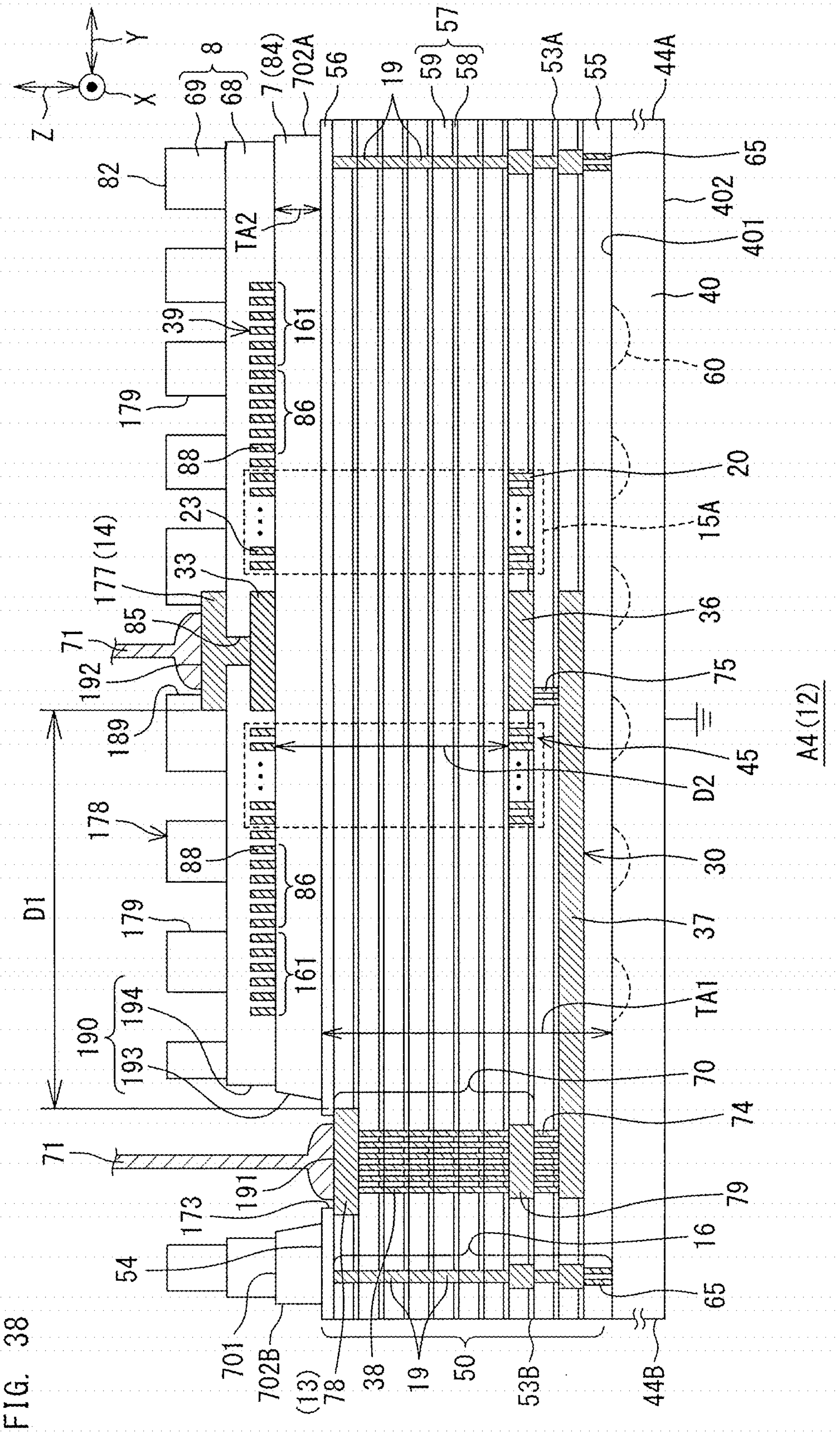
FIG. 38 is a schematic cross-sectional view of a semiconductor device according to one preferred embodiment of the present disclosure.

FIG. 38 is a schematic cross-sectional view of a semiconductor device A4 according to a preferred embodiment of the present disclosure. The same reference sign is hereinafter assigned to a constituent equivalent to the constituent mentioned with respect to the aforementioned semiconductor devices A2 and A3, and a description of this constituent is omitted.

In the semiconductor device A4, the protective layer 8 of the semiconductor device A2 includes the first protective layer 68 and the second protective layer 69 in the same way as the aforementioned semiconductor device A3. Additionally, the protective layer 8 has the uneven structure 178 in a region between the low potential terminal opening 190 and the high potential terminal opening 189.

As described above, with this semiconductor device A4, the second insulating portion 7 made of the organic insulating layer 84 is formed between the low potential coil 20 and the high potential coil 23 in addition to the first insulating portion 50 having a laminated structure consisting of the inorganic insulating layers 58 and 59 in the same way as the semiconductor device A1. Therefore, it is possible to achieve a dielectric withstand voltage between the low potential coil 20 and the high potential coil 23 by means of the thickening of the second insulating portion 7. As a result, it is possible to make a lead time shorter and make costs lower than in a case in which the first insulating portion 50 is thickly formed.

Additionally, the first low potential pad wiring 170 and the second low potential pad wiring 171 are not formed, and the bonding wire 71 is directly connected to the first low potential wiring 30. Therefore, it is possible to exclude the formation step of the first low potential pad wiring 170 and the second low potential pad wiring 171 (FIG. 26A, 26B to FIG. 31A, 31B), hence making it possible to further shorten the lead time.

Additionally, the uneven structure 178 is formed in the protective layer 8. This makes it possible to increase the creepage distance along the protective principal surface 82 of the protective layer 8 between the high potential terminal 14 and the low potential terminal 13, and makes it possible to increase the insulation distance between the high potential terminal 14 and the low potential terminal 13. Therefore, it is possible to suppress the occurrence of a creeping discharge in a region between the high potential terminal 14 and the low potential terminal 13, hence making it possible to suppress the breakage or the deterioration of the protective layer 8 between the high potential terminal 14 and the low potential terminal 13. As a result, it is possible to suppress a short circuit between the high potential terminal 14 and the low potential terminal 13, hence making it possible to suppress an additional breakage or an additional deterioration of the protective layer 8 caused by the short circuit.

Figure 39:
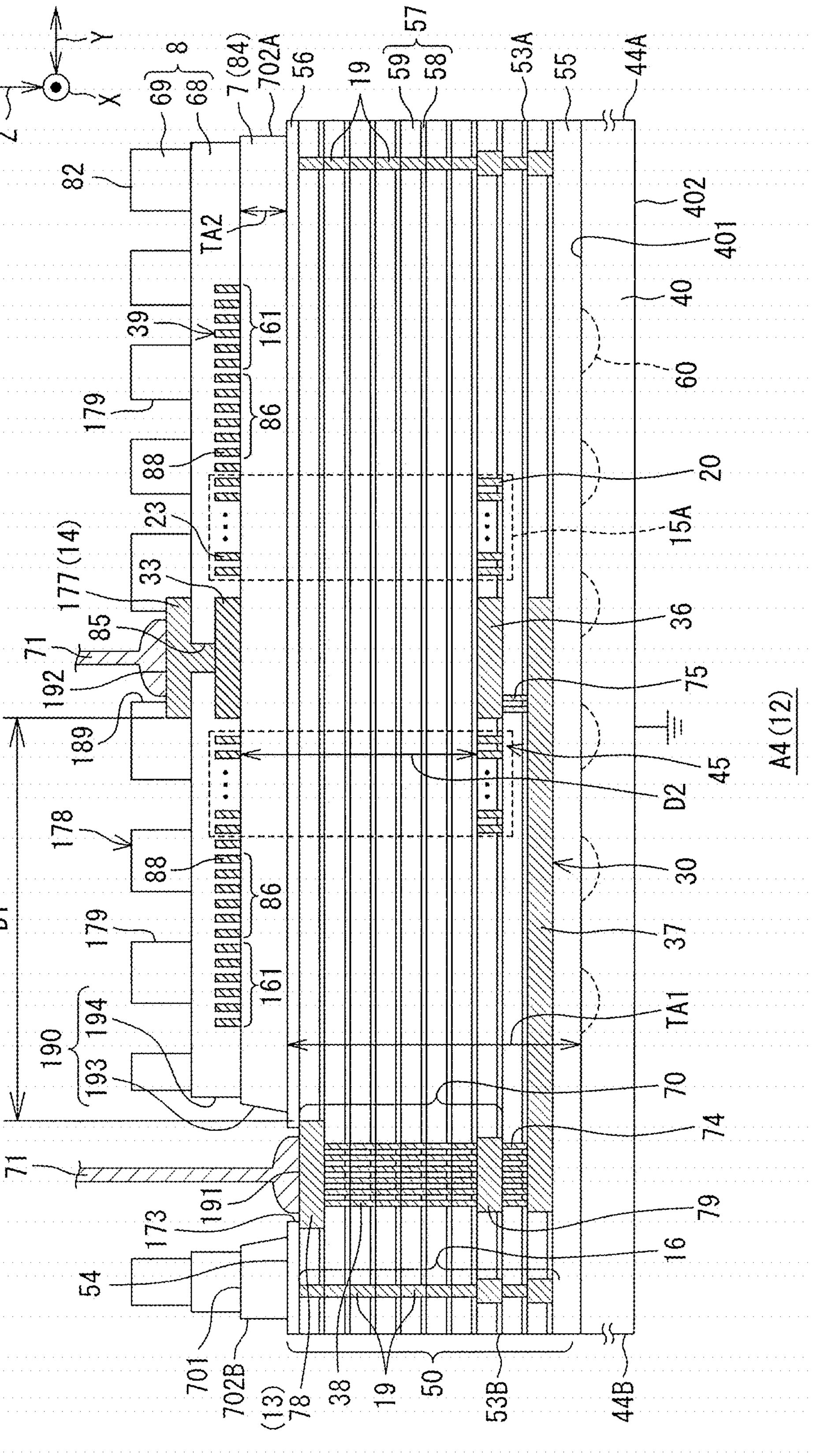
FIG. 39 is a schematic cross-sectional view of a semiconductor device according to one preferred embodiment of the present disclosure.

In the description above, the seal conductor 16 is connected to the semiconductor chip 40 through the seal via conductor 65, and is fixed to the ground potential. On the other hand, the seal conductor 16 is not necessarily required to be fixed to the ground potential by excluding the seal via conductor 65 as shown in FIG. 39.

<Structures of Semiconductor Devices B1 to B4>

First Preferred Embodiment

Figure 40:
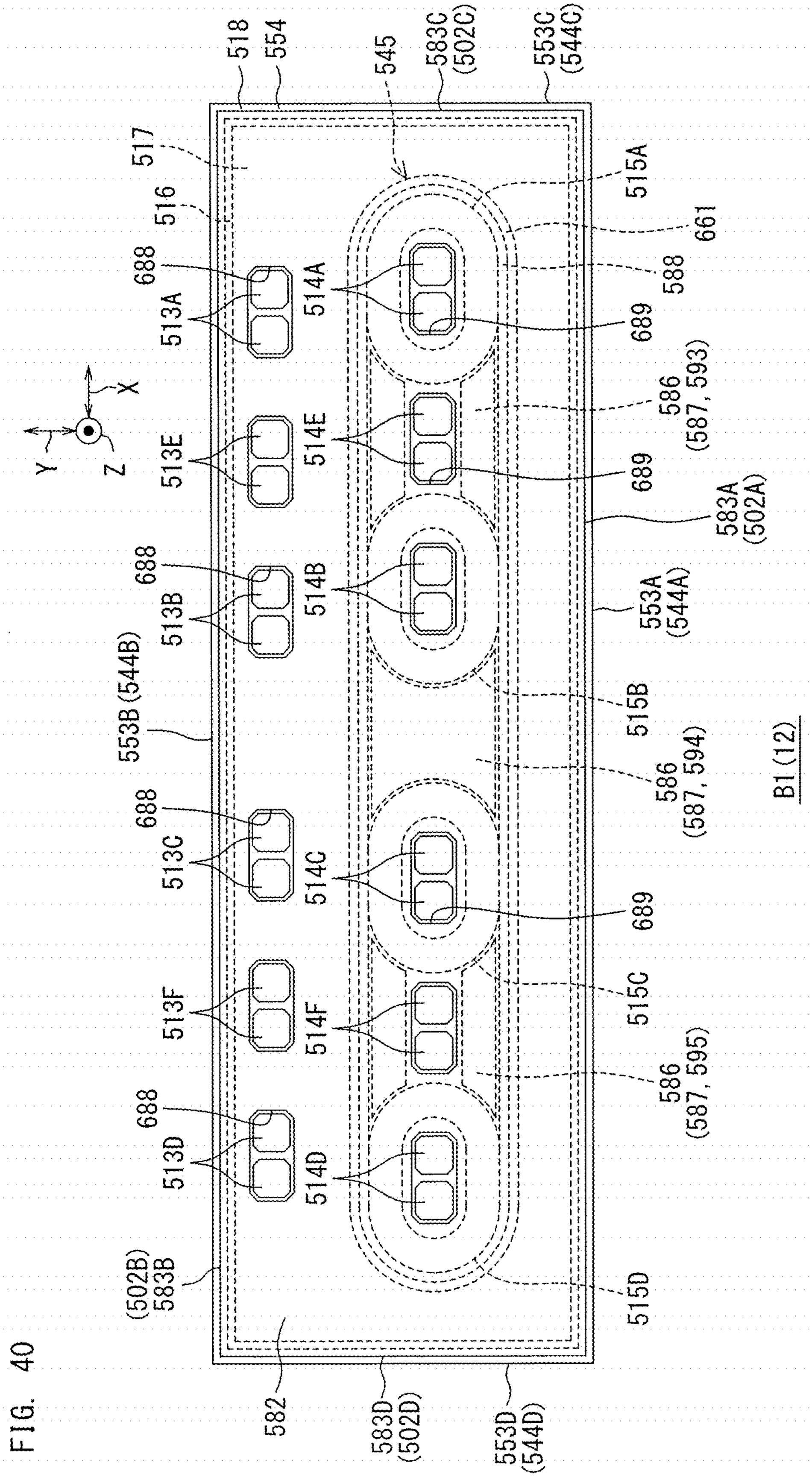
FIG. 40 is a schematic plan view of a semiconductor device according to one preferred embodiment of the present disclosure.
Figure 41:
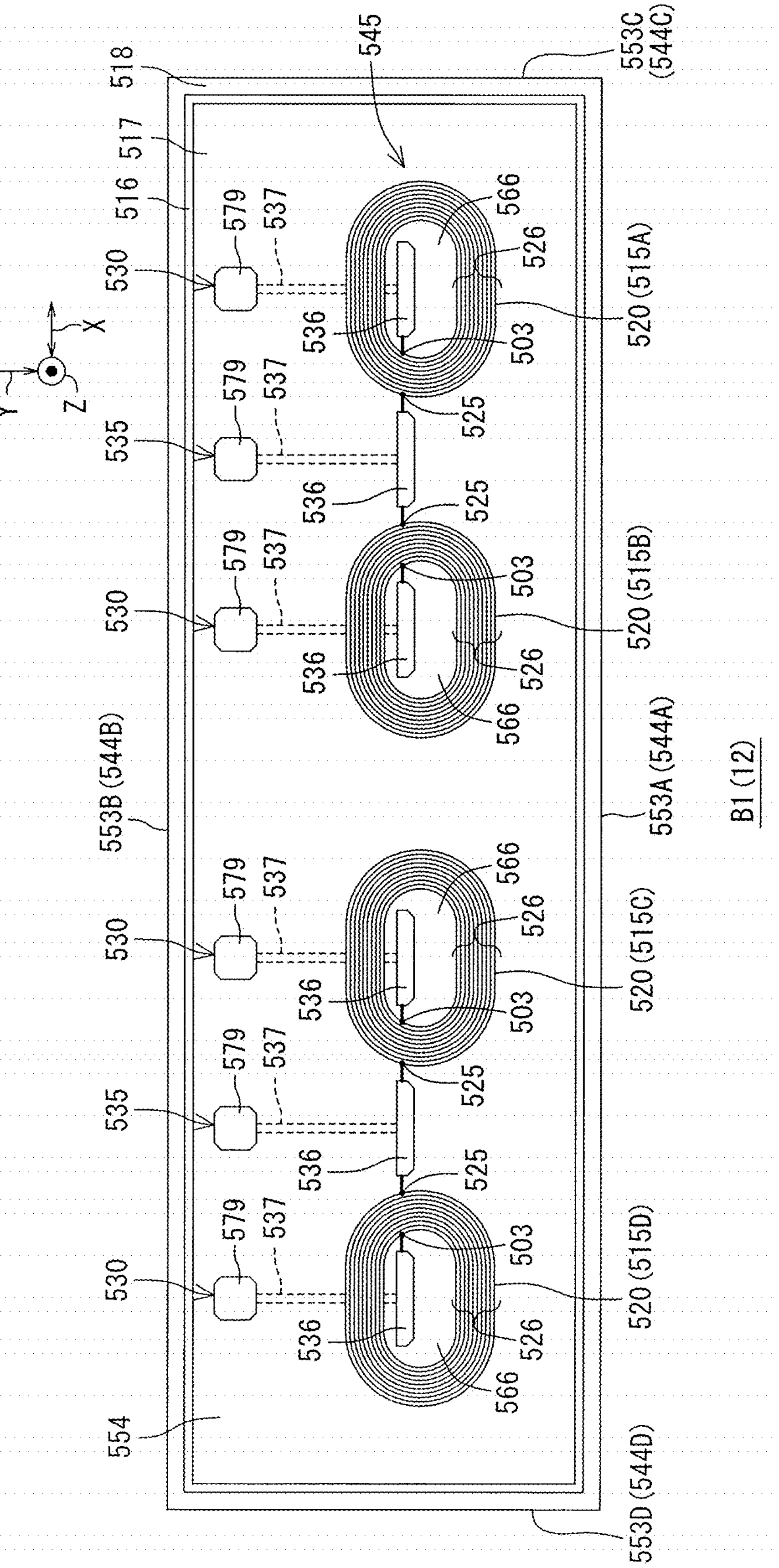
FIG. 41 is a plan view showing a layer in which a low potential coil is formed in the semiconductor device of FIG. 40.
Figure 42:
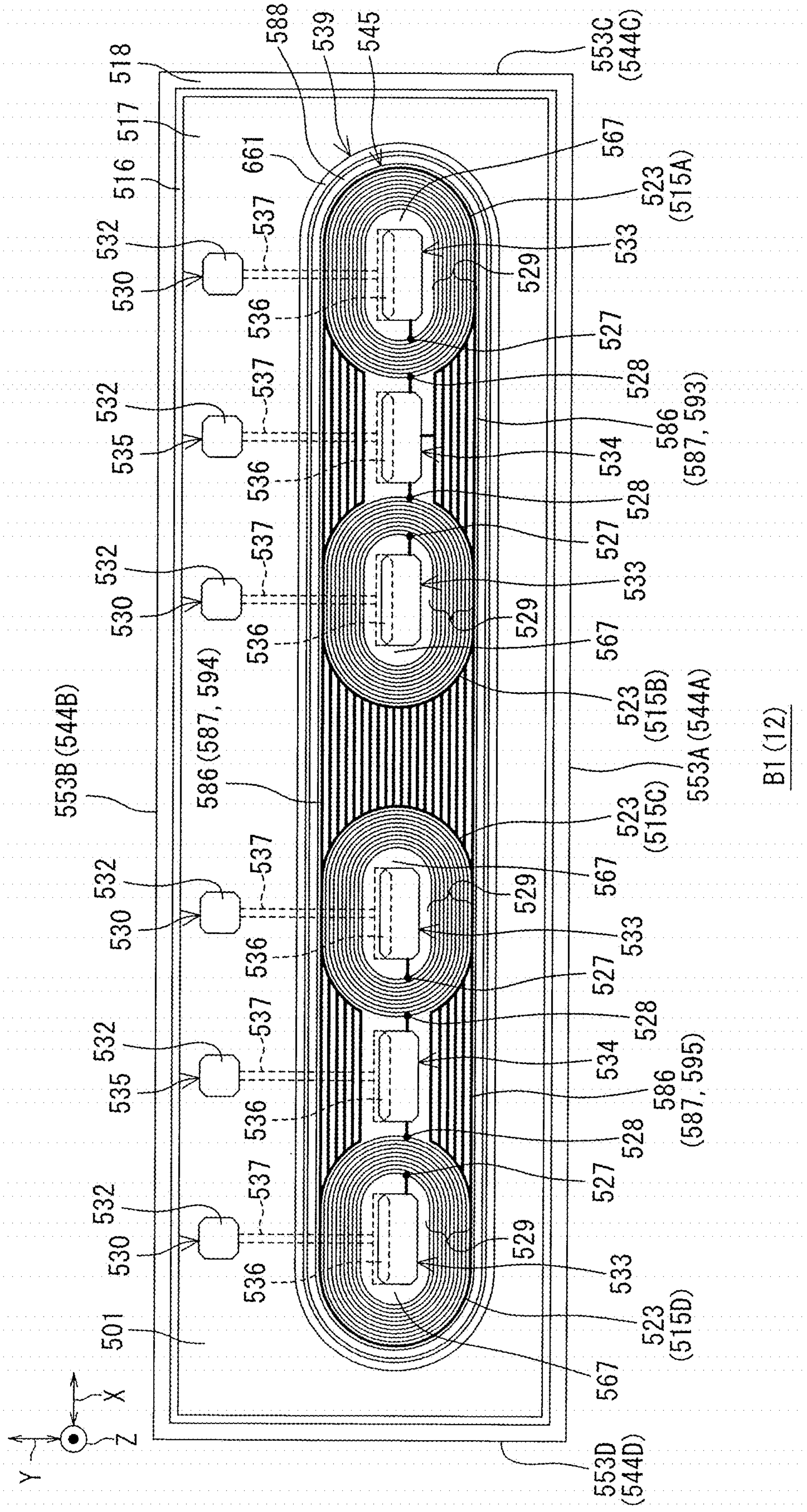
FIG. 42 is a plan view showing a layer in which a high potential coil is formed in the semiconductor device of FIG. 40.
Figure 43:
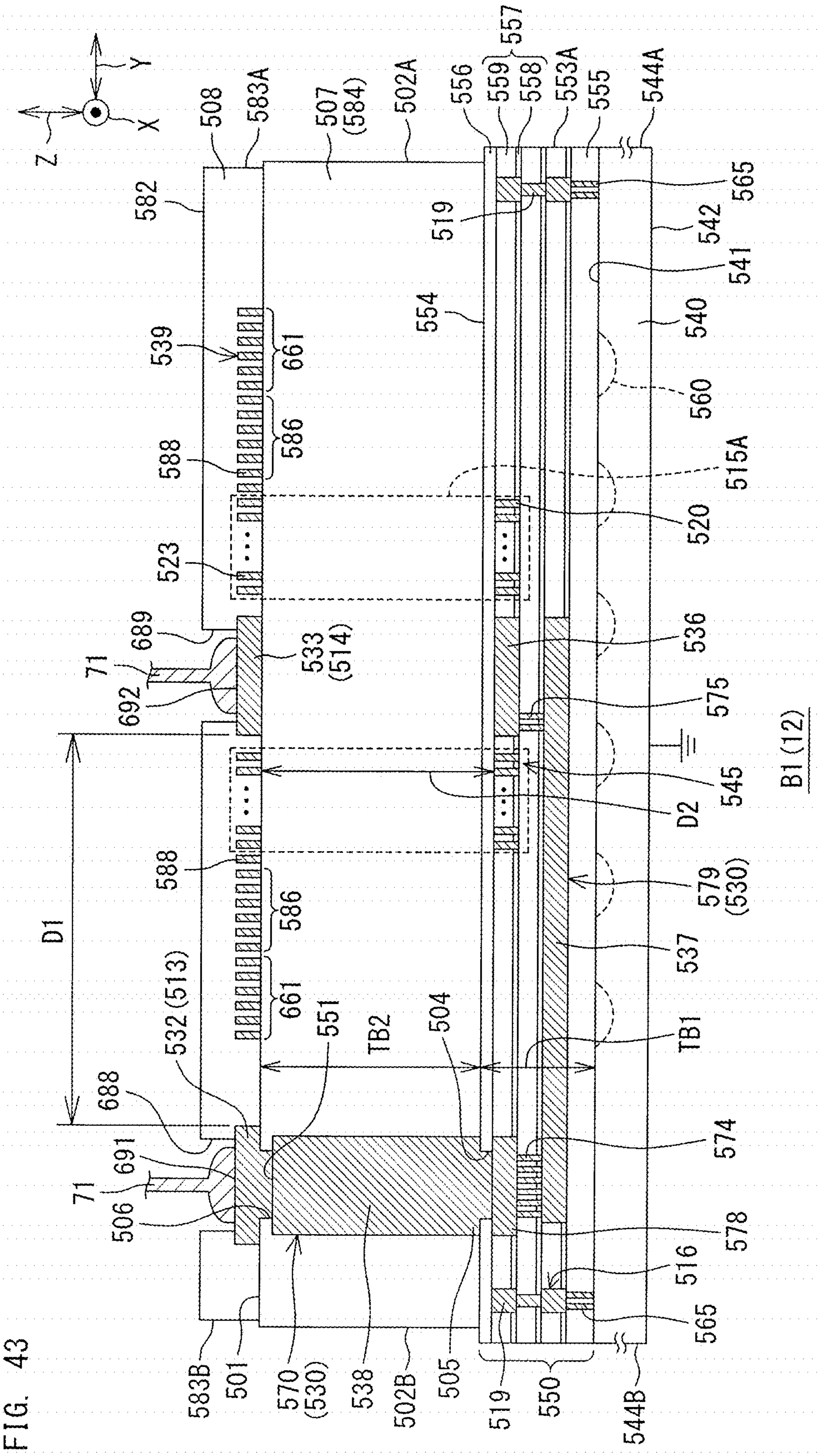
FIG. 43 is a schematic cross-sectional view of the semiconductor device of FIG. 40.

FIG. 40 is a schematic plan view of a semiconductor device B1 according to a preferred embodiment of the present disclosure. FIG. 41 is a plan view showing a layer in which a low potential coil 520 is formed in the semiconductor device B1 of FIG. 40. FIG. 42 is a plan view showing a layer in which a high potential coil 523 is formed in the semiconductor device B1 of FIG. 40. FIG. 43 is a schematic cross-sectional view of the semiconductor device B1 of FIG. 40.

Referring to FIG. 40 to FIG. 43, the semiconductor device B1 includes a rectangular parallelepiped shaped semiconductor chip 540. The semiconductor chip 540 includes at least one among silicon, a wide bandgap semiconductor, and a compound semiconductor.

The wide bandgap semiconductor is made of a semiconductor exceeding the bandgap of silicon (about 1.12 eV). Preferably, the bandgap of the wide bandgap semiconductor is 2.0 eV or more. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 540 includes a silicon-made semiconductor substrate. The semiconductor chip 540 may be an epitaxial substrate having a laminated structure including a silicon-made semiconductor substrate and a silicon-made epitaxial layer. The conductivity type of the semiconductor substrate may be an n type or may be a p type. The epitaxial layer may be an n type or may be a p type. Additionally, the semiconductor chip 540 may be fixed to the ground potential.

The semiconductor chip 540 has a first principal surface 541 on one side, a second principal surface 542 on the other side, and chip sidewalls 544A to 544D that connect the first principal surface 541 and the second principal surface 542. The first and second principal surfaces 541 and 542 are each formed in a quadrangular shape (in this embodiment, rectangular shape) in a plan view seen from their normal directions Z (hereinafter, referred to simply as a "plan view").

The chip sidewalls 544A to 544D include a first chip sidewall 544A, a second chip sidewall 544B, a third chip sidewall 544C, and a fourth chip sidewall 544D. Each of the first and second chip sidewalls 544A and 544B forms a long side of the semiconductor chip 540. The first and second chip sidewalls 544A and 544B extend along the first direction X, and face each other in the second direction Y. Each of the third and fourth chip sidewalls 544C and 544D forms a short side of the semiconductor chip 540. The third and fourth chip sidewalls 544C and 544D extend in the second direction Y, and face each other in the first direction X. The chip sidewalls 544A to 544D are each constituted of a ground surface.

The semiconductor device B1 includes a first insulating portion 550, a second insulating portion 507, and a protective layer 508 that are formed in this order on the first principal surface 541 of the semiconductor chip 540.

The first insulating portion 550 has an insulating principal surface 554 and insulating sidewalls 553A to 553D. The insulating principal surface 554 is formed in a quadrangular shape (in this embodiment, rectangular shape) that matches the first principal surface 541 in a plan view. The insulating principal surface 554 extends in parallel with the first principal surface 541.

The insulating sidewalls 553A to 553D include a first insulating sidewall 553A, a second insulating sidewall 553B, a third insulating sidewall 553C, and a fourth insulating sidewall 553D. The insulating sidewalls 553A to 553D extend from a peripheral edge of the insulating principal surface 554 toward the semiconductor chip 540, and are continuous with the chip sidewalls 544A to 544D. In detail, the insulating sidewalls 553A to 553D are formed so as to be flush with the chip sidewalls 544A to 544D. The insulating sidewalls 553A to 553D form ground surfaces flush with the chip sidewalls 544A to 544D, respectively.

The second insulating portion 507 is formed on the insulating principal surface 554, and has an insulating principal surface 501 and insulating sidewalls 502A to 502D. The insulating principal surface 501 is formed in a quadrangular shape (in this embodiment, rectangular shape) that matches the first principal surface 541 in a plan view. The insulating principal surface 501 extends in parallel with the first principal surface 541.

The insulating sidewalls 502A to 502D include a first insulating sidewall 502A, a second insulating sidewall 502B, a third insulating sidewall 502C, and a fourth insulating sidewall 502D. The insulating sidewalls 502A to 502D extend from a peripheral edge of the insulating principal surface 501 toward the semiconductor chip 540. In detail, the insulating sidewalls 502A to 502D are formed on an inward side with respect to the insulating sidewalls 553A to 553D. Hence, a level difference is formed between the insulating sidewalls 502A to 502D and the insulating sidewalls 553A to 553D.

The protective layer 508 is formed on the insulating principal surface 501, and has a protective principal surface 582 and protective sidewalls 583A to 583D. The protective principal surface 582 is formed in a quadrangular shape (in this embodiment, rectangular shape) so as to match the first principal surface 541 in a plan view. The protective principal surface 582 extends in parallel with the first principal surface 541.

The protective sidewalls 583A to 583D include a first protective sidewall 583A, a second protective sidewall 583B, a third protective sidewall 583C, and a fourth protective sidewall 583D. The protective sidewalls 583A to 583D extend from a peripheral edge of the protective principal surface 582 toward the semiconductor chip 540. In detail, the protective sidewalls 583A to 583D are formed on an inward side with respect to the insulating sidewalls 502A to 502D. Hence, a level difference is formed between the protective sidewalls 583A to 583D and the insulating sidewalls 502A to 502D.

The first insulating portion 550 is formed of a multilayer insulating laminated structure including an undermost insulating layer 555, an uppermost insulating layer 556, and a plurality of (in this embodiment, ten) interlayer insulating layers 557. The undermost insulating layer 555 is an insulating layer that directly covers the first principal surface 541. The uppermost insulating layer 556 is an insulating layer that forms the insulating principal surface 554. The interlayer insulating layers 557 are insulating layers interposed between the undermost insulating layer 555 and the uppermost insulating layer 556. In this embodiment, the undermost insulating layer 555 has a single layer structure including silicon oxide. In this embodiment, the uppermost insulating layer 556 has a single layer structure including silicon nitride. The thickness of the undermost insulating layer 555 and the thickness of the uppermost insulating layer 556 may be each not less than 1 μm and not more than 3 μm (for example, about 2 μm).

Each of the interlayer insulating layers 557 has a laminated structure including a first insulating layer 558 on the undermost insulating layer 555 side and a second insulating layer 559 on the uppermost insulating layer 556 side. The first insulating layer 558 may be made of an inorganic insulating layer, and may include, for example, silicon nitride. The first insulating layer 558 is formed as an etching stopper layer with respect to the second insulating layer 559. The thickness of the first insulating layer 558 may be not less than 0.1 μm and not more than 1 μm (for example, about 0.3 μm).

The second insulating layer 559 is formed on the first insulating layer 558. The second insulating layer 559 includes an insulating material differing from that of the first insulating layer 558. The second insulating layer 559 is made of an inorganic insulating layer differing from that of the first insulating layer 558, and may include, for example, silicon oxide. The thickness of the second insulating layer 559 may be not less than 1 μm and not more than 3 μm (for example, about 2 μm). Preferably, the thickness of the second insulating layer 559 exceeds the thickness of the first insulating layer 558.

Additionally, the first insulating layer 558 may be a compressive stress film, and the second insulating layer 559 may be a tensile stress film. In other words, the interlayer insulating layer 557 may be a structure in which a compressive stress film and a tensile stress film are repeatedly laminated. This makes it possible to form the first insulating portion 550 while canceling a stress in a lamination interface of the interlayer insulating layer 557. As a result, it is possible to prevent the occurrence of large warping deformation in a semiconductor wafer that serves as a base material of the semiconductor chip 540 in a manufacturing process of the semiconductor device B1. The compressive stress film may be, for example, a silicon oxide film, and the tensile stress film may be, for example, a silicon nitride film.

The total thickness TB1 of the first insulating portion 550 may be not less than 1 μm and not more than 20 μm. The total thickness TB1 of the first insulating portion 550 and the number of laminated layers of the interlayer insulating layer 557 are arbitrary, and are adjusted in accordance with a dielectric withstand voltage (dielectric breakdown resistance) to be realized. Additionally, the insulating material of the undermost insulating layer 555, the insulating material of the uppermost insulating layer 556, and the insulating material of the interlayer insulating layer 557 are arbitrary, and are not limited to a specific insulating material.

The second insulating portion 507 is made of an insulating material having a dielectric constant differing from that of the first insulating layer 558 and differing from that of the second insulating layer 559, and has a layer structure including, for example, an organic insulating layer 584. The second insulating portion 507 consists of the single layer of the organic insulating layer 584 in this embodiment, and yet the second insulating portion 507 may have a laminated structure of a plurality of organic insulating layers. For example, a polyimide film, a phenol resin film, an epoxy resin film, etc., can be mentioned as the organic insulating layer 584. The total thickness TB2 of the second insulating portion 507 may be not less than 2 μm and not more than 100 μm. The total thickness TB2 of the second insulating portion 507 is arbitrary, and is adjusted in accordance with a dielectric withstand voltage (dielectric breakdown resistance) to be realized.

The semiconductor device B1 includes a first functional device 545. The first functional device 545 includes a single or a plurality of (in this embodiment, a plurality of) transformers 515. In other words, the semiconductor device B1 is formed of a multichannel type device including the transformers 515. The transformers 515 are formed at an inward portion of a laminated structure of the first and second insulating portions 550 and 507 at a distance from the insulating sidewalls 553A to 553D. The transformers 515 are formed at a distance from each other in the first direction X.

In detail, the transformers 515 include a first transformer 515A, a second transformer 515B, a third transformer 515C, and a fourth transformer 515D that are formed in this order from the insulating sidewall 553C side toward the insulating sidewall 553D side in a plan view. The first transformer 515A, the second transformer 515B, the third transformer 515C, and the fourth transformer 515D may correspond to the first transformer 131, the second transformer 132, the third transformer 133, and the fourth transformer 134 of FIG. 11, respectively. The transformers 515A to 515D each have the same structure. A structure of the first transformer 515A will be hereinafter described as an example. A description of structures of the second transformer 515B, the third transformer 515C, and the fourth transformer 515D is omitted on the condition that a description of the structure of the first transformer 515A is correspondingly applied.

Referring to FIG. 40 to FIG. 43, the first transformer 515A includes a low potential coil 520 and a high potential coil 523. The low potential coil 520 is formed in the first insulating portion 550. The high potential coil 523 is formed on the second insulating portion 507 so as to face the low potential coil 520 in the normal direction Z. In this embodiment, the low potential coil 520 is formed in a region (i.e., in the interlayer insulating layers 557) interposed between the undermost insulating layer 555 and the uppermost insulating layer 556. In more detail, the low potential coil 520 is formed in the interlayer insulating layer 557 contiguous to the uppermost insulating layer 556, and its upper surface is contiguous to the uppermost insulating layer 556.

The high potential coil 523 is formed at the insulating principal surface 501 of the second insulating portion 507. In other words, the high potential coil 523 faces the semiconductor chip 540 with the low potential coil 520 between the high potential coil 523 and the semiconductor chip 540. Disposition places of the low potential coil 520 and the high potential coil 523 are arbitrary. Additionally, the high potential coil 523 is merely required to face the low potential coil 520 with the second insulating portion 507 between the high potential coil 523 and the low potential coil 520.

The distance D2 between the low potential coil 520 and the high potential coil 523 (i.e., the thickness of the uppermost insulating layer 556 and the thickness of the second insulating portion 507) is appropriately adjusted in accordance with a dielectric withstand voltage or an electric field strength between the low potential coil 520 and the high potential coil 523. In this embodiment, the low potential coil 520 is formed at the interlayer insulating layer 557 that is an uppermost layer in order from the undermost insulating layer 555 side. On the other hand, the high potential coil 523 is formed at the insulating principal surface 501 of the second insulating portion 507. Therefore, the uppermost insulating layer 556 and the second insulating portion 507 are interposed between the low potential coil 520 and the high potential coil 523.

The low potential coil 520 is buried while penetrating through the first and second insulating layers 558 and 559 in the interlayer insulating layer 557. The low potential coil 520 includes a first inner end 503, a first outer end 525, and a first helical portion 526 that is helically routed around between the first inner end 503 and the first outer end 525 as shown in FIG. 41. The first helical portion 526 is helically routed around while extending in an elliptical shape (oval shape) in a plan view. A part, which forms an innermost peripheral edge, of the first helical portion 526 demarcates a first inner region 566 having an elliptical shape in a plan view.

The number of winding turns of the first helical portion 526 may be not less than 5 and not more than 30. The width of the first helical portion 526 may be not less than 0.1 μm and not more than 5 μm. Preferably, the width of the first helical portion 526 is not less than 1 μm and not more than 3 μm. The width of the first helical portion 526 is defined by a width in the direction perpendicular to the helical direction. A first winding pitch of the first helical portion 526 may be not less than 0.1 μm and not more than 5 μm. Preferably, the first winding pitch is not less than 1 μm and not more than 3 μm. The first winding pitch is defined by a distance between two parts, which adjoin each other in the direction perpendicular to the helical direction, of the first helical portion 526.

The wound shape of the first helical portion 526 or the planar shape of the first inner region 566 is arbitrary, and is not limited to the form shown in FIG. 41, etc. The first helical portion 526 may be wound in a polygonal shape, such as a triangular shape or a quadrangular shape, or in a circular shape in a plan view. The first inner region 566 may be demarcated so as to be a polygonal shape, such as a triangular shape or a quadrangular shape, or so as to be a circular shape in a plan view in accordance with the wound shape of the first helical portion 526.

The low potential coil 520 may include at least one among titanium, titanium nitride, copper, aluminum, and tungsten. The low potential coil 520 may have a laminated structure including a barrier layer and a main body layer. The barrier layer demarcates a recessed space in the interlayer insulating layer 557. The main body layer is buried in the recessed space demarcated by the barrier layer. The barrier layer may include at least one of titanium and titanium nitride. The main body layer may include at least one among copper, aluminum, and tungsten.

The high potential coil 523 is formed so as to be erected from the insulating principal surface 501 of the second insulating portion 507 to the side opposite to the first insulating portion 550. The high potential coil 523 is covered with the protective layer 508 from its top portion side. The high potential coil 523 includes a second inner end 527, a second outer end 528, and a second helical portion 529 helically routed around between the second inner end 527 and the second outer end 528 as shown in FIG. 42. The second helical portion 529 is helically routed around while extending in an elliptical shape (oval shape) in a plan view. In this embodiment, a part, which forms an innermost peripheral edge, of the second helical portion 529 demarcates a second inner region 567 having an elliptical shape in a plan view. The second inner region 567 of the second helical portion 529 faces the first inner region 566 of the first helical portion 526 in the normal direction Z.

The number of winding turns of the second helical portion 529 may be not less than 5 and not more than 30. The number of winding turns of the second helical portion 529 with respect to the number of winding turns of the first helical portion 526 is adjusted in accordance with a voltage value to be increased. Preferably, the number of winding turns of the second helical portion 529 exceeds the number of winding turns of the first helical portion 526. Of course, the number of winding turns of the second helical portion 529 may be less than the number of winding turns of the first helical portion 526, or may be equal to the number of winding turns of the first helical portion 526.

The width of the second helical portion 529 may be not less than 0.1 μm and not more than 10 μm. Preferably, the width of the second helical portion 529 is not less than 1 μm and not more than 5 μm. The width of the second helical portion 529 is defined by a width in the direction perpendicular to the helical direction. Preferably, the width of the second helical portion 529 is equal to the width of the first helical portion 526.

A second winding pitch of the second helical portion 529 may be not less than 0.1 μm and not more than 20 μm. Preferably, the second winding pitch is not less than 1 μm and not more than 10 μm. The second winding pitch is defined by a distance between two parts, which adjoin each other in the direction perpendicular to the helical direction, of the second helical portion 529. Preferably, the second winding pitch is equal to the first winding pitch of the first helical portion 526.

The wound shape of the second helical portion 529 or the planar shape of the second inner region 567 is arbitrary, and is not limited to the form shown in FIG. 42, etc. The second helical portion 529 may be wound in a polygonal shape, such as a triangular shape or a quadrangular shape, or in a circular shape in a plan view. The second inner region 567 may be demarcated so as to be a polygonal shape, such as a triangular shape or a quadrangular shape, or so as to be a circular shape in a plan view in accordance with the wound shape of the second helical portion 529. Additionally, a part of the protective layer 508 enters a gap of the second helical portion 529.

The high potential coil 523 may include at least one among titanium, titanium nitride, copper, aluminum, and tungsten. The high potential coil 523 may have a laminated structure including a barrier layer and a main body layer. The barrier layer is formed in a flat shape along the insulating principal surface 501 of the second insulating portion 507. The main body layer is laminated on the barrier layer. The barrier layer may include at least one of titanium and titanium nitride. The main body layer may include at least one among copper, aluminum, and tungsten.

Referring to FIG. 40, the semiconductor device B1 includes a plurality of (in this embodiment, twelve) low potential terminals 513 and a plurality of (in this embodiment, twelve) high potential terminals 514. The low potential terminals 513 are each electrically connected to the low potential coil 520 of corresponding transformers 515A to 515D. The high potential terminals 514 are each electrically connected to the high potential coil 523 of corresponding transformers 515A to 515D.

The low potential terminals 513 are formed on the insulating principal surface 501 of the second insulating portion 507. In detail, the low potential terminals 513 are formed in a region on the insulating sidewall 553B side at a distance in the second direction Y from the transformers 515A to 515D, and are arranged at a distance from each other in the first direction X.

The low potential terminals 513 include a first low potential terminal 513A, a second low potential terminal 513B, a third low potential terminal 513C, a fourth low potential terminal 513D, a fifth low potential terminal 513E, and a sixth low potential terminal 513F. In this embodiment, the low potential terminals 513A to 513F are each formed as two low potential terminals. The number of the low potential terminals 513A to 513F is arbitrary.

The first low potential terminal 513A faces the first transformer 515A in the second direction Y in a plan view. The second low potential terminal 513B faces the second transformer 515B in the second direction Y in a plan view. The third low potential terminal 513C faces the third transformer 515C in the second direction Y in a plan view. The fourth low potential terminal 513D faces the fourth transformer 515D in the second direction Y in a plan view. The fifth low potential terminal 513E is formed in a region between the first low potential terminal 513A and the second low potential terminal 513B in a plan view. The sixth low potential terminal 13F is formed in a region between the third low potential terminal 513C and the fourth low potential terminal 513D in a plan view.

The first low potential terminal 513A is electrically connected to the first inner end 503 of the first transformer 515A (low potential coil 520). The second low potential terminal 513B is electrically connected to the first inner end 503 of the second transformer 515B (low potential coil 520). The third low potential terminal 513C is electrically connected to the first inner end 503 of the third transformer 515C (low potential coil 520). The fourth low potential terminal 513D is electrically connected to the first inner end 503 of the fourth transformer 515D (low potential coil 520).

The fifth low potential terminal 513E is electrically connected to the first outer end 525 of the first transformer 515A (low potential coil 520) and to the first outer end 525 of the second transformer 515B (low potential coil 520). The sixth low potential terminal 513F is electrically connected to the first outer end 525 of the third transformer 515C (low potential coil 520) and to the first outer end 525 of the fourth transformer 515D (low potential coil 520).

In other words, the low potential terminals 513A to 513D connected to the first inner end 503 of each of the transformers 515A to 515D are disposed closer to each of the transformers 515A to 515D than the low potential terminals 513E and 513F connected to the first outer end 525 of each of the transformers 515A to 515D. For example, the first low potential terminal 513A connected to the first inner end 503 of the first transformer 515A is disposed closer to the first transformer 515A than to the fifth low potential terminal 513E connected to the first outer end 525 of the first transformer 515A. The same applies to a disposition relationship of the second and fifth low potential terminals 513B and 513E with respect to the second transformer 515B, a disposition relationship of the third and sixth low potential terminals 513C and 513F with respect to the third transformer 515C, and a disposition relationship of the fourth and sixth low potential terminals 513D and 513F with respect to the fourth transformer 515D.

The high potential terminals 514 are formed on the insulating principal surface 501 of the second insulating portion 507 at a distance from the low potential terminals 513. In detail, the high potential terminals 514 are formed in a region on the insulating sidewall 553A side at a distance in the second direction Y from the low potential terminals 513, and are arranged at a distance from each other in the first direction X.

The high potential terminals 514 are each formed in a region in proximity to corresponding transformers 515A to 515D in a plan view. That the high potential terminal 514 is in proximity to the transformers 515A to 515D means that the distance between the high potential terminal 514 and the transformer 515 is less than the distance between the low potential terminal 513 and the high potential terminal 514 in a plan view.

In detail, the high potential terminals 514 are formed at a distance along the first direction X so as to face the transformers 515A to 515D along the first direction X in a plan view. In more detail, the high potential terminals 514 are formed at a distance along the first direction X so as to be placed in the second inner region 567 of the high potential coil 523 and in a region between adjoining high potential coils 523 in a plan view. Hence, the high potential terminals 514 are arranged side by side with the transformers 515A to 515D in a line in the first direction X in a plan view.

The high potential terminals 514 include a first high potential terminal 514A, a second high potential terminal 514B, a third high potential terminal 514C, a fourth high potential terminal 514D, a fifth high potential terminal 514E, and a sixth high potential terminal 514F. In this embodiment, the high potential terminals 514A to 514F are each formed as two high potential terminals. The number of the high potential terminals 514A to 514F is arbitrary.

The first high potential terminal 514A is formed in the second inner region 567 of the first transformer 515A (high potential coil 523) in a plan view. The second high potential terminal 514B is formed in the second inner region 567 of the second transformer 515B (high potential coil 523) in a plan view. The third high potential terminal 514C is formed in the second inner region 567 of the third transformer 515C (high potential coil 523) in a plan view. The fourth high potential terminal 514D is formed in the second inner region 567 of the fourth transformer 515D (high potential coil 523) in a plan view. The fifth high potential terminal 514E is formed in a region between the first transformer 515A and the second transformer 515B in a plan view. The sixth high potential terminal 514F is formed in a region between the third transformer 515C and the fourth transformer 515D in a plan view.

The first high potential terminal 514A is electrically connected to the second inner end 527 of the first transformer 515A (high potential coil 523). The second high potential terminal 514B is electrically connected to the second inner end 527 of the second transformer 515B (high potential coil 523). The third high potential terminal 514C is electrically connected to the second inner end 527 of the third transformer 515C (high potential coil 523). The fourth high potential terminal 514D is electrically connected to the second inner end 527 of the fourth transformer 515D (high potential coil 523).

The fifth high potential terminal 514E is electrically connected to the second outer end 528 of the first transformer 515A (high potential coil 523) and the second outer end 528 of the second transformer 515B (high potential coil 523). The sixth high potential terminal 514F is electrically connected to the second outer end 528 of the third transformer 515C (high potential coil 523) and the second outer end 528 of the fourth transformer 515D (high potential coil 523).

Referring to FIG. 41 and FIG. 42, the semiconductor device B1 includes a first low potential wiring 530, a second low potential wiring 535, a first high potential wiring 533, and a second high potential wiring 534. In this embodiment, a plurality of first low potential wirings 530, a plurality of second low potential wirings 535, a plurality of first high potential wirings 533, and a plurality of second high potential wirings 534 are formed.

The first low potential wiring 530 and the second low potential wiring 535 fix the low potential coil 520 of the first transformer 515A and the low potential coil 520 of the second transformer 515B to the same potential. Additionally, the first low potential wiring 530 and the second low potential wiring 535 fix the low potential coil 520 of the third transformer 515C and the low potential coil 520 of the fourth transformer 515D to the same potential. In this embodiment, the first low potential wiring 530 and the second low potential wiring 535 fix all of the low potential coils 520 of the transformers 515A to 515D to the same potential.

The first high potential wiring 533 and the second high potential wirings 534 fix the high potential coil 523 of the first transformer 515A and the high potential coil 523 of the second transformer 515B to the same potential. Additionally, the first high potential wiring 533 and the second high potential wirings 534 fix the high potential coil 523 of the third transformer 515C and the high potential coil 523 of the fourth transformer 515D to the same potential. In this embodiment, the first high potential wiring 533 and the second high potential wirings 534 fix all of the high potential coils 523 of the transformers 515A to 515D to the same potential.

The first low potential wirings 530 are each electrically connected to corresponding low potential terminals 513A to 513D and to the first inner ends 503 of corresponding transformers 515A to 515D (low potential coils 520). The first low potential wirings 530 have the same structure. A structure of the first low potential wiring 530 connected to the first low potential terminal 513A and to the first transformer 515A will be hereinafter described as an example. A description of structures of other first low potential wirings 530 is omitted on the condition that a description of the structure of the first low potential wiring 530 connected to the first transformer 515A is correspondingly applied.

The first low potential wiring 530 includes a first wiring 579 formed closer to the first insulating portion 550 than to a boundary portion between the first insulating portion 550 and the second insulating portion 507 and a second wiring 570 formed closer to the second insulating portion 507 than to the boundary portion between the first insulating portion 550 and the second insulating portion 507. The first wiring 579 is formed in the first insulating portion 550, and the second wiring 570 is formed in the second insulating portion 507. The first wiring 579 and the second wiring 570 are connected to each other in the boundary portion between the first insulating portion 550 and the second insulating portion 507.

The first wiring 579 includes a low potential connection wiring 536, a lead-out wiring 537, a relay pad electrode layer 578, a first connection plug electrode 574, and a second connection plug electrode 575. Preferably, the low potential connection wiring 536, the lead-out wiring 537, the relay pad electrode layer 578, the first connection plug electrode 574, and the second connection plug electrode 575 are each made of the same conductive material as the low potential coil 520, etc. In other words, preferably, each of the low potential connection wiring 536, the lead-out wiring 537, the relay pad electrode layer 578, the first connection plug electrode 574, and the second connection plug electrode 575 includes a barrier layer and a main body layer in the same way as the low potential coil 520, etc.

The low potential connection wiring 536 is formed in the first inner region 566 of the first transformer 515A (low potential coil 520) in the same interlayer insulating layer 557 as the low potential coil 520. The low potential connection wiring 536 is formed in an island shape, and faces the high potential terminal 514 (first high potential terminal 514A) in the normal direction Z. The low potential connection wiring 536 is electrically connected to the first inner end 503 of the low potential coil 520.

The lead-out wiring 537 is formed in a region between the semiconductor chip 540 and the second wiring 570 in the interlayer insulating layer 557. In this embodiment, the lead-out wiring 537 is formed in the interlayer insulating layer 557 that is a first layer in order from the undermost insulating layer 555. The lead-out wiring 537 includes a first end portion on one side, a second end portion on the other side, and a wiring portion connecting the first and second end portions. The first end portion of the lead-out wiring 537 is placed in a region between the semiconductor chip 540 and the lower end portion of the second wiring 570. The second end portion of the lead-out wiring 537 is placed in a region between the semiconductor chip 540 and the low potential connection wiring 536. The wiring portion extends along the first principal surface 541 of the semiconductor chip 540, and extends in a belt shape in a region between the first and second end portions.

The relay pad electrode layer 578 is a part, which is connected to the second wiring 570, of the first wiring 579. The relay pad electrode layer 578 is formed in the same interlayer insulating layer 557 as the low potential coil 520. The relay pad electrode layer 578 is partially exposed from a penetrating hole 504 formed in the uppermost insulating layer 556. The relay pad electrode layer 578 is formed in an island shape, and faces the first end portion of the lead-out wiring 537 with the interlayer insulating layer 557 between the relay pad electrode layer 578 and the first end portion of the lead-out wiring 537 in the normal direction Z.

The first connection plug electrode 574 is formed in a region between the relay pad electrode layer 578 and the lead-out wiring 537 in the interlayer insulating layer 557, and is electrically connected to the relay pad electrode layer 578 and the first end portion of the lead-out wiring 537. The second connection plug electrode 575 is formed in a region between the low potential connection wiring 536 and the lead-out wiring 537 in the interlayer insulating layer 557, and is electrically connected to the low potential connection wiring 536 and the second end portion of the lead-out wiring 537.

The second wiring 570 includes a pillar-shaped wiring 538 and a first low potential pad wiring 532. Preferably, the pillar-shaped wiring 538 and the first low potential pad wiring 532 are each made of the same conductive material as the high potential coil 523. In other words, preferably, the pillar-shaped wiring 538 and the first low potential pad wiring 532 each include a barrier layer and a main body layer in the same way as the high potential coil 523, etc.

The pillar-shaped wiring 538 is formed at the insulating principal surface 554 of the first insulating portion 550. The pillar-shaped wiring 538 extends from the insulating principal surface 554 toward the insulating principal surface 501 of the second insulating portion 507, and penetrates through the second insulating portion 507 in the thickness direction. In this embodiment, although the pillar-shaped wiring 538 is formed in a pillar shape extending in the normal direction Z, from the viewpoint of penetrating through the second insulating portion 507, the pillar-shaped wiring 538 may be referred to as a penetrating wiring. A lower end portion of the pillar-shaped wiring 538 enters the penetrating hole 504 formed in the uppermost insulating layer 556, and is connected to the relay pad electrode layer 578 in the penetrating hole 504. The pillar-shaped wiring 538 has a width wider than the opening width of the penetrating hole 504. Hence, the pillar-shaped wiring 538 has a peripheral edge portion 505 overlapping with the uppermost insulating layer 556 around the penetrating hole 504. The peripheral edge portion 505 of the pillar-shaped wiring 538 faces the relay pad electrode layer 578 with the uppermost insulating layer 556 between the peripheral edge portion 505 and the relay pad electrode layer 578. Additionally, the pillar-shaped wiring 538 comes into direct contact with the relay pad electrode layer 578, and is formed in a region directly on the relay pad electrode layer 578.

Additionally, an upper end portion of the pillar-shaped wiring 538 is exposed from a penetrating hole 506 formed in the insulating principal surface 501 of the second insulating portion 507. The penetrating hole 506 has a certain depth from the insulating principal surface 501 of the second insulating portion 507 toward the first insulating portion 550. Hence, a top surface 551 of the pillar-shaped wiring 538 is formed on the first insulating portion 550 side with respect to the insulating principal surface 501, and a level difference is formed between the top surface 551 and the insulating principal surface 501.

The first low potential pad wiring 532 is formed on the insulating principal surface 501 of the second insulating portion 507. In other words, in this embodiment, the first low potential pad wiring 532 is formed at the same layer as the high potential coil 523. The first low potential pad wiring 532 may form the low potential terminal 513 mentioned above. The first low potential pad wiring 532 is connected to the pillar-shaped wiring 538 through the penetrating hole 506 formed in the second insulating portion 507. The first low potential pad wiring 532 has a width wider than the pillar-shaped wiring 538. Additionally, the first low potential pad wiring 532 may have a planar shape that is the same as the second low potential pad wiring 171 shown in FIG. 21. In other words, a lead-out portion 552 (not shown) that is led out from the penetrating hole 506 to a region not overlapping with the penetrating hole 506 may be provided. This lead-out portion 552 may have a shape corresponding to the lead-out portion 175 of FIG. 21. The first low potential pad wiring 532 is formed in the protective layer 508 by being covered with the protective layer 508.

The second low potential wirings 535 are each electrically connected to corresponding low potential terminals 513E and 513F and to the first outer end 525 of the low potential coil 520 of corresponding transformers 515A to 515D as shown in FIG. 41. The second low potential wirings 535 each have the same structure as the first low potential wiring 530.

Referring to FIG. 42, the first high potential wirings 533 are each electrically connected to corresponding high potential terminals 514A to 12D and to the second inner end 527 of corresponding transformers 515A to 515D (high potential coil 523). The first high potential wirings 533 each have the same structure. The first high potential wiring 533 may form the high potential terminal 514 mentioned above. A structure of the first high potential wiring 533 connected to the first high potential terminal 514A and to the first transformer 515A will be hereinafter described as an example. A description of structures of other first high potential wirings 533 is omitted on the condition that a description of the structure of the first high potential wiring 533 connected to the first transformer 515A is correspondingly applied.

Preferably, the first high potential wiring 533 is made of the same conductive material as the high potential coil 523. In other words, preferably, the first high potential wirings 533 each include a barrier layer and a main body layer in the same way as the high potential coil 523, etc. The first high potential wiring 533 is formed in the second inner region 567 of the high potential coil 523 on the second insulating portion 507. The first high potential wiring 533 is formed in an island shape, and is electrically connected to the second inner end 527 of the high potential coil 523. The first high potential wiring 533 faces the low potential connection wiring 536 with the second insulating portion 507 and the uppermost insulating layer 556 between the first high potential wiring 533 and the low potential connection wiring 536 in the normal direction Z. Additionally, the first high potential wiring 533 may be referred to as a first high potential pad electrode layer because the first high potential wiring 533 is formed in an island shape.

The second high potential wirings 534 are each electrically connected to corresponding high potential terminals 514E and 514F and to the second outer ends 528 of corresponding transformers 515A to 515D (high potential coils 523). The second high potential wirings 534 each have the same structure. A structure of the second high potential wiring 534 connected to the fifth high potential terminal 514E and to the first transformer 515A (second transformer 515B) will be hereinafter described as an example. A description of structures of other second high potential wirings 534 is omitted on the condition that a description of the structure of the second high potential wiring 534 connected to the first transformer 515A (second transformer 515B) is correspondingly applied.

The second high potential wiring 534 has the same structure as the first high potential wiring 533 except that the second high potential wirings 534 is electrically connected to the second outer end 528 of the first transformer 515A (high potential coil 523) and to the second outer end 528 of the second transformer 515B (high potential coil 523). In other words, the second high potential wiring 534 is formed in an island shape. The second high potential wiring 534 may be referred to as a second high potential pad electrode layer because the second high potential wiring 534 is formed in an island shape.

The second high potential wiring 534 is formed around the high potential coil 523 on the second insulating portion 507. The second high potential wiring 534 is formed in a region between two adjoining high potential coils 523 in a plan view, and faces the high potential terminal 514 (fifth high potential terminal 514E) in the normal direction Z. The second high potential wiring 534 faces the low potential connection wiring 536 with the second insulating portion 507 and the uppermost insulating layer 556 between the second high potential wiring 534 and the low potential connection wiring 536 in the normal direction Z.

Referring to FIG. 43, preferably, a distance D1 between the low potential terminal 513 and the high potential terminal 514 exceeds a distance D2 between the low potential coil 520 and the high potential coil 523 (D2<D1). Preferably, the distance D1 exceeds the sum of the total thickness TB1 of the first insulating portion 550 and the total thickness TB2 of the second insulating portion 507 (TB1+TB2<D1). The ratio D2/D1 of the distance D2 with respect to the distance D1 may be not less than 0.005 and not more than 0.5. Preferably, the distance D1 is not less than 100 μm and not more than 1000 μm. The distance D2 may be not less than 2 μm and not more than 120 μm. Preferably, the distance D2 is not less than 5 μm and not more than 50 μm. The value of the distance D1 and the value of the distance D2 are arbitrary, and are appropriately adjusted in accordance with a dielectric withstand voltage to be realized.

Referring to FIG. 42 and FIG. 43, the semiconductor device B1 includes a dummy pattern 539 formed on the second insulating portion 507 so as to be placed around the transformers 515A to 515D in a plan view.

Figure 55:
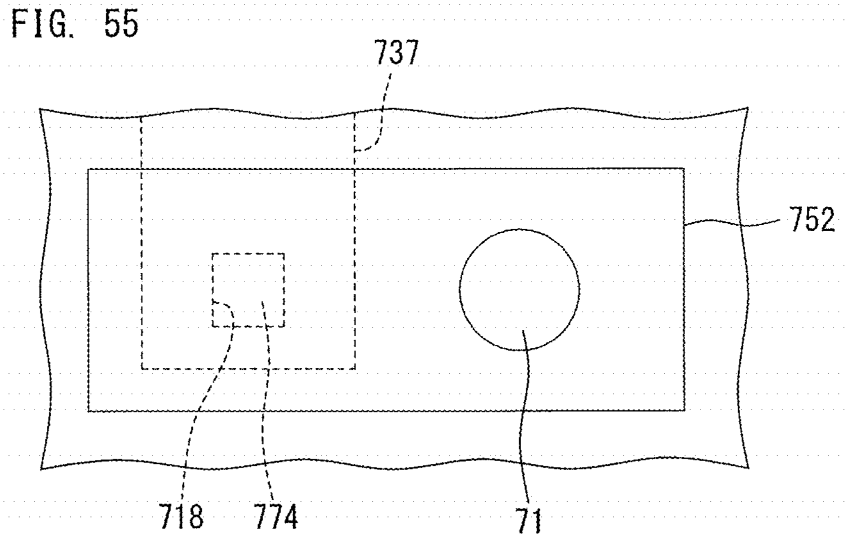
FIG. 55 is an enlarged view of a main part of the semiconductor device of FIG. 51.

The dummy pattern 539 may have a shape that is the same as the dummy pattern 39 of the semiconductor device A1. For example, the dummy pattern 539 may include a high potential dummy pattern 586 having a shape corresponding to the high potential dummy pattern 86, a first high potential dummy pattern 587 having a shape corresponding to the first high potential dummy pattern 87, a second high potential dummy pattern 588 having a shape corresponding to the second high potential dummy pattern 88, and a floating dummy pattern 661 having a shape corresponding to the floating dummy pattern 161. In FIG. 55, the high potential dummy pattern 586, the second high potential dummy pattern 588, and the floating dummy pattern 661 are shown.

Referring to FIG. 43, the semiconductor device B1 includes a second functional device 560 formed at the first principal surface 541 of the semiconductor chip 540 in a device region 517. The second functional device 560 is formed by utilizing a surface layer portion of the first principal surface 541 of the semiconductor chip 540 and/or a region on the first principal surface 541 of the semiconductor chip 540, and is covered by the first insulating portion 550 (undermost insulating layer 555). In FIG. 43, the second functional device 560 is simplified and shown by the broken line shown in the surface layer portion of the first principal surface 541.

The second functional device 560 is electrically connected to the low potential terminal 513 through a low potential wiring, and is electrically connected to the high potential terminal 514 through a high potential wiring. The second functional device 560 may include at least one among a passive device, a semiconductor rectifying device, and a semiconductor switching device. The second functional device 560 may include a circuit network in which two or more kinds of arbitrary devices among the passive device, the semiconductor rectifying device, and the semiconductor switching device are selectively combined. The circuit network may form a part or all of an integrated circuit.

The passive device may include a semiconductor passive device. The passive device may include either one or both of a resistor and a capacitor. The semiconductor rectifying device may include at least one among a pn junction diode, a PIN diode, a Zener diode, a Schottky barrier diode, and a fast-recovery diode. The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

Referring to FIG. 43, the semiconductor device B1 further includes a seal conductor 516 buried in the first insulating portion 550. The seal conductor 516 is buried in the first insulating portion 550 in the form of a wall at a distance from the insulating sidewalls 553A to 553D in a plan view, and demarcates the first insulating portion 550 into the device region 517 and an outer region 518. The seal conductor 516 suppresses penetration of moisture and penetration of cracks into the device region 517 from the outer region 518.

The device region 517 is a region including the first functional device 545 (transformers 515), the second functional device 560, the low potential terminals 513, the high potential terminals 514, the first low potential wiring 530, the second low potential wiring 535, the first high potential wiring 533, the second high potential wiring 534, and the dummy pattern 539. The outer region 518 is a region outside the device region 517.

The seal conductor 516 is electrically separated from the device region 517. In detail, the seal conductor 516 is electrically separated from the first functional device 545 (transformers 515), the second functional device 560, the low potential terminals 513, the high potential terminals 514, the first low potential wiring 530, the second low potential wiring 535, the first high potential wiring 533, the second high potential wiring 534, and the dummy pattern 539. In more detail, the seal conductor 516 is fixed in an electrically floating state. The seal conductor 516 does not form a current path connected to the device region 517.

The seal conductor 516 is formed in a belt shape along the insulating sidewalls 553 to 553D in a plan view. In this embodiment, the seal conductor 516 is formed in a quadrangular annular shape (in detail, rectangular annular shape) in a plan view. Hence, the seal conductor 516 demarcates the device region 517 having a quadrangular shape (in detail, rectangular shape) in a plan view. Additionally, the seal conductor 516 demarcates the outer region 518 having a quadrangular annular shape (in detail, rectangular annular shape) surrounding the device region 517 in a plan view.

In detail, the seal conductor 516 has an upper end portion on the insulating principal surface 554 side, a lower end portion on the semiconductor chip 540 side, and a wall portion extending in a wall shape between the upper end portion and the lower end portion. In this embodiment, the upper end portion of the seal conductor 516 is formed at a distance from the insulating principal surface 554 toward the semiconductor chip 540 side, and is placed in the first insulating portion 550. In this embodiment, the upper end portion of the seal conductor 516 is covered by the uppermost insulating layer 556. The upper end portion of the seal conductor 516 may be covered by the single or plural interlayer insulating layers 557. The upper end portion of the seal conductor 516 may be exposed from the uppermost insulating layer 556. The lower end portion of the seal conductor 516 is formed at a distance from the semiconductor chip 540 toward the upper end portion side.

As thus described, in this embodiment, the seal conductor 516 is buried in the first insulating portion 550 so as to be placed on the semiconductor chip 540 side with respect to the low potential terminals 513 and the high potential terminals 514. Additionally, in the first insulating portion 550, the seal conductor 516 faces the first functional device 545 (transformers 515), the first low potential wiring 530, the second low potential wiring 535, the first high potential wiring 533, the second high potential wiring 534, and the dummy pattern 539 in a direction parallel to the insulating principal surface 554. In the first insulating portion 550, the seal conductor 516 may face a part of the second functional device 560 in the direction parallel to the insulating principal surface 554.

The seal conductor 516 includes a plurality of seal plug conductors 519 and a single or a plurality of (in this embodiment, a plurality of) seal via conductors 565. The number of the seal via conductors 565 is arbitrary. The seal plug conductor 519, which is an uppermost one among the seal plug conductors 519, forms the upper end portion of the seal conductor 516. The seal via conductors 565 each form the lower end portion of the seal conductor 516. Preferably, the seal plug conductor 519 and the seal via conductor 565 are made of the same conductive material as the low potential coil 520. In other words, preferably, the seal plug conductor 519 and the seal via conductor 565 include a barrier layer and a main body layer in the same way as the low potential coil 520, etc.

The seal plug conductors 519 are buried in the interlayer insulating layers 557, respectively, and are each formed in a quadrangular annular shape (in detail, rectangular annular shape) surrounding the device region 517 in a plan view. The seal plug conductors 519 are stacked from the undermost insulating layer 555 toward the uppermost insulating layer 556 so as to be connected to each other. The number of laminated layers of the seal plug conductors 519 coincides with the number of laminated layers of the interlayer insulating layers 557. Of course, the single or the plural seal plug conductors 519 penetrating through the interlayer insulating layers 557 may be formed.

All of the seal plug conductors 519 are not required to be formed so as to be annular as long as one annular seal conductor 516 is formed by an aggregate of the seal plug conductors 519. For example, at least one of the seal plug conductors 519 may be formed in a shape with ends. Additionally, at least one of the seal plug conductors 519 may be divided into a plurality of belt shape parts with ends. However, preferably, the seal plug conductors 519 are formed in an endless shape (annular shape) in consideration of the risk of penetration of moisture and cracks into the device region 517.

The seal via conductors 565 are each formed in a region between the semiconductor chip 540 and the seal plug conductor 519 in the undermost insulating layer 555. The seal via conductors 565 are connected to the semiconductor chip 540 and are connected to the seal plug conductor 519. Hence, the seal conductor 516 may be fixed to the ground potential through the seal via conductor 565. The seal via conductors 565 have a plane area less than the plane area of the seal plug conductor 519. If the single seal via conductor 565 is formed, the single seal via conductor 565 may have a plane area equal to or larger than the plane area of the seal plug conductor 519.

The width of the seal conductor 516 may be not less than 0.1 μm and not more than 20 μm. Preferably, the width of the seal conductor 516 is not less than 1 μm and not more than 10 μm. The width of the seal conductor 516 is defined by a width in a direction perpendicular to a direction in which the seal conductor 516 extends.

Referring to FIG. 43, the protective layer 508 is formed on the insulating principal surface 501 of the second insulating portion 507 so as to cover the high potential coil 523, the low potential terminal 513, the high potential terminal 514, and the dummy pattern 539. The protective layer 508 may be referred to as a passivation layer. The protective layer 508 protects the second insulating portion 507, the first insulating portion 550, and the semiconductor chip 540 from above the insulating principal surface 501. The protective layer 508 may be made of an organic insulating layer, and may include a photosensitive resin. The protective layer 508 may include at least one among polyimide, polyamide, and polybenzoxazole. In this embodiment, the protective layer 508 includes polyimide. The thickness of the protective layer 508 may be not less than 1 μm and not more than 100 μm.

Preferably, the thickness of the protective layer 508 is equal to or larger than the distance D2 between the low potential coil 520 and the high potential coil 523. In this case, preferably, the thickness of the protective layer 508 is not less than 5 μm and not more than 50 μm. With these structures, it is possible to suppress the thickening of the protective layer 508, and at the same time, it is possible to appropriately raise a dielectric withstand voltage on the high potential coil 523 by means of the protective layer 508.

The protective layer 508 has a plurality of low potential terminal openings 688 that respectively expose the low potential terminals 513. The low potential terminal 513 exposed from the low potential terminal opening 688 may be referred to as a low potential pad 691. A covering layer including at least one of palladium and nickel may be formed on a surface of the low potential pad 691. The low potential terminal opening 688 exposes the lead-out portion 552 of the first low potential pad wiring 532. In other words, the low potential terminal opening 688 does not face the penetrating hole 506, and is formed at a position that deviates from the penetrating hole 506 in a plan view. This makes it possible to suppress a connection defect of the bonding wire 71 with respect to the low potential terminal 513. For example, when a conductive material of the first low potential pad wiring 532 is buried in the penetrating hole 506, there is a case in which an upper surface of the first low potential pad wiring 532 that has been buried is concaved at a position coinciding with the penetrating hole 506 depending on the size of the diameter of the penetrating hole 506. However, in this embodiment, the lead-out portion 552 is formed by leading out a part of the first low potential pad wiring 532 onto the flat insulating principal surface 501 of the second insulating portion 507, and this lead-out portion 552 is exposed from the low potential terminal opening 688. As a result, an exposed part of the first low potential pad wiring 532 from the low potential terminal opening 688 becomes flat, hence making it possible to excellently connect the bonding wire 71.

The protective layer 508 has a plurality of high potential terminal openings 689 that respectively expose the high potential terminals 514. The high potential terminal 514 exposed from the high potential terminal opening 689 may be referred to as a high potential pad 692.

As described above, with this semiconductor device B1, the second insulating portion 507 made of the organic insulating layer 884 is formed between the low potential coil 520 and the high potential coil 523. Therefore, it is possible to achieve a dielectric withstand voltage between the low potential coil 520 and the high potential coil 523 by means of the thickening of the second insulating portion 507. If the organic insulating layer 584 is used, it is possible to thicken the second insulating portion 507 with only one kind of organic insulating material (resin material) without forming a laminated structure consisting of several kinds of mutually-different insulating materials, such as the inorganic insulating layers 558 and 559. It is possible to easily achieve thickening by, for example, the spin coating method. As a result, it is possible to make a lead time shorter and make costs lower than in a case in which the first insulating portion 550 is thickly formed.

Additionally, the second insulating portion 507 is made of the single-layer organic insulating layer 584, and therefore it is possible to easily form a wiring (pillar-shaped wiring 538) penetrating through the second insulating portion 507 by being subjected to plating growth one time. On the other hand, if the second insulating portion 707 has a multilayer wiring structure including a plurality of inorganic insulating layers like the first insulating portion 550, a step of burying a conductor in this inorganic insulating layer is required to be performed (for example, in the same way as the seal conductor 516) whenever those inorganic insulating layers are laminated, and steps the number of which is equal to the number of layers of the multilayer wiring structure are required to be performed in order to form a wiring penetrating through the second insulating portion 507. Therefore, in the semiconductor device B1, it is also possible to shorten a lead time for the formation step of the wiring penetrating through the second insulating portion 507.

On the other hand, the interval between the low potential coil 520 and the semiconductor chip 540 is the first insulating portion 550 having a multilayer insulating laminated structure including the interlayer insulating layer 557. This makes it possible to use the first insulating portion 550 as a space in which a multilayer wiring, which is connected to the second functional device 560, is routed around in a case in which the first functional device 545 (transformer 515) and the second functional device 560 are mounted in a consolidated state. Additionally, the first insulating portion 550 made of an inorganic insulating layer is more excellent in flatness than the second insulating portion 507 made of an organic insulating layer, and therefore it is also possible to excellently secure the flatness of the multilayer wiring structure on the semiconductor chip 540.

In the description above, the seal conductor 516 is connected to the semiconductor chip 540 through the seal via conductor 565, and is fixed to the ground potential. On the other hand, the seal conductor 516 is not necessarily required to be fixed to the ground potential by excluding the seal via conductor 565 as shown in FIG. 44.

Figure 44:
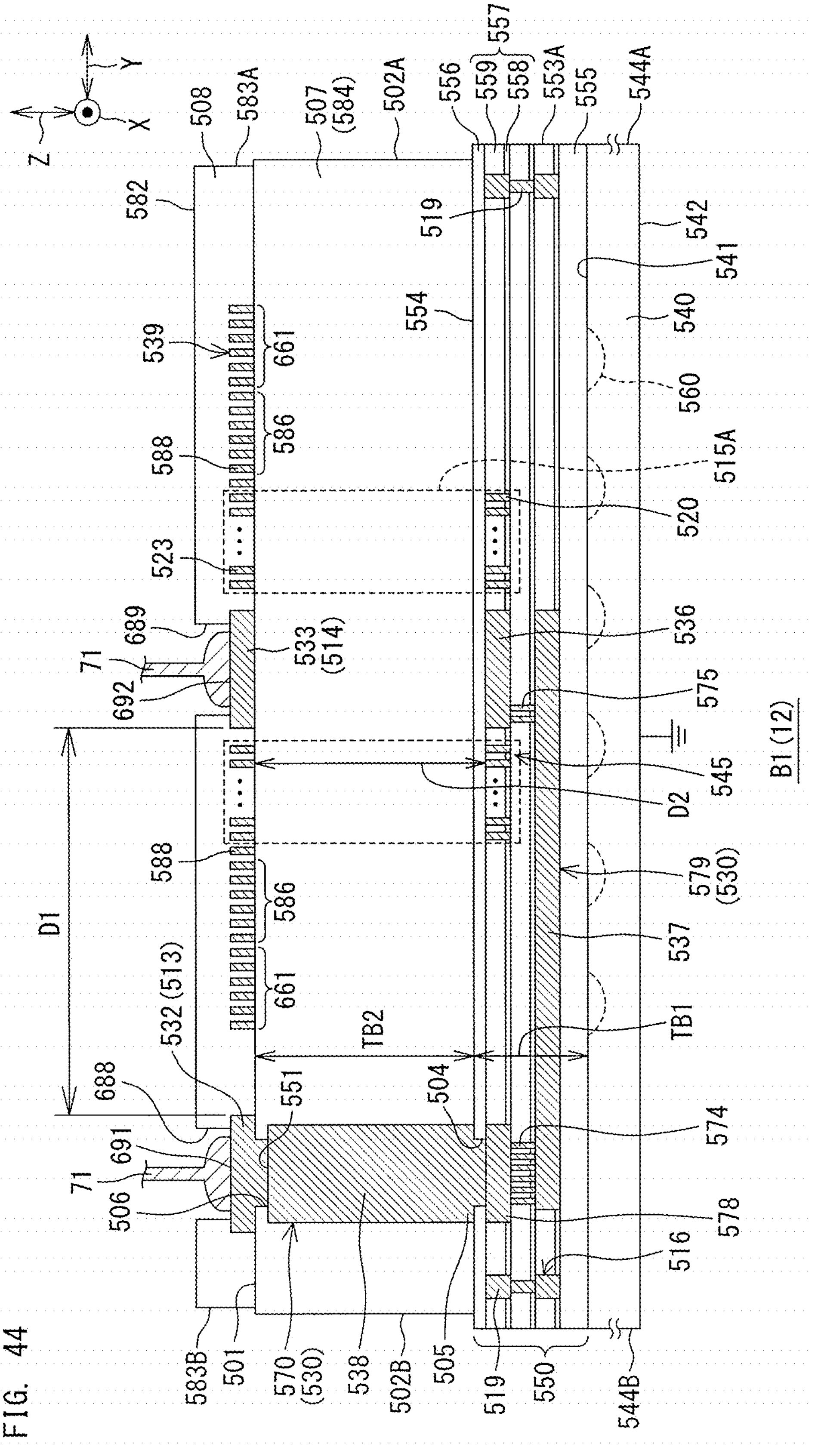
FIG. 44 is a schematic cross-sectional view of a semiconductor device according to one preferred embodiment of the present disclosure.

Additionally, an upper corner portion of the second insulating portion 507 formed by allowing the insulating principal surface 501 of the second insulating portion 507 and the insulating sidewalls 502A to 502D to intersect each other may have a certain angle as shown in FIG. 43 and FIG. 44 or may be formed in a round shape so as to be curved in a cross-sectional view. Additionally, the entirety of the insulating principal surface 501 may be formed in a curved surface shape that swells to the side opposite to the semiconductor chip 540.

Additionally, the second insulating portion 507 may have a laminated structure consisting of a plurality of organic insulating layers. In this case, the organic insulating layers may be made of mutually-identical organic insulating materials, or may be made of mutually-different organic insulating materials.

Second Preferred Embodiment

Figure 45:
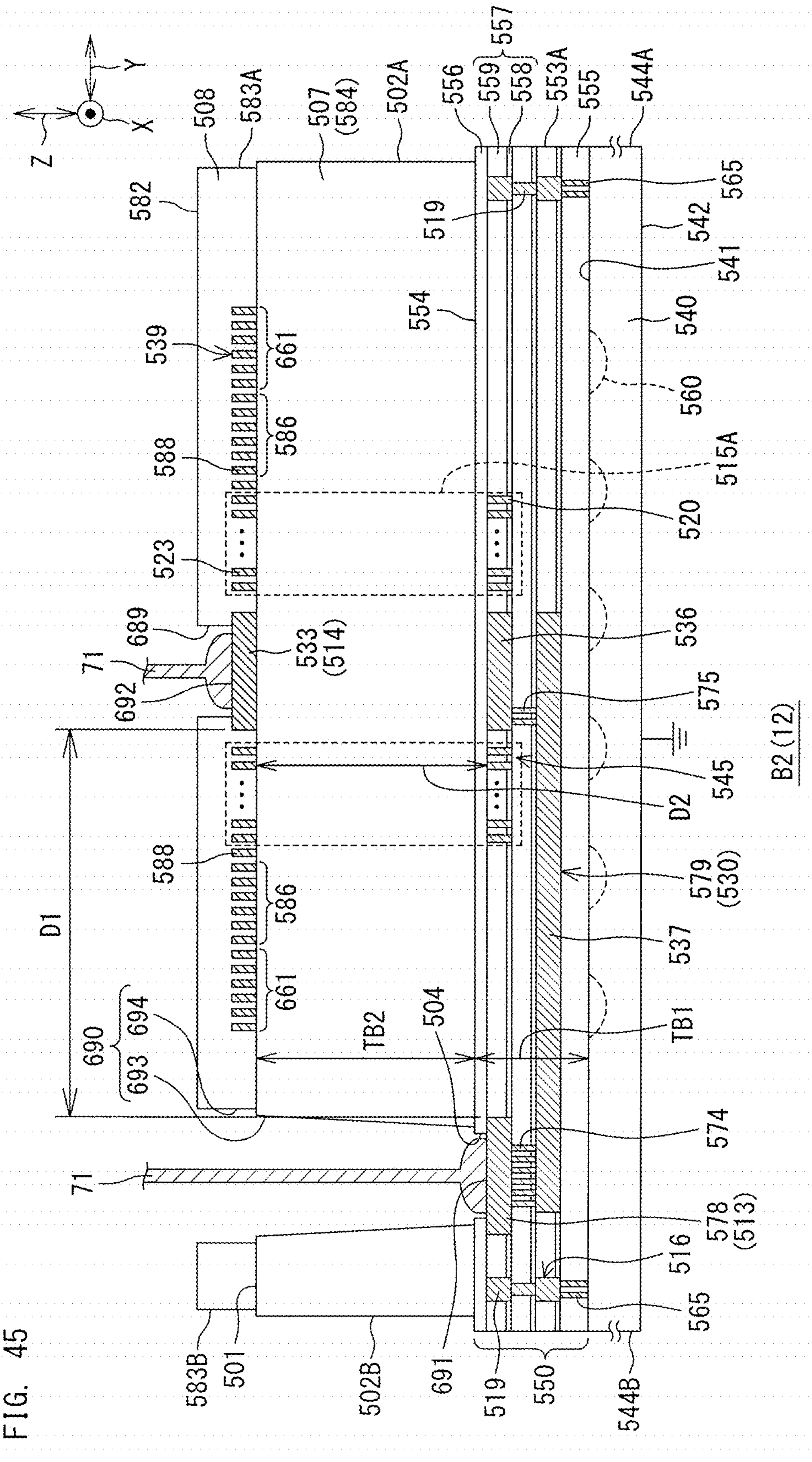
FIG. 45 is a schematic cross-sectional view of a semiconductor device according to one preferred embodiment of the present disclosure.

FIG. 45 is a schematic cross-sectional view of a semiconductor device B2 according to a preferred embodiment of the present disclosure. The same reference sign is hereinafter assigned to a constituent equivalent to the constituent mentioned with respect to the aforementioned semiconductor device B1, and a description of this constituent is omitted.

In the semiconductor device B2, a part of the first low potential wiring 530 functions as the low potential terminal 513 of the semiconductor device B2. More specifically, the first wiring 579 (relay pad electrode layer 578) is exposed as the low potential pad 691. In this case, the relay pad electrode layer 578 is not a member that relays an electric current between the pillar-shaped wiring 538 and the first low potential wiring 530 unlike the semiconductor device B1, and therefore the relay pad electrode layer 578 may be referred to as, for example, a pad electrode layer.

A low potential terminal opening 690 that exposes the low potential pad 691 is formed so as to penetrate through the protective layer 508 and through the second insulating portion 507. The low potential terminal opening 690 may include a first portion 693 formed at the second insulating portion 507 and a second portion 694 formed at the protective layer 508. The second portion 694 is formed with a width larger than the first portion 693. Hence, a level difference is formed between the first portion 693 and the second portion 694. Additionally, the first portion 693 may be formed in a tapered shape whose width becomes smaller in proportion to an approach to the low potential pad 691 in a cross-sectional view. On the other hand, the second portion 694 may have a substantially constant width toward the low potential pad 691.

Additionally, the first portion 693 of the low potential terminal opening 690 is formed with a width larger than the penetrating hole 504 of the uppermost insulating layer 556. Hence, a level difference may be formed between the first portion 693 of the low potential terminal opening 690 and the penetrating hole 504.

As described above, with this semiconductor device B2, the second insulating portion 507 made of the organic insulating layer 584 is formed between the low potential coil 520 and the high potential coil 523 in the same way as the semiconductor device B1. Therefore, it is possible to achieve a dielectric withstand voltage between the low potential coil 520 and the high potential coil 523 by means of the thickening of the second insulating portion 507. As a result, it is possible to make a lead time shorter and make costs lower than in a case in which the first insulating portion 550 is thickly formed.

Additionally, the interval between the low potential coil 520 and the semiconductor chip 540 is the first insulating portion 550 having a multilayer insulating laminated structure including the interlayer insulating layer 557. This makes it possible to use the first insulating portion 550 as a space in which a multilayer wiring, which is connected to the second functional device 560, is routed around in a case in which the first functional device 545 (transformer 515) and the second functional device 560 are mounted in a consolidated state. Additionally, the first insulating portion 550 made of an inorganic insulating layer is more excellent in flatness than the second insulating portion 507 made of an organic insulating layer, and therefore it is also possible to excellently secure the flatness of the multilayer wiring structure on the semiconductor chip 540.

Additionally, the pillar-shaped wiring 538 and the first low potential pad wiring 532 are not formed, and the bonding wire 71 is directly connected to the first wiring 579 (first low potential wiring 530). Therefore, it is possible to exclude the formation step of the pillar-shaped wiring 538 and the first low potential pad wiring 532, hence making it possible to further shorten the lead time.

Figure 46:
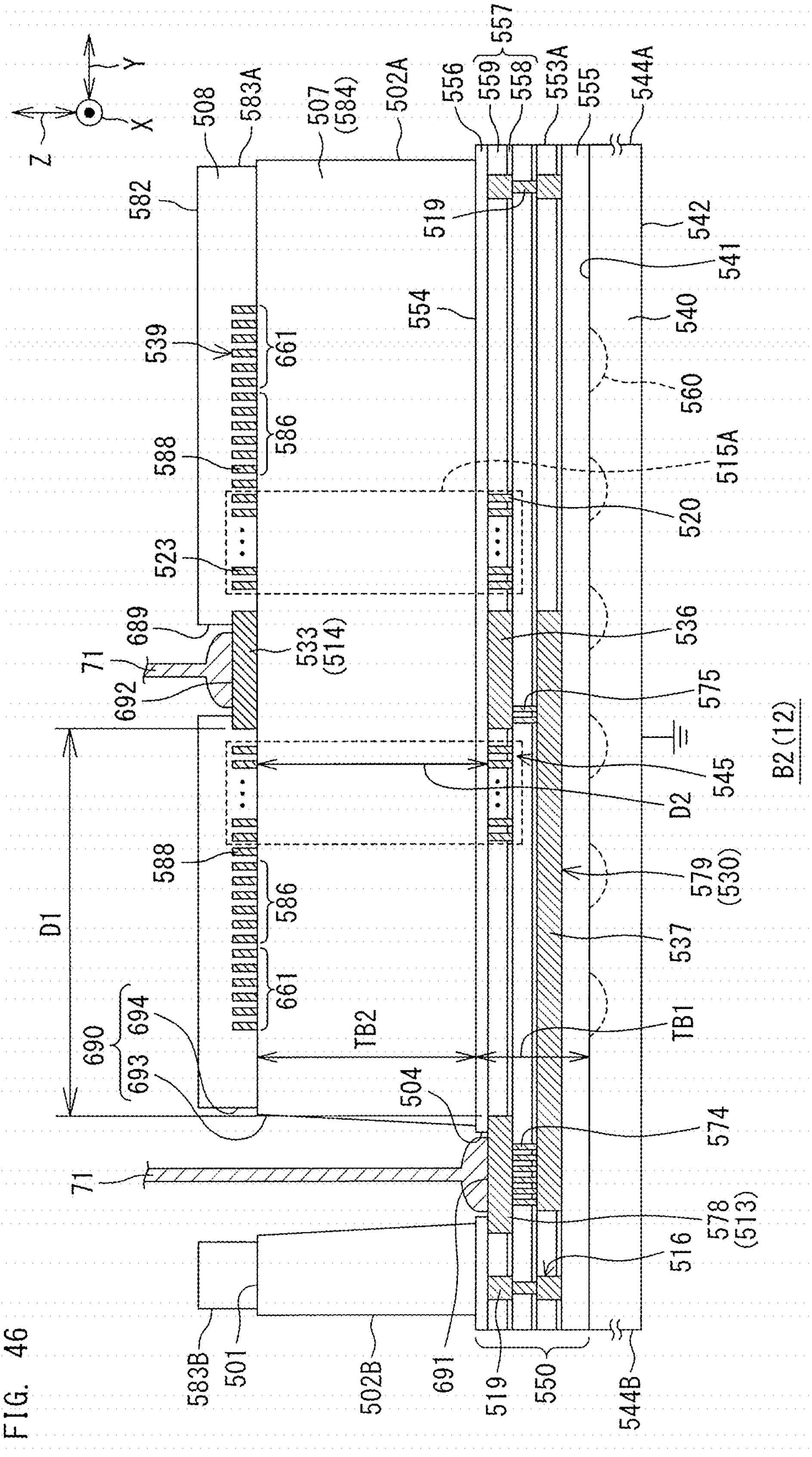
FIG. 46 is a schematic cross-sectional view of a semiconductor device according to one preferred embodiment of the present disclosure.

In the description above, the seal conductor 516 is connected to the semiconductor chip 540 through the seal via conductor 565, and is fixed to the ground potential. On the other hand, the seal conductor 516 is not necessarily required to be fixed to the ground potential by excluding the seal via conductor 565 as shown in FIG. 46.

Third Preferred Embodiment

Figure 47:
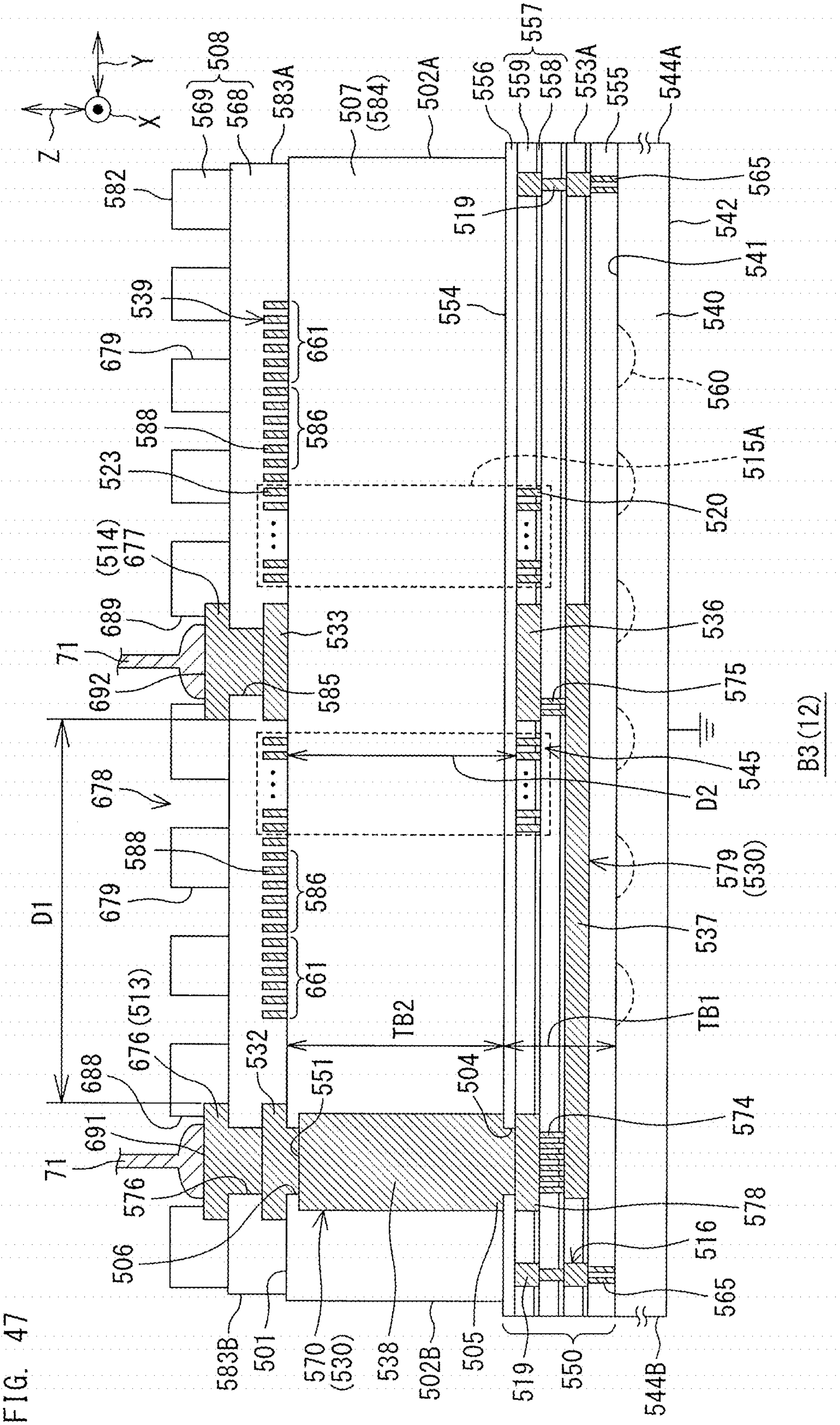
FIG. 47 is a schematic cross-sectional view of a semiconductor device according to one preferred embodiment of the present disclosure.

FIG. 47 is a schematic cross-sectional view of a semiconductor device B3 according to a preferred embodiment of the present disclosure. The same reference sign is hereinafter assigned to a constituent equivalent to the constituent mentioned with respect to the aforementioned semiconductor device B1, and a description of this constituent is omitted.

In the semiconductor device B3, the protective layer 508 includes a first protective layer 568 and a second protective layer 569. The first protective layer 568 is formed on the insulating principal surface 501 of the second insulating portion 507 so as to cover the high potential coil 523, the first low potential pad wiring 532, the first high potential wiring 533, and the dummy pattern 539. The second protective layer 569 is laminated on the first protective layer 568.

The first protective layer 568 and the second protective layer 569 may be made of mutually-identical organic insulating layers, or may be made of mutually-different kinds of organic insulating layers. For example, the first protective layer 568 may include at least one among polyimide, polyamide, and polybenzoxazole, and the second protective layer 569 may be made of the same organic insulating material as the first protective layer 568 or may be made of an organic insulating material differing in kind from the first protective layer 568 among the organic insulating materials mentioned above.

Additionally, the thickness of the first protective layer 568 and the thickness of the second protective layer 569 may be equal to each other, or may be different from each other. Preferably, the thickness of the second protective layer 569 is larger than the thickness of the first protective layer 568 in this embodiment. It is possible to deepen a concave portion 679 described later by thickening the second protective layer 569, hence making it possible to further increase a creepage distance between the high potential terminal 514 and the low potential terminal 513. For example, the thickness of the first protective layer 568 may be not less than 1 μm and not more than 100 μm, and the thickness of the second protective layer 569 may be not less than 1 μm and not more than 100 μm.

A second low potential pad wiring 676 and a high potential pad wiring 677 are formed at the principal surface of the first protective layer 568. Preferably, the second low potential pad wiring 676 and the high potential pad wiring 677 are each made of the same conductive material as the high potential coil 523. In other words, preferably, the second low potential pad wiring 676 and the high potential pad wiring 677 each include a barrier layer and a main body layer in the same way as the high potential coil 523, etc.

The second low potential pad wiring 676 is formed at the principal surface of the first protective layer 568. In other words, in this embodiment, the second low potential pad wiring 676 is formed at a layer higher than the high potential coil 523. Additionally, the second low potential pad wiring 676 is formed in the second protective layer 569 by being covered with the second protective layer 569. The second low potential pad wiring 676 may form the low potential terminal 513 mentioned above. The second low potential pad wiring 676 is connected to the first low potential pad wiring 532 through a penetrating hole 576 formed in the first protective layer 568.

The high potential pad wiring 677 is formed at the principal surface of the first protective layer 568. In other words, in this embodiment, the high potential pad wiring 677 is formed at a layer higher than the high potential coil 523. Additionally, the high potential pad wiring 677 is formed in the second protective layer 569 by being covered with the second protective layer 569. The high potential pad wiring 677 may form the high potential terminal 514 mentioned above. The high potential pad wiring 677 is connected to the first high potential wiring 533 through a penetrating hole 585 formed in the first protective layer 568.

The second low potential pad wiring 676 and the high potential pad wiring 677 may be each formed in an island shape, and may each have a lead-out portion (not shown) that is led out from the penetrating holes 576 and 585 to a region not coinciding with the penetrating holes 576 and 585 in the same way as the first low potential pad wiring 532.

The protective layer 508 has the low potential terminal openings 688 that respectively expose the second low potential pad wirings 676 (low potential terminals 513). The low potential terminal 513 exposed from the low potential terminal opening 688 may be referred to as the low potential pad 691.

The protective layer 508 has the high potential terminal openings 689 that respectively expose the high potential pad wirings 677 (high potential terminals 514). The high potential terminal 514 exposed from the high potential terminal opening 689 may be referred to as the high potential pad 692. A covering layer including at least one of palladium and nickel may be formed on a surface of the high potential pad 692.

Additionally, the protective layer 508 has an uneven structure 678 in a region between the low potential terminal opening 688 and the high potential terminal opening 689. The uneven structure 678 includes a plurality of concave portions 679 hollowed toward the second insulating portion 507 from the protective principal surface 582 of the protective layer 508. The uneven structure 678 increases a creepage distance along the protective principal surface 582 of the protective layer 508. Therefore, the uneven structure 678 suppresses the occurrence of a creeping discharge along the protective principal surface 582 of the protective layer 508. In this embodiment, the concave portions 679 penetrate through the second protective layer 569 and expose the principal surface of the first protective layer 568, and have a side surface formed with the second protective layer 569 from its upper end to its lower end and a bottom surface formed with the first protective layer 568. On the other hand, the concave portions 679 penetrate through the second protective layer 569, and its bottom portion may reach a position between both ends in the thickness direction of the first protective layer 568. In this case, the side surface of the concave portions 679 may have an upper portion that is formed with the second protective layer 569 and a lower portion that is formed with the first protective layer 568. Additionally, the uneven structure 678 may be formed so as to surround the high potential coil 523 in a plan view (not shown).

As described above, with this semiconductor device B3, the second insulating portion 507 made of the organic insulating layer 584 is formed between the low potential coil 520 and the high potential coil 523. Therefore, it is possible to achieve a dielectric withstand voltage between the low potential coil 520 and the high potential coil 523 by means of the thickening of the second insulating portion 507. As a result, it is possible to make a lead time shorter and make costs lower than in a case in which the first insulating portion 550 is thickly formed.

Additionally, the interval between the low potential coil 520 and the semiconductor chip 540 is the first insulating portion 550 having a multilayer insulating laminated structure including the interlayer insulating layer 557 in the same way as the semiconductor device B1. This makes it possible to use the first insulating portion 550 as a space in which a multilayer wiring, which is connected to the second functional device 560, is routed around in a case in which the first functional device 545 (transformer 515) and the second functional device 560 are mounted in a consolidated state.

Additionally, the first insulating portion 550 made of an inorganic insulating layer is more excellent in flatness than the second insulating portion 507 made of an organic insulating layer, and therefore it is also possible to excellently secure the flatness of the multilayer wiring structure on the semiconductor chip 540.

Additionally, the uneven structure 678 is formed in the protective layer 508. This makes it possible to increase the creepage distance along the protective principal surface 582 of the protective layer 508 between the high potential terminal 514 and the low potential terminal 513, and makes it possible to increase the insulation distance between the high potential terminal 514 and the low potential terminal 513. Therefore, it is possible to suppress the occurrence of a creeping discharge in a region between the high potential terminal 514 and the low potential terminal 513, hence making it possible to suppress the breakage or the deterioration of the protective layer 508 between the high potential terminal 514 and the low potential terminal 513. As a result, it is possible to suppress a short circuit between the high potential terminal 514 and the low potential terminal 513, hence making it possible to suppress an additional breakage or an additional deterioration of the protective layer 508 caused by the short circuit.

Figure 48:
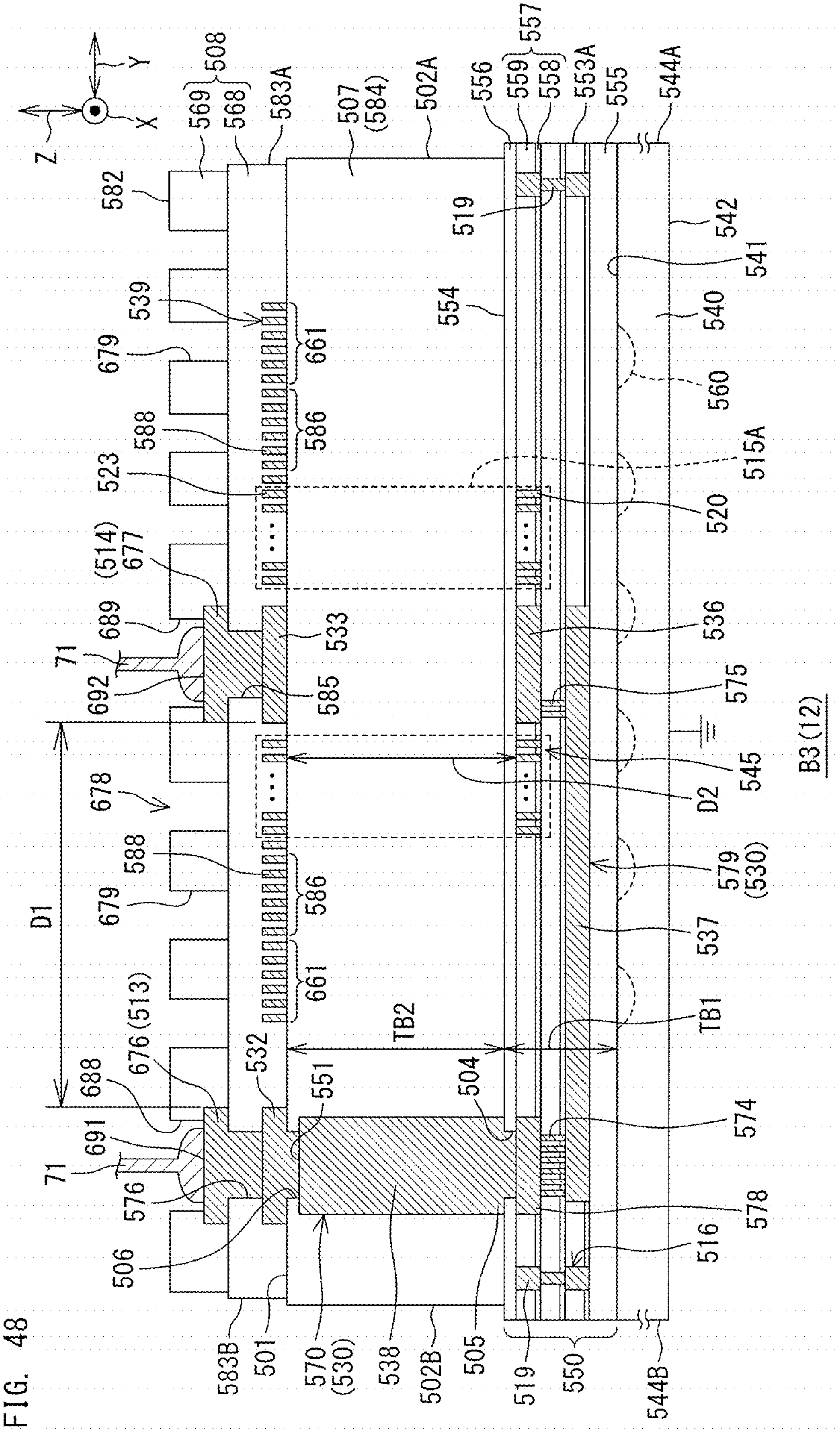
FIG. 48 is a schematic cross-sectional view of a semiconductor device according to one preferred embodiment of the present disclosure.

In the description above, the seal conductor 516 is connected to the semiconductor chip 540 through the seal via conductor 565, and is fixed to the ground potential. On the other hand, the seal conductor 516 is not necessarily required to be fixed to the ground potential by excluding the seal via conductor 565 as shown in FIG. 48.

Fourth Preferred Embodiment

Figure 49:
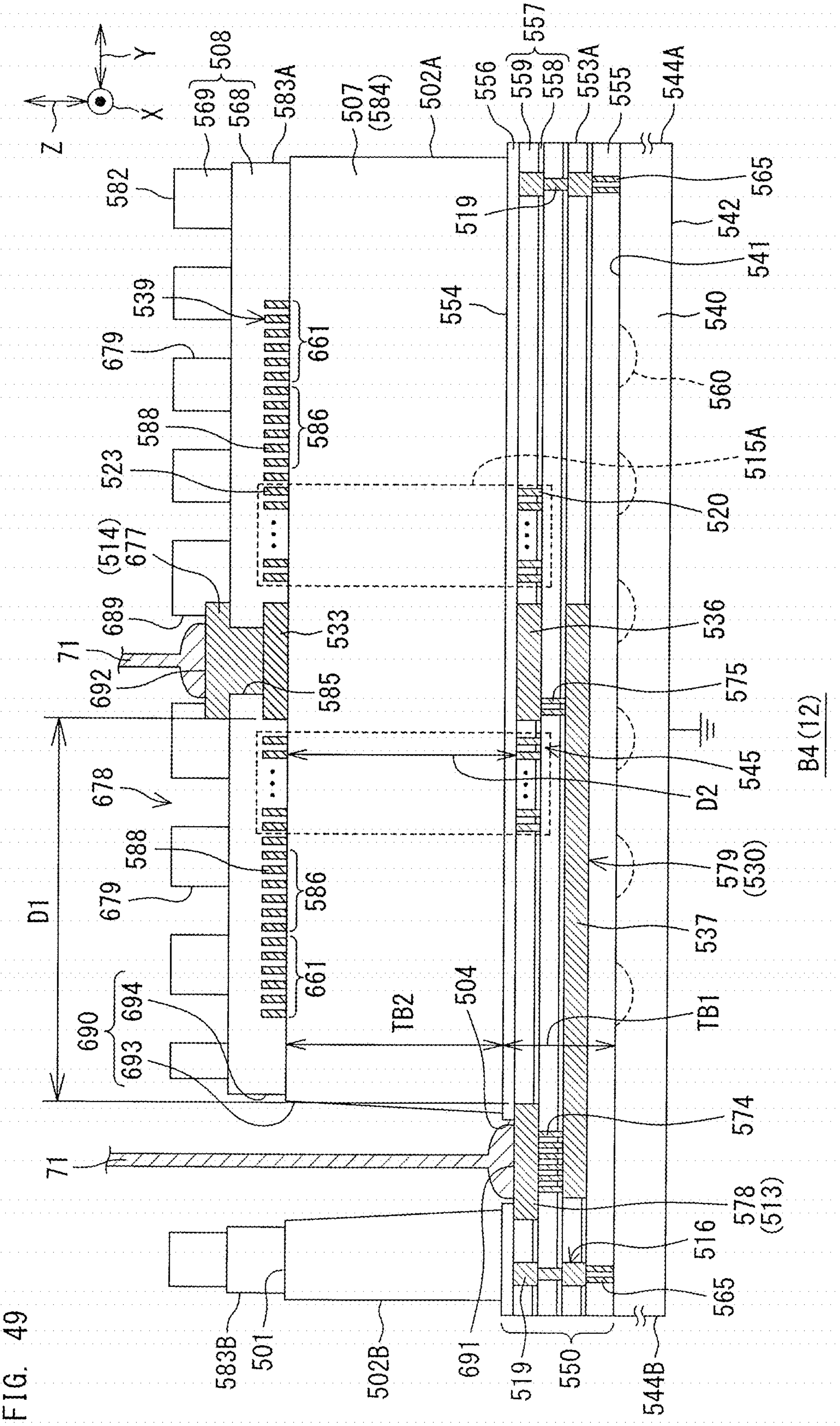
FIG. 49 is a schematic cross-sectional view of a semiconductor device according to one preferred embodiment of the present disclosure.

FIG. 49 is a schematic cross-sectional view of a semiconductor device B4 according to a preferred embodiment of the present disclosure. The same reference sign is hereinafter assigned to a constituent equivalent to the constituent mentioned with respect to the aforementioned semiconductor devices B2 and B3, and a description of this constituent is omitted.

In the semiconductor device B4, the protective layer 508 of the semiconductor device B2 includes the first protective layer 568 and the second protective layer 569 in the same way as the aforementioned semiconductor device B3. Additionally, the protective layer 508 has the uneven structure 678 in a region between the low potential terminal opening 690 and the high potential terminal opening 689.

As described above, with this semiconductor device B4, the second insulating portion 507 made of the organic insulating layer 584 is formed between the low potential coil 520 and the high potential coil 523 in the same way as the semiconductor device B1. Therefore, it is possible to achieve a dielectric withstand voltage between the low potential coil 520 and the high potential coil 523 by means of the thickening of the second insulating portion 507. As a result, it is possible to make a lead time shorter and make costs lower than in a case in which the first insulating portion 550 is thickly formed.

Additionally, the interval between the low potential coil 520 and the semiconductor chip 540 is the first insulating portion 550 having a multilayer insulating laminated structure including the interlayer insulating layer 557 in the same way as the semiconductor device B1. This makes it possible to use the first insulating portion 550 as a space in which a multilayer wiring, which is connected to the second functional device 560, is routed around in a case in which the first functional device 545 (transformer 515) and the second functional device 560 are mounted in a consolidated state. Additionally, the first insulating portion 550 made of an inorganic insulating layer is more excellent in flatness than the second insulating portion 507 made of an organic insulating layer, and therefore it is also possible to excellently secure the flatness of the multilayer wiring structure on the semiconductor chip 540.

Additionally, the pillar-shaped wiring 538 and the first low potential pad wiring 532 are not formed, and the bonding wire 71 is directly connected to the first wiring 579 (first low potential wiring 530) in the same way as the semiconductor device B2. Therefore, it is possible to exclude the formation step of the pillar-shaped wiring 538 and the first low potential pad wiring 532, hence making it possible to further shorten the lead time.

Additionally, the uneven structure 678 is formed in the protective layer 508 in the same way as the semiconductor device B3. This makes it possible to increase the creepage distance along the protective principal surface 582 of the protective layer 508 between the high potential terminal 514 and the low potential terminal 513, and makes it possible to increase the insulation distance between the high potential terminal 514 and the low potential terminal 513. Therefore, it is possible to suppress the occurrence of a creeping discharge in a region between the high potential terminal 514 and the low potential terminal 513, hence making it possible to suppress the breakage or the deterioration of the protective layer 508 between the high potential terminal 514 and the low potential terminal 513. As a result, it is possible to suppress a short circuit between the high potential terminal 514 and the low potential terminal 513, hence making it possible to suppress an additional breakage or an additional deterioration of the protective layer 508 caused by the short circuit.

Figure 50:
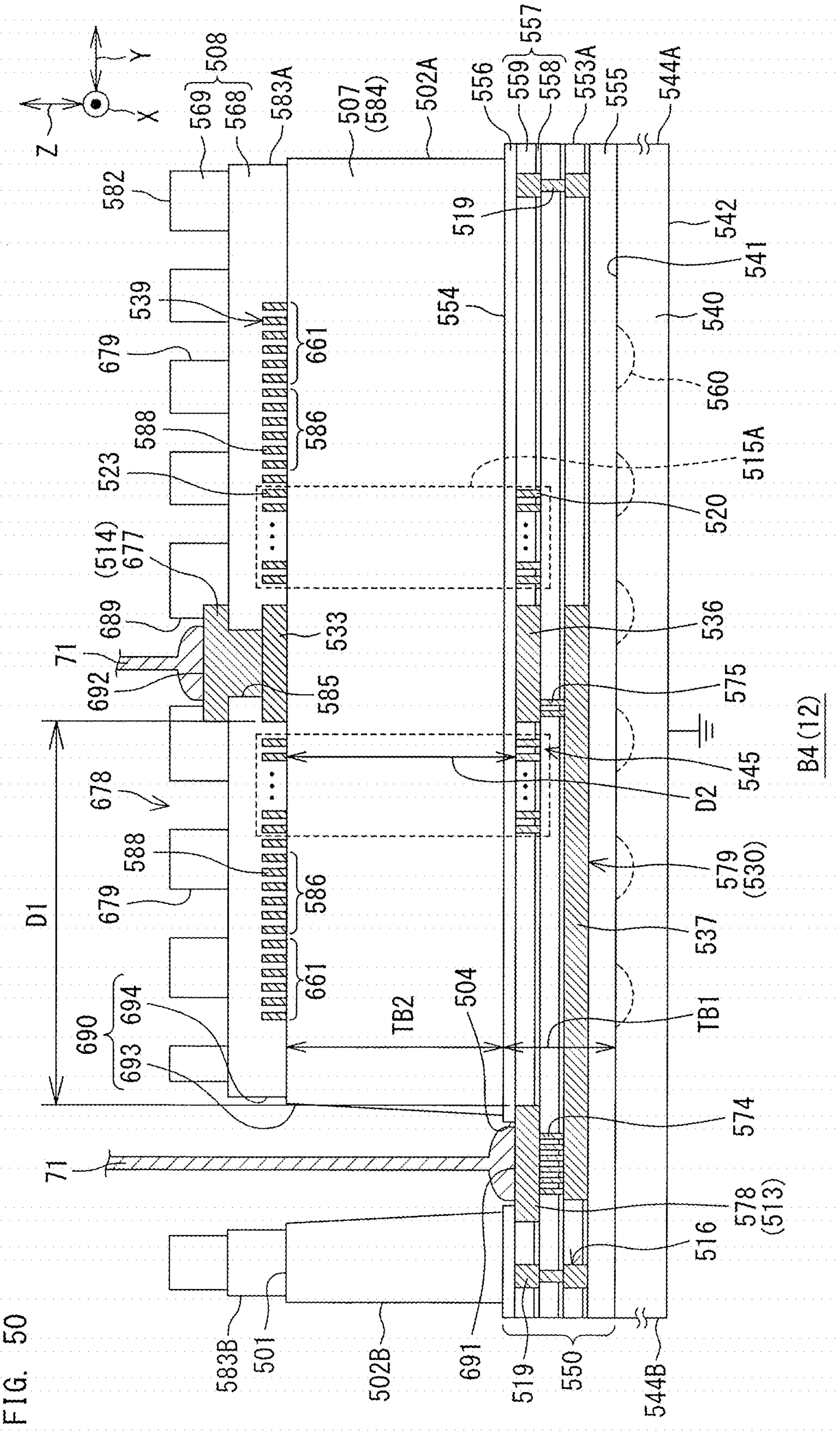
FIG. 50 is a schematic cross-sectional view of a semiconductor device according to one preferred embodiment of the present disclosure.

In the description above, the seal conductor 516 is connected to the semiconductor chip 540 through the seal via conductor 565, and is fixed to the ground potential. On the other hand, the seal conductor 516 is not necessarily required to be fixed to the ground potential by excluding the seal via conductor 565 as shown in FIG. 50.

<Structures of Semiconductor Devices C1 to C4>

First Preferred Embodiment

Figure 51:
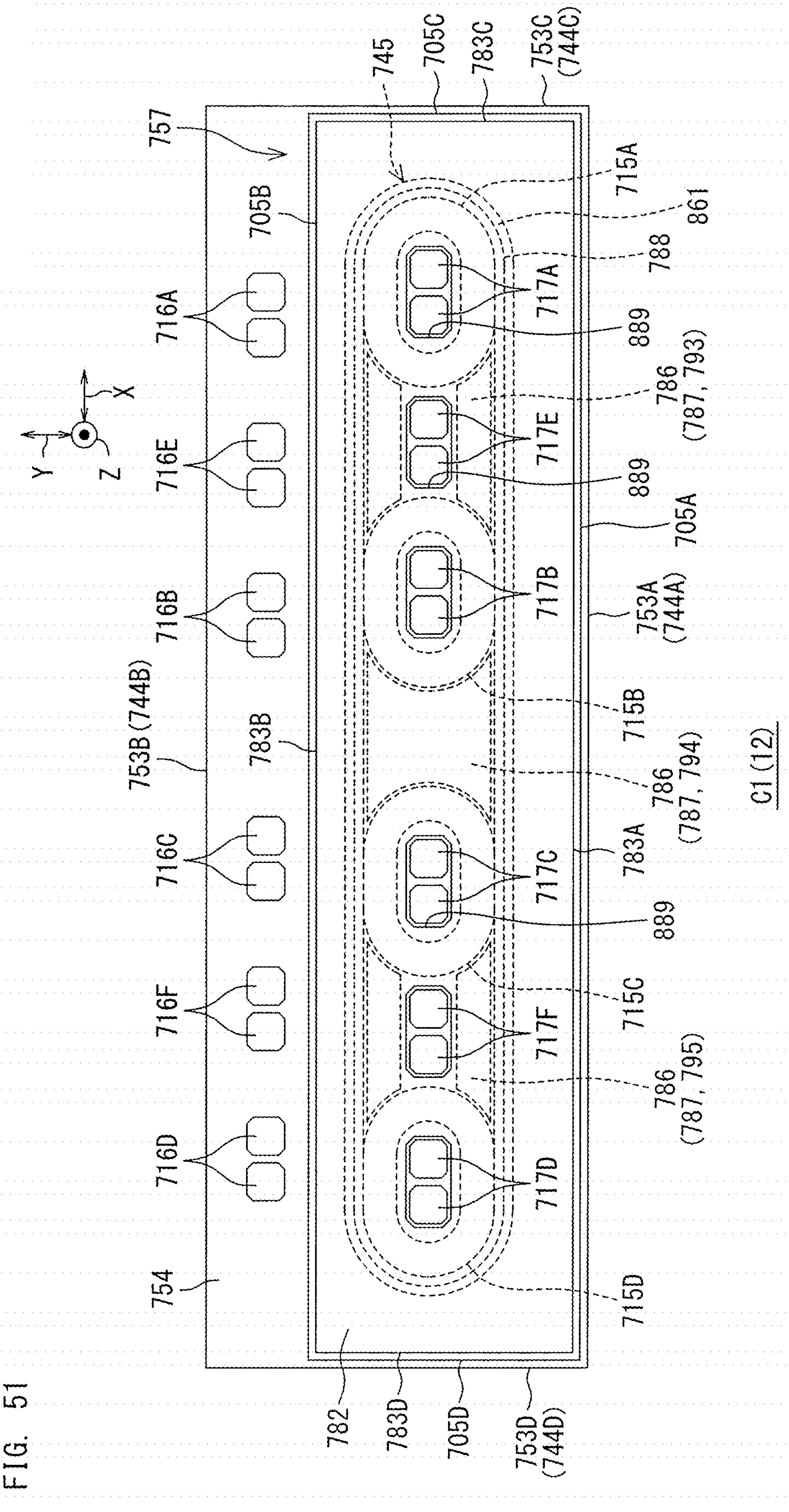
FIG. 51 is a schematic plan view of a semiconductor device according to one preferred embodiment of the present disclosure.
Figure 52:
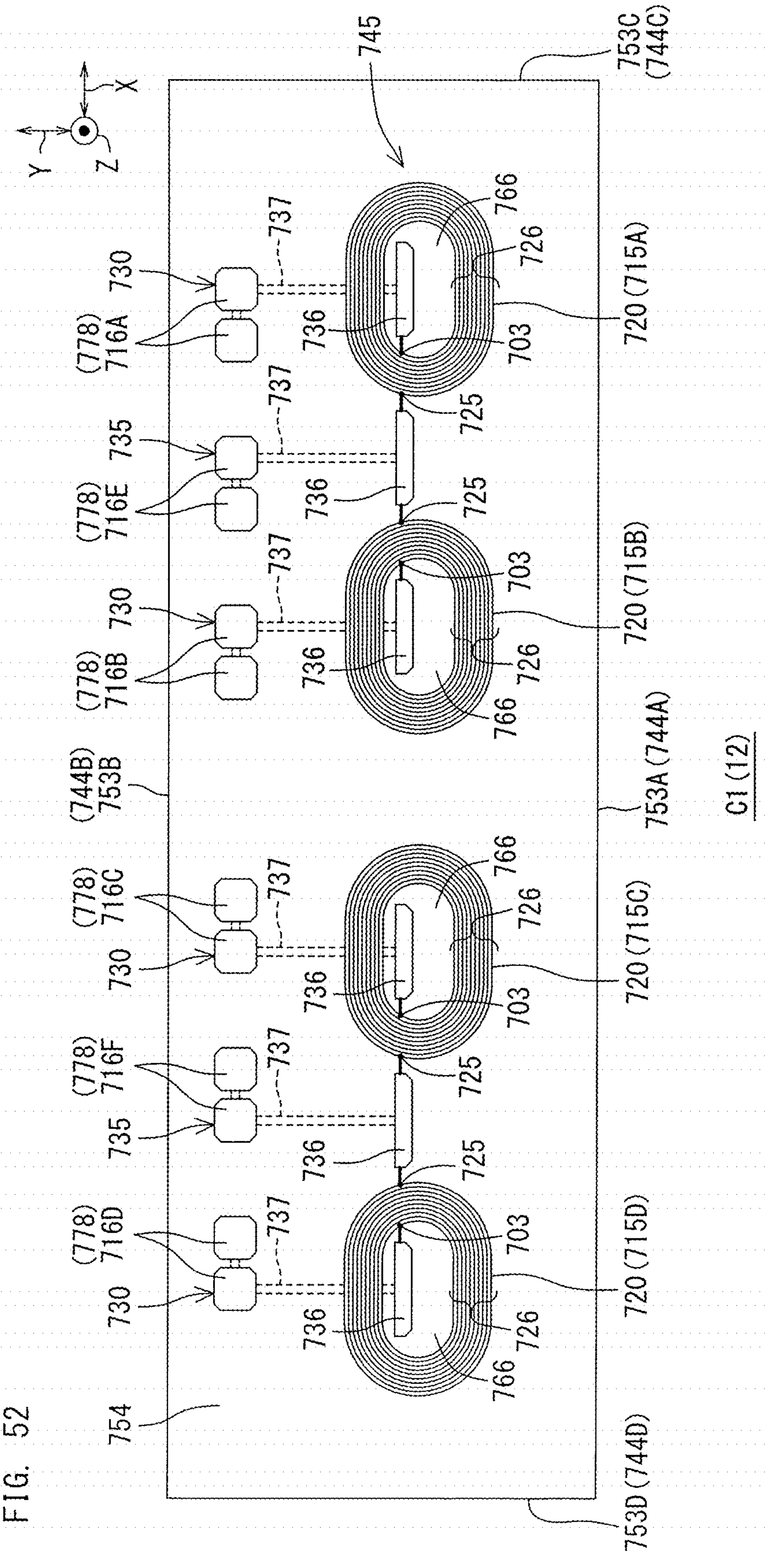
FIG. 52 is a plan view showing a layer in which a low potential coil is formed in the semiconductor device of FIG. 51.
Figure 53:
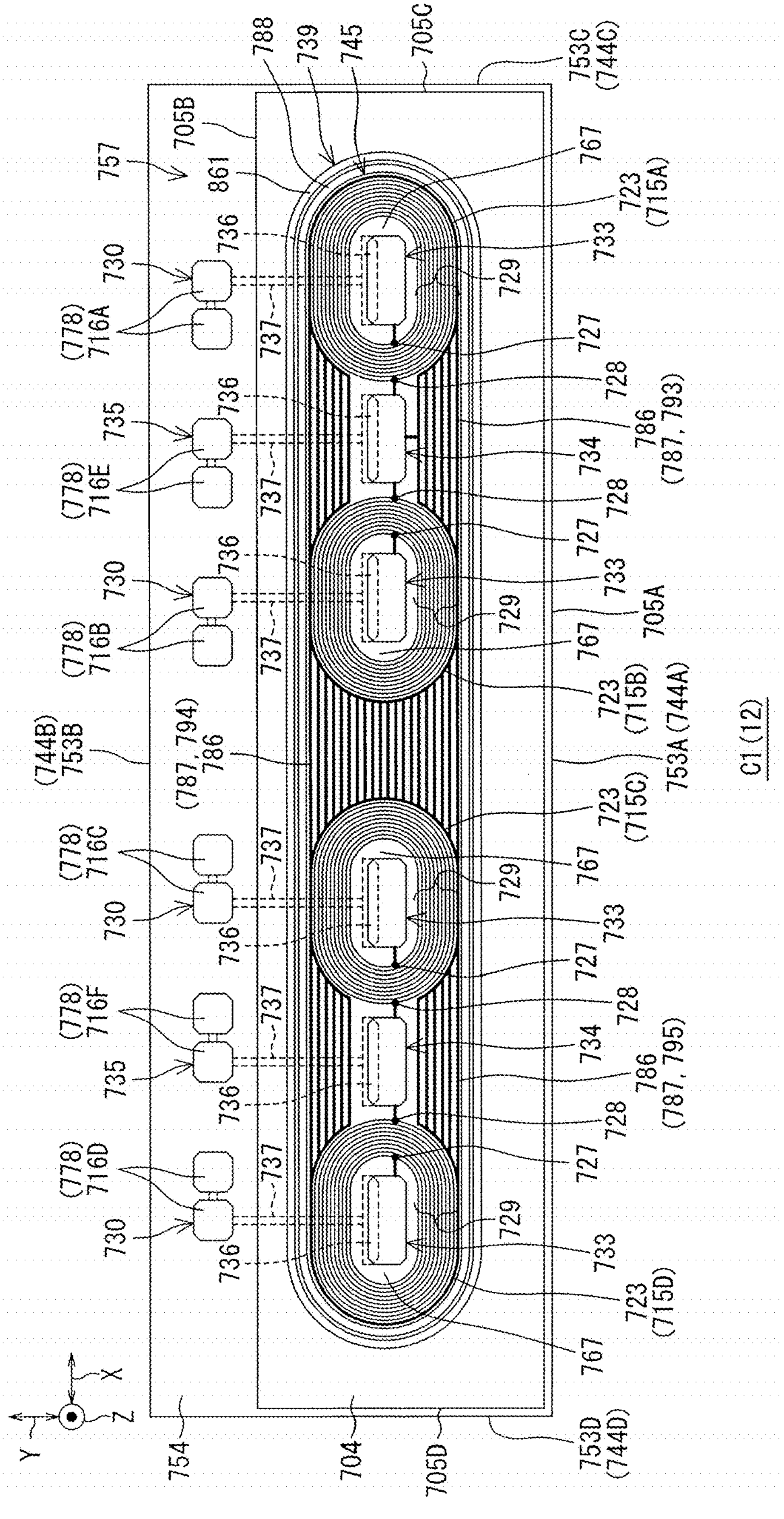
FIG. 53 is a plan view showing a layer in which a high potential coil is formed in the semiconductor device of FIG. 51.
Figure 54:
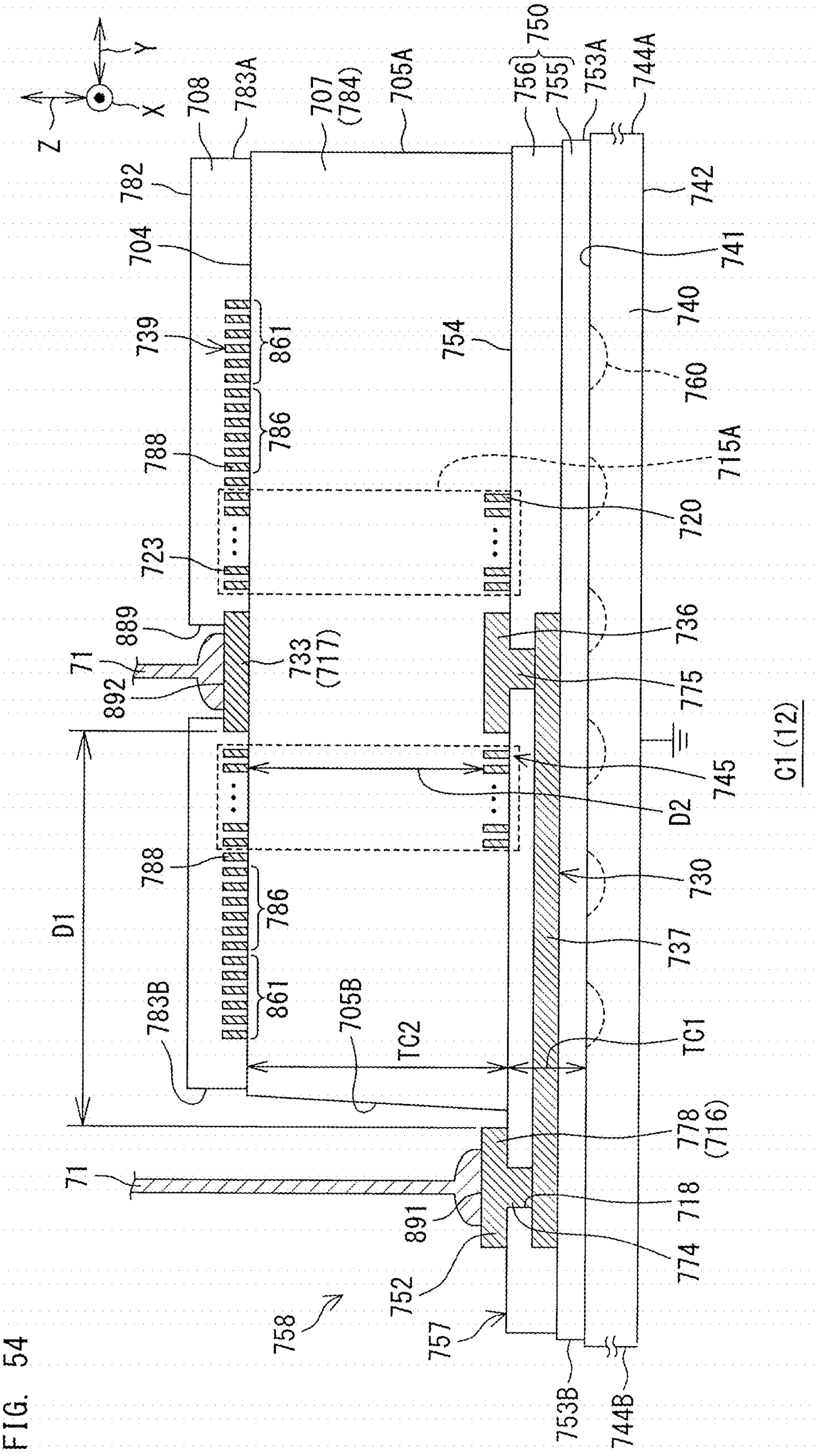
FIG. 54 is a schematic cross-sectional view of the semiconductor device of FIG. 51.

FIG. 51 is a schematic cross-sectional view of a semiconductor device C1 according to a preferred embodiment of the present disclosure. FIG. 52 is a plan view showing a layer in which a low potential coil is formed in the semiconductor device C1 of FIG. 51. FIG. 53 is a plan view showing a layer in which a high potential coil 723 is formed in the semiconductor device C1 of FIG. 51. FIG. 54 is a schematic cross-sectional view of the semiconductor device C1 of FIG. 51. FIG. 55 is an enlarged view of a main part of the semiconductor device C1 of FIG. 51.

Referring to FIG. 51 to FIG. 54, the semiconductor device C1 includes a rectangular parallelepiped shaped semiconductor chip 740. The semiconductor chip 740 includes at least one among silicon, a wide bandgap semiconductor, and a compound semiconductor.

The wide bandgap semiconductor is made of a semiconductor exceeding the bandgap of silicon (about 1.12 eV). Preferably, the bandgap of the wide bandgap semiconductor is 2.0 eV or more. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 740 includes a silicon-made semiconductor substrate. The semiconductor chip 740 may be an epitaxial substrate having a laminated structure including a silicon-made semiconductor substrate and a silicon-made epitaxial layer. The conductivity type of the semiconductor substrate may be an n type or may be a p type. The epitaxial layer may be an n type or may be a p type. Additionally, the semiconductor chip 740 may be fixed to the ground potential.

The semiconductor chip 740 has a first principal surface 741 on one side, a second principal surface 742 on the other side, and chip sidewalls 744A to 744D that connect the first principal surface 741 and the second principal surface 742. The first and second principal surfaces 741 and 742 are each formed in a quadrangular shape (in this embodiment, rectangular shape) in a plan view seen from their normal directions Z (hereinafter, referred to simply as a "plan view").

The chip sidewalls 744A to 744D include a first chip sidewall 744A, a second chip sidewall 744B, a third chip sidewall 744C, and a fourth chip sidewall 744D. Each of the first and second chip sidewalls 744A and 744B forms a long side of the semiconductor chip 740. The first and second chip sidewalls 744A and 744B extend along the first direction X, and face each other in the second direction Y. Each of the third and fourth chip sidewalls 744C and 744D forms a short side of the semiconductor chip 740. The third and fourth chip sidewalls 744C and 744D extend in the second direction Y, and face each other in the first direction X. The chip sidewalls 744A to 744D are each constituted of a ground surface.

The semiconductor device C1 includes a first insulating portion 750, a second insulating portion 707, and a protective layer 708 that are formed in this order on the first principal surface 741 of the semiconductor chip 740.

The first insulating portion 750 has an insulating principal surface 754 and insulating sidewalls 753A to 753D. The insulating principal surface 754 is formed in a quadrangular shape (in this embodiment, rectangular shape) that matches the first principal surface 741 in a plan view. The insulating principal surface 754 extends in parallel with the first principal surface 741.

The insulating sidewalls 753A to 753D include a first insulating sidewall 753A, a second insulating sidewall 753B, a third insulating sidewall 753C, and a fourth insulating sidewall 753D. The insulating sidewalls 753A to 753D extend from a peripheral edge of the insulating principal surface 754 toward the semiconductor chip 740, and are continuous with the chip sidewalls 744A to 744D. In detail, the insulating sidewalls 753A to 753D are formed so as to be flush with the chip sidewalls 744A to 744D. The insulating sidewalls 753A to 753D form ground surfaces flush with the chip sidewalls 744A to 744D, respectively.

The second insulating portion 707 is formed on the insulating principal surface 754, and has an insulating principal surface 704 and insulating sidewalls 705A to 705D. The insulating principal surface 704 is formed in a quadrangular shape (in this embodiment, rectangular shape) that matches the first principal surface 741 in a plan view. The insulating principal surface 704 extends in parallel with the first principal surface 741.

The insulating sidewalls 705A to 705D include a first insulating sidewall 705A, a second insulating sidewall 705B, a third insulating sidewall 705C, and a fourth insulating sidewall 705D. The insulating sidewalls 705A to 705D extend from a peripheral edge of the insulating principal surface 704 toward the semiconductor chip 740. In detail, the insulating sidewalls 705A to 705D are formed on an inward side with respect to the insulating sidewalls 753A to 753D. Hence, a level difference is formed between the insulating sidewalls 705A to 705D and the insulating sidewalls 753A to 753D.

The protective layer 708 is formed on the insulating principal surface 704, and has a protective principal surface 782 and protective sidewalls 783A to 783D. The protective principal surface 782 is formed in a quadrangular shape (in this embodiment, rectangular shape) so as to match the first principal surface 741 in a plan view. The protective principal surface 782 extends in parallel with the first principal surface 741.

The protective sidewalls 783A to 783D include a first protective sidewall 783A, a second protective sidewall 783B, a third protective sidewall 783C, and a fourth protective sidewall 783D. The protective sidewalls 783A to 783D extend from a peripheral edge of the protective principal surface 782 toward the semiconductor chip 740. In detail, the protective sidewalls 783A to 783D are formed on an inward side with respect to the insulating sidewalls 705A to 705D. Hence, a level difference is formed between the protective sidewalls 783A to 783D and the insulating sidewalls 705A to 705D.

The first insulating portion 750 is formed of a multilayer insulating laminated structure including a plurality of organic insulating layers. In this embodiment, the first insulating portion 750 includes a first organic insulating layer 755 and a second organic insulating layer 756. The second organic insulating layer 756 is a layer that forms the insulating principal surface 754, and may be referred to as an uppermost organic insulating layer. On the other hand, the first organic insulating layer 755 is a layer contiguous to the first principal surface 741 of the semiconductor chip 740, and may be referred to as an undermost organic insulating layer. Additionally, one or more organic insulating layers may be interposed between the first organic insulating layer 755 (undermost organic insulating layer) and the second organic insulating layer 756 (uppermost organic insulating layer).

The first organic insulating layer 755 and the second organic insulating layer 756 may be made of mutually-identical organic insulating layers, or may be made of mutually-different kinds of organic insulating layers. For example, the first organic insulating layer 755 may include at least one among polyimide, polyamide, and polybenzoxazole, and the second organic insulating layer 756 may be made of the same organic insulating material as the first organic insulating layer 755 or may be made of an organic insulating material differing in kind from the first organic insulating layer 755 among the organic insulating materials mentioned above.

Additionally, the thickness of the first organic insulating layer 755 and the thickness of the second organic insulating layer 756 may be equal to each other, or may be different from each other. Preferably, the thickness of the second organic insulating layer 756 is larger than the thickness of the first organic insulating layer 755 in this embodiment. For example, the thickness of the first organic insulating layer 755 may be not less than 0.5 μm and not more than 30 μm, and the thickness of the second organic insulating layer 756 may be not less than 0.5 μm and not more than 30 μm. The total thickness TC1 of the first insulating portion 750 may be not less than 1 μm and not more than 60 μm. The total thickness TC1 of the first insulating portion 750 is arbitrary, and is adjusted in accordance with a dielectric withstand voltage (dielectric breakdown resistance) to be realized.

The second insulating portion 707 has a layer structure including an organic insulating layer 784. The second insulating portion 707 consists of the single layer of the organic insulating layer 784 in this embodiment, and yet the second insulating portion 707 may have a laminated structure of a plurality of organic insulating layers. For example, a polyimide film, a phenol resin film, an epoxy resin film, etc., can be mentioned as the organic insulating layer 784. The total thickness TC2 of the second insulating portion 707 may be not less than 2 μm and not more than 100 μm. The total thickness TC2 of the second insulating portion 707 is arbitrary, and is adjusted in accordance with a dielectric withstand voltage (dielectric breakdown resistance) to be realized.

The protective layer 708 protects the second insulating portion 707, the first insulating portion 750, and the semiconductor chip 740 from above the insulating principal surface 704. The protective layer 708 may be made of an organic insulating layer, and may include a photosensitive resin. The protective layer 708 may include at least one among polyimide, polyamide, and polybenzoxazole. In this embodiment, the protective layer 708 includes polyimide.

A part of the first insulating portion 750 is exposed from the protective layer 708 and from the second insulating portion 707 as a pad region 757. In this embodiment, a space portion 758 opened toward the chip sidewall 744B side of the semiconductor chip 740 is formed between the insulating sidewall 705B of the second insulating portion 707, the protective sidewall 783B of the protective layer 708 and the insulating sidewall 753B of the first insulating portion 750. The space portion 758 is a region demarcated by the insulating principal surface 754, the insulating sidewall 705B, and the protective sidewall 783B, and the insulating principal surface 754 forming this space portion 758 forms the pad region 757. Additionally, the insulating sidewall 705B may be formed so as to be inclined with respect to the first principal surface 741 of the semiconductor chip 740. On the other hand, the protective sidewall 783B may be formed perpendicularly to the first principal surface 741 of the semiconductor chip 740. In other words, the sidewalls 705B and 783B forming the space portion 758 may have their parts inclined with respect to the normal direction Z of the first principal surface 741 of the semiconductor chip 740, and may have their other parts inclined with respect to the parts inclined with respect to the normal direction Z.

The semiconductor device C1 includes a first functional device 745. The first functional device 545 includes a single or a plurality of (in this embodiment, a plurality of) transformers 715. In other words, the semiconductor device C1 is formed of a multichannel type device including the transformers 715. The transformers 715 are formed at an inward portion of a laminated structure of the first and second insulating portions 750 and 707 at a distance from the insulating sidewalls 753A to 753D. The transformers 715 are formed at a distance from each other in the first direction X.

In detail, the transformers 715 include a first transformer 715A, a second transformer 715B, a third transformer 715C, and a fourth transformer 715D that are formed in this order from the insulating sidewall 753C side toward the insulating sidewall 753D side in a plan view. The first transformer 715A, the second transformer 715B, the third transformer 715C, and the fourth transformer 715D may correspond to the first transformer 131, the second transformer 132, the third transformer 133, and the fourth transformer 134 of FIG. 11, respectively. The transformers 715A to 715D each have the same structure. A structure of the first transformer 715A will be hereinafter described as an example. A description of structures of the second transformer 715B, the third transformer 715C, and the fourth transformer 715D is omitted on the condition that a description of the structure of the first transformer 715A is correspondingly applied.

Referring to FIG. 51 to FIG. 54, the first transformer 715A includes a low potential coil 720 and a high potential coil 723. The low potential coil 720 is formed on the first insulating portion 750. The high potential coil 723 is formed on the second insulating portion 707 so as to face the low potential coil 720 in the normal direction Z. The low potential coil 720 is formed at the insulating principal surface 754 of the first insulating portion 750. The high potential coil 723 is formed at the insulating principal surface 704 of the second insulating portion 707. In other words, the high potential coil 723 faces the semiconductor chip 740 with the low potential coil 720 between the high potential coil 723 and the semiconductor chip 740. Disposition places of the low potential coil 720 and the high potential coil 723 are arbitrary. Additionally, the high potential coil 723 is merely required to face the low potential coil 720 with the second insulating portion 707 between the high potential coil 723 and the low potential coil 720.

The distance D2 between the low potential coil 720 and the high potential coil 723 (i.e., the thickness of the second insulating portion 707) is appropriately adjusted in accordance with a dielectric withstand voltage or an electric field strength between the low potential coil 720 and the high potential coil 723. In this embodiment, the low potential coil 720 is formed at the insulating principal surface 754 of the first insulating portion 750. On the other hand, the high potential coil 723 is formed at the insulating principal surface 704 of the second insulating portion 707. Therefore, the second insulating portion 707 is interposed between the low potential coil 720 and the high potential coil 723.

The low potential coil 720 is formed so as to be erected from the insulating principal surface 754 of the first insulating portion 750 to the side opposite to the semiconductor chip 740. The low potential coil 720 is covered by the second insulating portion 707 from its top portion side. The low potential coil 720 includes a first inner end 703, a first outer end 725, and a first helical portion 726 that is helically routed around between the first inner end 703 and the first outer end 725 as shown in FIG. 52. The first helical portion 726 is helically routed around while extending in an elliptical shape (oval shape) in a plan view. A part, which forms an innermost peripheral edge, of the first helical portion 726 demarcates a first inner region 766 having an elliptical shape in a plan view.

The number of winding turns of the first helical portion 726 may be not less than 3 and not more than 30. The width of the first helical portion 726 may be not less than 0.1 μm and not more than 10 μm. Preferably, the width of the first helical portion 726 is not less than 1 μm and not more than 5 μm. The width of the first helical portion 726 is defined by a width in the direction perpendicular to the helical direction. A first winding pitch of the first helical portion 726 may be not less than 0.1 μm and not more than 20 μm. Preferably, the first winding pitch is not less than 1 μm and not more than 10 μm. The first winding pitch is defined by a distance between two parts, which adjoin each other in the direction perpendicular to the helical direction, of the first helical portion 726.

The wound shape of the first helical portion 726 or the planar shape of the first inner region 766 is arbitrary, and is not limited to the form shown in FIG. 52, etc. The first helical portion 726 may be wound in a polygonal shape, such as a triangular shape or a quadrangular shape, or in a circular shape in a plan view. The first inner region 766 may be demarcated so as to be a polygonal shape, such as a triangular shape or a quadrangular shape, or so as to be a circular shape in a plan view in accordance with the wound shape of the first helical portion 726. Additionally, a part of the second insulating portion 707 enters a gap of the first helical portion 726.

The low potential coil 720 may include at least one among titanium, titanium nitride, copper, aluminum, and tungsten. The low potential coil 720 may have a laminated structure including a barrier layer and a main body layer. The barrier layer is formed in a flat shape along the insulating principal surface 754 of the first insulating portion 750. The main body layer is laminated on the barrier layer. The barrier layer may include at least one of titanium and titanium nitride. The main body layer may include at least one among copper, aluminum, and tungsten.

The high potential coil 723 is formed so as to be erected from the insulating principal surface 704 of the second insulating portion 707 to the side opposite to the first insulating portion 750. The high potential coil 723 is covered with the protective layer 708 from its top portion side. The high potential coil 723 includes a second inner end 727, a second outer end 728, and a second helical portion 729 helically routed around between the second inner end 727 and the second outer end 728 as shown in FIG. 53. The second helical portion 729 is helically routed around while extending in an elliptical shape (oval shape) in a plan view. In this embodiment, a part, which forms an innermost peripheral edge, of the second helical portion 729 demarcates a second inner region 767 having an elliptical shape in a plan view. The second inner region 767 of the second helical portion 729 faces the first inner region 766 of the first helical portion 726 in the normal direction Z.

The number of winding turns of the second helical portion 729 may be not less than 5 and not more than 30. The number of winding turns of the second helical portion 729 with respect to the number of winding turns of the first helical portion 726 is adjusted in accordance with a voltage value to be increased. Preferably, the number of winding turns of the second helical portion 729 exceeds the number of winding turns of the first helical portion 726. Of course, the number of winding turns of the second helical portion 729 may be less than the number of winding turns of the first helical portion 726, or may be equal to the number of winding turns of the first helical portion 726.

The width of the second helical portion 729 may be not less than 0.1 μm and not more than 10 μm. Preferably, the width of the second helical portion 729 is not less than 1 μm and not more than 5 μm. The width of the second helical portion 729 is defined by a width in the direction perpendicular to the helical direction. Preferably, the width of the second helical portion 729 is equal to the width of the first helical portion 726.

A second winding pitch of the second helical portion 729 may be not less than 0.1 μm and not more than 20 μm. Preferably, the second winding pitch is not less than 1 μm and not more than 10 μm. The second winding pitch is defined by a distance between two parts, which adjoin each other in the direction perpendicular to the helical direction, of the second helical portion 729. Preferably, the second winding pitch is equal to the first winding pitch of the first helical portion 726.

The wound shape of the second helical portion 729 or the planar shape of the second inner region 767 is arbitrary, and is not limited to the form shown in FIG. 53, etc. The second helical portion 729 may be wound in a polygonal shape, such as a triangular shape or a quadrangular shape, or in a circular shape in a plan view. The second inner region 767 may be demarcated so as to be a polygonal shape, such as a triangular shape or a quadrangular shape, or so as to be a circular shape in a plan view in accordance with the wound shape of the second helical portion 729. Additionally, a part of the protective layer 708 enters a gap of the second helical portion 729.

The high potential coil 723 may include at least one among titanium, titanium nitride, copper, aluminum, and tungsten. The high potential coil 723 may have a laminated structure including a barrier layer and a main body layer. The barrier layer is formed in a flat shape along the insulating principal surface 704 of the second insulating portion 707. The main body layer is laminated on the barrier layer. The barrier layer may include at least one of titanium and titanium nitride. The main body layer may include at least one among copper, aluminum, and tungsten.

Referring to FIG. 51, the semiconductor device C1 includes a plurality of (in this embodiment, twelve) low potential terminals 716 and a plurality of (in this embodiment, twelve) high potential terminals 717. The low potential terminals 716 are each electrically connected to the low potential coil 720 of corresponding transformers 715A to 715D. The high potential terminals 717 are each electrically connected to the high potential coil 723 of corresponding transformers 715A to 715D.

The low potential terminals 716 are formed on the pad region 757 of the first insulating portion 750. In detail, the low potential terminals 716 are formed in a region on the insulating sidewall 753B side at a distance in the second direction Y from the transformers 715A to 715D, and are arranged at a distance from each other in the first direction X.

The low potential terminals 716 include a first low potential terminal 716A, a second low potential terminal 716B, a third low potential terminal 716C, a fourth low potential terminal 716D, a fifth low potential terminal 716E, and a sixth low potential terminal 716F. In this embodiment, the low potential terminals 716A to 716F are each formed as two low potential terminals. The number of the low potential terminals 716A to 716F is arbitrary.

The first low potential terminal 716A faces the first transformer 715A in the second direction Y in a plan view. The second low potential terminal 716B faces the second transformer 715B in the second direction Y in a plan view. The third low potential terminal 716C faces the third transformer 715C in the second direction Y in a plan view. The fourth low potential terminal 716D faces the fourth transformer 715D in the second direction Y in a plan view. The fifth low potential terminal 716E is formed in a region between the first low potential terminal 716A and the second low potential terminal 716B in a plan view. The sixth low potential terminal 716F is formed in a region between the third low potential terminal 716C and the fourth low potential terminal 716D in a plan view.

The first low potential terminal 716A is electrically connected to the first inner end 703 of the first transformer 715A (low potential coil 720). The second low potential terminal 716B is electrically connected to the first inner end 703 of the second transformer 715B (low potential coil 720). The third low potential terminal 716C is electrically connected to the first inner end 703 of the third transformer 715C (low potential coil 720). The fourth low potential terminal 716D is electrically connected to the first inner end 703 of the fourth transformer 715D (low potential coil 720).

The fifth low potential terminal 716E is electrically connected to the first outer end 725 of the first transformer 715A (low potential coil 720) and to the first outer end 725 of the second transformer 715B (low potential coil 720). The sixth low potential terminal 716F is electrically connected to the first outer end 725 of the third transformer 715C (low potential coil 720) and to the first outer end 725 of the fourth transformer 715D (low potential coil 720).

In other words, the low potential terminals 716A to 716D connected to the first inner end 703 of each of the transformers 715A to 715D are disposed closer to each of the transformers 15A to 15D than to the low potential terminals 716E and 716F connected to the first outer end 725 of each of the transformers 715A to 715D. For example, the first low potential terminal 716A connected to the first inner end 703 of the first transformer 715A is disposed closer to the first transformer 715A than to the fifth low potential terminal 716E connected to the first outer end 725 of the first transformer 715A. The same applies to a disposition relationship of the second and fifth low potential terminals 716B and 716E with respect to the second transformer 715B, a disposition relationship of the third and sixth low potential terminals 716C and 716F with respect to the third transformer 715C, and a disposition relationship of the fourth and sixth low potential terminals 716D and 716F with respect to the fourth transformer 715D.

The high potential terminals 717 are formed on the insulating principal surface 704 of the second insulating portion 707 at a distance from the low potential terminals 716. In detail, the high potential terminals 717 are formed in a region on the insulating sidewall 753A side at a distance in the second direction Y from the low potential terminals 716, and are arranged at a distance from each other in the first direction X.

The high potential terminals 717 are each formed in a region in proximity to corresponding transformers 715A to 715D in a plan view. That the high potential terminal 717 is in proximity to the transformers 715A to 715D means that the distance between the high potential terminal 717 and the transformer 715 is less than the distance between the low potential terminal 716 and the high potential terminal 717 in a plan view.

In detail, the high potential terminals 717 are formed at a distance along the first direction X so as to face the transformers 715A to 715D along the first direction X in a plan view. In more detail, the high potential terminals 717 are formed at a distance along the first direction X so as to be placed in the second inner region 767 of the high potential coil 723 and in a region between adjoining high potential coils 723 in a plan view. Hence, the high potential terminals 717 are arranged side by side with the transformers 715A to 715D in a line in the first direction X in a plan view.

The high potential terminals 717 include a first high potential terminal 717A, a second high potential terminal 717B, a third high potential terminal 717C, a fourth high potential terminal 717D, a fifth high potential terminal 717E, and a sixth high potential terminal 717F. In this embodiment, the high potential terminals 717A to 717F are each formed as two high potential terminals. The number of the high potential terminals 717A to 717F is arbitrary.

The first high potential terminal 717A is formed in the second inner region 767 of the first transformer 715A (high potential coil 723) in a plan view. The second high potential terminal 717B is formed in the second inner region 767 of the second transformer 715B (high potential coil 723) in a plan view. The third high potential terminal 717C is formed in the second inner region 767 of the third transformer 715C (high potential coil 723) in a plan view. The fourth high potential terminal 717D is formed in the second inner region 767 of the fourth transformer 715D (high potential coil 723) in a plan view. The fifth high potential terminal 717E is formed in a region between the first transformer 715A and the second transformer 715B in a plan view. The sixth high potential terminal 717F is formed in a region between the third transformer 715C and the fourth transformer 715D in a plan view.

The first high potential terminal 717A is electrically connected to the second inner end 727 of the first transformer 715A (high potential coil 723). The second high potential terminal 717B is electrically connected to the second inner end 727 of the second transformer 715B (high potential coil 723). The third high potential terminal 717C is electrically connected to the second inner end 727 of the third transformer 715C (high potential coil 723). The fourth high potential terminal 717D is electrically connected to the second inner end 727 of the fourth transformer 715D (high potential coil 723).

The fifth high potential terminal 717E is electrically connected to the second outer end 728 of the first transformer 715A (high potential coil 723) and the second outer end 728 of the second transformer 715B (high potential coil 723). The sixth high potential terminal 717F is electrically connected to the second outer end 728 of the third transformer 715C (high potential coil 723) and the second outer end 728 of the fourth transformer 715D (high potential coil 723).

Referring to FIG. 52 and FIG. 53, the semiconductor device C1 includes a first low potential wiring 730, a second low potential wiring 735, a first high potential wiring 733, and a second high potential wiring 734. In this embodiment, a plurality of first low potential wirings 730, a plurality of second low potential wirings 735, a plurality of first high potential wirings 733, and a plurality of second high potential wirings 734 are formed.

The first low potential wiring 730 and the second low potential wiring 735 fix the low potential coil 720 of the first transformer 715A and the low potential coil 720 of the second transformer 715B to the same potential. Additionally, the first low potential wiring 730 and the second low potential wiring 735 fix the low potential coil 720 of the third transformer 715C and the low potential coil 720 of the fourth transformer 715D to the same potential. In this embodiment, the first low potential wiring 730 and the second low potential wiring 735 fix all of the low potential coils 720 of the transformers 715A to 715D to the same potential.

The first high potential wiring 733 and the second high potential wirings 734 fix the high potential coil 723 of the first transformer 715A and the high potential coil 723 of the second transformer 715B to the same potential. Additionally, the first high potential wiring 733 and the second high potential wirings 734 fix the high potential coil 723 of the third transformer 715C and the high potential coil 723 of the fourth transformer 715D to the same potential. In this embodiment, the first high potential wiring 733 and the second high potential wirings 734 fix all of the high potential coils 723 of the transformers 715A to 715D to the same potential.

The first low potential wirings 730 are each electrically connected to corresponding low potential terminals 713A to 713D and to the first inner ends 703 of corresponding transformers 715A to 715D (low potential coils 720). The first low potential wirings 730 have the same structure. A structure of the first low potential wiring 730 connected to the first low potential terminal 716A and to the first transformer 715A will be hereinafter described as an example. A description of structures of other first low potential wirings 730 is omitted on the condition that a description of the structure of the first low potential wiring 730 connected to the first transformer 715A is correspondingly applied.

The first low potential wiring 730 is connected to the low potential coil 720. The first low potential wiring 730 extends through a region below the low potential coil 720 in the first insulating portion 750, and reaches the insulating principal surface 754 of the first insulating portion 750 (boundary portion between the first insulating portion 750 and the second insulating portion 707).

The first low potential wiring 730 includes a low potential connection wiring 736, a lead-out wiring 737, and a first low potential pad wiring 778. Preferably, the low potential connection wiring 736, the lead-out wiring 737, and the first low potential pad wiring 778 are each made of the same conductive material as the low potential coil 720, etc. In other words, preferably, each of the low potential connection wiring 736, the lead-out wiring 737, and the first low potential pad wiring 778 includes a barrier layer and a main body layer in the same way as the low potential coil 720, etc.

The low potential connection wiring 736 is formed in the first inner region 766 of the first transformer 715A (low potential coil 720) in the same layer (i.e., the insulating principal surface 754 of the first insulating portion 750) as the low potential coil 720. The low potential connection wiring 736 is formed in an island shape, and faces the high potential terminal 717 (first high potential terminal 714A) in the normal direction Z. The low potential connection wiring 736 is electrically connected to the first inner end 703 of the low potential coil 720. A part of the low potential connection wiring 736 is buried in the first insulating portion 750 as a plug portion 775, and this plug portion 775 is connected to the lead-out wiring 737.

The lead-out wiring 737 is formed in a region between the insulating principal surface 754 and the semiconductor chip 740 in the first insulating portion 750. In this embodiment, the lead-out wiring 737 is formed on the first organic insulating layer 755, and is covered with the second organic insulating layer 756. The lead-out wiring 737 includes a first end portion on one side, a second end portion on the other side, and a wiring portion connecting the first and second end portions. The first end portion of the lead-out wiring 737 is placed in a region between the semiconductor chip 740 and the first low potential pad wiring 778. The second end portion of the lead-out wiring 737 is placed in a region between the semiconductor chip 740 and the low potential connection wiring 736. The wiring portion extends along the first principal surface 741 of the semiconductor chip 740, and extends in a belt shape in a region between the first and second end portions.

The first low potential pad wiring 778 is exposed as a low potential pad 891 (low potential terminal 716). A covering layer including at least one of palladium and nickel may be formed on a surface of the low potential pad 891. The first low potential pad wiring 778 is formed in the pad region 757 in the same layer as the low potential coil 720 (in other words, the insulating principal surface 754 of the first insulating portion 750). The first low potential pad wiring 778 has a plug portion 774 buried in a penetrating hole 718 formed in the second organic insulating layer 756 and a lead-out portion 752 that is led out from the plug portion 774 to a region not overlapping with the penetrating hole 718 as shown in FIG. 55. The lead-out portion 752 has a width wider than the plug portion 774.

This makes it possible to suppress a connection defect of the bonding wire 71 with respect to the low potential terminal 716. For example, when a conductive material of the first low potential pad wiring 778 is buried in the penetrating hole 718, there is a case in which an upper surface of the first low potential pad wiring 778 that has been buried is concaved at a position coinciding with the penetrating hole 718 depending on the size of the diameter of the penetrating hole 718. However, in this embodiment, the lead-out portion 752 is formed by leading out a part of the first low potential pad wiring 778 onto the flat insulating principal surface 754 of the first insulating portion 750, and the bonding wire 71 is connected to this lead-out portion 752. As a result, it is possible to excellently connect the bonding wire 71 to the low potential terminal 716.

The second low potential wirings 735 are each electrically connected to corresponding low potential terminals 716E and 716F and to the first outer end 725 of the low potential coil 720 of corresponding transformers 715A to 715D as shown in FIG. 52. The second low potential wirings 735 each have the same structure as the first low potential wiring 730.

Referring to FIG. 53, the first high potential wirings 733 are each electrically connected to corresponding high potential terminals 717A to 717D and to the second inner end 727 of corresponding transformers 715A to 715D (high potential coil 723). The first high potential wirings 733 each have the same structure. The first high potential wiring 733 may form the high potential terminal 717 mentioned above. A structure of the first high potential wiring 733 connected to the first high potential terminal 717A and to the first transformer 715A will be hereinafter described as an example. A description of structures of other first high potential wirings 733 is omitted on the condition that a description of the structure of the first high potential wiring 733 connected to the first transformer 715A is correspondingly applied.

Preferably, the first high potential wiring 733 is made of the same conductive material as the high potential coil 723. In other words, preferably, the first high potential wirings 733 each include a barrier layer and a main body layer in the same way as the high potential coil 723, etc. The first high potential wiring 733 is formed in the second inner region 767 of the high potential coil 723 on the second insulating portion 707. The first high potential wiring 733 is formed in an island shape, and is electrically connected to the second inner end 727 of the high potential coil 723. The first high potential wiring 733 faces the low potential connection wiring 736 with the second insulating portion 707 between the first high potential wiring 733 and the low potential connection wiring 736 in the normal direction Z. Additionally, the first high potential wiring 733 may be referred to as a first high potential pad electrode layer because the first high potential wiring 733 is formed in an island shape.

The second high potential wirings 734 are each electrically connected to corresponding high potential terminals 717E and 717F and to the second outer ends 728 of corresponding transformers 715A to 715D (high potential coils 723). The second high potential wirings 734 each have the same structure. A structure of the second high potential wiring 734 connected to the fifth high potential terminal 717E and to the first transformer 715A (second transformer 715B) will be hereinafter described as an example. A description of structures of other second high potential wirings 734 is omitted on the condition that a description of the structure of the second high potential wiring 734 connected to the first transformer 715A (second transformer 715B) is correspondingly applied.

The second high potential wiring 734 has the same structure as the first high potential wiring 733 except that the second high potential wirings 734 is electrically connected to the second outer end 728 of the first transformer 715A (high potential coil 723) and to the second outer end 728 of the second transformer 715B (high potential coil 723). In other words, the second high potential wiring 734 is formed in an island shape. The second high potential wiring 734 may be referred to as a second high potential pad electrode layer because the second high potential wiring 734 is formed in an island shape.

The second high potential wiring 734 is formed around the high potential coil 723 on the second insulating portion 707. The second high potential wiring 734 is formed in a region between two adjoining high potential coils 723 in a plan view, and faces the high potential terminal 717 (fifth high potential terminal 717E) in the normal direction Z. The second high potential wiring 734 faces the low potential connection wiring 736 with the second insulating portion 707 between the second high potential wiring 734 and the low potential connection wiring 736 in the normal direction Z.

Referring to FIG. 54, preferably, a distance D1 between the low potential terminal 716 and the high potential terminal 717 exceeds a distance D2 between the low potential coil 720 and the high potential coil 723 (D2<D1). Preferably, the distance D1 exceeds the sum of the total thickness TC1 of the first insulating portion 750 and the total thickness TC2 of the second insulating portion 707 (TC1+TC2<D1). The ratio D2/D1 of the distance D2 with respect to the distance D1 may be not less than 0.005 and not more than 0.5. Preferably, the distance D1 is not less than 100 μm and not more than 1000 μm. The distance D2 may be not less than 2 μm and not more than 120 μm. Preferably, the distance D2 is not less than 5 μm and not more than 50 μm. The value of the distance D1 and the value of the distance D2 are arbitrary, and are appropriately adjusted in accordance with a dielectric withstand voltage to be realized.

Referring to FIG. 53 and FIG. 54, the semiconductor device C1 includes a dummy pattern 739 formed on the second insulating portion 707 so as to be placed around the transformers 715A to 715D in a plan view.

The dummy pattern 739 may have a shape that is the same as the dummy pattern 39 of the semiconductor device A1. For example, the dummy pattern 739 may include a high potential dummy pattern 786 having a shape corresponding to the high potential dummy pattern 86, a first high potential dummy pattern 787 having a shape corresponding to the first high potential dummy pattern 87, a second high potential dummy pattern 788 having a shape corresponding to the second high potential dummy pattern 88, and a floating dummy pattern 861 having a shape corresponding to the floating dummy pattern 161. In FIG. 54, the high potential dummy pattern 786, the second high potential dummy pattern 788, and the floating dummy pattern 861 are shown.

Referring to FIG. 54, the semiconductor device C1 includes a second functional device 760 formed at the first principal surface 741 of the semiconductor chip 740. The second functional device 760 is formed by utilizing a surface layer portion of the first principal surface 741 of the semiconductor chip 740 and/or a region on the first principal surface 741 of the semiconductor chip 740, and is covered by the first insulating portion 750 (first organic insulating layer 755). In FIG. 54, the second functional device 760 is simplified and shown by the broken line shown in the surface layer portion of the first principal surface 741.

The second functional device 760 is electrically connected to the low potential terminal 716 through a low potential wiring, and is electrically connected to the high potential terminal 717 through a high potential wiring. The second functional device 760 may include at least one among a passive device, a semiconductor rectifying device, and a semiconductor switching device. The second functional device 760 may include a circuit network in which two or more kinds of arbitrary devices among the passive device, the semiconductor rectifying device, and the semiconductor switching device are selectively combined. The circuit network may form a part or all of an integrated circuit.

The passive device may include a semiconductor passive device. The passive device may include either one or both of a resistor and a capacitor. The semiconductor rectifying device may include at least one among a pn junction diode, a PIN diode, a Zener diode, a Schottky barrier diode, and a fast-recovery diode. The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

Referring to FIG. 54, the protective layer 708 is formed on the insulating principal surface 704 of the second insulating portion 707 so as to cover the high potential coil 723, the high potential terminal 717, and the dummy pattern 739. The protective layer 708 may be referred to as a passivation layer.

The thickness of the protective layer 708 may be not less than 1 μm and not more than 100 μm. Preferably, the thickness of the protective layer 708 is equal to or larger than the distance D2 between the low potential coil 720 and the high potential coil 723. In this case, preferably, the thickness of the protective layer 708 is not less than 5 μm and not more than 50 μm. With these structures, it is possible to suppress the thickening of the protective layer 708, and at the same time, it is possible to appropriately raise a dielectric withstand voltage on the high potential coil 723 by means of the protective layer 708.

The protective layer 708 has a plurality of high potential terminal openings 889 that respectively expose the high potential terminals 717. The high potential terminal 717 exposed from the high potential terminal opening 889 may be referred to as a high potential pad 892. A covering layer including at least one of palladium and nickel may be formed on a surface of the high potential pad 892.

As described above, with this semiconductor device C1, the second insulating portion 707 made of the organic insulating layer 784 is formed between the low potential coil 720 and the high potential coil 723. Therefore, it is possible to achieve a dielectric withstand voltage between the low potential coil 720 and the high potential coil 723 by means of the thickening of the second insulating portion 707. If the organic insulating layer 784 is used, it is possible to thicken the second insulating portion 707 with only one kind of organic insulating material (resin material) without forming a laminated structure consisting of several kinds of mutually-different insulating materials, such as inorganic insulating layers. It is possible to easily achieve thickening by, for example, the spin coating method. As a result, it is possible to make a lead time shorter and make costs lower.

Additionally, in this semiconductor device C1, the first insulating portion 750 made of the organic insulating layers 755, 756 is interposed also between the low potential coil 720 and the semiconductor chip 740. Therefore, it is also possible to shorten a lead time required when a structure is formed to insulate the low potential coil 720 and the semiconductor chip 740 from each other.

Additionally, the low potential terminal 716 is formed in the pad region 757 opened toward the end-surface (chip sidewall 744B) side of the semiconductor chip 740. This makes it possible to widen the degree of freedom of a connection angle (angle formed between the low potential pad 891 and the bonding wire 71) of the bonding wire 71 with respect to the low potential terminal 716.

Additionally, the low potential pad 891 is formed in the pad region 757 formed at the insulating principal surface 754 of the first insulating portion 750, and therefore there is no need to form a wiring electrically connected to the low potential coil 720 in the second insulating portion 707. This makes it possible to make the lead time still shorter.

Additionally, an upper corner portion of the second insulating portion 707 formed by allowing the insulating principal surface 704 of the second insulating portion 707 and the insulating sidewalls 705A to 705D to intersect each other may have a certain angle as shown in FIG. 54 or may be formed in a round shape so as to be curved in a cross-sectional view. Additionally, the entirety of the insulating principal surface 704 may be formed in a curved surface shape that swells to the side opposite to the semiconductor chip 740.

Additionally, the second insulating portion 707 may have a laminated structure consisting of a plurality of organic insulating layers. In this case, the organic insulating layers may be made of mutually-identical organic insulating materials, or may be made of mutually-different organic insulating materials.

Second Preferred Embodiment

Figure 56:
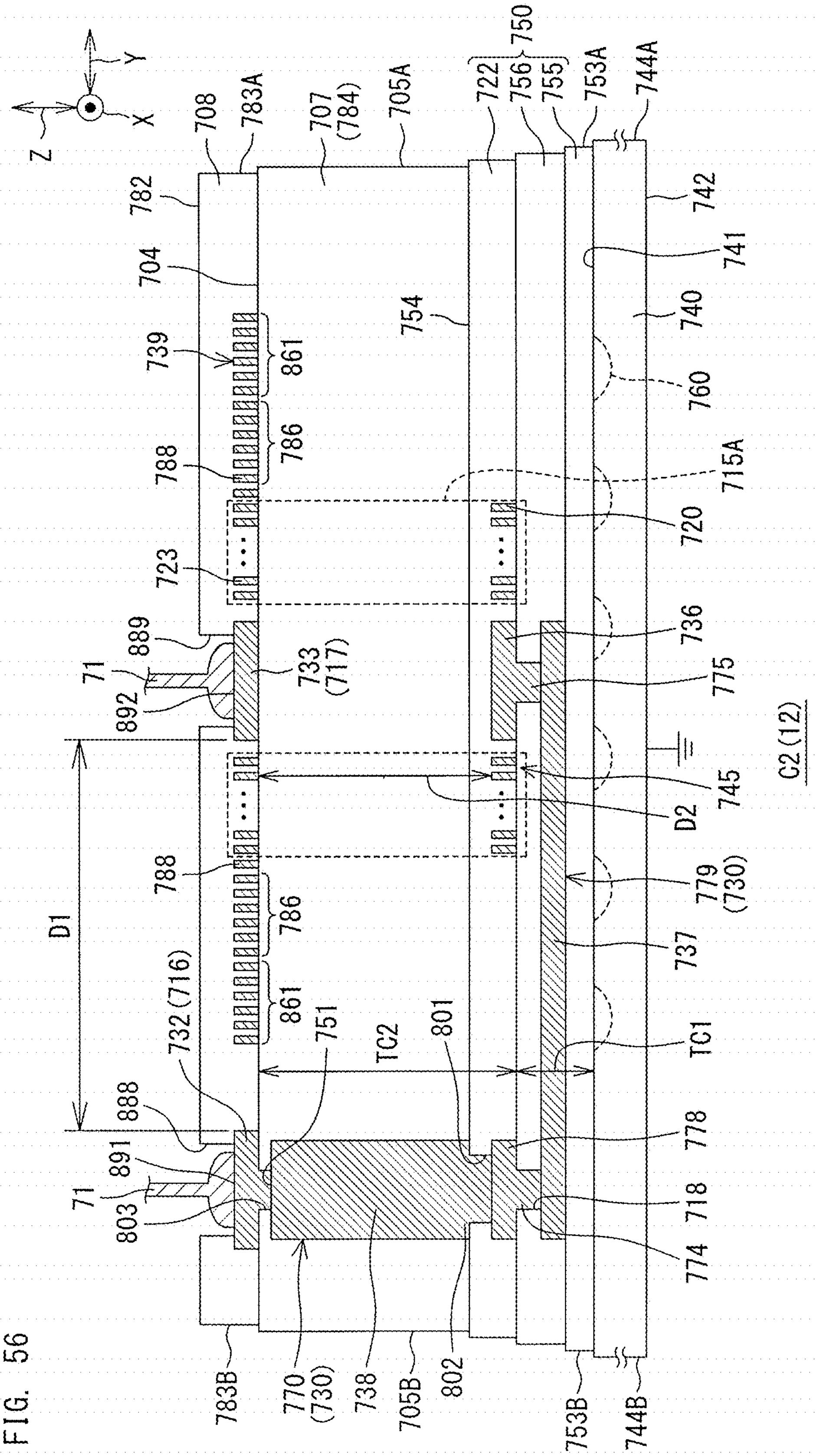
FIG. 56 is a schematic cross-sectional view of a semiconductor device according to one preferred embodiment of the present disclosure.

FIG. 56 is a schematic cross-sectional view of a semiconductor device C2 according to a preferred embodiment of the present disclosure. The same reference sign is hereinafter assigned to a constituent equivalent to the constituent mentioned with respect to the aforementioned semiconductor device C1, and a description of this constituent is omitted.

In the semiconductor device C2, the first low potential wiring 730 includes a first wiring 779 formed closer to the first insulating portion 750 than to a boundary portion between the first insulating portion 750 and the second insulating portion 707 and a second wiring 770 formed closer to the second insulating portion 707 than to the boundary portion between the first insulating portion 750 and the second insulating portion 707. In other words, the first wiring 779 is formed in the first insulating portion 750, and the second wiring 770 is formed in the second insulating portion 707. The first wiring 779 and the second wiring 770 are connected to each other in the boundary portion between the first insulating portion 750 and the second insulating portion 707.

The first wiring 779 includes the low potential connection wiring 736, the lead-out wiring 737, and the first low potential pad wiring 778 mentioned above. The first wiring 779 is covered with the third organic insulating layer 722 included in the first insulating portion 750. More specifically, the third organic insulating layer 722 is formed on the second organic insulating layer 756, and covers the low potential coil 720, the low potential connection wiring 736, and the low potential pad wiring 778.

The third organic insulating layer 722 may be made of an organic insulating layer identical with those of the first and second organic insulating layers 755 and 756, or may be made of an organic insulating layer different in kind from those thereof. For example, the third organic insulating layer 722 may include at least one among polyimide, polyamide, and polybenzoxazole. Additionally, the thickness of the third organic insulating layer 722 may be equal to that of each of the first and second organic insulating layers 755 and 756, or may be different therefrom. Preferably, the thickness of the third organic insulating layer 722 may be larger than that of each of the first and second organic insulating layers 755 and 756 in this embodiment. It is possible to easily secure a dielectric withstand voltage between the low potential coil 720 and the high potential coil 723 by thickening the third organic insulating layer 722. For example, the thickness of the third organic insulating layer 722 may be not less than 1 μm and not more than 100 μm.

The second wiring 770 includes a pillar-shaped wiring 738 and a second low potential pad wiring 732. Preferably, the pillar-shaped wiring 738 and the second low potential pad wiring 732 are each made of the same conductive material as the high potential coil 723. In other words, preferably, the pillar-shaped wiring 738 and the second low potential pad wiring 732 each include a barrier layer and a main body layer in the same way as the high potential coil 723, etc.

The pillar-shaped wiring 738 is formed at the insulating principal surface 754 of the first insulating portion 750. The pillar-shaped wiring 738 extends from the insulating principal surface 754 toward the insulating principal surface 704 of the second insulating portion 707, and penetrates through the second insulating portion 707 in the thickness direction. In this embodiment, although the pillar-shaped wiring 738 is formed in a pillar shape extending in the normal direction Z, from the viewpoint of penetrating through the second insulating portion 707, the pillar-shaped wiring 738 may be referred to as a penetrating wiring. A lower end portion of the pillar-shaped wiring 738 enters a penetrating hole 801 formed in the third organic insulating layer 722 (uppermost organic insulating layer), and is connected to the first low potential pad wiring 778 in the penetrating hole 801. The pillar-shaped wiring 738 has a width wider than the opening width of the penetrating hole 801. Hence, the pillar-shaped wiring 738 has a peripheral edge portion 802 overlapping with the third organic insulating layer 722 around the penetrating hole 801. The peripheral edge portion 802 of the pillar-shaped wiring 738 faces the first low potential pad wiring 778 with the third organic insulating layer 722 between the peripheral edge portion 802 and the first low potential pad wiring 778. Additionally, the pillar-shaped wiring 738 comes into direct contact with the first low potential pad wiring 778, and is formed in a region directly on the first low potential pad wiring 778.

Additionally, an upper end portion of the pillar-shaped wiring 738 is exposed from a penetrating hole 803 formed in the insulating principal surface 704 of the second insulating portion 707. The penetrating hole 803 has a certain depth from the insulating principal surface 704 of the second insulating portion 707 toward the first insulating portion 750. Hence, a top surface 751 of the pillar-shaped wiring 738 is formed on the first insulating portion 750 side with respect to the insulating principal surface 704, and a level difference is formed between the top surface 751 and the insulating principal surface 704.

The second low potential pad wiring 732 is formed on the insulating principal surface 704 of the second insulating portion 707. In other words, in this embodiment, the second low potential pad wiring 732 is formed at the same layer as the high potential coil 723. The second low potential pad wiring 732 may form the low potential terminal 716 mentioned above. The second low potential pad wiring 732 is connected to the pillar-shaped wiring 738 through the penetrating hole 803 formed in the second insulating portion 707. The second low potential pad wiring 732 has a width wider than the pillar-shaped wiring 738. Additionally, the second low potential pad wiring 732 may have a planar shape that is the same as the second low potential pad wiring 171 shown in FIG. 21. In other words, a lead-out portion 804 (not shown) that is led out from the penetrating hole 803 to a region not overlapping with the penetrating hole 803 may be provided. This lead-out portion 804 may have a shape corresponding to the lead-out portion 175 of FIG. 21. The second low potential pad wiring 732 is formed in the protective layer 708 by being covered with the protective layer 708.

The protective layer 708 has a plurality of low potential terminal openings 888 that respectively expose the low potential terminals 716. The low potential terminal 716 exposed from the low potential terminal opening 888 may be referred to as the low potential pad 891. The low potential terminal opening 888 exposes the lead-out portion 804 of the second low potential pad wiring 732. In other words, the low potential terminal opening 888 does not face the penetrating hole 803, and is formed at a position that deviates from the penetrating hole 803 in a plan view. This makes it possible to suppress a connection defect of the bonding wire 71 with respect to the low potential terminal 716. For example, when a conductive material of the second low potential pad wiring 732 is buried in the penetrating hole 803, there is a case in which an upper surface of the second low potential pad wiring 732 that has been buried is concaved at a position coinciding with the penetrating hole 803 depending on the size of the diameter of the penetrating hole 803. However, in this embodiment, the lead-out portion 804 is formed by leading out a part of the second low potential pad wiring 732 onto the flat insulating principal surface 704 of the second insulating portion 707, and this lead-out portion 804 is exposed from the low potential terminal opening 888. As a result, an exposed part of the second low potential pad wiring 732 from the low potential terminal opening 888 becomes flat, hence making it possible to excellently connect the bonding wire 71.

As described above, with this semiconductor device C2, the second insulating portion 707 made of the organic insulating layer 784 is formed between the low potential coil 720 and the high potential coil 723 in the same way as the semiconductor device C1. Therefore, it is possible to achieve a dielectric withstand voltage between the low potential coil 720 and the high potential coil 723 by means of the thickening of the second insulating portion 707. As a result, it is possible to make a lead time shorter and make costs lower. Additionally, the first insulating portion 750 including the organic insulating layers 755, 756 is interposed also between the low potential coil 720 and the semiconductor chip 740. Therefore, it is also possible to shorten a lead time required when a structure is formed to insulate the low potential coil 720 and the semiconductor chip 740 from each other.

Additionally, the second insulating portion 707 is made of the single-layer organic insulating layer 784, and therefore it is possible to easily form a wiring (pillar-shaped wiring 738) penetrating through the second insulating portion 707 by being subjected to plating growth one time. On the other hand, if the second insulating portion 707 has a multilayer wiring structure including a plurality of inorganic insulating layers, a step of burying a conductor in this inorganic insulating layer is required to be performed whenever those inorganic insulating layers are laminated, and steps the number of which is equal to the number of layers of the multilayer wiring structure are required to be performed in order to form a wiring penetrating through the second insulating portion 707. Therefore, in the semiconductor device C2, it is also possible to shorten a lead time for the formation step of the wiring penetrating through the second insulating portion 707.

Third Preferred Embodiment

Figure 57:
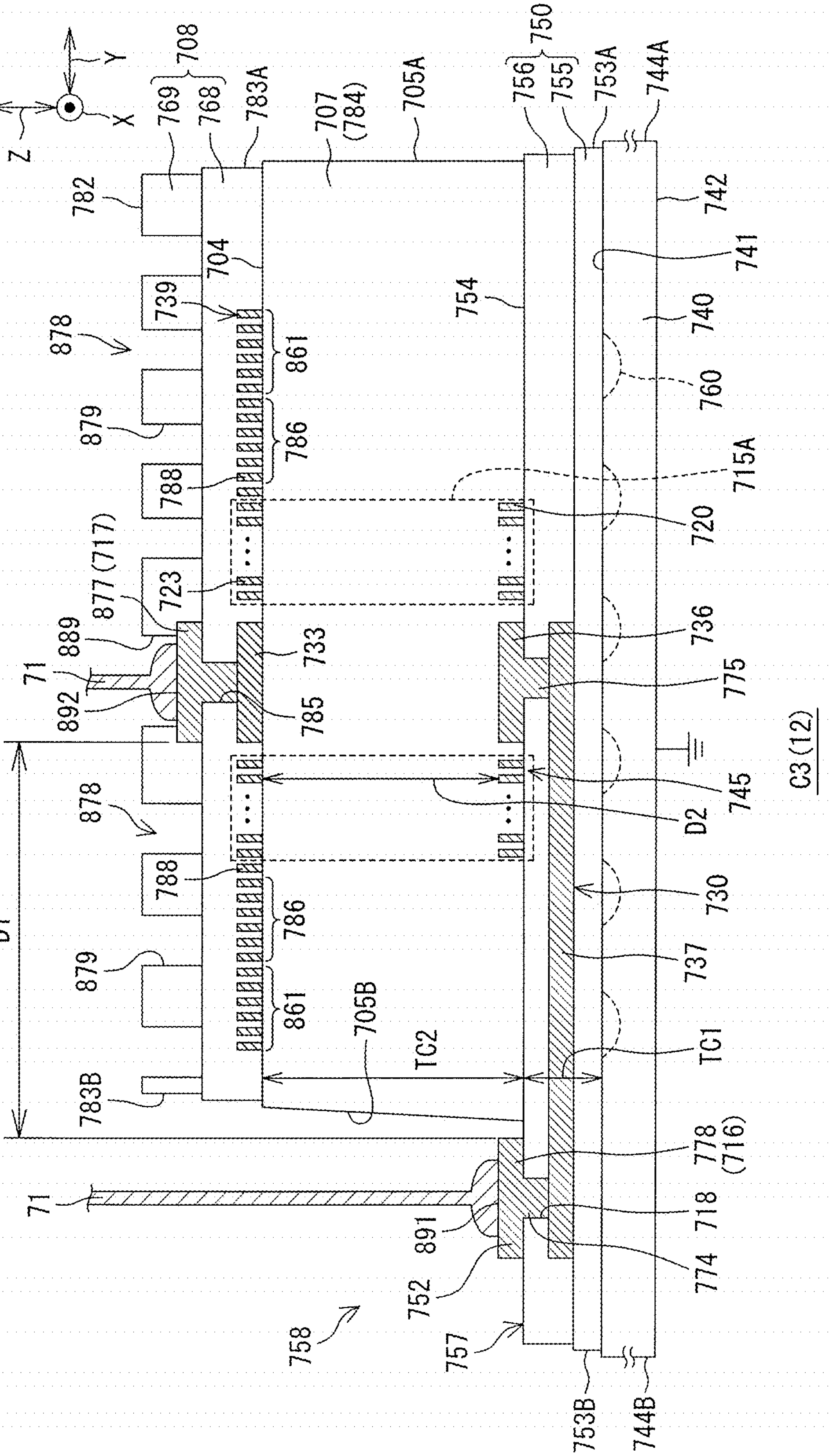
FIG. 57 is a schematic cross-sectional view of a semiconductor device according to one preferred embodiment of the present disclosure.

FIG. 57 is a schematic cross-sectional view of a semiconductor device C3 according to a preferred embodiment of the present disclosure. The same reference sign is hereinafter assigned to a constituent equivalent to the constituent mentioned with respect to the aforementioned semiconductor device C1, and a description of this constituent is omitted.

In the semiconductor device C3, the protective layer 708 includes a first protective layer 768 and a second protective layer 769. The protective layer 768 is formed on the insulating principal surface 704 of the second insulating portion 707 so as to cover the high potential coil 723, the second low potential pad wiring 732, the first high potential wiring 733, and the dummy pattern 739. The second protective layer 769 is laminated on the first protective layer 768.

The first protective layer 768 and the second protective layer 769 may be made of mutually-identical organic insulating layers, or may be made of mutually-different kinds of organic insulating layers. For example, the first protective layer 768 may include at least one among polyimide, polyamide, and polybenzoxazole, and the second protective layer 769 may be made of the same organic insulating material as the first protective layer 768 or may be made of an organic insulating material differing in kind from the first protective layer 768 among the organic insulating materials mentioned above.

Additionally, the thickness of the first protective layer 768 and the thickness of the second protective layer 769 may be equal to each other, or may be different from each other. Preferably, the thickness of the second protective layer 769 is larger than the thickness of the first protective layer 768 in this embodiment. It is possible to deepen a concave portion 879 described later by thickening the second protective layer 769, hence making it possible to further increase a creepage distance between the high potential terminal 717 and the low potential terminal 716. For example, the thickness of the first protective layer 768 may be not less than 1 μm and not more than 100 μm, and the thickness of the second protective layer 769 may be not less than 1 μm and not more than 100 μm.

A high potential pad wiring 877 is formed at the principal surface of the first protective layer 768. Preferably, the high potential pad wiring 877 is made of the same conductive material as the high potential coil 723. In other words, preferably, the high potential pad wiring 877 includes a barrier layer and a main body layer in the same way as the high potential coil 723, etc.

The high potential pad wiring 877 is formed at the principal surface of the first protective layer 768. In other words, in this embodiment, the high potential pad wiring 877 is formed at a layer higher than the high potential coil 723. Additionally, the high potential pad wiring 877 is formed in the second protective layer 769 by being covered with the second protective layer 769. The high potential pad wiring 877 may form the high potential terminal 717 mentioned above. The high potential pad wiring 877 is connected to the first high potential wiring 733 through a penetrating hole 785 formed in the first protective layer 768.

The high potential pad wiring 877 may be formed in an island shape, and may have a lead-out portion (not shown) that is led out from the penetrating hole 785 to a region not coinciding with the penetrating hole 785 in the same way as the second low potential pad wiring 732.

The protective layer 708 has the high potential terminal openings 889 that respectively expose the high potential pad wirings 877 (high potential terminals 717). The high potential terminal 717 exposed from the high potential terminal opening 889 may be referred to as the high potential pad 892.

Additionally, the protective layer 708 has an uneven structure 878 in a region between the space portion 758 and the high potential terminal opening 889. The uneven structure 878 includes a plurality of concave portions 879 hollowed toward the second insulating portion 707 from the protective principal surface 782 of the protective layer 708. The uneven structure 878 increases a creepage distance along the protective principal surface 782 of the protective layer 708. Therefore, the uneven structure 878 suppresses the occurrence of a creeping discharge along the protective principal surface 782 of the protective layer 708. In this embodiment, the concave portions 879 penetrate through the second protective layer 769 and expose the principal surface of the first protective layer 768, and have a side surface formed with the second protective layer 769 from its upper end to its lower end and a bottom surface formed with the first protective layer 768. On the other hand, the concave portions 879 penetrate through the second protective layer 769, and its bottom portion may reach a position between both ends in the thickness direction of the first protective layer 768. In this case, the side surface of the concave portions 879 may have an upper portion that is formed with the second protective layer 769 and a lower portion that is formed with the first protective layer 768. Additionally, the uneven structure 878 may be formed so as to surround the high potential coil 723 in a plan view (not shown).

As described above, with this semiconductor device C3, the second insulating portion 707 made of the organic insulating layer 784 is formed between the low potential coil 720 and the high potential coil 723 in the same way as the semiconductor device C1. Therefore, it is possible to achieve a dielectric withstand voltage between the low potential coil 720 and the high potential coil 723 by means of the thickening of the second insulating portion 707. As a result, it is possible to make a lead time shorter and make costs lower. Additionally, the first insulating portion 750 including the organic insulating layers 755, 756 is interposed also between the low potential coil 720 and the semiconductor chip 740. Therefore, it is also possible to shorten a lead time required when a structure is formed to insulate the low potential coil 720 and the semiconductor chip 740 from each other.

Additionally, the uneven structure 878 is formed in the protective layer 708. This makes it possible to increase the creepage distance along the protective principal surface 782 of the protective layer 708 between the high potential terminal 717 and the low potential terminal 716, and makes it possible to increase the insulation distance between the high potential terminal 717 and the low potential terminal 716. Therefore, it is possible to suppress the occurrence of a creeping discharge in a region between the high potential terminal 717 and the low potential terminal 716, hence making it possible to suppress the breakage or the deterioration of the protective layer 708 between the high potential terminal 717 and the low potential terminal 716. As a result, it is possible to suppress a short circuit between the high potential terminal 717 and the low potential terminal 716, hence making it possible to suppress an additional breakage or an additional deterioration of the protective layer 708 caused by the short circuit.

Fourth Preferred Embodiment

Figure 58:
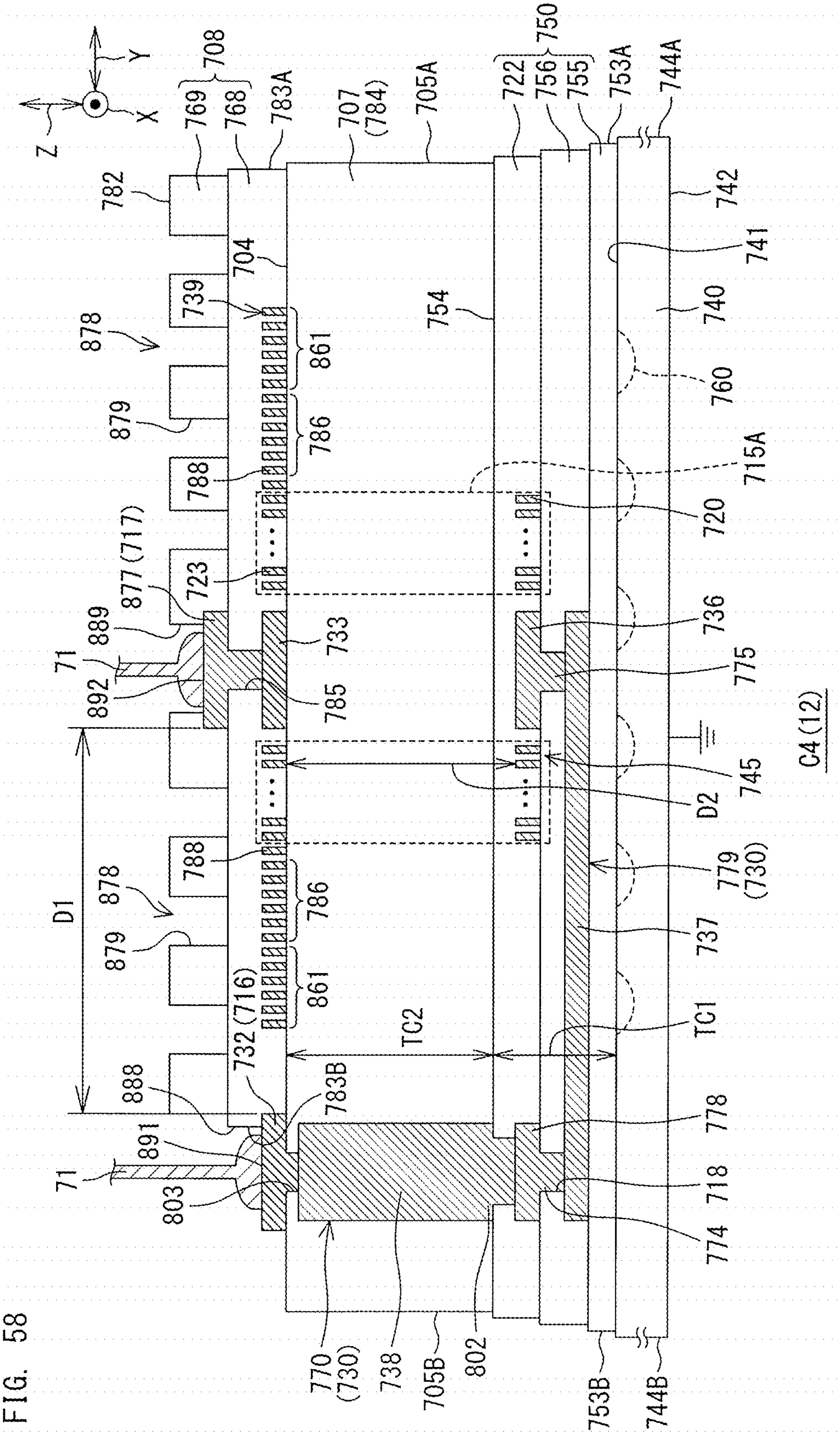
FIG. 58 is a schematic cross-sectional view of a semiconductor device according to one preferred embodiment of the present disclosure.

FIG. 58 is a schematic cross-sectional view of a semiconductor device C4 according to a preferred embodiment of the present disclosure. The same reference sign is hereinafter assigned to a constituent equivalent to the constituent mentioned with respect to the aforementioned semiconductor devices C2 and C3, and a description of this constituent is omitted.

In the semiconductor device C4, the protective layer 708 of the semiconductor device C2 includes the first protective layer 768 and the second protective layer 769 in the same way as the aforementioned semiconductor device C3. Additionally, the protective layer 708 has the uneven structure 878 in a region between the low potential terminal opening 888 and the high potential terminal opening 889. The low potential terminal opening 888 may be a space portion opened toward the chip sidewall 744B side of the semiconductor chip 740.

As described above, with this semiconductor device C4, the second insulating portion 707 made of the organic insulating layer 784 is formed between the low potential coil 720 and the high potential coil 723 in the same way as the semiconductor device C1. Therefore, it is possible to achieve a dielectric withstand voltage between the low potential coil 720 and the high potential coil 723 by means of the thickening of the second insulating portion 707. As a result, it is possible to make a lead time shorter and make costs lower. Additionally, the first insulating portion 750 including the organic insulating layers 755, 756 is interposed also between the low potential coil 720 and the semiconductor chip 740. Therefore, it is also possible to shorten a lead time required when a structure is formed to insulate the low potential coil 720 and the semiconductor chip 740 from each other.

Additionally, the uneven structure 878 is formed in the protective layer 708 in the same way as the semiconductor device C3. This makes it possible to increase the creepage distance along the protective principal surface 782 of the protective layer 708 between the high potential terminal 717 and the low potential terminal 716, and makes it possible to increase the insulation distance between the high potential terminal 717 and the low potential terminal 716. Therefore, it is possible to suppress the occurrence of a creeping discharge in a region between the high potential terminal 717 and the low potential terminal 716, hence making it possible to suppress the breakage or the deterioration of the protective layer 708 between the high potential terminal 717 and the low potential terminal 716. As a result, it is possible to suppress a short circuit between the high potential terminal 717 and the low potential terminal 716, hence making it possible to suppress an additional breakage or an additional deterioration of the protective layer 708 caused by the short circuit.

<Structures of Semiconductor Devices D1 and D2>

First Preferred Embodiment

Figure 59:
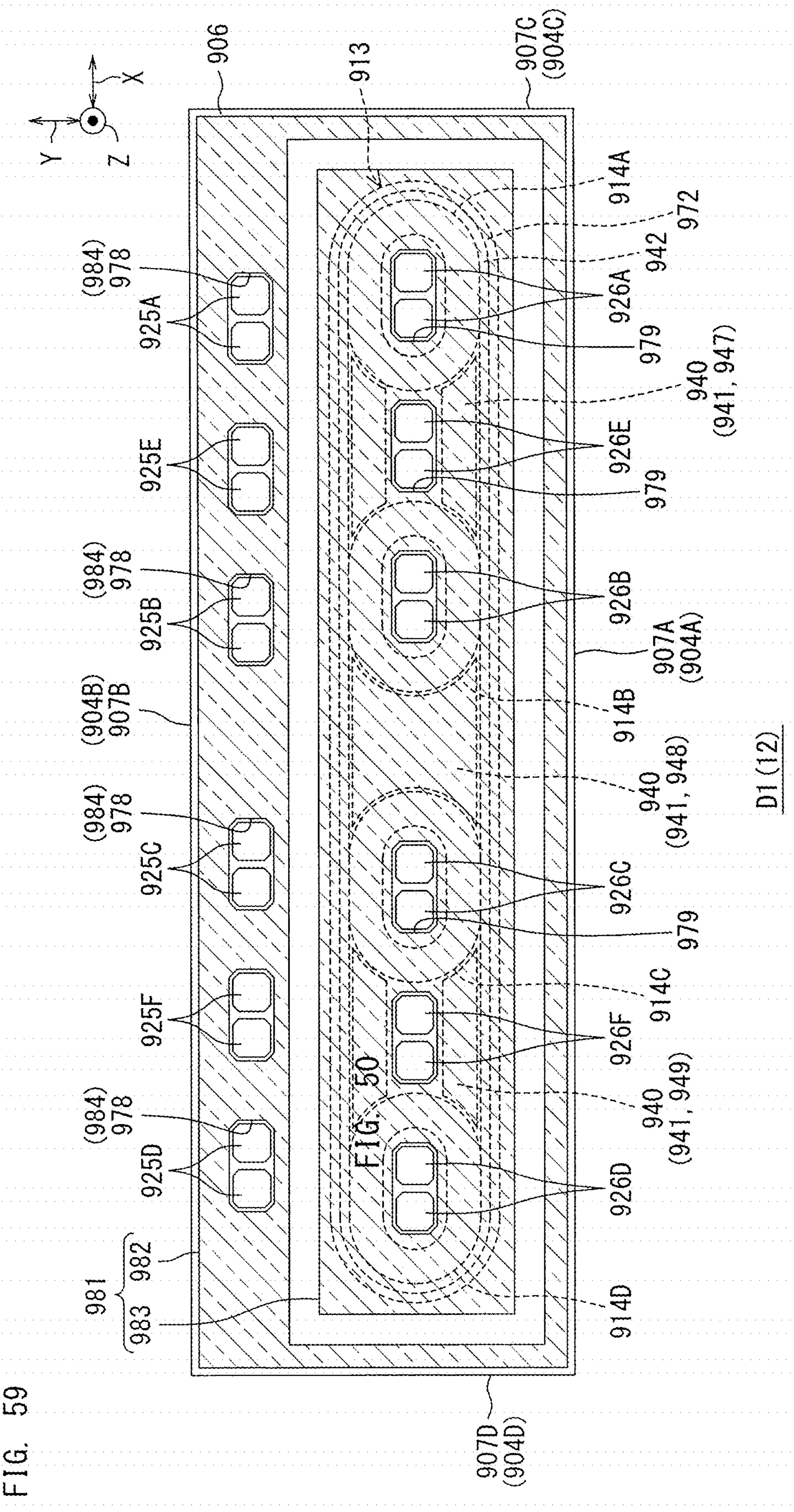
FIG. 59 is a schematic plan view of a semiconductor device D1 according to one preferred embodiment of the present disclosure.
Figure 60:
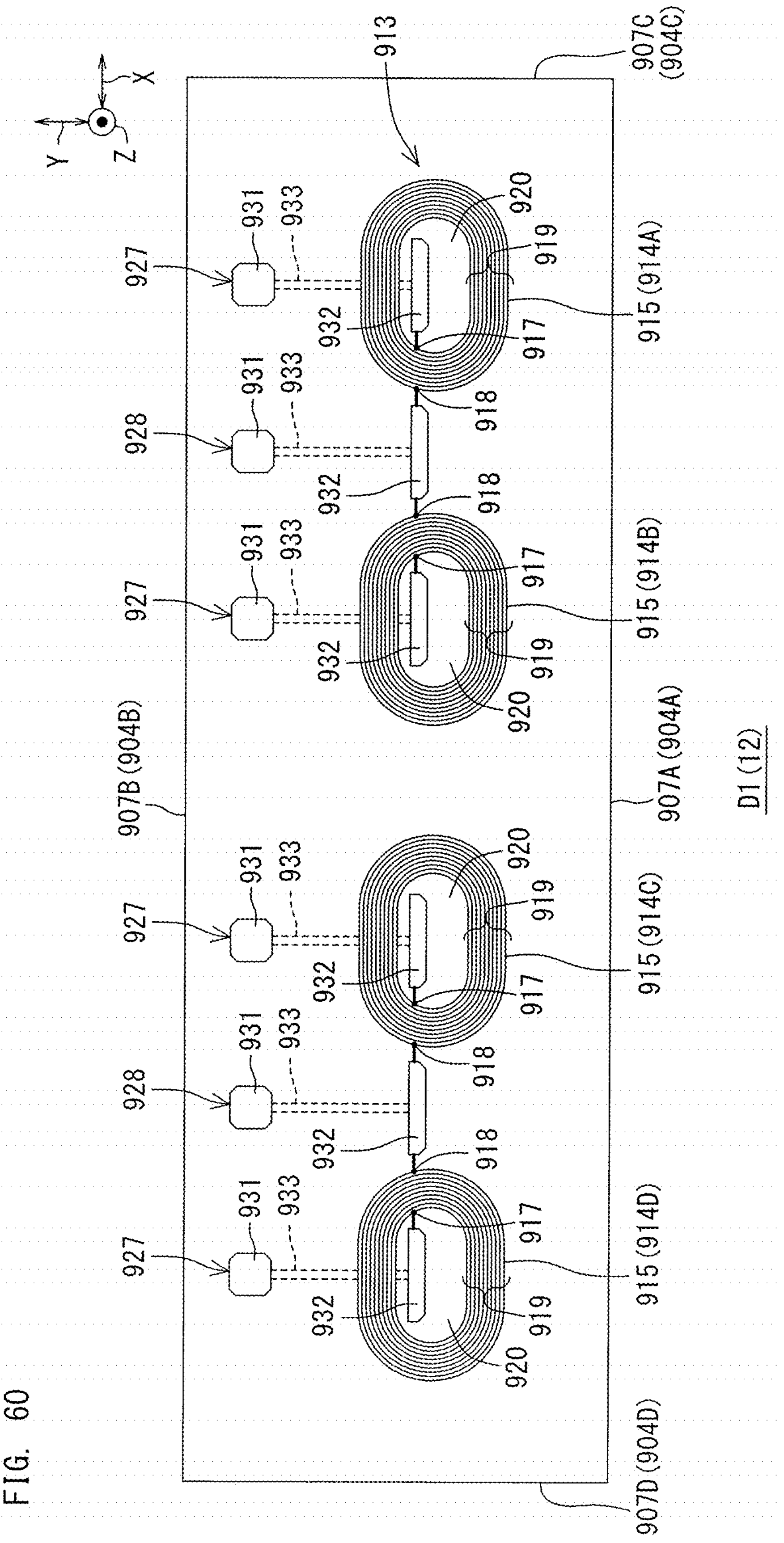
FIG. 60 is a plan view showing a layer in which a low potential coil 915 is formed in the semiconductor device D1 of FIG. 59.
Figure 61:
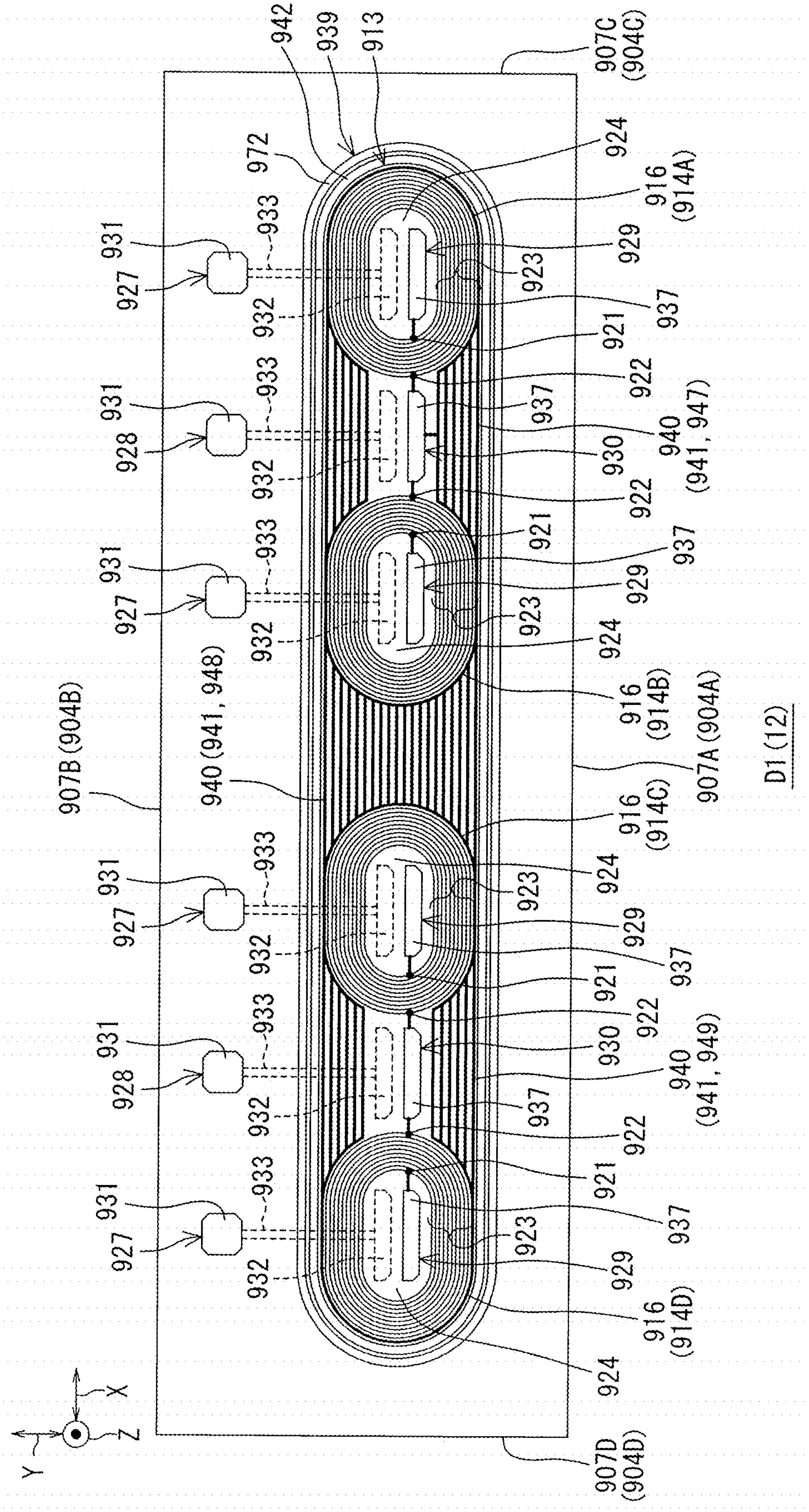
FIG. 61 is a plan view showing a layer in which a high potential coil 916 is formed in the semiconductor device D1 of FIG. 59.
Figure 62:
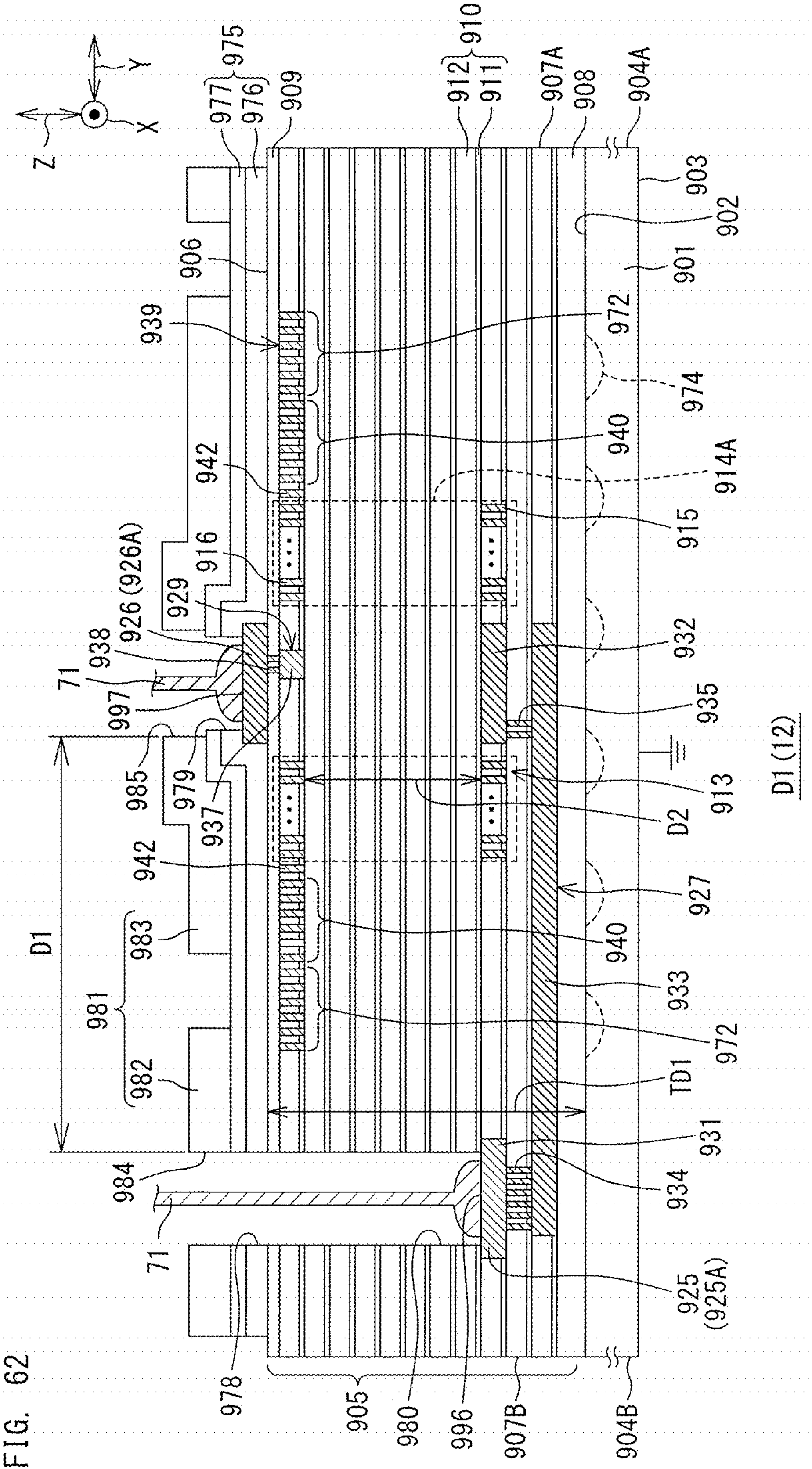
FIG. 62 is a schematic cross-sectional view of the semiconductor device D1 of FIG. 59.

FIG. 59 is a schematic plan view of a semiconductor device D1 according to a preferred embodiment of the present disclosure. FIG. 60 is a plan view showing a layer in which a low potential coil 915 is formed in the semiconductor device D1 of FIG. 59. FIG. 61 is a plan view showing a layer in which a high potential coil 916 is formed in the semiconductor device D1 of FIG. 59. FIG. 62 is a schematic cross-sectional view of the semiconductor device D1 of FIG. 59.

Referring to FIG. 59 to FIG. 62, the semiconductor device D1 includes a rectangular parallelepiped shaped semiconductor chip 901. The semiconductor chip 901 includes at least one among silicon, a wide bandgap semiconductor, and a compound semiconductor.

The wide bandgap semiconductor is made of a semiconductor exceeding the bandgap of silicon (about 1.12 eV). Preferably, the bandgap of the wide bandgap semiconductor is 2.0 eV or more. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 901 includes a silicon-made semiconductor substrate. The semiconductor chip 901 may be an epitaxial substrate having a laminated structure including a silicon-made semiconductor substrate and a silicon-made epitaxial layer. The conductivity type of the semiconductor substrate may be an n type or may be a p type. The epitaxial layer may be an n type or may be a p type. Additionally, the semiconductor chip 901 may be fixed to the ground potential.

The semiconductor chip 901 has a first principal surface 902 on one side, a second principal surface 903 on the other side, and chip sidewalls 904A to 904D that connect the first principal surface 902 and the second principal surface 903. The first and second principal surfaces 902 and 903 are each formed in a quadrangular shape (in this embodiment, rectangular shape) in a plan view seen from their normal directions Z (hereinafter, referred to simply as a "plan view").

The chip sidewalls 904A to 904D include a first chip sidewall 904A, a second chip sidewall 904B, a third chip sidewall 904C, and a fourth chip sidewall 904D. Each of the first and second chip sidewalls 904A and 904B forms a long side of the semiconductor chip 901. The first and second chip sidewalls 904A and 904B extend along the first direction X, and face each other in the second direction Y. Each of the third and fourth chip sidewalls 904C and 904D forms a short side of the semiconductor chip 901. The third and fourth chip sidewalls 904C and 904D extend in the second direction Y, and face each other in the first direction X. The chip sidewalls 904A to 904D are each constituted of a ground surface.

The semiconductor device D1 includes a first insulating portion 905 formed in order on the first principal surface 902 of the semiconductor chip 901. The first insulating portion 905 has an insulating principal surface 906 and insulating sidewalls 907A to 907D. The insulating principal surface 906 is formed in a quadrangular shape (in this embodiment, rectangular shape) that matches the first principal surface 902 in a plan view. The insulating principal surface 906 extends in parallel with the first principal surface 902.

The insulating sidewalls 907A to 907D include a first insulating sidewall 907A, a second insulating sidewall 907B, a third insulating sidewall 907C, and a fourth insulating sidewall 907D. The insulating sidewalls 907A to 907D extend from a peripheral edge of the insulating principal surface 906 toward the semiconductor chip 901, and are continuous with the chip sidewalls 904A to 904D. In detail, the insulating sidewalls 907A to 907D are formed so as to be flush with the chip sidewalls 904A to 904D. The insulating sidewalls 907A to 907D form ground surfaces flush with the chip sidewalls 904A to 904D, respectively.

The first insulating portion 905 is formed of a multilayer insulating laminated structure including an undermost insulating layer 908, an uppermost insulating layer 909, and a plurality of (in this embodiment, eleven) interlayer insulating layers 910. The undermost insulating layer 908 is an insulating layer that directly covers the first principal surface 902. The uppermost insulating layer 909 is an insulating layer that forms the insulating principal surface 906. The interlayer insulating layers 910 are insulating layers interposed between the undermost insulating layer 908 and the uppermost insulating layer 909. In this embodiment, the undermost insulating layer 908 has a single layer structure including silicon oxide. In this embodiment, the uppermost insulating layer 909 has a single layer structure including silicon nitride. The thickness of the undermost insulating layer 908 may be not less than 0.5 μm and not more than 3 μm (for example, about 1 μm), and the thickness of the uppermost insulating layer 909 may be not less than 0.2 μm and not more than 4 μm (for example, about 1 μm).

Each of the interlayer insulating layers 910 has a laminated structure including a first insulating layer 911 on the undermost insulating layer 908 side and a second insulating layer 912 on the uppermost insulating layer 909 side. The first insulating layer 911 may be made of an inorganic insulating layer, and may include, for example, silicon nitride. The first insulating layer 911 is formed as an etching stopper layer with respect to the second insulating layer 912. The thickness of the first insulating layer 911 may be not less than 0.1 μm and not more than 1 μm (for example, about 0.3 μm).

The second insulating layer 912 is formed on the first insulating layer 911. The second insulating layer 912 includes an insulating material differing from that of the first insulating layer 911. The second insulating layer 912 is made of an inorganic insulating layer differing from that of the first insulating layer 558, and may include, for example, silicon oxide. The thickness of the second insulating layer 912 may be not less than 1 μm and not more than 3 μm (for example, about 2 μm). Preferably, the thickness of the second insulating layer 912 exceeds the thickness of the first insulating layer 558.

Additionally, the first insulating layer 911 may be a compressive stress film, and the second insulating layer 912 may be a tensile stress film. In other words, the interlayer insulating layer 910 may be a structure in which a compressive stress film and a tensile stress film are repeatedly laminated. This makes it possible to form the first insulating portion 905 while canceling a stress in a lamination interface of the interlayer insulating layer 910. As a result, it is possible to prevent the occurrence of large warping deformation in a semiconductor wafer that serves as a base material of the semiconductor chip 901 in a manufacturing process of the semiconductor device D1. The compressive stress film may be, for example, a silicon oxide film, and the tensile stress film may be, for example, a silicon nitride film.

The total thickness TD1 of the first insulating portion 905 may be not less than 2 μm and not more than 120 μm. The total thickness TD1 of the first insulating portion 905 and the number of laminated layers of the interlayer insulating layer 910 are arbitrary, and are adjusted in accordance with a dielectric withstand voltage (dielectric breakdown resistance) to be realized. Additionally, the insulating material of the undermost insulating layer 908, the insulating material of the uppermost insulating layer 909, and the insulating material of the interlayer insulating layer 910 are arbitrary, and are not limited to a specific insulating material.

The semiconductor device D1 includes a first functional device 913 formed at the first insulating portion 905. The first functional device 913 includes a single or a plurality of (in this embodiment, a plurality of) transformers 914. In other words, the semiconductor device D1 is formed of a multichannel type device including the transformers 914. The transformers 914 are formed at an inward portion of a laminated structure of the first insulating portion 905 at a distance from the insulating sidewalls 907A to 907D. The transformers 914 are formed at a distance from each other in the first direction X.

In detail, the transformers 914 include a first transformer 914A, a second transformer 914B, a third transformer 914C, and a fourth transformer 914D that are formed in this order from the insulating sidewall 907C side toward the insulating sidewall 907D side in a plan view. The first transformer 914A, the second transformer 914B, the third transformer 914C, and the fourth transformer 914D may correspond to the first transformer 131, the second transformer 132, the third transformer 133, and the fourth transformer 134 of FIG. 11, respectively. The transformers 914A to 914D each have the same structure. A structure of the first transformer 914A will be hereinafter described as an example. A description of structures of the second transformer 914B, the third transformer 914C, and the fourth transformer 914D is omitted on the condition that a description of the structure of the first transformer 914A is correspondingly applied.

Referring to FIG. 59 to FIG. 62, the first transformer 914A includes a low potential coil 915 and a high potential coil 916. The low potential coil 915 is formed on the undermost insulating layer 908 side (semiconductor chip 901 side) in the first insulating portion 905. The high potential coil 916 is formed on the uppermost insulating layer 909 side (insulating principal surface 906 side) in the first insulating portion 905 with respect to the low potential coil 915. In other words, the high potential coil 916 faces the semiconductor chip 901 with the low potential coil 915 between the high potential coil 916 and the semiconductor chip 901. Disposition places of the low potential coil 915 and the high potential coil 916 are arbitrary. Additionally, the high potential coil 916 is merely required to face the low potential coil 915 with one or more interlayer insulating layers 910 between the high potential coil 916 and the low potential coil 915.

The distance D2 between the low potential coil 915 and the high potential coil 916 (i.e., the number of laminated layers of the interlayer insulating layer 910) is appropriately adjusted in accordance with a dielectric withstand voltage or an electric field strength between the low potential coil 915 and the high potential coil 916. In this embodiment, the low potential coil 915 is formed at the interlayer insulating layer 910 that is the third layer in order from the undermost insulating layer 908 side. On the other hand, the high potential coil 916 is, in this embodiment, formed at the interlayer insulating layer 910 that is the first layer in order from the uppermost insulating layer 909 side. Therefore, the interlayer insulating layer 910, which is equivalent to seven layers, is interposed between the low potential coil 915 and the high potential coil 916.

The low potential coil 915 is buried while penetrating through the first and second insulating layers 911 and 912 in the interlayer insulating layer 910. The low potential coil 915 includes a first inner end 917, a first outer end 918, and a first helical portion 919 that is helically routed around between the first inner end 917 and the first outer end 918 as shown in FIG. 60. The first helical portion 919 is helically routed around while extending in an elliptical shape (oval shape) in a plan view. A part, which forms an innermost peripheral edge, of the first helical portion 919 demarcates a first inner region 920 having an elliptical shape in a plan view.

The number of winding turns of the first helical portion 919 may be not less than 3 and not more than 30. The width of the first helical portion 919 may be not less than 0.1 μm and not more than 10 μm. Preferably, the width of the first helical portion 919 is not less than 1 μm and not more than 5 μm. The width of the first helical portion 919 is defined by a width in the direction perpendicular to the helical direction. A first winding pitch of the first helical portion 919 may be not less than 0.1 μm and not more than 20 μm. Preferably, the first winding pitch is not less than 1 μm and not more than 10 μm. The first winding pitch is defined by a distance between two parts, which adjoin each other in the direction perpendicular to the helical direction, of the first helical portion 919.

The wound shape of the first helical portion 919 or the planar shape of the first inner region 920 is arbitrary, and is not limited to the form shown in FIG. 60, etc. The first helical portion 919 may be wound in a polygonal shape, such as a triangular shape or a quadrangular shape, or in a circular shape in a plan view. The first inner region 920 may be demarcated so as to be a polygonal shape, such as a triangular shape or a quadrangular shape, or so as to be a circular shape in a plan view in accordance with the wound shape of the first helical portion 919.

The low potential coil 915 may include at least one among titanium, titanium nitride, copper, aluminum, and tungsten. The low potential coil 915 may have a laminated structure including a barrier layer and a main body layer. The barrier layer demarcates a recessed space in the interlayer insulating layer 910. The main body layer is buried in the recessed space demarcated by the barrier layer. The barrier layer may include at least one of titanium and titanium nitride. The main body layer may include at least one among copper, aluminum, and tungsten.

The high potential coil 916 is buried while penetrating through the first and second insulating layers 911 and 912 in the interlayer insulating layer 910. The high potential coil 916 includes a second inner end 921, a second outer end 922, and a second helical portion 923 helically routed around between the second inner end 921 and the second outer end 922 as shown in FIG. 61. The second helical portion 923 is helically routed around while extending in an elliptical shape (oval shape) in a plan view. In this embodiment, a part, which forms an innermost peripheral edge, of the second helical portion 923 demarcates a second inner region 924 having an elliptical shape in a plan view. The second inner region 924 of the second helical portion 923 faces the first inner region 920 of the first helical portion 919 in the normal direction Z.

The number of winding turns of the second helical portion 923 may be not less than 3 and not more than 30. The number of winding turns of the second helical portion 923 with respect to the number of winding turns of the first helical portion 919 is adjusted in accordance with a voltage value to be increased. Preferably, the number of winding turns of the second helical portion 923 exceeds the number of winding turns of the first helical portion 919. Of course, the number of winding turns of the second helical portion 923 may be less than the number of winding turns of the first helical portion 919, or may be equal to the number of winding turns of the first helical portion 919.

The width of the second helical portion 923 may be not less than 0.1 μm and not more than 10 μm. Preferably, the width of the second helical portion 923 is not less than 1 μm and not more than 5 μm. The width of the second helical portion 923 is defined by a width in the direction perpendicular to the helical direction. Preferably, the width of the second helical portion 923 is equal to the width of the first helical portion 919.

A second winding pitch of the second helical portion 923 may be not less than 0.1 μm and not more than 20 μm. Preferably, the second winding pitch is not less than 1 μm and not more than 10 μm. The second winding pitch is defined by a distance between two parts, which adjoin each other in the direction perpendicular to the helical direction, of the second helical portion 923. Preferably, the second winding pitch is equal to the first winding pitch of the first helical portion 919.

The wound shape of the second helical portion 923 or the planar shape of the second inner region 924 is arbitrary, and is not limited to the form shown in FIG. 61, etc. The second helical portion 923 may be wound in a polygonal shape, such as a triangular shape or a quadrangular shape, or in a circular shape in a plan view. The second inner region 924 may be demarcated so as to be a polygonal shape, such as a triangular shape or a quadrangular shape, or so as to be a circular shape in a plan view in accordance with the wound shape of the second helical portion 923. Additionally, a part of the protective layer 8 enters a gap of the second helical portion 923.

Preferably, the high potential coil 916 is made of the same conductive material as the low potential coil 915. In other words, preferably, the high potential coil 916 includes a barrier layer and a main body layer in the same way as the low potential coil 915, etc.

Referring to FIG. 59, the semiconductor device D1 includes a plurality of (in this embodiment, twelve) low potential terminals 925 and a plurality of (in this embodiment, twelve) high potential terminals 926. The low potential terminals 925 are each electrically connected to the low potential coil 915 of corresponding transformers 914A to 914D. The high potential terminals 926 are each electrically connected to the high potential coil 916 of corresponding transformers 914A to 914D.

The low potential terminals 925 are formed in a layer that is the same as the low potential coil 915. In other words, they are buried while penetrating through the first and second insulating layers 911 and 912 in the interlayer insulating layer 910 in which the low potential coil 915 is buried. In detail, the low potential terminals 925 are formed in a region on the insulating sidewall 907B side at a distance in the second direction Y from the transformers 914A to 914D, and are arranged at a distance from each other in the first direction X.

The low potential terminals 925 include a first low potential terminal 925A, a second low potential terminal 925B, a third low potential terminal 925C, a fourth low potential terminal 925D, a fifth low potential terminal 925E, and a sixth low potential terminal 925F. In this embodiment, the low potential terminals 925A to 925F are each formed as two low potential terminals. The number of the low potential terminals 925A to 925F is arbitrary.

The first low potential terminal 925A faces the first transformer 914A in the second direction Y in a plan view. The second low potential terminal 925B faces the second transformer 914B in the second direction Y in a plan view. The third low potential terminal 925C faces the third transformer 914C in the second direction Y in a plan view. The fourth low potential terminal 925D faces the fourth transformer 914D in the second direction Y in a plan view. The fifth low potential terminal 925E is formed in a region between the first low potential terminal 925A and the second low potential terminal 925B in a plan view. The sixth low potential terminal 925F is formed in a region between the third low potential terminal 925C and the fourth low potential terminal 925D in a plan view.

The first low potential terminal 925A is electrically connected to the first inner end 917 of the first transformer 914A (low potential coil 915). The second low potential terminal 925B is electrically connected to the first inner end 917 of the second transformer 914B (low potential coil 915). The third low potential terminal 925C is electrically connected to the first inner end 917 of the third transformer 914C (low potential coil 915). The fourth low potential terminal 925D is electrically connected to the first inner end 917 of the fourth transformer 914D (low potential coil 915).

The fifth low potential terminal 925E is electrically connected to the first outer end 918 of the first transformer 914A (low potential coil 915) and to the first outer end 918 of the second transformer 914B (low potential coil 915). The sixth low potential terminal 925F is electrically connected to the first outer end 918 of the third transformer 914C (low potential coil 915) and to the first outer end 918 of the fourth transformer 914D (low potential coil 915).

In other words, the low potential terminals 925A to 925D connected to the first inner end 917 of each of the transformers 914A to 914D are disposed closer to each of the transformers 914A to 914D than to the low potential terminals 925E and 925F connected to the first outer end 918 of each of the transformers 914A to 914D. For example, the first low potential terminal 925A connected to the first inner end 917 of the first transformer 914A is disposed closer to the first transformer 914A than to the fifth low potential terminal 925E connected to the first outer end 918 of the first transformer 914A. The same applies to a disposition relationship of the second and fifth low potential terminals 925B and 925E with respect to the second transformer 914B, a disposition relationship of the third and sixth low potential terminals 925C and 925F with respect to the third transformer 914C, and a disposition relationship of the fourth and sixth low potential terminals 925D and 925F with respect to the fourth transformer 914D.

The high potential terminals 926 are formed on the insulating principal surface 906 of the first insulating portion 905 at a distance from the low potential terminals 925. In detail, the high potential terminals 926 are formed in a region on the insulating sidewall 907A side at a distance in the second direction Y from the low potential terminals 925, and are arranged at a distance from each other in the first direction X.

The high potential terminals 926 are each formed in a region in proximity to corresponding transformers 914A to 914D in a plan view. That the high potential terminal 926 is in proximity to the transformers 914A to 914D means that the distance between the high potential terminal 926 and the transformer 914 is less than the distance between the low potential terminal 925 and the high potential terminal 926 in a plan view.

In detail, the high potential terminals 926 are formed at a distance along the first direction X so as to face the transformers 914A to 914D along the first direction X in a plan view. In more detail, the high potential terminals 926 are formed at a distance along the first direction X so as to be placed in the second inner region 924 of the high potential coil 916 and in a region between adjoining high potential coils 916 in a plan view. Hence, the high potential terminals 926 are arranged side by side with the transformers 914A to 914D in a line in the first direction X in a plan view.

The high potential terminals 926 include a first high potential terminal 926A, a second high potential terminal 926B, a third high potential terminal 926C, a fourth high potential terminal 926D, a fifth high potential terminal 926E, and a sixth high potential terminal 926F. In this embodiment, the high potential terminals 926A to 926F are each formed as two high potential terminals. The number of the high potential terminals 926A to 926F is arbitrary.

The first high potential terminal 926A is formed in the second inner region 924 of the first transformer 914A (high potential coil 916) in a plan view. The second high potential terminal 926B is formed in the second inner region 924 of the second transformer 914B (high potential coil 916) in a plan view. The third high potential terminal 926C is formed in the second inner region 924 of the third transformer 914C (high potential coil 916) in a plan view. The fourth high potential terminal 926D is formed in the second inner region 924 of the fourth transformer 914D (high potential coil 916) in a plan view. The fifth high potential terminal 926E is formed in a region between the first transformer 914A and the second transformer 914B in a plan view. The sixth high potential terminal 926F is formed in a region between the third transformer 914C and the fourth transformer 914D in a plan view.

The first high potential terminal 926A is electrically connected to the second inner end 921 of the first transformer 914A (high potential coil 916). The second high potential terminal 926B is electrically connected to the second inner end 921 of the second transformer 914B (high potential coil 916). The third high potential terminal 926C is electrically connected to the second inner end 921 of the third transformer 914C (high potential coil 916). The fourth high potential terminal 926D is electrically connected to the second inner end 921 of the fourth transformer 914D (high potential coil 916).

The fifth high potential terminal 926E is electrically connected to the second outer end 922 of the first transformer 914A (high potential coil 916) and the second outer end 922 of the second transformer 914B (high potential coil 916). The sixth high potential terminal 926F is electrically connected to the second outer end 922 of the third transformer 914C (high potential coil 916) and the second outer end 922 of the fourth transformer 914D (high potential coil 916).

Referring to FIG. 60 and FIG. 61, the semiconductor device D1 includes a first low potential wiring 927, a second low potential wiring 928, a first high potential wiring 929, and a second high potential wiring 930 that are each formed in the first insulating portion 905. In this embodiment, a plurality of first low potential wirings 927, a plurality of second low potential wirings 928, a plurality of first high potential wirings 929, and a plurality of second high potential wirings 930 are formed.

The first low potential wiring 927 and the second low potential wiring 928 fix the low potential coil 915 of the first transformer 914A and the low potential coil 915 of the second transformer 914B to the same potential. Additionally, the first low potential wiring 927 and the second low potential wiring 928 fix the low potential coil 915 of the third transformer 914C and the low potential coil 915 of the fourth transformer 914D to the same potential. In this embodiment, the first low potential wiring 927 and the second low potential wiring 928 fix all of the low potential coils 915 of the transformers 914A to 914D to the same potential.

The first high potential wiring 929 and the second high potential wirings 930 fix the high potential coil 916 of the first transformer 914A and the high potential coil 916 of the second transformer 914B to the same potential. Additionally, the first high potential wiring 929 and the second high potential wirings 930 fix the high potential coil 916 of the third transformer 914C and the high potential coil 916 of the fourth transformer 914D to the same potential. In this embodiment, the first high potential wiring 929 and the second high potential wirings 930 fix all of the high potential coils 916 of the transformers 914A to 914D to the same potential.

The first low potential wirings 927 are each electrically connected to corresponding low potential terminals 925A to 925D and to the first inner ends 917 of corresponding transformers 914A to 914D (low potential coils 915). The first low potential wirings 927 have the same structure. A structure of the first low potential wiring 927 connected to the first low potential terminal 925A and to the first transformer 914A will be hereinafter described as an example. A description of structures of other first low potential wirings 927 is omitted on the condition that a description of the structure of the first low potential wiring 927 connected to the first transformer 914A is correspondingly applied.

The first low potential wiring 927 includes a first low potential pad electrode layer 931, a low potential connection wiring 932, a lead-out wiring 933, a first connection plug electrode 934, and a second connection plug electrode 935. These energization members are formed in the first insulating portion 905.

Preferably, the first low potential pad electrode layer 931, the low potential connection wiring 932, the lead-out wiring 933, the first connection plug electrode 934, and the second connection plug electrode 935 are each made of the same conductive material as the low potential coil 915, etc. In other words, preferably, each of the first low potential pad electrode layer 931, the low potential connection wiring 932, the lead-out wiring 933, the first connection plug electrode 934, and the second connection plug electrode 935 includes a barrier layer and a main body layer in the same way as the low potential coil 915, etc.

The first low potential pad electrode layer 931 is formed at the interlayer insulating layer 910 that is the same as the low potential coil 915. The first low potential pad electrode layer 931 is formed in an island shape, and faces the first end portion of the lead-out wiring 933 with the interlayer insulating layer 910 between the first low potential pad electrode layer 931 and the first end portion of the lead-out wiring 933. The first low potential pad electrode layer 931 forms the low potential terminal 925.

The low potential connection wiring 932 is formed in the first inner region 920 of the first transformer 914A (low potential coil 915) in the interlayer insulating layer 910 that is the same as the low potential coil 915. The low potential connection wiring 932 is formed in an island shape, and faces the high potential terminal 926 (first high potential terminal 926A) in the normal direction Z. Preferably, the low potential connection wiring 932 has a plane area exceeding the plane area of the wiring plug electrode 38. The low potential connection wiring 932 is electrically connected to the first inner end 917 of the low potential coil 915.

The lead-out wiring 933 is formed in a region between the semiconductor chip 901 and the first low potential pad electrode layer 931 in the interlayer insulating layer 910. In this embodiment, the lead-out wiring 933 is formed in the interlayer insulating layer 910 that is a first layer in order from the undermost insulating layer 908. The lead-out wiring 933 includes a first end portion on one side, a second end portion on the other side, and a wiring portion connecting the first and second end portions. The first end portion of the lead-out wiring 933 is placed in a region between the semiconductor chip 901 and the first low potential pad electrode layer 931. The second end portion of the lead-out wiring 933 is placed in a region between the semiconductor chip 901 and the low potential connection wiring 932. The wiring portion extends along the first principal surface 902 of the semiconductor chip 901, and extends in a belt shape in a region between the first and second end portions.

The first connection plug electrode 934 is formed in a region between the first low potential pad electrode layer 931 and the lead-out wiring 933 in the interlayer insulating layer 910, and is electrically connected to the first low potential pad electrode layer 931 and the first end portion of the lead-out wiring 933. The second connection plug electrode 935 is formed in a region between the low potential connection wiring 932 and the lead-out wiring 933 in the interlayer insulating layer 910, and is electrically connected to the low potential connection wiring 932 and the second end portion of the lead-out wiring 933.

The second low potential wirings 928 are each electrically connected to the first outer end 918 of the low potential coil 915 of corresponding transformers 914A to 914D as shown in FIG. 60. The second low potential wirings 928 each have the same structure as the first low potential wiring 927.

Referring to FIG. 61, the first high potential wirings 929 are each electrically connected to corresponding high potential terminals 926A to 12D and to the second inner end 921 of corresponding transformers 914A to 914D (high potential coil 916). The first high potential wirings 929 each have the same structure. The first high potential wiring 929 may form the high potential terminal 926 mentioned above. A structure of the first high potential wiring 929 connected to the first high potential terminal 926A and to the first transformer 914A will be hereinafter described as an example. A description of structures of other first high potential wirings 929 is omitted on the condition that a description of the structure of the first high potential wiring 929 connected to the first transformer 914A is correspondingly applied.

The first high potential wiring 929 includes a high potential connection wiring 937 and a single or a plurality of (in this embodiment, a plurality of) pad plug electrodes 938. Preferably, the high potential connection wiring 937 and the pad plug electrode 938 are made of the same conductive material as the low potential coil 915, etc. In other words, preferably, the high potential connection wiring 937 and the pad plug electrode 938 each include a barrier layer and a main body layer in the same way as the low potential coil 915, etc.

The high potential connection wiring 937 is formed in the second inner region 924 of the high potential coil 916 in the interlayer insulating layer 910 that is the same as the high potential coil 916. The high potential connection wiring 937 is formed in an island shape, and faces the high potential terminal 926 (first high potential terminal 926A) in the normal direction Z. The high potential connection wiring 937 is electrically connected to the second inner end 921 of the high potential coil 916. The high potential connection wiring 937 is formed at a distance from the low potential connection wiring 932 in a plan view, and does not face the low potential connection wiring 932 in the normal direction Z. Hence, the insulation distance between the low potential connection wiring 932 and the high potential connection wiring 937 is increased, and the dielectric withstand voltage of the first insulating portion 905 is raised.

The pad plug electrodes 938 are formed in a region between the high potential terminal 926 (first high potential terminal 926A) and the high potential connection wiring 937 in the uppermost insulating layer 909, and are each electrically connected to the high potential terminal 926 and the high potential connection wiring 937. The pad plug electrodes 938 each have a plane area less than the plane area of the high potential connection wiring 937 in a plan view.

The second high potential wirings 930 are each electrically connected to corresponding high potential terminals 926E and 926F and to the second outer ends 922 of corresponding transformers 914A to 914D (high potential coils 916). The second high potential wirings 930 each have the same structure. A structure of the second high potential wiring 930 connected to the fifth high potential terminal 926E and to the first transformer 914A (second transformer 914B) will be hereinafter described as an example. A description of structures of other second high potential wirings 930 is omitted on the condition that a description of the structure of the second high potential wiring 930 connected to the first transformer 914A (second transformer 914B) is correspondingly applied.

The second high potential wiring 930 has the same structure as the first high potential wiring 929 except that the second high potential wiring 930 is electrically connected to the second outer end 922 of the first transformer 914A (high potential coil 916) and to the second outer end 922 of the second transformer 914B (high potential coil 916).

The second high potential wiring 930 is formed around the high potential coil 916. The second high potential wiring 930 is formed in a region between two adjoining high potential coils 916 in a plan view, and faces the high potential terminal 926 (fifth high potential terminal 926E) in the normal direction Z. The second high potential wiring 930 is formed at a distance from the low potential connection wiring 932 in a plan view, and does not face the low potential connection wiring 932 in the normal direction Z. Hence, the insulation distance between the low potential connection wiring 932 and the second high potential wiring 930 is increased, and the dielectric withstand voltage of the first insulating portion 905 is raised.

Referring to FIG. 62, preferably, a distance D1 between the low potential terminal 925 and the high potential terminal 926 exceeds a distance D2 between the low potential coil 915 and the high potential coil 916 (D2<D1). Preferably, the distance D1 exceeds the total thickness TD1 of the first insulating portion 905 (TD1<D1). The ratio D2/D1 of the distance D2 with respect to the distance D1 may be not less than 0.005 and not more than 0.5. Preferably, the distance D1 is not less than 100 μm and not more than 1000 μm. The distance D2 may be not less than 2 μm and not more than 120 μm. Preferably, the distance D2 is not less than 5 μm and not more than 50 μm. The value of the distance D1 and the value of the distance D2 are arbitrary, and are appropriately adjusted in accordance with a dielectric withstand voltage to be realized.

Referring to FIG. 61 and FIG. 62, the semiconductor device D1 includes a dummy pattern 939 buried in the first insulating portion 905 so as to be placed around the transformers 914A to 914D in a plan view.

The dummy pattern 939 may have a shape that is the same as the dummy pattern 39 of the semiconductor device A1. For example, the dummy pattern 939 may include a high potential dummy pattern 940 having a shape corresponding to the high potential dummy pattern 86, a first high potential dummy pattern 941 having a shape corresponding to the first high potential dummy pattern 87, a second high potential dummy pattern 942 having a shape corresponding to the second high potential dummy pattern 88, and a floating dummy pattern 972 having a shape corresponding to the floating dummy pattern 161. In FIG. 62, the high potential dummy pattern 940, the second high potential dummy pattern 942, and the floating dummy pattern 972 are shown.

Referring to FIG. 62, the semiconductor device D1 includes a second functional device 974 formed at the first principal surface 902 of the semiconductor chip 901. The second functional device 974 is formed by utilizing a surface layer portion of the first principal surface 902 of the semiconductor chip 901 and/or a region on the first principal surface 902 of the semiconductor chip 901, and is covered by the first insulating portion 905 (undermost insulating layer 908). In FIG. 62, the second functional device 974 is simplified and shown by the broken line shown in the surface layer portion of the first principal surface 902.

The second functional device 974 is electrically connected to the low potential terminal 925 through a low potential wiring, and is electrically connected to the high potential terminal 926 through a high potential wiring. The second functional device 974 may include at least one among a passive device, a semiconductor rectifying device, and a semiconductor switching device. The second functional device 974 may include a circuit network in which two or more kinds of arbitrary devices among the passive device, the semiconductor rectifying device, and the semiconductor switching device are selectively combined. The circuit network may form a part or all of an integrated circuit.

The passive device may include a semiconductor passive device. The passive device may include either one or both of a resistor and a capacitor. The semiconductor rectifying device may include at least one among a pn junction diode, a PIN diode, a Zener diode, a Schottky barrier diode, and a fast-recovery diode. The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

Referring to FIG. 62, the semiconductor device D1 further includes a second insulating portion 975 formed on the insulating principal surface 906 of the first insulating portion 905. The second insulating portion 975 may be referred to as a passivation layer. The second insulating portion 975 protects the first insulating portion 905 or the semiconductor chip 40 from above the insulating principal surface 906.

In this embodiment, the second insulating part 975 has a laminated structure consisting of inorganic insulating layers including a first inorganic insulating layer 976 and a second inorganic insulating layer 977. The first inorganic insulating layer 976 may include silicon oxide. Preferably, the first inorganic insulating layer 976 includes USG (undoped silicate glass) that is silicon oxide undoped with impurities. The thickness of the first inorganic insulating layer 976 may be not less than 50 nm and not more than 5000 nm. The second inorganic insulating layer 977 may include silicon nitride. The thickness of the second inorganic insulating layer 977 may be not less than 500 nm and not more than 5000 nm. It is possible to raise a dielectric withstand voltage on the high potential coil 916 by increasing the total thickness of the second insulating portion 975.

The dielectric breakdown voltage (V/cm) of USG exceeds the dielectric breakdown voltage (V/cm) of silicon nitride if the first inorganic insulating layer 976 is made of USG and if the second inorganic insulating layer 977 is made of silicon nitride. Therefore, preferably, the first inorganic insulating layer 976 thicker than the second inorganic insulating layer 977 is formed when the second insulating portion 975 is thickened.

The first inorganic insulating layer 976 may include at least either one of BPSG (boron doped phosphor silicate glass) and PSG (phosphorus silicate glass) as an example of silicon oxide. However, in this case, impurities (boron or phosphorus) are included in silicon oxide, and therefore, particularly preferably, the first inorganic insulating layer 976 made of USG is formed from the viewpoint of raising a dielectric withstand voltage on the high potential coil 916. Of course, the second insulating portion 975 may have a single layer structure consisting of either one of the first inorganic insulating layer 976 and the second inorganic insulating layer 977.

The second insulating portion 975 has a plurality of low potential pad openings 978 and a plurality of high potential pad openings 979. In this embodiment, an insulating layer in a region on the low potential terminal 925 is removed in the first insulating portion 905. In other words, a penetrating hole 980 is formed that penetrates through the insulating layers (in this embodiment, the uppermost insulating layer 909 and the interlayer insulating layers 910) from the insulating principal surface 906 toward the low potential terminal 925 (first low potential pad electrode layer 931). The penetrating hole 980 is a space portion that is closed in the lateral direction and that is surrounded and demarcated by the interlayer insulating layer 910.

Through this penetrating hole 980, the low potential pad openings 978 respectively expose the low potential terminals 925. The high potential pad openings 979 respectively expose the high potential terminals 926. The second insulating portion 975 may have an overlap portion that is stranded on a peripheral edge portion of the high potential terminal 926. The low potential terminal 925 exposed from the low potential pad opening 978 may be referred to as a low potential pad 996, and the high potential terminal 926 exposed from the high potential pad opening 979 may be referred to as a high potential pad 997. A covering layer including at least one of palladium and nickel may be formed on a surface of the low potential pad 996 and a surface of the high potential pad 997.

The semiconductor device D1 further includes a protective layer 981 formed on the second insulating part 975. The protective layer 981 may include an organic insulating layer, and may include a photosensitive resin. The protective layer 981 may include at least one among polyimide, polyamide, and polybenzoxazole. In this embodiment, the protective layer 708 includes polyimide. The thickness of the protective layer 981 may be not less than 1 μm and not more than 100 μm.

Preferably, the thickness of the protective layer 981 exceeds the total thickness of the second insulating portion 975. Additionally, preferably, the total thickness of the second insulating portion 975 and the protective layer 981 is equal to or larger than the distance D2 between the low potential coil 20 and the high potential coil 916. In this case, preferably, the total thickness of the second insulating portion 975 is not less than 2 μm and not more than 10 μm. Additionally, preferably, the thickness of the protective layer 981 is not less than 5 μm and not more than 50 μm. With these structures, it is possible to suppress the thickening of the second insulating portion 975 and the protective layer 981, and at the same time, it is possible to appropriately raise a dielectric withstand voltage on the high potential coil 916 by means of the laminated film consisting of the second insulating portion 975 and the protective layer 981.

The protective layer 981 includes a first portion 982 covering a region on the low potential side and a second portion 983 covering a region on the high potential side. The first portion 982 has a plurality of low potential terminal openings 984 that respectively expose the low potential terminals 925 (low potential pad openings 978).

The second portion 983 is formed at a distance from the first portion 982, and exposes the second insulating portion 975 from an interval between the first portion 982 and the second portion 983. The second portion 983 has a plurality of high potential terminal openings 985 that respectively expose the high potential terminals 926 (high potential pad openings 979). The second portion 983 entirely covers the transformers 914A to 914D and the dummy pattern 939. In detail, the second portion 983 entirely covers the high potential coils 916, the high potential terminals 926, the first high potential dummy pattern 941, the second high potential dummy pattern 942, and the floating dummy pattern 972.

In the protective layer 981, a slit between the first portion 982 and the second portion 983 functions as an anchor portion with respect to the sealing resin 6. A part of the sealing resin 6 enters the slit between the first portion 982 and the second portion 983, and is connected to the second insulating portion 975. Hence, the adhesive force of the sealing resin 6 to the semiconductor device D1 is raised. Of course, the first portion 982 and the second portion 983 may be formed integrally with each other. Additionally, the protective layer 981 may include only either one of the first portion 982 and the second portion 983.

As described above, with this semiconductor device D1, the low potential terminal 925 (low potential pad) is formed at a layer that is the same as the low potential coil 915. Therefore, there is no need to form a wiring electrically connected to the low potential coil 720 at the interlayer insulating layer 910 and the uppermost insulating layer 909 that are closer to the high potential coil 916 than the first low potential pad electrode layer 731. For example, in order to form the low potential terminal 925 at the same layer as the high potential terminal 926, a step of forming a via by burying a conductor in each of the inorganic insulating layers of the first insulating portion 905 is required whenever these inorganic insulating layers are laminated, and, as a result, a lead time becomes long.

Figure 63:
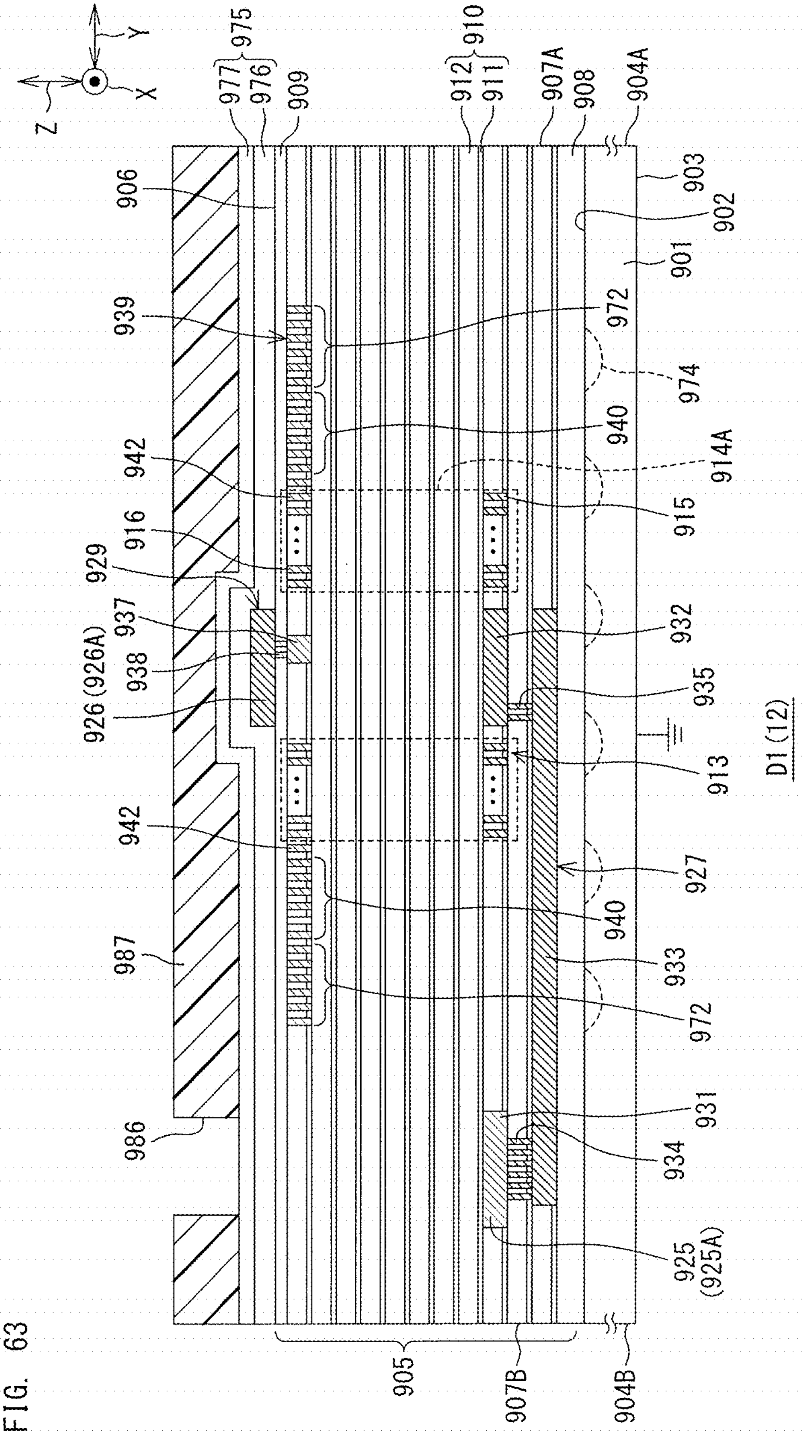
FIG. 63 is a view shown to describe an effect of the semiconductor device of FIG. 59.

On the other hand, with this semiconductor device D1, it suffices to form a laminated structure consisting of the first insulating portion 905 and the second insulating portion 975 on the semiconductor chip 901 according to the CVD method or the like and then form the penetrating hole 980 by performing etching through a mask 987 selectively having an opening 986 as shown in FIG. 63. In other words, it is possible to save time and labor for moving semiconductor wafers between a plurality of devices, such as a device for laminating inorganic insulating layers, a device for forming a via hole in an inorganic insulating layer, and a device for burying a via in a via hole, and it is possible to expose the low potential terminal 925 by forming the penetrating hole 980 by use of a single etching device. As a result, it is possible to make a lead time shorter and make costs lower.

Various masking materials, such as a resist film, an inorganic insulating film, and a metal film, can be used as the mask 987. In more detail, a thick film resist, an inorganic insulating film, such as SiC, a metal film, such as Ti, TiN, Ta, TaN, W, and Al, may be used.

Second Preferred Embodiment

Figure 64:
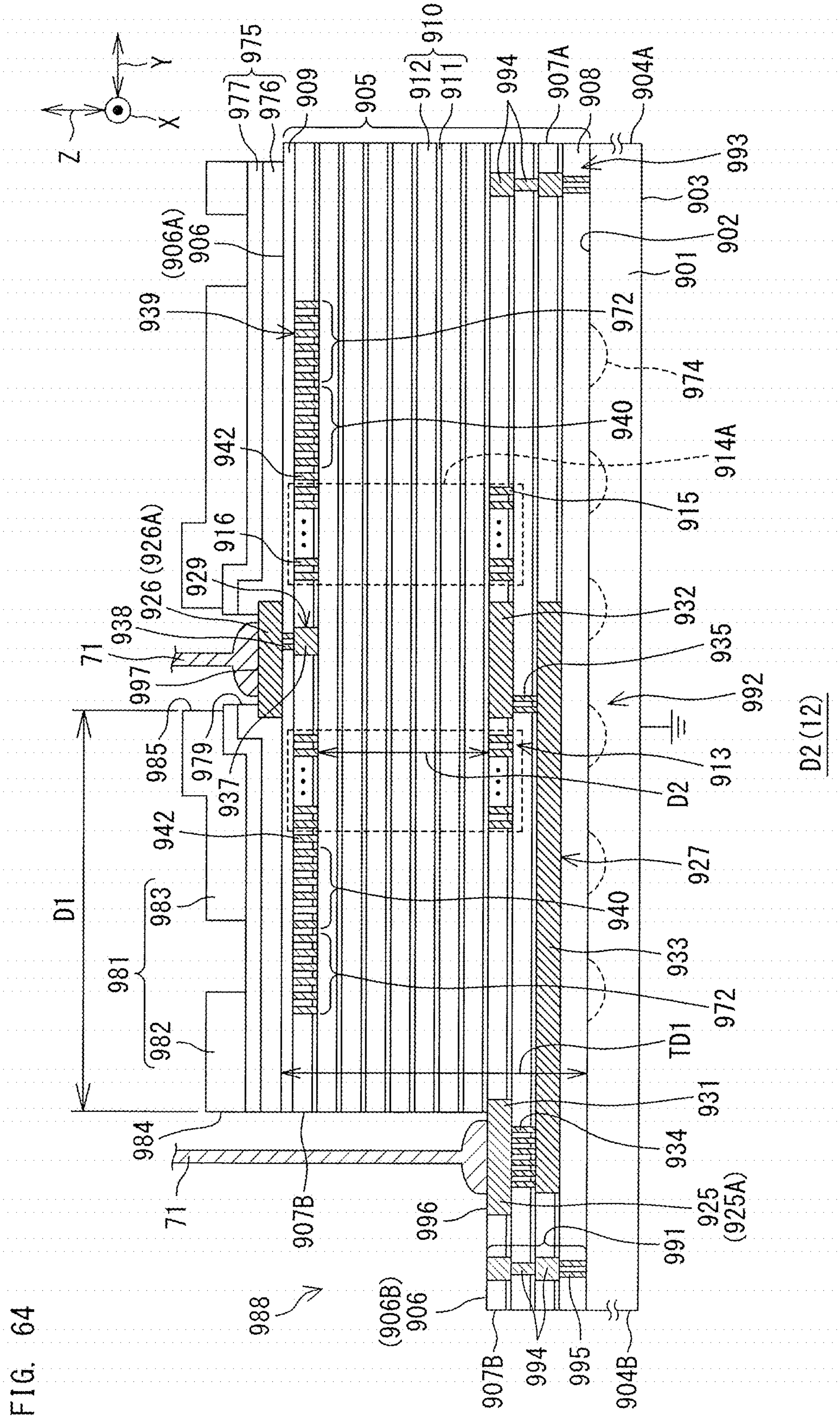
FIG. 64 is a schematic cross-sectional view of a semiconductor device D1 according to one preferred embodiment of the present disclosure.

FIG. 64 is a schematic cross-sectional view of a semiconductor device D2 according to a preferred embodiment of the present disclosure. The same reference sign is hereinafter assigned to a constituent equivalent to the constituent mentioned with respect to the aforementioned semiconductor device D1, and a description of this constituent is omitted.

In the semiconductor device D2, a space portion 988 is defined by forming the penetrating hole 980 of the semiconductor device D1 so as to be open to the chip sidewall 904B side. Hence, the insulating principal surface 906 of the first insulating portion 905 includes a first insulating principal surface 906A and a second insulating principal surface 906B. The first insulating principal surface 906A is formed by an upper surface of the uppermost insulating layer 909, and the second insulating principal surface 906B is formed by an upper surface of the interlayer insulating layer 910 in which the low potential coil 915 and the low potential terminal 925 are buried. A level difference in the normal direction Z is formed between the first insulating principal surface 906A and the second insulating principal surface 906B, and the space portion 988 is formed at this level difference portion. The space portion 988 may be a region demarcated by the second insulating principal surface 906B and by the insulating sidewall 907B closer to the high potential coil 916 than the second insulating principal surface 906B. The low potential terminal 925 is exposed to the space portion 988.

Additionally, the semiconductor device D1 further includes a seal conductor 991 buried in the first insulating portion 905. The seal conductor 991 is buried in the first insulating portion 905 in the form of a wall at a distance from the insulating sidewalls 907A to 907D in a plan view, and partitions the first insulating portion 905 into a device region 992 and an outer region 993. The seal conductor 991 suppresses penetration of moisture and penetration of cracks into the device region 992 from the outer region 993.

The device region 992 is a region including the first functional device 913 (transformers 914), the second functional device 974, the low potential terminals 925, the high potential terminals 926, the first low potential wiring 927, the second low potential wiring 928, the first high potential wiring 929, the second high potential wiring 930, and the dummy pattern 939. The outer region 993 is a region outside the device region 992.

The seal conductor 991 is electrically separated from the device region 992. In detail, the seal conductor 991 is electrically separated from the first functional device 913 (transformers 914), the second functional device 974, the low potential terminals 925, the high potential terminals 926, the first low potential wiring 927, the second low potential wiring 928, the first high potential wiring 929, the second high potential wiring 930, and the dummy pattern 939. In more detail, the seal conductor 991 is fixed in an electrically floating state. The seal conductor 991 does not form a current path connected to the device region 992.

The seal conductor 991 is formed in a belt shape along the insulating sidewalls 907 to 907D in a plan view. In this embodiment, the seal conductor 991 is formed in a quadrangular annular shape (in detail, rectangular annular shape) in a plan view. Hence, the seal conductor 991 demarcates the device region 992 having a quadrangular shape (in detail, rectangular shape) in a plan view. Additionally, the seal conductor 991 demarcates the outer region 939 having a quadrangular annular shape (in detail, rectangular annular shape) surrounding the device region 992 in a plan view.

In detail, the seal conductor 991 has an upper end portion on the second insulating principal surface 906B side, a lower end portion on the semiconductor chip 901 side, and a wall portion extending in a wall shape between the upper end portion and the lower end portion. In this embodiment, the upper end portion of the seal conductor 991 is formed so as to be exposed from the second insulating principal surface 906B, and is placed in the first insulating portion 905. The lower end portion of the seal conductor 991 is formed at a distance from the semiconductor chip 901 toward the upper end portion side.

As thus described, in this embodiment, the seal conductor 991 is buried in the first insulating portion 905 so as to be placed on the semiconductor chip 901 side with respect to the low potential terminals 925 and the high potential terminals 926. Additionally, in the first insulating portion 905, the seal conductor 991 faces the first functional device 913 (transformers 914), the first low potential wiring 927, the second low potential wiring 928, the first high potential wiring 929, the second high potential wiring 930, and the dummy pattern 939 in a direction parallel to the insulating principal surface 906. In the first insulating portion 905, the seal conductor 991 may face a part of the second functional device 974 in the direction parallel to the insulating principal surface 906.

The seal conductor 991 includes a plurality of seal plug conductors 994 and a single or a plurality of (in this embodiment, a plurality of) seal via conductors 995. The number of the seal via conductors 995 is arbitrary. The seal plug conductor 994, which is an uppermost one among the seal plug conductors 994, forms the upper end portion of the seal conductor 991. The seal via conductors 995 each form the lower end portion of the seal conductor 991. Preferably, the seal plug conductor 994 and the seal via conductor 995 are made of the same conductive material as the low potential coil 915. In other words, preferably, the seal plug conductor 994 and the seal via conductor 995 include a barrier layer and a main body layer in the same way as the low potential coil 915, etc.

The seal plug conductors 994 are buried in the interlayer insulating layers 910, respectively, and are each formed in a quadrangular annular shape (in detail, rectangular annular shape) surrounding the device region 992 in a plan view. The seal plug conductors 994 are stacked from the undermost insulating layer 908 toward the uppermost insulating layer 909 so as to be connected to each other. The number of laminated layers of the seal plug conductors 994 coincides with the number of laminated layers of the interlayer insulating layers 910 to the second insulating principal surface 906B. Of course, the single or the plural seal plug conductors 994 penetrating through the interlayer insulating layers 910 may be formed.

All of the seal plug conductors 994 are not required to be formed so as to be annular as long as one annular seal conductor 991 is formed by an aggregate of the seal plug conductors 994. For example, at least one of the seal plug conductors 994 may be formed in a shape with ends. Additionally, at least one of the seal plug conductors 994 may be divided into a plurality of belt shape parts with ends. However, preferably, the seal plug conductors 994 are formed in an endless shape (annular shape) in consideration of the risk of penetration of moisture and cracks into the device region 992.

The seal via conductors 995 are each formed in a region between the semiconductor chip 901 and the seal plug conductor 994 in the undermost insulating layer 908. The seal via conductors 995 are connected to the semiconductor chip 901 and are connected to the seal plug conductor 994. Hence, the seal conductor 991 may be fixed to the ground potential through the seal via conductor 995. The seal via conductors 995 have a plane area less than the plane area of the seal plug conductor 994. If the single seal via conductor 995 is formed, the single seal via conductor 995 may have a plane area equal to or larger than the plane area of the seal plug conductor 994.

The width of the seal conductor 991 may be not less than 0.1 μm and not more than 20 μm. Preferably, the width of the seal conductor 991 is not less than 1 μm and not more than 10 μm. The width of the seal conductor 991 is defined by a width in a direction perpendicular to a direction in which the seal conductor 991 extends.

As described above, with this semiconductor device D2, the low potential terminal 925 (low potential pad) is formed at a layer that is the same as the low potential coil 915. Therefore, there is no need to form a wiring electrically connected to the low potential coil 720 at the interlayer insulating layer 910 and the uppermost insulating layer 909 that are closer to the high potential coil 916 than the first low potential pad electrode layer 731. For example, in order to form the low potential terminal 925 at the same layer as the high potential terminal 926, a step of forming a via by burying a conductor in each of the inorganic insulating layers of the first insulating portion 905 is required whenever these inorganic insulating layers are laminated, and, as a result, a lead time becomes long.

Figure 65:
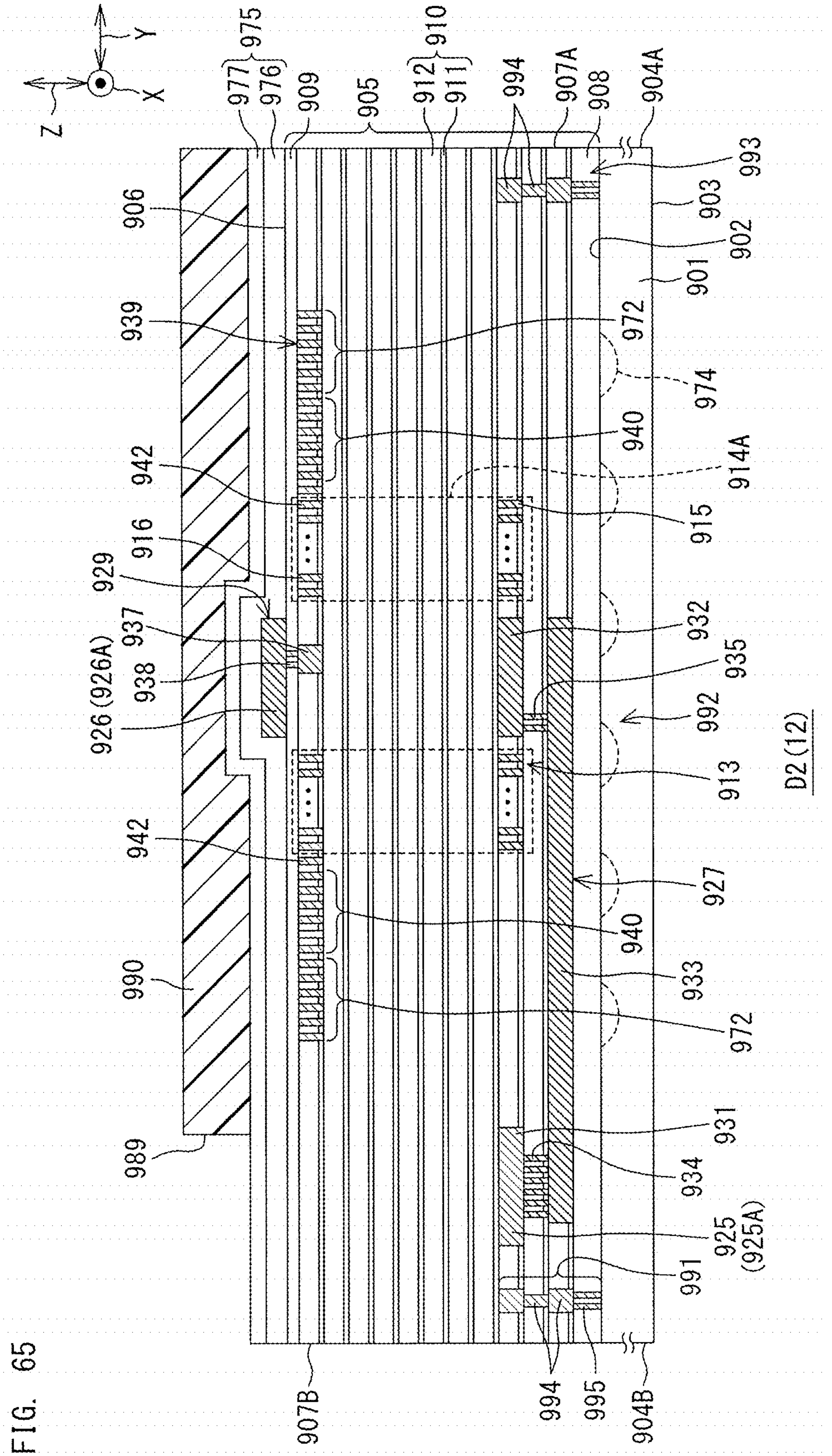
FIG. 65 is a view shown to describe an effect of the semiconductor device of FIG. 64.

On the other hand, with this semiconductor device D2, it suffices to form a laminated structure consisting of the first insulating portion 905 and the second insulating portion 975 on the semiconductor chip 901 according to the CVD method or the like and then form the space portion 988 by performing etching through a mask 990 selectively having an opening 989 as shown in FIG. 65. In other words, it is possible to save time and labor for moving semiconductor wafers between a plurality of devices, such as a device for laminating inorganic insulating layers, a device for forming a via hole in an inorganic insulating layer, and a device for burying a via in a via hole, and it is possible to expose the low potential terminal 925 by forming the penetrating hole 988 by use of a single etching device. As a result, it is possible to make a lead time shorter and make costs lower.

Various masking materials, such as a resist film, an inorganic insulating film, and a metal film, can be used as the mask 990. In more detail, a thick film resist, an inorganic insulating film, such as SiC, a metal film, such as Ti, TiN, Ta, TaN, W, and Al, may be used.

Figure 66:
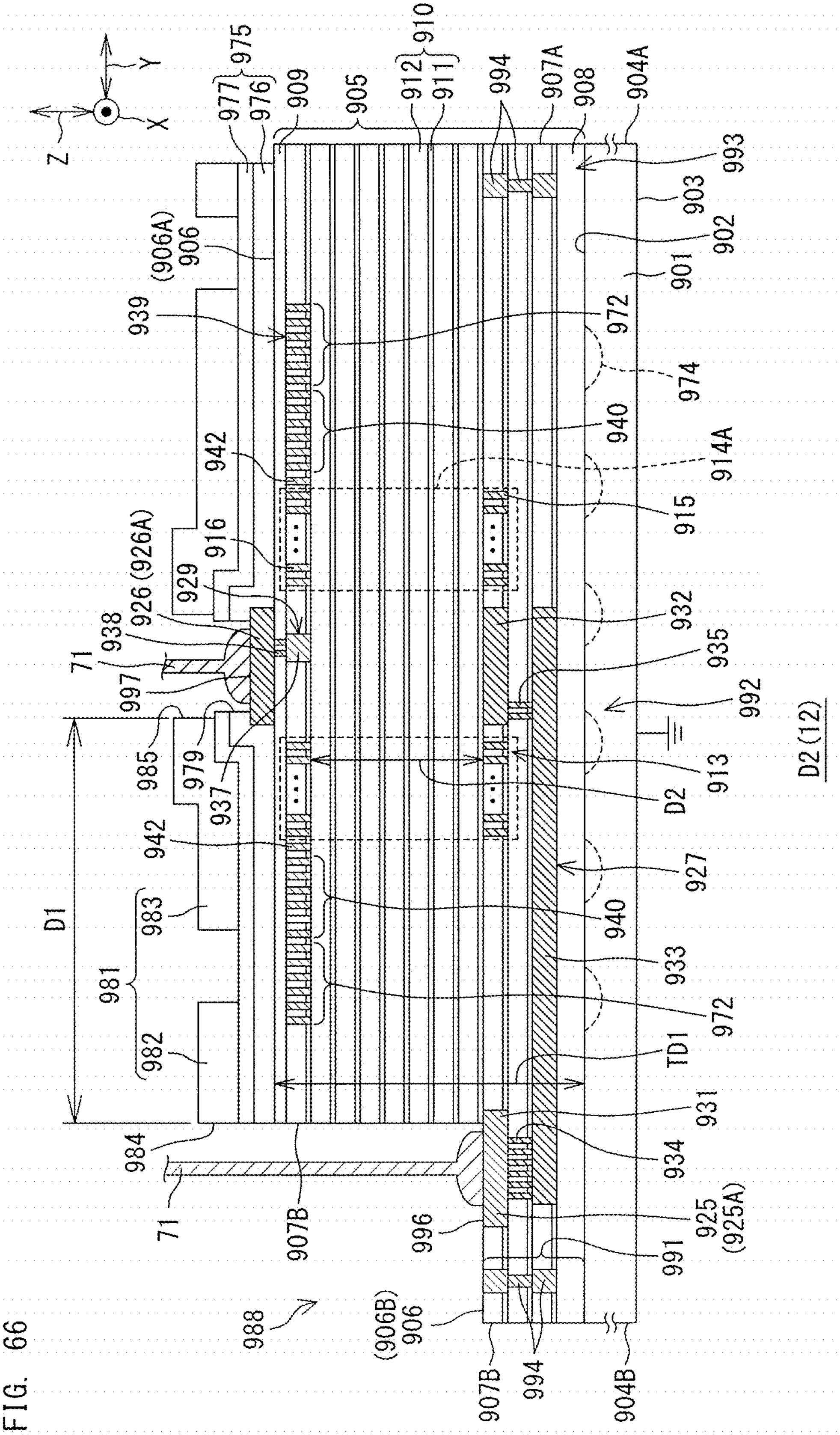
FIG. 66 is a schematic cross-sectional view of a semiconductor device D1 according to one preferred embodiment of the present disclosure.

In the description above, the seal conductor 991 is connected to the semiconductor chip 901 through the seal via conductor 995, and is fixed to the ground potential. On the other hand, the seal conductor 991 is not necessarily required to be fixed to the ground potential by excluding the seal via conductor 995 as shown in FIG. 66. Additionally, the entirety of the seal conductor 991 may be excluded.

<Structures of Semiconductor Devices E1 and E2>

First Preferred Embodiment

Figure 67:
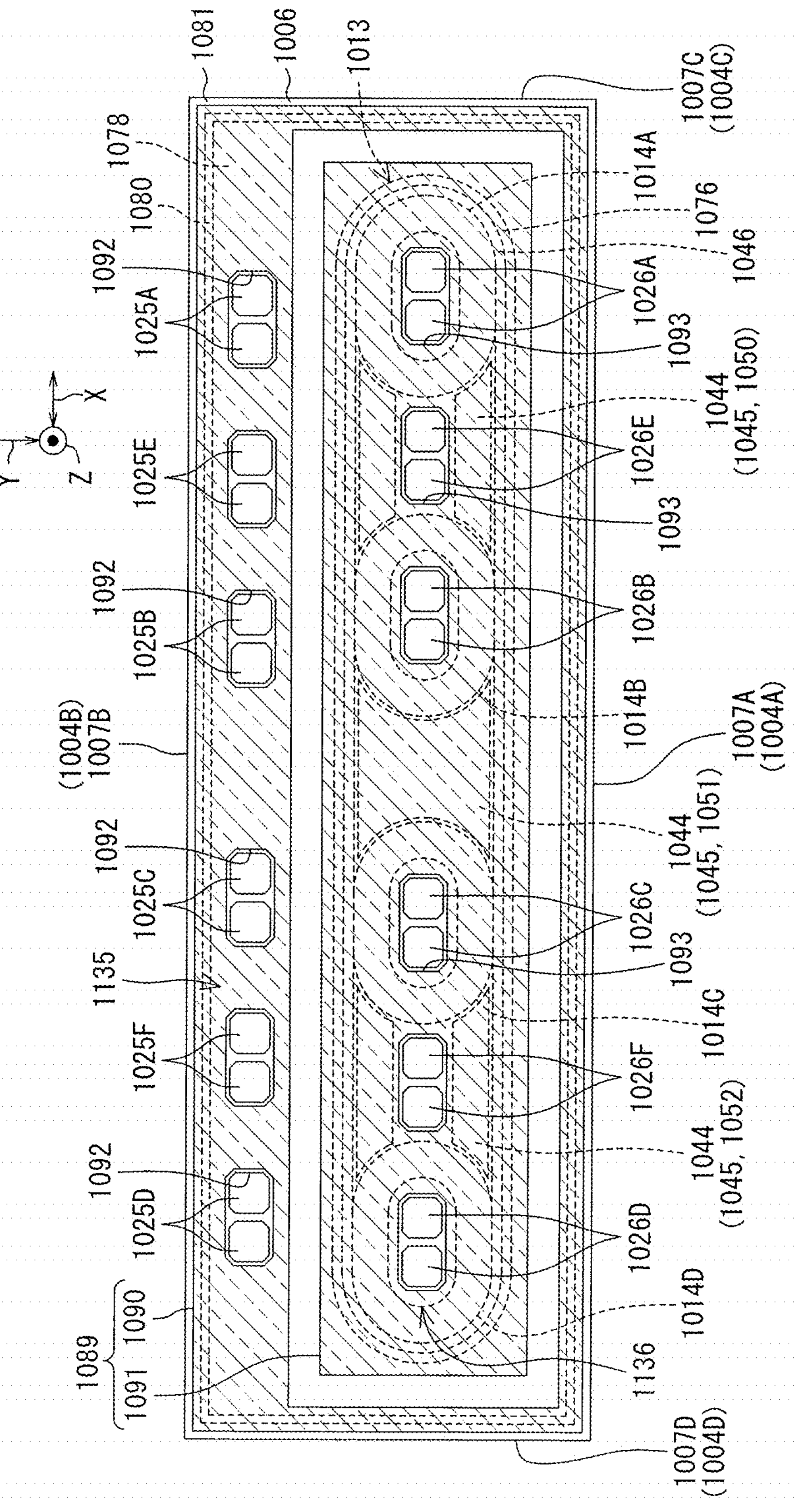
FIG. 67 is a schematic plan view of a semiconductor device E1 according to one preferred embodiment of the present disclosure.
Figure 68:
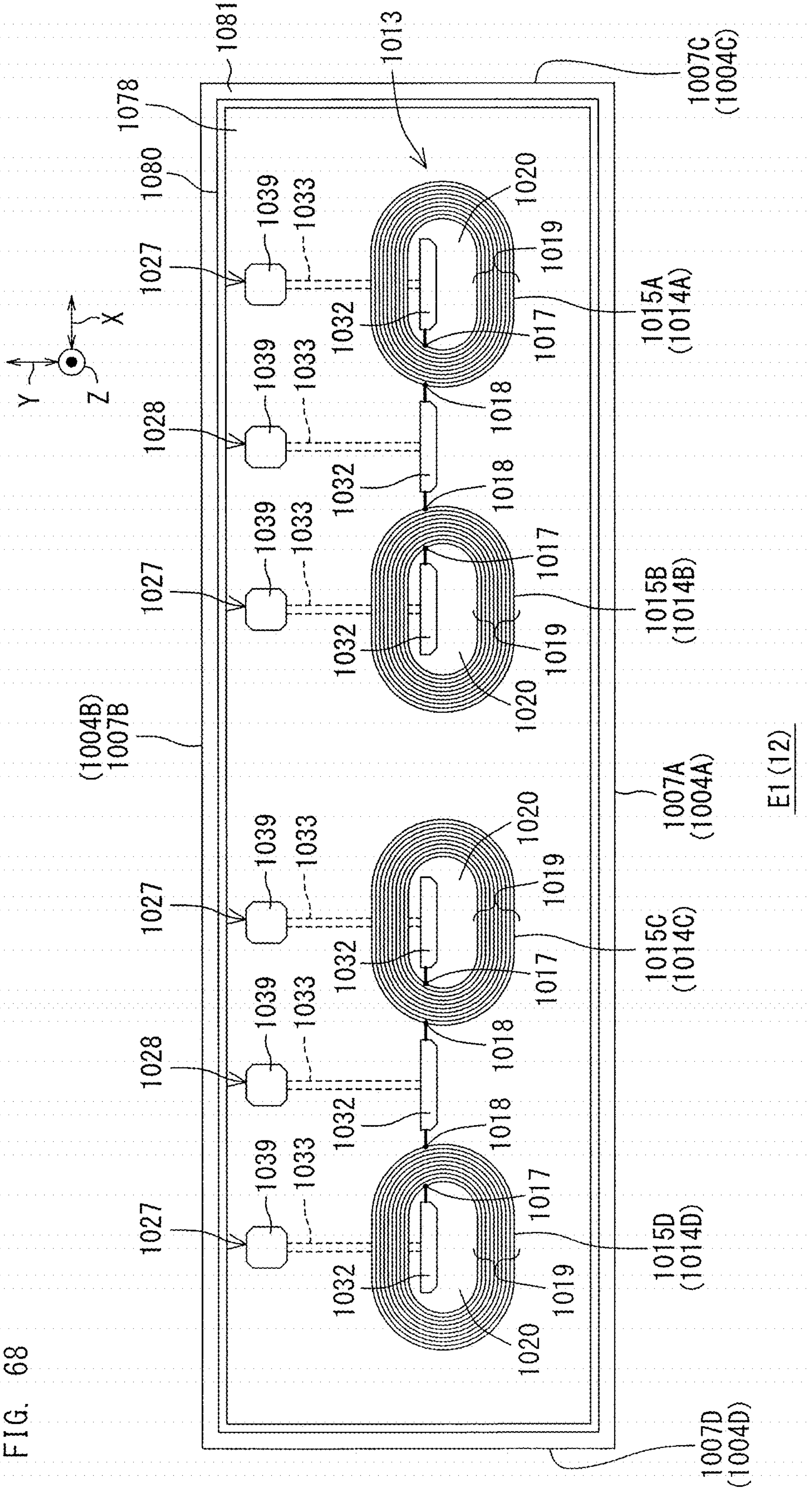
FIG. 68 is a plan view showing a layer in which a low potential coil 20 is formed in the semiconductor device E1 of FIG. 67.
Figure 69:
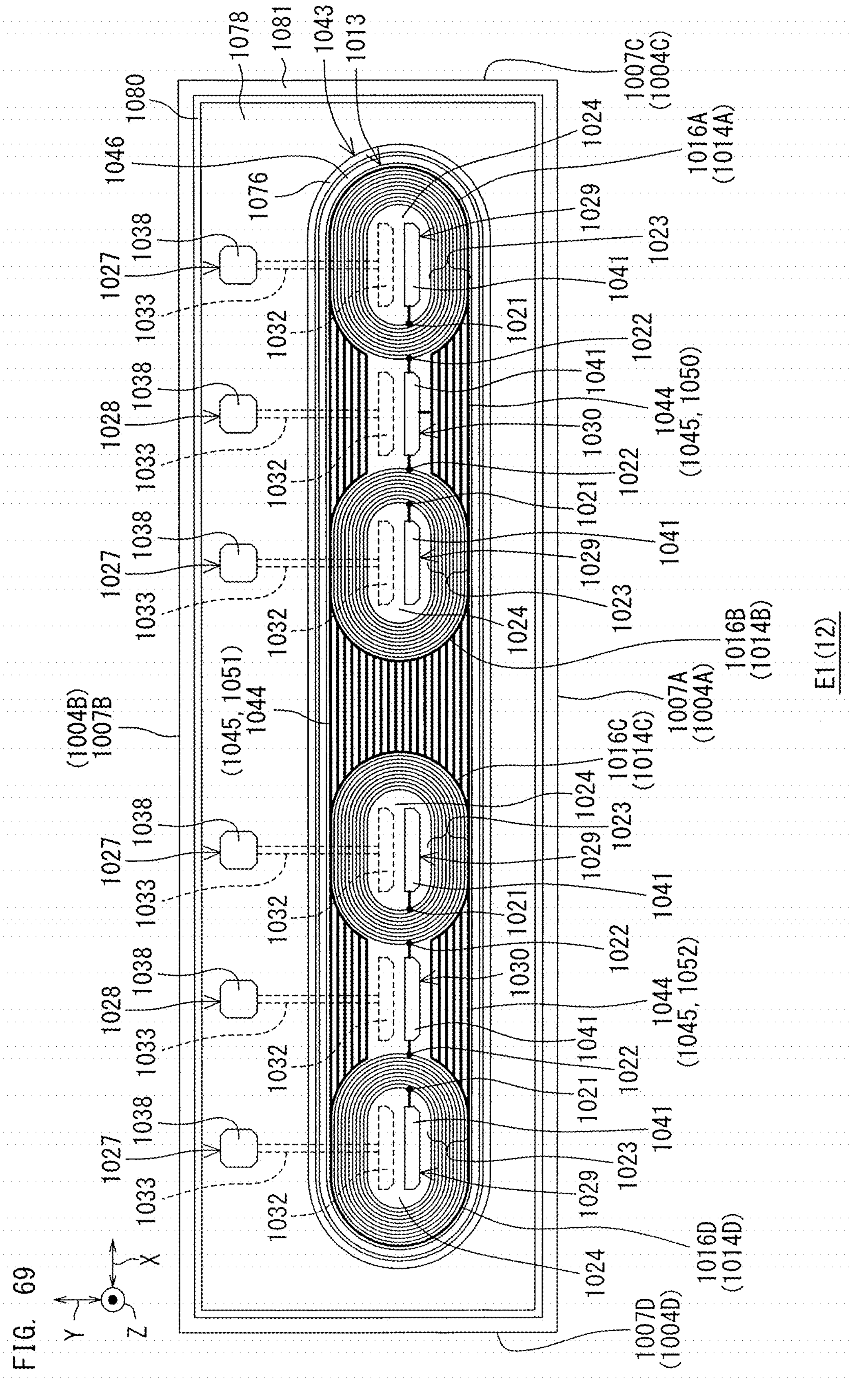
FIG. 69 is a plan view showing a layer in which a high potential coil 1016 is formed in the semiconductor device E1 of FIG. 67.
Figure 70:
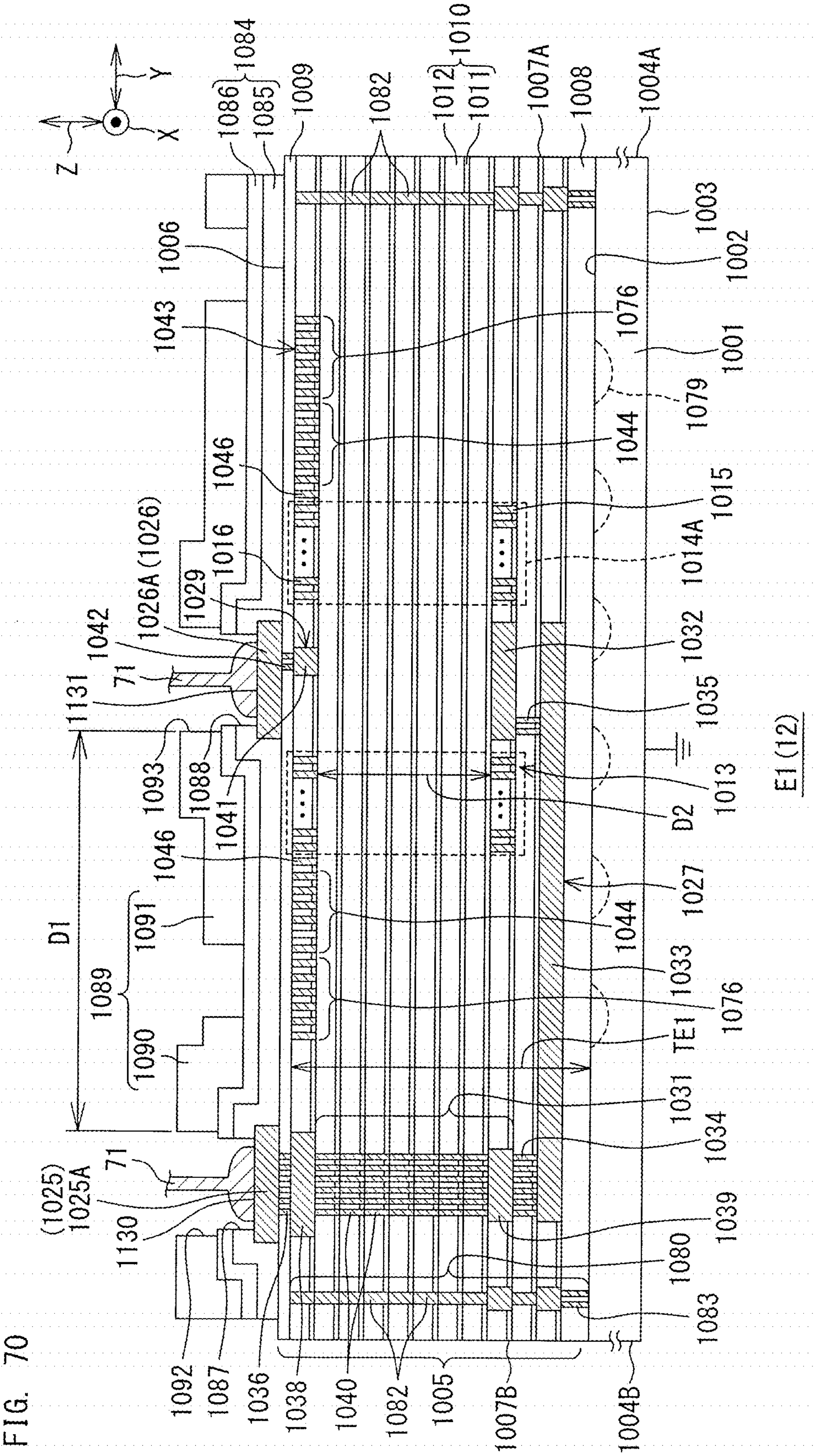
FIG. 70 is a schematic cross-sectional view of the semiconductor device E1 of FIG. 67.

FIG. 67 is a schematic plan view of a semiconductor device E1 according to a preferred embodiment of the present disclosure. FIG. 68 is a plan view showing a layer in which the low potential coil 20 is formed in the semiconductor device E1 of FIG. 67. FIG. 69 is a plan view showing a layer in which a high potential coil 1016 is formed in the semiconductor device E1 of FIG. 67. FIG. 70 is a schematic cross-sectional view of the semiconductor device E1 of FIG. 67.

Referring to FIG. 67 to FIG. 69, the semiconductor device E1 includes a rectangular parallelepiped shaped semiconductor chip 1001. The semiconductor chip 1001 includes at least one among silicon, a wide bandgap semiconductor, and a compound semiconductor.

The wide bandgap semiconductor is made of a semiconductor exceeding the bandgap of silicon (about 1.12 eV). Preferably, the bandgap of the wide bandgap semiconductor is 2.0 eV or more. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 1001 includes a silicon-made semiconductor substrate. The semiconductor chip 1001 may be an epitaxial substrate having a laminated structure including a silicon-made semiconductor substrate and a silicon-made epitaxial layer. The conductivity type of the semiconductor substrate may be an n type or may be a p type. The epitaxial layer may be an n type or may be a p type.

The semiconductor chip 1001 has a first principal surface 1002 on one side, a second principal surface 1003 on the other side, and chip sidewalls 1004A to 1004D that connect the first principal surface 1002 and the second principal surface 1003. The first and second principal surfaces 1002 and 1003 are each formed in a quadrangular shape (in this embodiment, rectangular shape) in a plan view seen from their normal directions Z (hereinafter, referred to simply as a "plan view").

The chip sidewalls 1004A to 1004D include a first chip sidewall 1004A, a second chip sidewall 1004B, a third chip sidewall 1004C, and a fourth chip sidewall 1004D. Each of the first and second chip sidewalls 1004A and 1004B forms a long side of the semiconductor chip 1001. The first and second chip sidewalls 1004A and 1004B extend along the first direction X, and face each other in the second direction Y. Each of the third and fourth chip sidewalls 1004C and 1004D forms a short side of the semiconductor chip 1001. The third and fourth chip sidewalls 1004C and 1004D extend in the second direction Y, and face each other in the first direction X. The chip sidewalls 1004A to 1004D are each constituted of a ground surface.

The semiconductor device E1 further includes a first insulating portion 1005 formed on the first principal surface 1002 of the semiconductor chip 1001. The first insulating portion 1005 has an insulating principal surface 1006 and insulating sidewalls 1007A to 1007D. The insulating principal surface 1006 is formed in a quadrangular shape (in this embodiment, rectangular shape) that matches the first principal surface 1002 in a plan view. The insulating principal surface 1006 extends in parallel with the first principal surface 1002.

The insulating sidewalls 1007A to 1007D include a first insulating sidewall 1007A, a second insulating sidewall 1007B, a third insulating sidewall 1007C, and a fourth insulating sidewall 1007D. The insulating sidewalls 1007A to 1007D extend from a peripheral edge of the insulating principal surface 1006 toward the semiconductor chip 1001, and are continuous with the chip sidewalls 1004A to 1004D. In detail, the insulating sidewalls 1007A to 1007D are formed so as to be flush with the chip sidewalls 1004A to 1004D. The insulating sidewalls 1007A to 1007D form ground surfaces flush with the chip sidewalls 1004A to 1004D, respectively.

The first insulating portion 1005 is formed of a multilayer insulating laminated structure including an undermost insulating layer 1008, an uppermost insulating layer 1009, and a plurality of (in this embodiment, eleven) interlayer insulating layers 1010. The undermost insulating layer 1008 is an insulating layer that directly covers the first principal surface 1002. The uppermost insulating layer 1009 is an insulating layer that forms the insulating principal surface 1006. The interlayer insulating layers 1010 are insulating layers interposed between the undermost insulating layer 1008 and the uppermost insulating layer 1009. In this embodiment, the undermost insulating layer 1008 has a single layer structure including silicon oxide. In this embodiment, the uppermost insulating layer 1009 has a single layer structure including silicon oxide. The thickness of the undermost insulating layer 1008 may be not less than 0.2 μm and not more than 4 μm (for example, about 1 μm), and the thickness of the uppermost insulating layer 1009 may be not less than 0.5 μm and not more than 3 μm (for example, about 1 μm).

Each of the interlayer insulating layers 1010 has a laminated structure including a first insulating layer 1011 on the undermost insulating layer 1008 side and a second insulating layer 1012 on the uppermost insulating layer 1009 side. The first insulating layer 1011 may include silicon nitride. The first insulating layer 1011 is formed as an etching stopper layer with respect to the second insulating layer 1012. The thickness of the first insulating layer 1011 may be not less than 0.1 μm and not more than 1 μm (for example, about 0.3 μm).

The second insulating layer 1012 is formed on the first insulating layer 1011. The second insulating layer 1012 includes an insulating material differing from that of the first insulating layer 1011. The second insulating layer 1012 may include silicon oxide. The thickness of the second insulating layer 1012 may be not less than 1 μm and not more than 3 μm (for example, about 2 μm). Preferably, the thickness of the second insulating layer 1012 exceeds the thickness of the first insulating layer 1011.

Additionally, the first insulating layer 1011 may be a compressive stress film, and the second insulating layer 1012 may be a tensile stress film. In other words, the interlayer insulating layer 1010 may be a structure in which a compressive stress film and a tensile stress film are repeatedly laminated. This makes it possible to form the first insulating portion 50 while canceling a stress in a lamination interface of the interlayer insulating layer 1010. As a result, it is possible to prevent the occurrence of large warping deformation in a semiconductor wafer that serves as a base material of the semiconductor chip 1001 in a manufacturing process of the semiconductor device E1. The compressive stress film may be, for example, a silicon oxide film, and the tensile stress film may be, for example, a silicon nitride film.

The total thickness TE1 of the first insulating portion 1005 may be not less than 2 μm and not more than 120 μm. The total thickness TE1 of the first insulating portion 1005 and the number of laminated layers of the interlayer insulating layer 1010 are arbitrary, and are adjusted in accordance with a dielectric withstand voltage (dielectric breakdown resistance) to be realized. Additionally, the insulating material of the undermost insulating layer 1008, the insulating material of the uppermost insulating layer 1009, and the insulating material of the interlayer insulating layer 1010 are arbitrary, and are not limited to a specific insulating material.

The semiconductor device E1 includes a first functional device 1013 formed at the first insulating portion 1005. The first functional device 1013 includes a single or a plurality of (in this embodiment, a plurality of) transformers 1014. In other words, the semiconductor device E1 is formed of a multichannel type device including the transformers 1014. The transformers 1014 are formed at an inward portion of the first insulating portion 1005 at a distance from the insulating sidewalls 1007A to 1007D. The transformers 1014 are formed at a distance from each other in the first direction X.

In detail, the transformers 1014 include a first transformer 1014A, a second transformer 1014B, a third transformer 1014C, and a fourth transformer 1014D that are formed in this order from the insulating sidewall 1007C side toward the insulating sidewall 1007D side in a plan view. The first transformer 1014A, the second transformer 1014B, the third transformer 1014C, and the fourth transformer 1014D may correspond to the first transformer 131, the second transformer 132, the third transformer 133, and the fourth transformer 134 of FIG. 11, respectively. The transformers 1014A to 1014D each have the same structure. A structure of the first transformer 1014A will be hereinafter described as an example. A description of structures of the second transformer 1014B, the third transformer 1014C, and the fourth transformer 1014D is omitted on the condition that a description of the structure of the first transformer 1014A is correspondingly applied.

Referring to FIG. 68 to FIG. 70, the first transformer 1014A includes a low potential coil 1015 and a high potential coil 1016. The low potential coil 1015 is formed in the first insulating portion 1005. The high potential coil 1016 is formed in the first insulating portion so as to face the low potential coil 1015 in the normal direction Z. In this embodiment, the low potential coil 1015 and the high potential coil 1016 are formed in a region (i.e., in the interlayer insulating layers 1010) interposed between the undermost insulating layer 1008 and the uppermost insulating layer 1009.

The low potential coil 1015 is formed on the undermost insulating layer 1008 (semiconductor chip 1001) side in the first insulating portion 1005, and the high potential coil 1016 is formed on the uppermost insulating layer 1009 (insulating principal surface 1006) side with respect to the low potential coil 1015 in the first insulating portion 1005. In other words, the high potential coil 1016 faces the semiconductor chip 1001 with the low potential coil 1015 between the high potential coil 1016 and the semiconductor chip 1001. Disposition places of the low potential coil 1015 and the high potential coil 1016 are arbitrary. Additionally, the high potential coil 1016 is merely required to face the low potential coil 1015 with one or more interlayer insulating layers 1010 between the high potential coil 1016 and the low potential coil 1015.

The distance between the low potential coil 1015 and the high potential coil 1016 (i.e., the number of laminated layers of the interlayer insulating layer 1010) is appropriately adjusted in accordance with a dielectric withstand voltage or an electric field strength between the low potential coil 1015 and the high potential coil 1016. In this embodiment, the low potential coil 1015 is formed at the interlayer insulating layer 1010 that is the third layer in order from the undermost insulating layer 1008 side. The high potential coil 1016 is, in this embodiment, formed at the interlayer insulating layer 1010 that is the first layer in order from the uppermost insulating layer 1009 side.

The low potential coil 1015 is buried while penetrating through the first and second insulating layers 1011 and 1012 in the interlayer insulating layer 1010. The low potential coil 1015 includes a first inner end 1017, a first outer end 1018, and a first helical portion 1019 that is helically routed around between the first inner end 1017 and the first outer end 1018. The first helical portion 1019 is helically routed around while extending in an elliptical shape (oval shape) in a plan view. A part, which forms an innermost peripheral edge, of the first helical portion 1019 demarcates a first inner region 1020 having an elliptical shape in a plan view.

The number of winding turns of the first helical portion 1019 may be not less than 3 and not more than 30. The width of the first helical portion 1019 may be not less than 0.1 μm and not more than 10 μm. Preferably, the width of the first helical portion 1019 is not less than 1 μm and not more than 5 μm. The width of the first helical portion 1019 is defined by a width in the direction perpendicular to the helical direction. A first winding pitch of the first helical portion 1019 may be not less than 0.1 μm and not more than 20 μm. Preferably, the first winding pitch is not less than 1 μm and not more than 10 μm. The first winding pitch is defined by a distance between two parts, which adjoin each other in the direction perpendicular to the helical direction, of the first helical portion 1019.

The wound shape of the first helical portion 1019 or the planar shape of the first inner region 1020 is arbitrary, and is not limited to the form shown in FIG. 68, etc. The first helical portion 1019 may be wound in a polygonal shape, such as a triangular shape or a quadrangular shape, or in a circular shape in a plan view. The first inner region 1020 may be demarcated so as to be a polygonal shape, such as a triangular shape or a quadrangular shape, or so as to be a circular shape in a plan view in accordance with the wound shape of the first helical portion 1019.

The low potential coil 1015 may include at least one among titanium, titanium nitride, copper, aluminum, and tungsten. The low potential coil 1015 may have a laminated structure including a barrier layer and a main body layer. The barrier layer demarcates a recessed space in the interlayer insulating layer 1010. The main body layer is buried in the recessed space demarcated by the barrier layer. The barrier layer may include at least one of titanium and titanium nitride. The main body layer may include at least one among copper, aluminum, and tungsten.

The high potential coil 1016 is buried while penetrating through the first and second insulating layers 1011 and 1012 in the interlayer insulating layer 1010. The high potential coil 1016 includes a second inner end 1021, a second outer end 1022, and a second helical portion 1023 helically routed around between the second inner end 1021 and the second outer end 1022. The second helical portion 1023 is helically routed around while extending in an elliptical shape (oval shape) in a plan view. In this embodiment, a part, which forms an innermost peripheral edge, of the second helical portion 1023 demarcates a second inner region 1024 having an elliptical shape in a plan view. The second inner region 1024 of the second helical portion 1023 faces the first inner region 1020 of the first helical portion 1019 in the normal direction Z.

The number of winding turns of the second helical portion 1023 may be not less than 3 and not more than 30. The number of winding turns of the second helical portion 1023 with respect to the number of winding turns of the first helical portion 1019 is adjusted in accordance with a voltage value to be increased. Preferably, the number of winding turns of the second helical portion 1023 exceeds the number of winding turns of the first helical portion 1019. Of course, the number of winding turns of the second helical portion 1023 may be less than the number of winding turns of the first helical portion 1019, or may be equal to the number of winding turns of the first helical portion 1019.

The width of the second helical portion 1023 may be not less than 0.1 μm and not more than 10 μm. Preferably, the width of the second helical portion 1023 is not less than 1 μm and not more than 5 μm. The width of the second helical portion 1023 is defined by a width in the direction perpendicular to the helical direction. Preferably, the width of the second helical portion 1023 is equal to the width of the first helical portion 1019.

A second winding pitch of the second helical portion 1023 may be not less than 0.1 μm and not more than 20 μm. Preferably, the second winding pitch is not less than 1 μm and not more than 10 μm. The second winding pitch is defined by a distance between two parts, which adjoin each other in the direction perpendicular to the helical direction, of the second helical portion 1023. Preferably, the second winding pitch is equal to the first winding pitch of the first helical portion 1019.

The wound shape of the second helical portion 1023 or the planar shape of the second inner region 1024 is arbitrary, and is not limited to the form shown in FIG. 69, etc. The second helical portion 1023 may be wound in a polygonal shape, such as a triangular shape or a quadrangular shape, or in a circular shape in a plan view. The second inner region 1024 may be demarcated so as to be a polygonal shape, such as a triangular shape or a quadrangular shape, or so as to be a circular shape in a plan view in accordance with the wound shape of the second helical portion 1023.

Preferably, the high potential coil 1016 is made of the same conductive material as the low potential coil 1015. In other words, preferably, the high potential coil 1016 includes a barrier layer and a main body layer in the same way as the low potential coil 1015.

Referring to FIG. 67, the semiconductor device E1 includes a plurality of (in this embodiment, twelve) low potential terminals 1025 and a plurality of (in this embodiment, twelve) high potential terminals 1026. The low potential terminals 1025 are each electrically connected to the low potential coil 1015 of corresponding transformers 1014A to 1014D. The high potential terminals 1026 are each electrically connected to the high potential coil 1016 of corresponding transformers 1014A to 1014D.

The low potential terminals 1025 are formed on the insulating principal surface 1006 of the first insulating portion 1005. In detail, the low potential terminals 1025 are formed in a region on the insulating sidewall 1007B side at a distance in the second direction Y from the transformers 1014A to 1014D, and are arranged at a distance from each other in the first direction X.

The low potential terminals 1025 include a first low potential terminal 1025A, a second low potential terminal 1025B, a third low potential terminal 1025C, a fourth low potential terminal 1025D, a fifth low potential terminal 1025E, and a sixth low potential terminal 1025F. In this embodiment, the low potential terminals 1025A to 1025F are each formed as two low potential terminals. The number of the low potential terminals 1025A to 1025F is arbitrary.

The first low potential terminal 1025A faces the first transformer 1014A in the second direction Y in a plan view. The second low potential terminal 1025B faces the second transformer 1014B in the second direction Y in a plan view. The third low potential terminal 1025C faces the third transformer 1014C in the second direction Y in a plan view. The fourth low potential terminal 1025D faces the fourth transformer 1014D in the second direction Y in a plan view. The fifth low potential terminal 1025E is formed in a region between the first low potential terminal 1025A and the second low potential terminal 1025B in a plan view. The sixth low potential terminal 1025F is formed in a region between the third low potential terminal 1025C and the fourth low potential terminal 1025D in a plan view.

As thus described, the region along the insulating sidewall 1007B in which the low potential terminal 1025A to 1025F are arranged may be referred to as a first region 1135 (low potential region).

The first low potential terminal 1025A is electrically connected to the first inner end 1017 of the first transformer 1014A (low potential coil 1015). The second low potential terminal 1025B is electrically connected to the first inner end 1017 of the second transformer 1014B (low potential coil 1015). The third low potential terminal 1025C is electrically connected to the first inner end 1017 of the third transformer 1014C (low potential coil 1015) The fourth low potential terminal 1025D is electrically connected to the first inner end 1017 of the fourth transformer 1014D (low potential coil 1015).

The fifth low potential terminal 1025E is electrically connected to the first outer end 1018 of the first transformer 1014A (low potential coil 1015) and to the first outer end 1018 of the second transformer 1014B (low potential coil 1015). The sixth low potential terminal 1025F is electrically connected to the first outer end 1018 of the third transformer 1014C (low potential coil 1015) and to the first outer end 1018 of the fourth transformer 1014D (low potential coil 1015).

The high potential terminals 1026 are formed on the insulating principal surface 1006 of the first insulating portion 1005 at a distance from the low potential terminals 1025. In detail, the high potential terminals 1026 are formed in a region on the insulating sidewall 1007A side at a distance in the second direction Y from the low potential terminals 1025, and are arranged at a distance from each other in the first direction X. As thus described, the region on the insulating sidewall 1007A side with respect to the low potential terminals 1025A to 1025F, in which the high potential terminals 1026A to 1026F are arranged, may be referred to as a second region 1136 (high potential region).

The high potential terminals 1026 are each formed in a region in proximity to corresponding transformers 1014A to 1014D in a plan view. That the high potential terminal 1026 is in proximity to the transformers 1014A to 1014D means that the distance between the high potential terminal 1026 and the transformer 1014 is less than the distance between the low potential terminal 1025 and the high potential terminal 1026 in a plan view.

In detail, the high potential terminals 1026 are formed at a distance along the first direction X so as to face the transformers 1014A to 1014D along the first direction X in a plan view. In more detail, the high potential terminals 1026 are formed at a distance along the first direction X so as to be placed in the second inner region 1024 of the high potential coil 1016 and in a region between adjoining high potential coils 1016 in a plan view. Hence, the high potential terminals 1026 are arranged side by side with the transformers 1014A to 1014D in a line in the first direction X in a plan view.

The high potential terminals 1026 include a first high potential terminal 1026A, a second high potential terminal 1026B, a third high potential terminal 1026C, a fourth high potential terminal 1026D, a fifth high potential terminal 1026E, and a sixth high potential terminal 1026F. In this embodiment, the high potential terminals 1026A to 1026F are each formed as two high potential terminals. The number of the high potential terminals 1026A to 1026F is arbitrary.

The first high potential terminal 1026A is formed in the second inner region 1024 of the first transformer 1014A (high potential coil 1016) in a plan view. The second high potential terminal 1026B is formed in the second inner region 1024 of the second transformer 1014B (high potential coil 1016) in a plan view. The third high potential terminal 1026C is formed in the second inner region 1024 of the third transformer 1014C (high potential coil 1016) in a plan view. The fourth high potential terminal 1026D is formed in the second inner region 1024 of the fourth transformer 1014D (high potential coil 1016) in a plan view. The fifth high potential terminal 1026E is formed in a region between the first transformer 1014A and the second transformer 1014B in a plan view. The sixth high potential terminal 1026F is formed in a region between the third transformer 1014C and the fourth transformer 1014D in a plan view.

The first high potential terminal 1026A is electrically connected to the second inner end 1021 of the first transformer 1014A (high potential coil 1016). The second high potential terminal 1026B is electrically connected to the second inner end 1021 of the second transformer 1014B (high potential coil 1016). The third high potential terminal 1026C is electrically connected to the second inner end 1021 of the third transformer 1014C (high potential coil 1016). The fourth high potential terminal 1026D is electrically connected to the second inner end 1021 of the fourth transformer 1014D (high potential coil 1016).

The fifth high potential terminal 1026E is electrically connected to the second outer end 1022 of the first transformer 1014A (high potential coil 1016) and the second outer end 1022 of the second transformer 1014B (high potential coil 1016). The sixth high potential terminal 1026F is electrically connected to the second outer end 1022 of the third transformer 1014C (high potential coil 1016) and the second outer end 1022 of the fourth transformer 1014D (high potential coil 1016).

Referring to FIG. 68 and FIG. 70, the semiconductor device E1 includes a first low potential wiring 1027, a second low potential wiring 1028, a first high potential wiring 1029, and a second high potential wiring 1030 that are each formed in the first insulating portion 1005. In this embodiment, a plurality of first low potential wirings 1027, a plurality of second low potential wirings 1028, a plurality of first high potential wirings 1029, and a plurality of second high potential wirings 1030 are formed.

The first low potential wiring 1027 and the second low potential wiring 1028 fix the low potential coil 1015 of the first transformer 1014A and the low potential coil 1015 of the second transformer 1014B to the same potential. Additionally, the first low potential wiring 1027 and the second low potential wiring 1028 fix the low potential coil 1015 of the third transformer 1014C and the low potential coil 1015 of the fourth transformer 1014D to the same potential. In this embodiment, the first low potential wiring 1027 and the second low potential wiring 1028 fix all of the low potential coils 1015 of the transformers 1014A to 1014D to the same potential.

The first high potential wiring 1029 and the second high potential wirings 1030 fix the high potential coil 1016 of the first transformer 1014A and the high potential coil 1016 of the second transformer 1014B to the same potential. Additionally, the first high potential wiring 1029 and the second high potential wirings 1030 fix the high potential coil 1016 of the third transformer 1014C and the high potential coil 1016 of the fourth transformer 1014D to the same potential. In this embodiment, the first high potential wiring 1029 and the second high potential wirings 1030 fix all of the high potential coils 1016 of the transformers 1014A to 1014D to the same potential.

The first low potential wirings 1027 are each electrically connected to corresponding low potential terminals 1025A to 1025D and to the first inner ends 1017 of corresponding transformers 1014A to 1014D (low potential coils 1015). The first low potential wirings 1027 have the same structure. A structure of the first low potential wiring 1027 connected to the first low potential terminal 1025A and to the first transformer 1014A will be hereinafter described as an example. A description of structures of other first low potential wirings 1027 is omitted on the condition that a description of the structure of the first low potential wiring 1027 connected to the first transformer 1014A is correspondingly applied.

The first low potential wiring 1027 includes a penetrating wiring 1031, a low potential connection wiring 1032, a lead-out wiring 1033, a first connection plug electrode 1034, a second connection plug electrode 1035, and a single or a plurality of (in this embodiment, a plurality of) pad plug electrodes 1036.

Preferably, the penetrating wiring 1031, the low potential connection wiring 1032, the lead-out wiring 1033, the first connection plug electrode 1034, the second connection plug electrode 1035, and the pad plug electrode 1036 are each made of the same conductive material as the low potential coil 1015, etc. In other words, preferably, each of the penetrating wiring 1031, the low potential connection wiring 1032, the lead-out wiring 1033, the first connection plug electrode 1034, the second connection plug electrode 1035, and the pad plug electrode 1036 includes a barrier layer and a main body layer in the same way as the low potential coil 1015, etc.

The penetrating wiring 1031 penetrates through the interlayer insulating layers 1010 in the first insulating portion 1005, and is formed in a pillar shape extending along the normal direction Z. In this embodiment, the penetrating wiring 1031 is formed in a region between the undermost insulating layer 1008 and the uppermost insulating layer 1009 in the first insulating portion 1005. The penetrating wiring 1031 has an upper end portion on the uppermost insulating layer 1009 side and a lower end portion on the undermost insulating layer 1008 side. The upper end portion of the penetrating wiring 1031 is formed at the interlayer insulating layer 1010 that is the same as the high potential coil 1016, and is covered by the uppermost insulating layer 1009. The lower end portion of the penetrating wiring 1031 is formed at the interlayer insulating layer 1010 that is the same as the low potential coil 1015.

In this embodiment, the penetrating wiring 1031 includes a first electrode layer 1038, a second electrode layer 1039, and a plurality of wiring plug electrodes 1040. In the penetrating wiring 1031, the first electrode layer 1038, the second electrode layer 1039, and the wiring plug electrode

1040 are each made of the same conductive material as the low potential coil 1015, etc. In other words, each of the first electrode layer 1038, the second electrode layer 1039, and the wiring plug electrode 1040 includes a barrier layer and a main body layer in the same way as the low potential coil 1015, etc.

The first electrode layer 1038 forms an upper end portion of the penetrating wiring 1031. The second electrode layer 1039 forms a lower end portion of the penetrating wiring 1031. The first electrode layer 1038 is formed in an island shape, and faces the low potential terminal 1025 (first low potential terminal 1025A) in the normal direction Z. The second electrode layer 1039 is formed in an island shape, and faces the first electrode layer 1038 in the normal direction Z.

The wiring plug electrodes 1040 are buried in the interlayer insulating layers 1010, respectively, placed in a region between the first electrode layer 1038 and the second electrode layer 1039. The wiring plug electrodes 1040 are stacked from the undermost insulating layer 1008 toward the uppermost insulating layer 1009 so as to be electrically connected, and electrically connect the first electrode layer 1038 and the second electrode layer 1039. Each of the wiring plug electrodes 1040 has a plane area less than the plane area of the first electrode layer 1038 and less than the plane area of the second electrode layer 1039.

The number of laminated layers of the wiring plug electrodes 1040 coincides with the number of laminated layers of the interlayer insulating layers 1010. The number of the wiring plug electrodes 1040 buried in each of the interlayer insulating layers 1010 is arbitrary although six wiring plug electrodes 1040 are buried in each of the interlayer insulating layers 1010 in this embodiment. Of course, a single or a plurality of wiring plug electrodes 1040 that penetrate through the interlayer insulating layers 1010 may be formed.

The low potential connection wiring 1032 is formed in the first inner region 1020 of the first transformer 1014A (low potential coil 1015) in the same interlayer insulating layer 1010 as the low potential coil 1015. The low potential connection wiring 1032 is formed in an island shape, and faces the high potential terminal 1026 (first high potential terminal 1026A) in the normal direction Z. Preferably, the low potential connection wiring 1032 has a plane area exceeding the plane area of the wiring plug electrode 1040. The low potential connection wiring 1032 is electrically connected to the first inner end 1017 of the low potential coil 1015.

The lead-out wiring 1033 is formed in a region between the semiconductor chip 1001 and the penetrating wiring 1031 in the interlayer insulating layer 1010. In this embodiment, the lead-out wiring 1033 is formed in the interlayer insulating layer 1010 that is a first layer in order from the undermost insulating layer 1008. The lead-out wiring 1033 includes a first end portion on one side, a second end portion on the other side, and a wiring portion connecting the first and second end portions. The first end portion of the lead-out wiring 1033 is placed in a region between the semiconductor chip 1001 and the lower end portion of the penetrating wiring 1031. The second end portion of the lead-out wiring 1033 is placed in a region between the semiconductor chip 1001 and the low potential connection wiring 1032. The wiring portion extends along the first principal surface 1002 of the semiconductor chip 1001, and extends in a belt shape in a region between the first and second end portions.

The first connection plug electrode 1034 is formed in a region between the penetrating wiring 1031 and the lead-out wiring 1033 in the interlayer insulating layer 1010, and is electrically connected to the penetrating wiring 1031 and the first end portion of the lead-out wiring 1033. The second connection plug electrode 1035 is formed in a region between the low potential connection wiring 1032 and the lead-out wiring 1033 in the interlayer insulating layer 1010, and is electrically connected to the low potential connection wiring 1032 and the second end portion of the lead-out wiring 1033.

The pad plug electrodes 1036 are formed in a region between the low potential terminal 1025 (first low potential terminal 1025A) and the penetrating wiring 1031 in the uppermost insulating layer 1009, and are each electrically connected to the low potential terminal 1025 and the upper end portion of the penetrating wiring 1031.

The second low potential wirings 1028 are each electrically connected to corresponding low potential terminals 1025E, 1025F and to the first outer ends 1018 of the low potential coils 1015 of corresponding transformers 1014A to 1014D. The second low potential wirings 1028 each have the same structure. A structure of the second low potential wiring 1028 connected to the fifth low potential terminal 1025E and to the first transformer 1014A (second transformer 1014B) will be hereinafter described as an example. A description of structures of other second low potential wirings 1028 is omitted on the condition that a description of the structure of the second low potential wiring 1028 connected to the first transformer 1014A (second transformer 1014B) is correspondingly applied.

The second low potential wiring 1028 includes the penetrating wiring 1031, the low potential connection wiring 1032, the lead-out wiring 1033, the first connection plug electrode 1034, the second connection plug electrode 1035, and the pad plug electrode 1036 in the same way as the first low potential wiring 1027. The second low potential wiring 1028 has the same structure as the first low potential wiring 1027 except that the low potential connection wiring 1032 is electrically connected to the first outer end 1018 of the first transformer 1014A (low potential coil 1015) and to the first outer end 1018 of the second transformer 1014B (low potential coil 1015).

The low potential connection wiring 1032 of the second low potential wiring 1028 is formed around the low potential coil 1015 in the interlayer insulating layer 1010 that is the same as the low potential coil 1015. In detail, the low potential connection wiring 1032 is formed in a region between two adjoining low potential coils 1015 in a plan view. The pad plug electrode 1036 is formed in a region between the low potential terminal 1025 (fifth low potential terminal 1025E) and the low potential connection wiring 1032 in the uppermost insulating layer 1009, and is electrically connected to the low potential terminal 1025 and the low potential connection wiring 1032.

The first high potential wirings 1029 are each electrically connected to corresponding high potential terminals 1026A to 1026D and to the second inner ends 1021 of corresponding transformers 1014A to 1014D (high potential coils 1016). The first high potential wirings 1029 each have the same structure. A structure of the first high potential wiring 1029 connected to the first high potential terminal 1026A and to the first transformer 1014A will be hereinafter described as an example. A description of structures of other first high potential wirings 1029 is omitted on the condition that a description of the structure of the first high potential wiring 1029 connected to the first transformer 1014A is correspondingly applied.

The first high potential wiring 1029 includes a high potential connection wiring 1041 and a single or a plurality of (in this embodiment, a plurality of) pad plug electrodes 1042. Preferably, the high potential connection wiring 1041 and the pad plug electrode 1042 are made of the same conductive material as the low potential coil 1015, etc. In other words, preferably, the high potential connection wiring 1041 and the pad plug electrode 1042 each include a barrier layer and a main body layer in the same way as the low potential coil 1015, etc.

The high potential connection wiring 1041 is formed in the second inner region 1024 of the high potential coil 1016 in the interlayer insulating layer 1010 that is the same as the high potential coil 1016. The high potential connection wiring 1041 is formed in an island shape, and faces the high potential terminal 1026 (first high potential terminal 1026A) in the normal direction Z. The high potential connection wiring 1041 is electrically connected to the second inner end 1021 of the high potential coil 1016. The high potential connection wiring 1041 is formed at a distance from the low potential connection wiring 1032 in a plan view, and does not face the low potential connection wiring 1032 in the normal direction Z. Hence, the insulation distance between the low potential connection wiring 1032 and the high potential connection wiring 1041 is increased, and the dielectric withstand voltage of the first insulating portion 1005 is raised.

The pad plug electrodes 1042 are formed in a region between the high potential terminal 1026 (first high potential terminal 1026A) and the high potential connection wiring 1041 in the uppermost insulating layer 1009, and are each electrically connected to the high potential terminal 1026 and the high potential connection wiring 1041. The pad plug electrodes 1042 each have a plane area less than the plane area of the high potential connection wiring 1041 in a plan view.

The second high potential wirings 1030 are each electrically connected to corresponding high potential terminals 1026E and 1026F and to the second outer ends 1022 of corresponding transformers 1014A to 1014D (high potential coils 1016). The second high potential wirings 1030 each have the same structure. A structure of the second high potential wiring 1030 connected to the fifth high potential terminal 1026E and to the first transformer 1014A (second transformer 1014B) will be hereinafter described as an example. A description of structures of other second high potential wirings 1030 is omitted on the condition that a description of the structure of the second high potential wiring 1030 connected to the first transformer 1014A (second transformer 1014B) is correspondingly applied.

The second high potential wiring 1030 includes the high potential connection wiring 1041 and the pad plug electrode 1042 in the same way as the first high potential wiring 1029. The second high potential wiring 1030 has the same structure as the first high potential wiring 1029 except that the high potential connection wiring 1041 is electrically connected to the second outer end 1022 of the first transformer 1014A (high potential coil 1016) and to the second outer end 1022 of the second transformer 1014B (high potential coil 1016).

The high potential connection wiring 1041 of the second high potential wiring 1030 is formed around the high potential coil 1016 in the same interlayer insulating layer 1010 as the high potential coil 1016. The high potential connection wiring 1041 is formed in a region between two adjoining high potential coils 1016 in a plan view, and faces the high potential terminal 1026 (fifth high potential terminal 1026E) in the normal direction Z. The high potential connection wiring 1041 is formed at a distance from the low potential connection wiring 1032 in a plan view, and does not face the low potential connection wiring 1032 in the normal direction Z.

The pad plug electrodes 1042 are formed in a region between the high potential terminal 1026 (fifth high potential terminal 1026E) and the high potential connection wiring 1041 in the uppermost insulating layer 1009, and are each electrically connected to the high potential terminal 1026 and the high potential connection wiring 1041.

Referring to FIG. 70, preferably, a distance D1 between the low potential terminal 1025 and the high potential terminal 1026 exceeds a distance D2 between the low potential coil 1015 and the high potential coil 1016 (D2<D1). Preferably, the distance D1 exceeds the total thickness TE1 of the interlayer insulating layers 1010 (DT<D1). The ratio D2/D1 of the distance D2 with respect to the distance D1 may be not less than 0.005 and not more than 0.5. Preferably, the distance D1 is not less than 100 μm and not more than 1000 μm. The distance D2 may be not less than 1 μm and not more than 120 μm. Preferably, the distance D2 is not less than 5 μm and not more than 50 μm. The value of the distance D1 and the value of the distance D2 are arbitrary, and are appropriately adjusted in accordance with a dielectric withstand voltage to be realized.

Referring to FIG. 69 and FIG. 70, the semiconductor device E1 includes a dummy pattern 1043 buried in the first insulating portion 1005 so as to be placed around the transformers 1014A to 1014D in a plan view.

The dummy pattern 1043 may have a shape that is the same as the dummy pattern 39 of the semiconductor device A1. For example, the dummy pattern 1043 may include a high potential dummy pattern 1044 having a shape corresponding to the high potential dummy pattern 86, a first high potential dummy pattern 1045 having a shape corresponding to the first high potential dummy pattern 87, a second high potential dummy pattern 1046 having a shape corresponding to the second high potential dummy pattern 88, and a floating dummy pattern 1076 having a shape corresponding to the floating dummy pattern 161. In FIG. 70, the high potential dummy pattern 1044, the second high potential dummy pattern 1046, and the floating dummy pattern 1076 are shown.

Referring to FIG. 70, the semiconductor device E1 includes a second functional device 1079 formed at the first principal surface 1002 of the semiconductor chip 1001. The second functional device 1079 is formed by utilizing a surface layer portion of the first principal surface 1002 of the semiconductor chip 1001 and/or a region on the first principal surface 1002 of the semiconductor chip 1001, and is covered by the first insulating portion 1005 (undermost insulating layer 1008). In FIG. 70, the second functional device 1079 is simplified and shown by the broken line shown in the surface layer portion of the first principal surface 1002.

The second functional device 1079 is electrically connected to the low potential terminal 1025 through a low potential wiring, and is electrically connected to the high potential terminal 1026 through a high potential wiring. The low potential wiring has the same structure as the first low potential wiring 1027 (second low potential wiring 1028) except that the low potential wiring is routed around in the first insulating portion 1005 so as to be connected to the second functional device 1079. The high potential wiring has the same structure as the first high potential wiring 1029 (second high potential wiring 1030) except that the high potential wiring is routed around in the first insulating portion 1005 so as to be connected to the second functional device 1079. A detailed description of both the low potential wiring and the high potential wiring according to the second functional device 1079 is omitted.

The second functional device 1079 may include at least one among a passive device, a semiconductor rectifying device, and a semiconductor switching device. The second functional device 1079 may include a circuit network in which two or more kinds of arbitrary devices among the passive device, the semiconductor rectifying device, and the semiconductor switching device are selectively combined. The circuit network may form a part or all of an integrated circuit.

The passive device may include a semiconductor passive device. The passive device may include either one or both of a resistor and a capacitor. The semiconductor rectifying device may include at least one among a pn junction diode, a PIN diode, a Zener diode, a Schottky barrier diode, and a fast-recovery diode. The semiconductor switching device may include at least one among BJT (Bipolar Junction Transistor), MISFET (Metal Insulator Field Effect Transistor), IGBT (Insulated Gate Bipolar Junction Transistor), and JFET (Junction Field Effect Transistor).

Referring to FIG. 70, the semiconductor device E1 further includes a seal conductor 1080 buried in the first insulating portion 1005. The seal conductor 1080 is buried in the first insulating portion 1005 in the form of a wall at a distance from the insulating sidewalls 1007A to 1007D in a plan view, and partitions the first insulating portion 1005 into the device region 1078 and an outer region 1081. The seal conductor 1080 suppresses penetration of moisture and penetration of cracks into the device region 1078 from the outer region 1081.

The device region 1078 is a region including the first functional device 1013 (transformers 1014), the second functional device 1079, the low potential terminals 1025, the high potential terminals 1026, the first low potential wiring 1027, the second low potential wiring 1028, the first high potential wiring 1029, the second high potential wiring 1030, and the dummy pattern 1043. The outer region 1081 is a region outside the device region 1078.

The seal conductor 1080 is electrically separated from the device region 1078. In detail, the seal conductor 1080 is electrically separated from the first functional device 1013 (transformers 1014), the second functional device 1079, the low potential terminals 1025, the high potential terminals 1026, the first low potential wiring 1027, the second low potential wiring 1028, the first high potential wiring 1029, the second high potential wiring 1030, and the dummy pattern 1043. In more detail, the seal conductor 1080 is fixed in an electrically floating state. The seal conductor 1080 does not form a current path connected to the device region 1078.

The seal conductor 1080 is formed in a belt shape along the insulating sidewalls 1007 to 1007D in a plan view. In this embodiment, the seal conductor 1080 is formed in a quadrangular annular shape (in detail, rectangular annular shape) in a plan view. Hence, the seal conductor 1080 demarcates the device region 1078 having a quadrangular shape (in detail, rectangular shape) in a plan view. Additionally, the seal conductor 1080 demarcates the outer region 1081 having a quadrangular annular shape (in detail, rectangular annular shape) surrounding the device region 1078 in a plan view.

In detail, the seal conductor 1080 has an upper end portion on the insulating principal surface 1006 side, a lower end portion on the semiconductor chip 1001 side, and a wall portion extending in a wall shape between the upper end portion and the lower end portion. In this embodiment, the upper end portion of the seal conductor 1080 is formed at a distance from the insulating principal surface 1006 toward the semiconductor chip 1001 side, and is placed in the first insulating portion 1005. In this embodiment, the upper end portion of the seal conductor 1080 is covered by the uppermost insulating layer 1009. The upper end portion of the seal conductor 1080 may be covered by the single or plural interlayer insulating layers 1010. The upper end portion of the seal conductor 1080 may be exposed from the uppermost insulating layer 1009. The lower end portion of the seal conductor 1080 is formed at a distance from the semiconductor chip 1001 toward the upper end portion side.

As thus described, in this embodiment, the seal conductor 1080 is buried in the first insulating portion 1005 so as to be placed on the semiconductor chip 1001 side with respect to the low potential terminals 1025 and the high potential terminals 1026. Additionally, in the first insulating portion 1005, the seal conductor 1080 faces the first functional device 1013 (transformers 1014), the first low potential wiring 1027, the second low potential wiring 1028, the first high potential wiring 1029, the second high potential wiring 1030, and the dummy pattern 1043 in a direction parallel to the insulating principal surface 1006. In the first insulating portion 1005, the seal conductor 1080 may face a part of the second functional device 1079 in the direction parallel to the insulating principal surface 1006.

The seal conductor 1080 includes a plurality of seal plug conductors 1082 and a single or a plurality of (in this embodiment, a plurality of) seal via conductors 1083. The number of the seal via conductors 1083 is arbitrary. The seal plug conductor 1082, which is an uppermost one among the seal plug conductors 1082, forms the upper end portion of the seal conductor 1080. The seal via conductors 1083 each form the lower end portion of the seal conductor 1080. Preferably, the seal plug conductor 1082 and the seal via conductor 1083 are made of the same conductive material as the low potential coil 1015. In other words, preferably, the seal plug conductor 1082 and the seal via conductor 1083 include a barrier layer and a main body layer in the same way as the low potential coil 1015, etc.

The seal plug conductors 1082 are buried in the interlayer insulating layers 1010, respectively, and are each formed in a quadrangular annular shape (in detail, rectangular annular shape) surrounding the device region 1078 in a plan view. The seal plug conductors 1082 are stacked from the undermost insulating layer 1008 toward the uppermost insulating layer 1009 so as to be connected to each other. The number of laminated layers of the seal plug conductors 1082 coincides with the number of laminated layers of the interlayer insulating layers 1010. Of course, the single or the plural seal plug conductors 1082 penetrating through the interlayer insulating layers 1010 may be formed.

All of the seal plug conductors 1082 are not required to be formed so as to be annular as long as one annular seal conductor 1080 is formed by an aggregate of the seal plug conductors 1082. For example, at least one of the seal plug conductors 1082 may be formed in a shape with ends. Additionally, at least one of the seal plug conductors 1082 may be divided into a plurality of belt shape parts with ends. However, preferably, the seal plug conductors 1082 are formed in an endless shape (annular shape) in consideration of the risk of penetration of moisture and cracks into the device region 1078.

The seal via conductors 1083 are each formed in a region between the semiconductor chip 1001 and the seal plug conductor 1082 in the undermost insulating layer 1008. The seal via conductors 565 are formed at a distance from the semiconductor chip 1001, and is connected to the seal plug conductor 1082. The seal via conductors 1083 have a plane area less than the plane area of the seal plug conductor 1082. If the single seal via conductor 1083 is formed, the single seal via conductor 1083 may have a plane area equal to or larger than the plane area of the seal plug conductor 1082.

The width of the seal conductor 1080 may be not less than 0.1 μm and not more than 20 μm. Preferably, the width of the seal conductor 1080 is not less than 1 μm and not more than 10 μm. The width of the seal conductor 1080 is defined by a width in a direction perpendicular to a direction in which the seal conductor 1080 extends.

Referring to FIG. 70, the semiconductor device E1 further includes a second insulating portion 1084 formed on the insulating principal surface 1006 of the first insulating portion 1005. The second insulating portion 1084 may be referred to as a passivation layer. The second insulating portion 1084 protects the first insulating portion 1005 or the semiconductor chip 1001 from above the insulating principal surface 1006.

In this embodiment, the second insulating portion 1084 is an inorganic insulating portion including an inorganic insulating layer. The second insulating portion 1084 has a laminated structure including a first inorganic insulating layer 1085 and a second inorganic insulating layer 1086. The first inorganic insulating layer 1085 may include silicon oxide. Preferably, the first inorganic insulating layer 1085 includes USG (undoped silicate glass) that is silicon oxide undoped with impurities. The thickness of the first inorganic insulating layer 1085 may be not less than 50 nm and not more than 5000 nm. The second inorganic insulating layer 1086 may include silicon nitride. The thickness of the second inorganic insulating layer 1086 may be not less than 500 nm and not more than 5000 nm. It is possible to raise a dielectric withstand voltage on the high potential coil 1016 by increasing the total thickness of the second insulating portion 1084.

The dielectric breakdown voltage (V/cm) of USG exceeds the dielectric breakdown voltage (V/cm) of silicon nitride if the first inorganic insulating layer 1085 is made of USG and if the second inorganic insulating layer 1086 is made of silicon nitride. Therefore, preferably, the first inorganic insulating layer 1085 thicker than the second inorganic insulating layer 1086 is formed when the second insulating portion 1084 is thickened.

The first inorganic insulating layer 1085 may include at least either one of BPSG (boron doped phosphor silicate glass) and PSG (phosphorus silicate glass) as an example of silicon oxide. However, in this case, impurities (boron or phosphorus) are included in silicon oxide, and therefore, particularly preferably, the first inorganic insulating layer 976 made of USG is formed from the viewpoint of raising a dielectric withstand voltage on the high potential coil 1016. Of course, the second insulating portion 1084 may have a single layer structure consisting of either one of the first inorganic insulating layer 1085 and the second inorganic insulating layer 1086.

The second insulating portion 1084 covers the whole area of the seal conductor 1080, and has a plurality of low potential pad openings 1087 and a plurality of high potential pad openings 1088 formed in a region in the seal conductor 1080. The low potential pad openings 1087 respectively expose the low potential terminals 1025. The high potential pad openings 1088 respectively expose the high potential terminals 1026. The second insulating portion 1084 may have an overlap portion that is stranded on a peripheral edge portion of the high potential terminal 1025. The second insulating portion 1084 may have an overlap portion that is stranded on a peripheral edge portion of the high potential terminal 1026. The low potential terminal 1025 exposed from the low potential pad opening 1087 may be referred to as a low potential pad 1130, and the high potential terminal 1026 exposed from the high potential pad opening 1088 may be referred to as a high potential pad 1131. A covering layer including at least one of palladium and nickel may be formed on a surface of the low potential pad 1130 and a surface of the high potential pad 1131.

The semiconductor device E1 further includes a protective layer 1089 formed on the second insulating part 1084. In this embodiment, the protective layer 1089 is an organic insulating portion including an organic insulating layer. The protective layer 1089 may include a photosensitive resin. The protective layer 1089 may include at least one among polyimide, polyamide, and polybenzoxazole. In this embodiment, the protective layer 1089 includes polyimide. The thickness of the protective layer 1089 may be not less than 1 μm and not more than 100 μm.

Preferably, the thickness of the protective layer 1089 exceeds the total thickness of the second insulating portion 1084. Additionally, preferably, the total thickness of the second insulating portion 1084 and the protective layer 1089 is equal to or larger than the distance D2 between the low potential coil 1015 and the high potential coil 1016. In this case, preferably, the total thickness of the second insulating portion 1084 is not less than 2 μm and not more than 10 μm. Additionally, preferably, the thickness of the protective layer 1089 is not less than 5 μm and not more than 50 μm. With these structures, it is possible to suppress the thickening of the second insulating portion 1084 and the protective layer 1089, and at the same time, it is possible to appropriately raise a dielectric withstand voltage on the high potential coil 1016 by means of the laminated film consisting of the second insulating portion 1084 and the protective layer 1089.

The protective layer 1089 includes a first portion 1090 covering a region on the low potential side and a second portion 1091 covering a region on the high potential side. The first portion 1090 covers the seal conductor 1080 with the second insulating portion 1084 between the first portion 1090 and the seal conductor 1080. The first portion 1090 has a plurality of low potential terminal openings 1092 that respectively expose the low potential terminals 1025 (low potential pad openings 1087), in a region outside the seal conductor 1080. The first portion 1090 may have an overlap portion that is stranded on a peripheral edge portion (overlap portion) of the low potential pad opening 1087.

The second portion 1091 is formed at a distance from the first portion 1090, and exposes the second insulating portion 1084 from an interval between the first portion 1090 and the second portion 1091. The second portion 1091 has a plurality of high potential terminal openings 1093 that respectively expose the high potential terminals 1026 (high potential pad openings 1088). The second portion 1091 may have an overlap portion that is stranded on a peripheral edge portion (overlap portion) of the high potential pad opening 1088.

The second portion 1091 entirely covers the transformers 1014A to 1014D and the dummy pattern 1043. In detail, the second portion 1091 entirely covers the high potential coils 1016, the high potential terminals 1026, the first high potential dummy pattern 1045, the second high potential dummy pattern 1046, and the floating dummy pattern 1076.

In the protective layer 1089, a slit between the first portion 1090 and the second portion 1091 functions as an anchor portion with respect to the sealing resin 6. A part of the sealing resin 6 enters the slit between the first portion 1090 and the second portion 1091, and is connected to the second insulating portion 1084. Hence, the adhesive force of the sealing resin 6 to the semiconductor device E1 is raised. Of course, the first portion 1090 and the second portion 1091 may be formed integrally with each other. Additionally, the protective layer 1089 may include only either one of the first portion 1090 and the second portion 1091.

Figure 71:
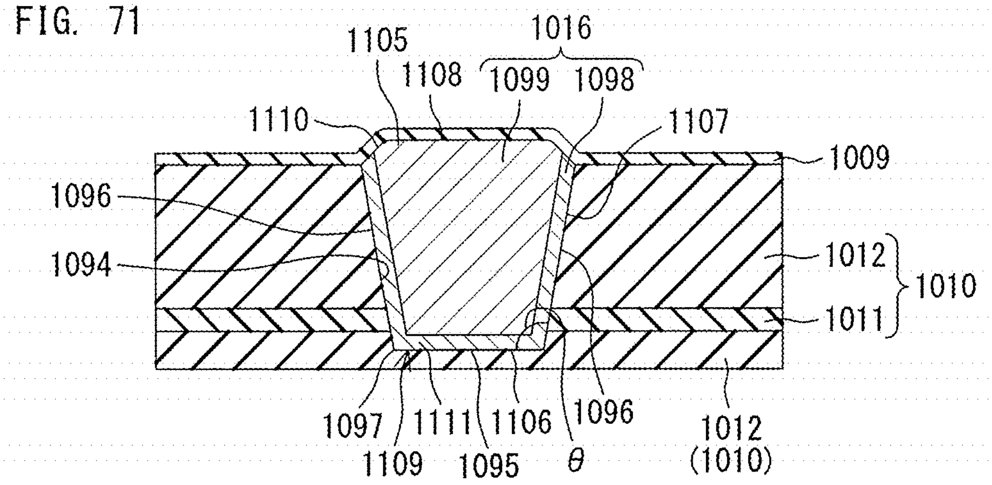
FIG. 71 is an enlarged view of a main part of the high potential coil 1016 of FIG. 70.

FIG. 71 is an enlarged view of a main part of the high potential coil 1016 of FIG. 70. A structure of the high potential coil 1016 will be described in more detail with reference to FIG. 71.

As described above, the high potential coil 1016 is buried while penetrating through the first and second insulating layers 1011 and 1012 in the interlayer insulating layer 1010. More specifically, a concave portion 1094 penetrating through the second insulating layer 1012 and the first insulating layer 1011 is formed in the interlayer insulating layer 1010 (interlayer insulating layer 1010 for high potential coil 1016) at which the high potential coil 1016 is formed. The concave portion 1094 penetrates through the second insulating layer 1012 and the first insulating layer 1011 from the principal surface of the second insulating layer 1012, and furthermore reaches the second insulating layer 1012 that is a lower layer of the interlayer insulating layer 1010 for the high potential coil 1016. Hence, the concave portion 1094 has a bottom portion 1095 in the second insulating layer 1012 of the interlayer insulating layer 1010 that comes into contact with the interlayer insulating layer 1010 for the high potential coil 1016 from below. For example, the depth of the concave portion 1094 may be not less than 1 μm and not more than 5 μm.

Additionally, the concave portion 1094 is formed in a tapered shape whose width becomes smaller in proportion to an approach to the interlayer insulating layer 1010 that is a lower layer. In other words, the concave portion 1094 is formed in a tapered shape whose width becomes smaller toward its bottom portion 1095, and has a side portion 1096 inclined with respect to the bottom portion 1095. An inclination θ of the side portion 1096 with respect to the bottom portion 1095 is, for example, not less than 70° and not more than 90°.

The concave portion 1094 has a corner portion 1109 formed by the intersection of the bottom portion 1095 with the side portion 1096 in a cross-sectional view. The corner portion 1109 may include a cross vertex 1097 between the bottom portion 1095 and the side portion 1096 and its peripheral portion. The corner portion 1109 of the concave portion 1094 may have a shape whose front end is pointed. That the front end of the corner portion 1109 is pointed may mean that the corner portion 1109 is pointed to such a degree that the cross vertex 1097 of the corner portion 1109 can be clearly perceived visually, for example, when the corner portion 1109 is represented by an electronic image, such as an SEM image, or may mean that the curvature radius of the cross vertex 1097 is about not less than 1 nm and not more than 500 nm.

The high potential coil 1016 is buried in the concave portion 1094. The high potential coil 1016 has a bottom surface 1106 contiguous to the bottom portion 1095 of the concave portion 1094, a side surface 1107 contiguous to the side portion 1096 of the concave portion 1094, and an upper surface 1108 exposed from the interlayer insulating layer 1010. The high potential coil 1016 has a projecting portion 1105 that projects so as to be closer to the uppermost insulating layer 1009 than a boundary portion between the interlayer insulating layer 1010 for the high potential coil 1016 and the uppermost insulating layer 1009. The projecting portion 1105 forms the upper end portion of the high potential coil 1016.

The high potential coil 1016 has an upper corner portion 1110 and a lower corner portion 1111 in a cross-sectional view. The upper corner portion 1110 may be formed by the intersection of the upper surface 1108 with the side surface 1107 of the high potential coil 1016. In this embodiment, the upper corner portion 1110 of the high potential coil 1016 may be formed in a curve shape in a cross-sectional view. In other words, the upper corner portion 1110 may have a chipped shape. That the upper corner portion 1110 has a curve shape or that the upper corner portion 1110 has a chipped shape may mean that the upper corner portion 1110 is obtuse to such a degree that the cross vertex between the upper surface 1108 and the side surface 1107 of the high potential coil 1016 cannot be visually perceived, for example, when the upper corner portion 1110 is represented by an electronic image, such as an SEM image, or may mean that the curvature radius of a portion that might be regarded as a cross vertex between the upper surface 1108 and the side surface 1107 is about 1 nm or more.

On the other hand, the lower corner portion 1111 of the high potential coil 1016 has a shape coinciding with that of the corner portion 1109 of the concave portion 1094. Therefore, the lower corner portion 1111 of the high potential coil 1016 may have a shape whose front end is pointed.

The high potential coil 1016 includes a first underlayer 1098 and a first main body portion 1099. The first underlayer 1098 is formed along an inner surface of the concave portion 1094 (bottom portion 1095 and side portion 1096), and demarcates a recessed space in the concave portion 1094. The first main body portion 1099 is buried in the recessed space demarcated by the first underlayer 1098. The upper corner portion 1110 of the high potential coil 1016 mentioned above may be formed so as to straddle between an upper end portion of the first underlayer 1098 and an upper end portion of the first main body portion 1099. In other words, a curve that defines the upper corner portion 1110 in a cross-sectional view may cross a boundary portion between the first underlayer 1098 and the first main body portion 1099 outside the interlayer insulating layer 1010 for the high potential coil 1016.

The first underlayer 1098 may form the aforementioned barrier layer. In other words, the first underlayer 1098 may include at least one of titanium and titanium nitride. Additionally, the first underlayer 1098 may include at least one of tantalum and tantalum nitride. In this embodiment, the first underlayer 1098 has a laminated structure (Ta/TaN/Ta) including tantalum nitride sandwiched between tantalum and tantalum. The first underlayer 1098 prevents the first main body portion 1099 and the interlayer insulating layer 1010 from coming into contact with each other, and prevents components of the first main body portion 1099 from diffusing into the interlayer insulating layer 1010. Additionally, the first underlayer 1098 may have a thickness of for example, not less than 0.005 μm and not more than 0.2 μm.

The first main body portion 1099 may form the main body layer mentioned above. In other words, the first main body portion 1099 may include at least one among copper, aluminum, and tungsten. In this embodiment, the first main body portion 1099 is formed with a plated layer of copper.

Additionally, the first main body portion 1099 may have a thickness of not less than 1 μm and not more than 5 μm.

FIG. 72 to FIG. 77 are views showing steps relative to the formation of the high potential coil 1016 of FIG. 71. Next, a formation method of the high potential coil 1016 will be described with reference to FIG. 72 to FIG. 77.

Figure 72:
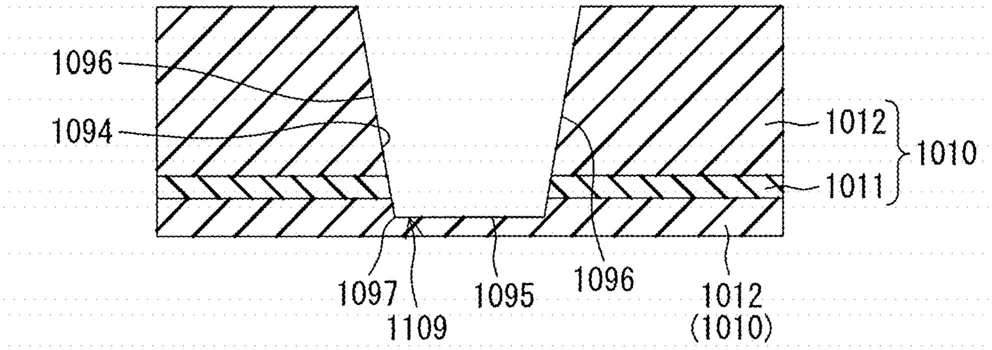
FIG. 72 is a view showing a step relative to the formation of the high potential coil 1016 of FIG. 71.

In order to form the high potential coil 1016, a laminated structure of the interlayer insulating layer 1010 is formed by, for example, the CVD method. Thereafter, the interlayer insulating layer 1010 is selectively etched as shown in FIG. 72, and, as a result, the concave portion 1094 is formed. The concave portion 1094 may be formed by, for example, dry etching.

Figure 73:
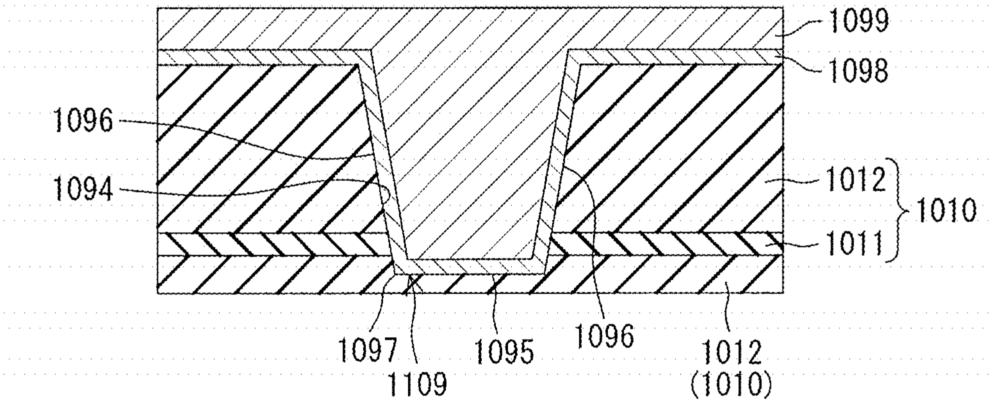
FIG. 73 is a view showing a step subsequent to the step of FIG. 72.

Next, the first underlayer 1098 is formed by, for example, the sputtering method as shown in FIG. 73. The first underlayer 1098 is formed so as to cover the inner surface of the concave portion 1094 and the principal surface of the interlayer insulating layer 1010. Next, a conductive material for the first main body portion 1099 is subjected to plating growth from the first underlayer 1098. In this embodiment, Cu is subjected to plating growth from the first underlayer 1098. Hence, the first main body portion 1099 is formed on the first underlayer 1098. The first main body portion 1099 grows until the first main body portion 1099 refills the recessed structure of the first underlayer 1098 and then covers the principal surface of the interlayer insulating layer 1010.

Figure 74:
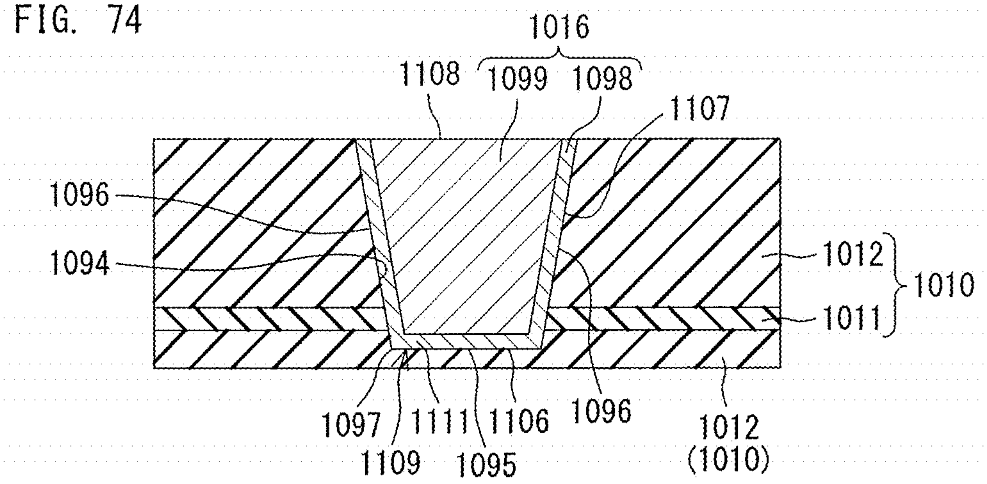
FIG. 74 is a view showing a step subsequent to the step of FIG. 73.

Next, unnecessary portions (portions outside the concave portion 1094) of the first underlayer 1098 and unnecessary portions (portions outside the concave portion 1094) of the first main body portion 1099 are removed by, for example, CMP as shown in FIG. 74. Hence, the high potential coil 1016 buried in the concave portion 1094 is formed. At this stage, the upper surface 1108 of the high potential coil 1016 and the principal surface of the interlayer insulating layer 1010 may be flush with each other.

Figure 75:
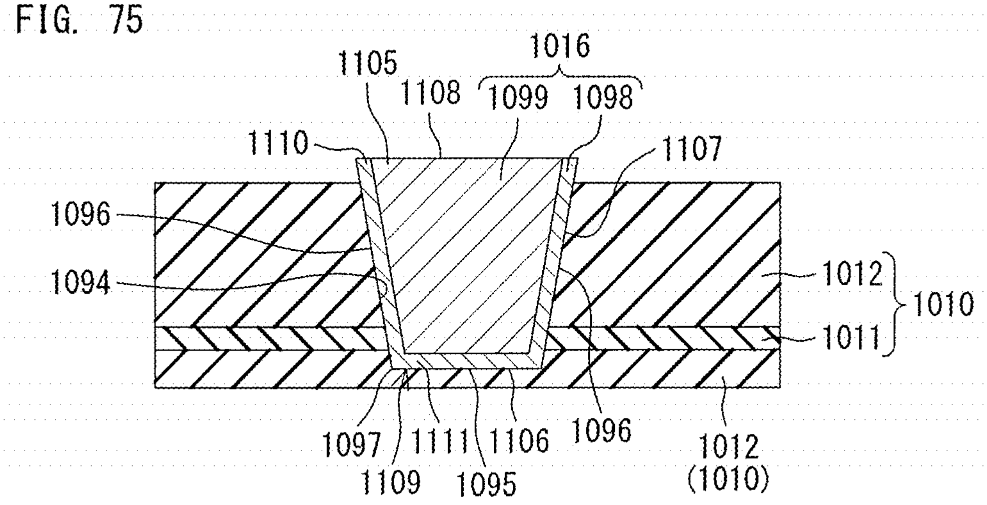
FIG. 75 is a view showing a step subsequent to the step of FIG. 74.

Next, the interlayer insulating layer 1010 for the high potential coil 1016 is etched from the principal-surface side as shown in FIG. 75. In this embodiment, the upper layer portion of the second insulating layer 1012 is etched. For example, dry etching and wet etching can be applied as the etching. Hence, a part of the high potential coil 1016 projects from the interlayer insulating layer 1010 as the projecting portion 1105.

Figure 76:
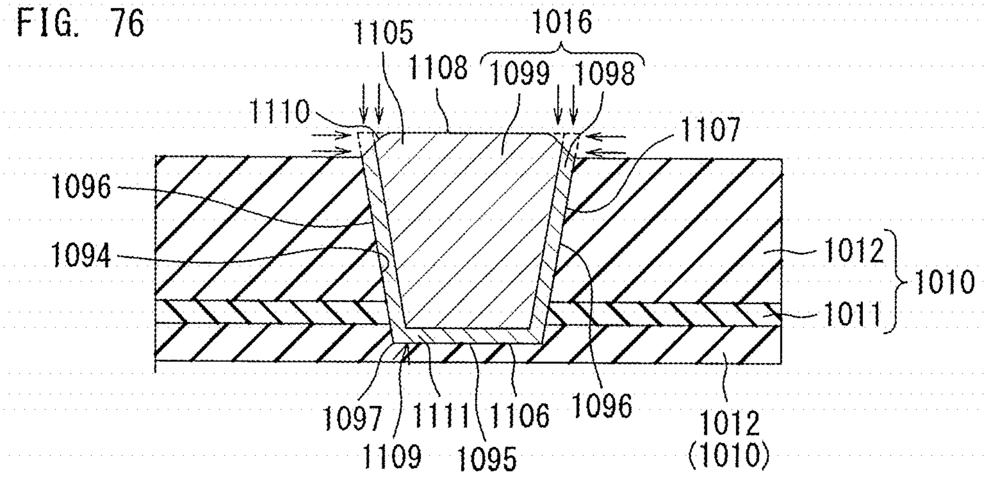
FIG. 76 is a view showing a step subsequent to the step of FIG. 75.

Next, the projecting portion 1105 of the high potential coil 1016 is etched as shown in FIG. 76. The etching operation progresses from the upper side in the thickness direction of the interlayer insulating layer 1010 and from both sides in the lateral direction along the principal surface of the interlayer insulating layer 1010. Hence, etching in the upper corner portion 1110 of the high potential coil 1016 progresses faster than in other parts of the upper end portion of the high potential coil 1016. As a result, the upper corner portion 1110 of the high potential coil 1016 is selectively eliminated, and is changed into a chipped shape.

Figure 77:
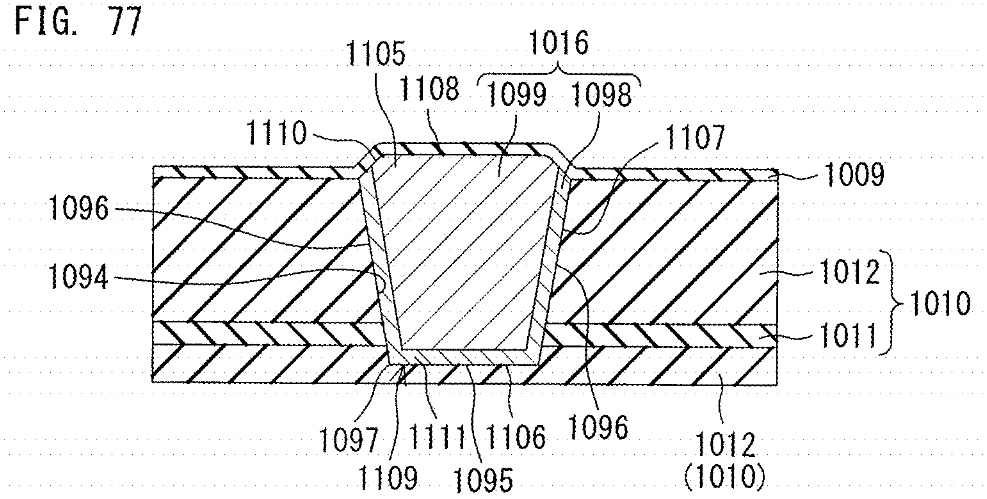
FIG. 77 is a view showing a step subsequent to the step of FIG. 76.

Next, the uppermost insulating layer 1009 is formed on the interlayer insulating layer 1010 so as to cover the high potential coil 1016 by, for example, the CVD method as shown in FIG. 77. Through these steps, the high potential coil 1016 can be formed.

As described above, with the semiconductor device E1, the upper corner portion 1110 of the high potential coil 1016 is formed in a curve shape in a cross-sectional view, and therefore it is possible to suppress the concentration of an electric field on the upper corner portion 1110 of the high potential coil 1016. This makes it possible to suppress the occurrence of a dielectric breakdown between the high potential coil and wirings placed on the low potential side (for example, low potential terminal 1025) while the upper corner portion 1110 of the high potential coil 1016 works as a starting point. As a result, it is possible to provide the semiconductor device E1 having high reliability.

The shape of this high potential coil 1016 may be applied to the high potential-side conductive layer that is formed at the same layer as the high potential coil 1016. For example, the high potential connection wiring 1041 and the dummy pattern 1043 may also have the same shape as the high potential coil 1016.

Figure 78:
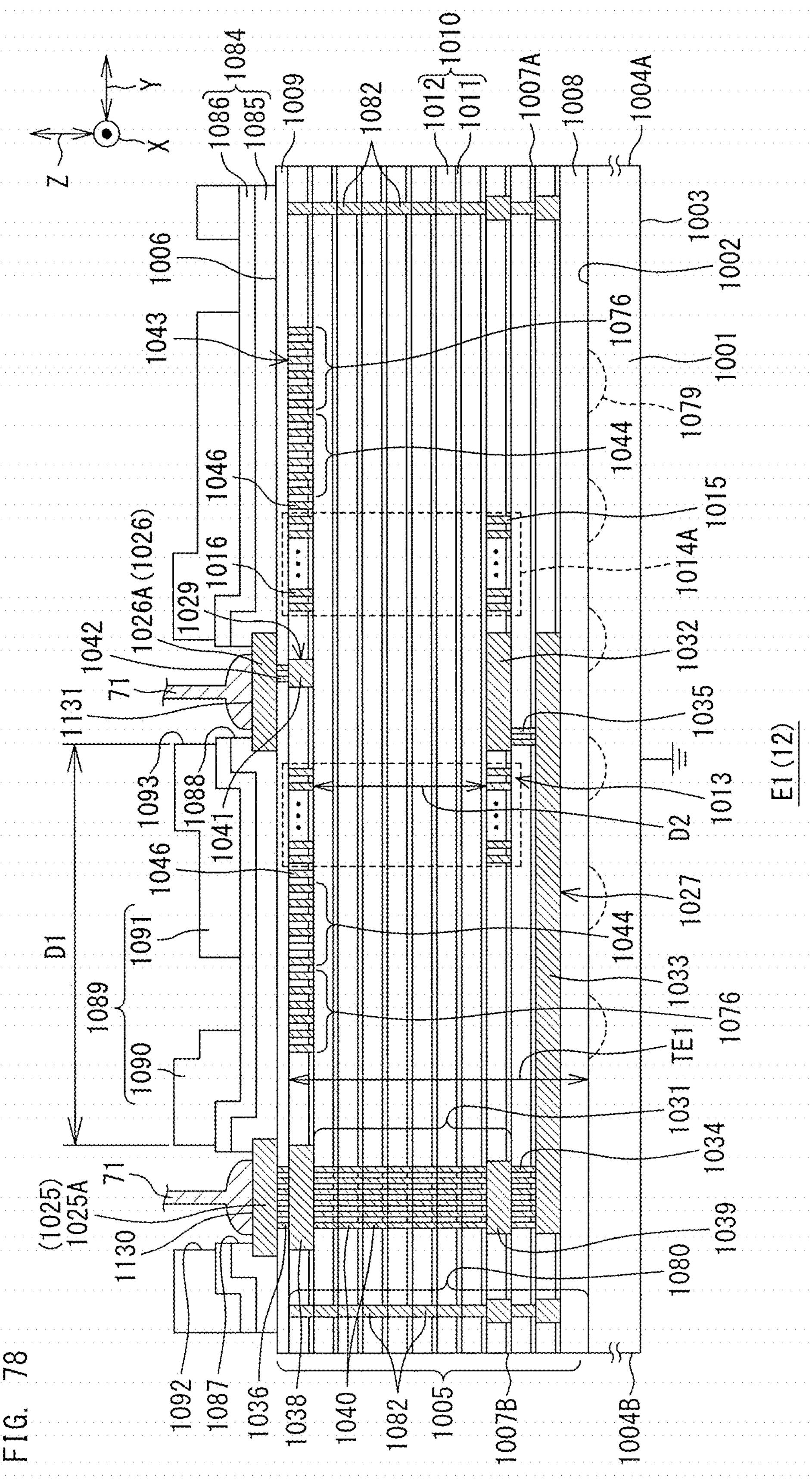
FIG. 78 is a schematic cross-sectional view of a semiconductor device E1 according to one preferred embodiment of the present disclosure.

Additionally, in the description above, the seal conductor 1080 is connected to the semiconductor chip 1001 through the seal via conductor 1083, and is fixed to the ground potential. On the other hand, the seal conductor 1080 is not necessarily required to be fixed to the ground potential by eliminating the seal via conductor 1083 as shown in FIG. 78.

Second Preferred Embodiment

Figure 79:
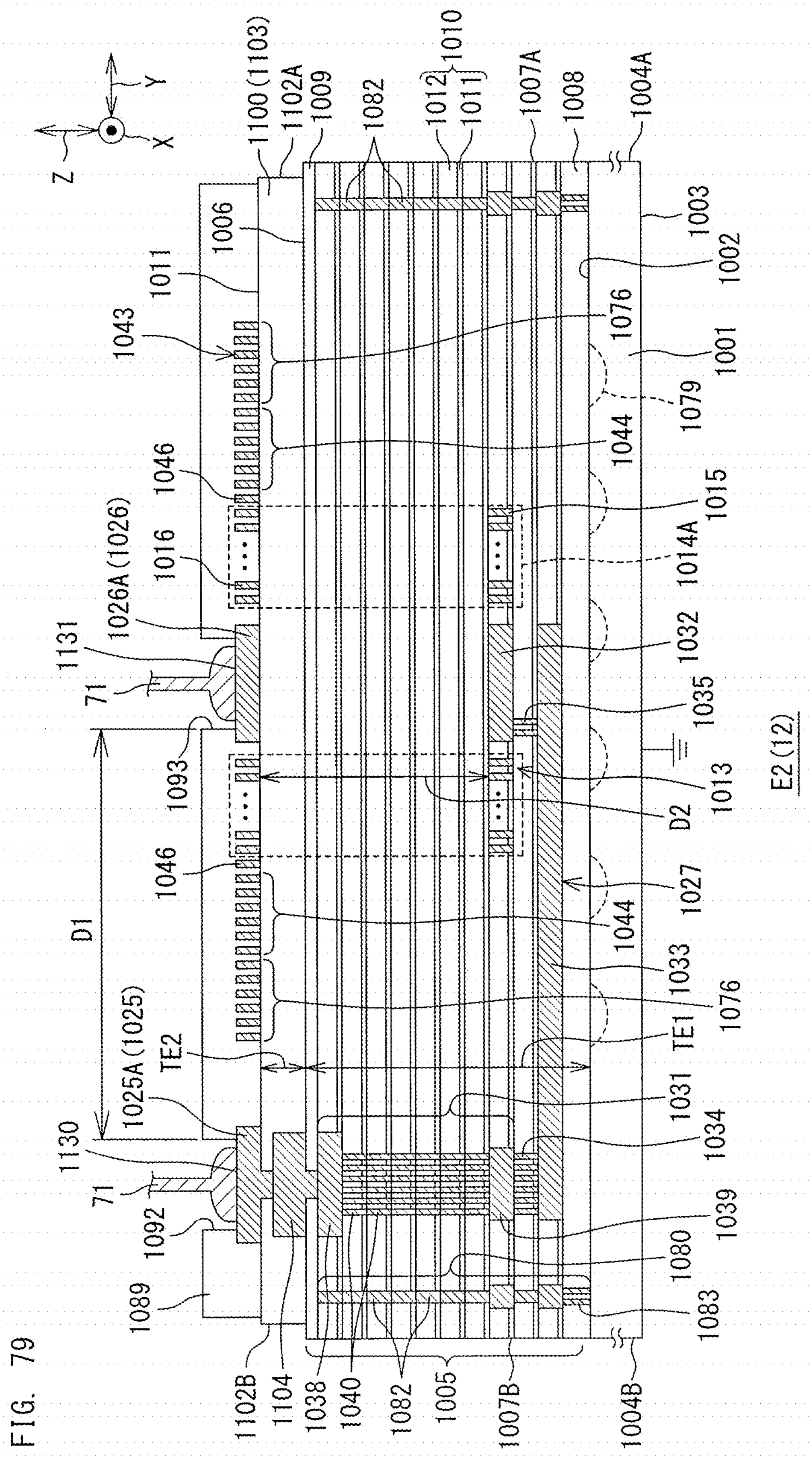
FIG. 79 is a schematic cross-sectional view of a semiconductor device E1 according to one preferred embodiment of the present disclosure.

FIG. 79 is a schematic cross-sectional view of a semiconductor device E2 according to a preferred embodiment of the present disclosure. The same reference sign is hereinafter assigned to a constituent equivalent to the constituent mentioned with respect to the aforementioned semiconductor device E1, and a description of this constituent is omitted.

In the semiconductor device E2, a second insulating portion 1100 including an organic insulating layer is formed on the first insulating portion 1005, instead of the second insulating portion 1084 including an inorganic insulating layer. The second insulating portion 1100 is formed on the insulating principal surface 1006, and has an insulating principal surface 1101 and insulating sidewalls 1102A to 1102D. The insulating principal surface 1101 is formed in a quadrangular shape (in this embodiment, rectangular shape) that matches the first principal surface 1002 in a plan view. The insulating principal surface 1101 extends in parallel with the first principal surface 1002.

The insulating sidewalls 1102A to 1102D include a first insulating sidewall 1102A, a second insulating sidewall 1102B, a third insulating sidewall 1102C, and a fourth insulating sidewall 1102D. The insulating sidewalls 1102A to 1102D extend from a peripheral edge of the insulating principal surface 1101 toward the semiconductor chip 1001. In detail, the insulating sidewalls 1102A to 1102D are formed on an inward side with respect to the insulating sidewalls 1007A to 1007D. Hence, a level difference is formed between the insulating sidewalls 1102A to 1102D and the insulating sidewalls 1007A to 1007D.

The second insulating portion 1100 is made of an insulating material having a dielectric constant differing from that of the first insulating layer 1011 and differing from that of the second insulating layer 1012, and has a layer structure including, for example, an organic insulating layer 1103. The second insulating portion 1100 consists of the single layer of the organic insulating layer 1103 in this embodiment, and yet the second insulating portion 1100 may have a laminated structure of a plurality of organic insulating layers. For example, a polyimide film, a phenol resin film, an epoxy resin film, etc., can be mentioned as the organic insulating layer 1103. The total thickness TE2 of the second insulating portion 1100 may be not less than 2 μm and not more than 100 μm. The total thickness TE2 of the second insulating portion 1100 is arbitrary, and is adjusted in accordance with a dielectric withstand voltage (dielectric breakdown resistance) to be realized.

The high potential coil 1016 is formed at the insulating principal surface 1101 of the second insulating portion 1100. Therefore, the high potential coil 1016 faces the low potential coil 1015 with the interlayer insulating layers 1010 and the second insulating portion 1100 between the high potential coil 1016 and the low potential coil 1015. The low potential terminal 1025, the high potential terminal 1026, and the dummy pattern 1043 are also formed at the insulating principal surface 1101 of the second insulating portion 1100 in the same way as the high potential coil 1016. The low potential terminal 1025 is connected to the penetrating wiring 1031 through the first low potential pad wiring 1104 formed on the first insulating portion 1005.

Additionally, the protective layer 1089 is not divided into the first portion 1090 and the second portion 1091, and is formed so as to cover the entirety of the insulating principal surface 1101 of the second insulating portion 1100.

Figure 80:
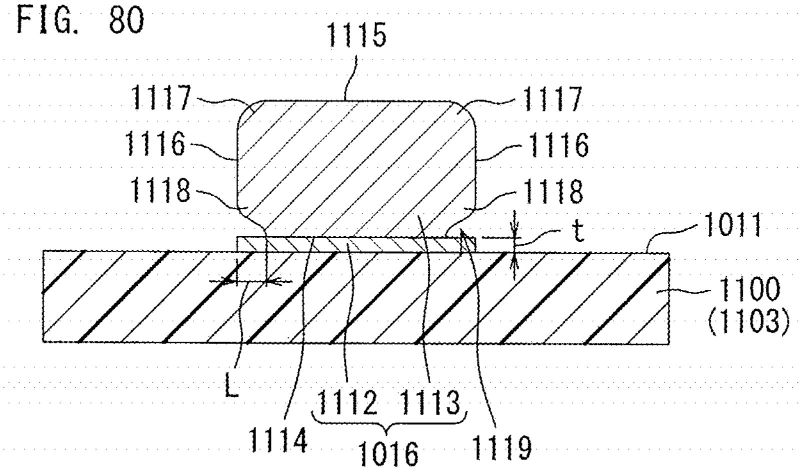
FIG. 80 is an enlarged view of a main part of the high potential coil 1016 of FIG. 79.

FIG. 80 is an enlarged view of a main part of the high potential coil 1016 of FIG. 79. A structure of the high potential coil 1016 will be described in more detail with reference to FIG. 80.

As described above, the high potential coil 1016 is formed at the insulating principal surface 1101 of the second insulating portion 1100. In more detail, the high potential coil 1016 is formed so as to be erected from the insulating principal surface 1101 of the second insulating portion 1100 to the side opposite to the first insulating portion 1005. The high potential coil 1016 includes a second underlayer 1112 contiguous to the insulating principal surface 1101 of the second insulating portion 1100 and a second main body portion 1113 formed on the second underlayer 1112.

The second underlayer 1112 is formed in a flat film shape on the insulating principal surface 1101 of the second insulating portion 1100. The second underlayer 1112 may have a thickness t of not less than 0.05 μm and not more than 2 μm. Additionally, the second underlayer 1112 may form an adhesion layer that raises adhesive properties between the second main body portion 1113 and the second insulating portion 1100 (organic insulating layer 1103). The second underlayer 1112 may include at least one of titanium and titanium nitride.

The second main body portion 1113 is thicker than the second underlayer 1112, and may have a thickness of, for example, not less than 1 μm and not more than 20 μm. The second main body portion 1113 may include at least one among copper, aluminum, and tungsten. In this embodiment, the second main body portion 1113 is formed with a plated layer of copper.

The second main body portion 1113 has a lower surface 1114 contiguous to the second underlayer 1112, an upper surface 1115 on the side opposite thereto, and a side surface 1116 that connects the lower surface 1114 and the upper surface 1115.

The second main body portion 1113 has an upper corner portion 1117 and a lower corner portion 1118. The upper corner portion 1117 may be formed by the intersection of the upper surface 1115 with the side surface 1116 of the second main body portion 1113. In this embodiment, the upper corner portion 1117 (upper corner portion of high potential coil 1016) of the second main body portion 1113 may be formed in a curve shape in a cross-sectional view. In other words, the upper corner portion 1117 may have a chipped shape. That the upper corner portion 1117 has a curve shape or that the upper corner portion 1117 has a chipped shape may mean that the upper corner portion 1117 is obtuse to such a degree that the cross vertex between the upper surface 1115 and the side surface 1116 of the second main body portion 1113 cannot be visually perceived, for example, when the upper corner portion 1117 is represented by an electronic image, such as an SEM image, or may mean that the curvature radius of a portion that might be regarded as a cross vertex between the upper surface 1115 and the side surface 1116 is about 1 nm or more.

On the other hand, the lower corner portion 1118 (lower corner portion of high potential coil 1016) of the second main body portion 1113 is separated from the second insulating portion 1100 in a cross-sectional view. Hence, a gap 1119 is formed between the lower corner portion 1118 of the second main body portion 1113 and the second insulating portion 1100. In more detail, the second underlayer 1112 in the high potential coil 1016 is contiguous to the second insulating portion 1100 throughout its entirety. The gap 1119 is formed between the second underlayer 1112 and the lower corner portion 1118 of the second main body portion 1113. The length L of the gap 1119 from the side surface 1116 of the second main body portion 1113 to its inward side may be twice or more the thickness t of the second underlayer 1112 (length L≥2t).

Additionally, the lower corner portion 1118 of the second main body portion 1113 may be formed in a curve shape in a cross-sectional view in the same way as the upper corner portion 1117. In other words, the lower corner portion 1118 may have a chipped shape. That the lower corner portion 1118 has a curve shape or that the lower corner portion 1118 has a chipped shape may mean that the lower corner portion 1118 is obtuse to such a degree that the cross vertex between the lower surface 1114 and the side surface 1116 of the second main body portion 1113 cannot be visually perceived, for example, when the lower corner portion 1118 is represented by an electronic image, such as an SEM image, or may mean that the curvature radius of a portion that might be regarded as a cross vertex between the lower surface 1114 and the side surface 1116 is about 1 nm or more.

FIG. 81 to FIG. 85 are views showing steps relative to the formation of the high potential coil 1016 of FIG. 80. Next, a formation method of the high potential coil 1016 will be described with reference to FIG. 81 to FIG. 85.

Figure 81:
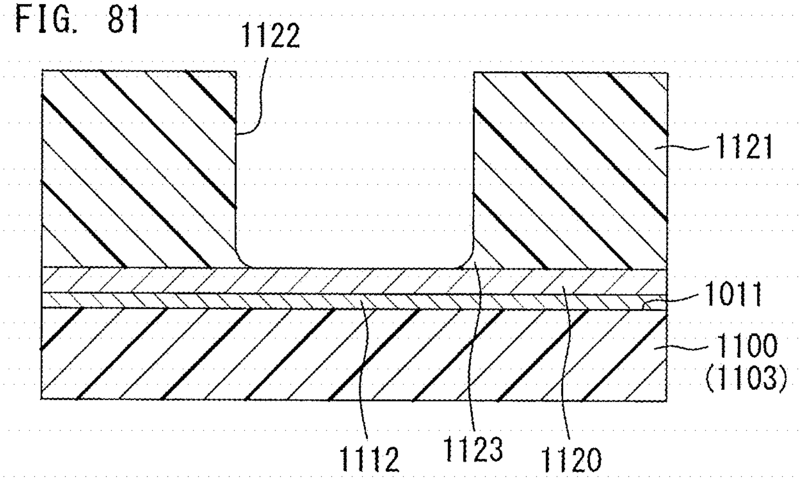
FIG. 81 is a view showing a step relative to the formation of the high potential coil 1016 of FIG. 80.

In order to form the high potential coil 1016, the second insulating portion 1100 is formed on the first insulating portion 1005 by, for example, the spin coating method. Next, the second underlayer 1112 and a seed layer 1120 are formed by, for example, the sputtering method as shown in FIG. 81. The seed layer 120 is a base conductive layer for the plating growth of the second main body portion 1113. For example, the seed layer 1120 may be Cu or the like. The thickness of the seed layer 1120 may be, for example, not less than 0.05 μm and not more than 2 μm.

Next, a resist film 1121 is formed on the seed layer 1120. Next, an opening 1122 that exposes a portion at which the high potential coil 1016 of the seed layer 1120 is to be formed is formed by selectively exposing and developing the resist film 1121. A projecting portion 1123 that projects from a side surface of the resist film 1121 toward an inward region of the opening 1122 may be formed at a bottom portion of the opening 1122.

Figure 82:
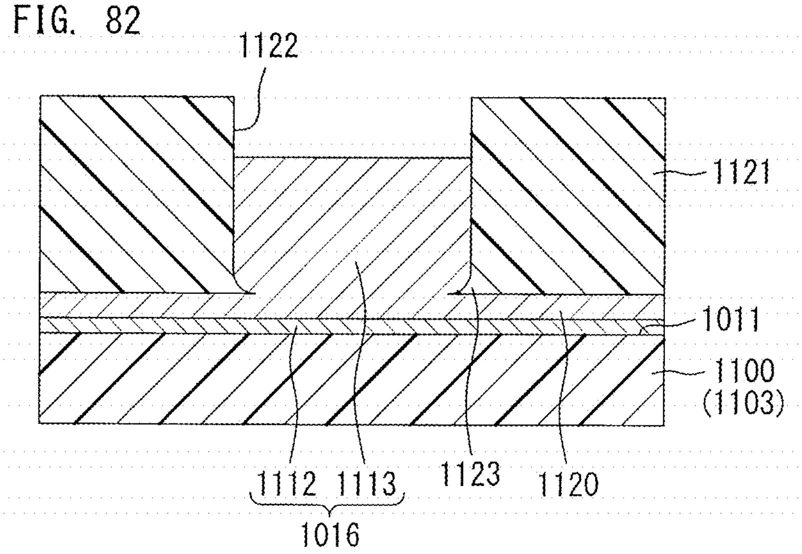
FIG. 82 is a view showing a step subsequent to the step of FIG. 81.

Next, a conductive material for the second main body portion 1113 is subjected to plating growth from the seed layer 1120 exposed from the opening 1122 as shown in FIG. 82. In this embodiment, Cu is subjected to plating growth from the seed layer 1120. Hence, the second main body portion 1113 is formed in the opening 1122.

Figure 83:
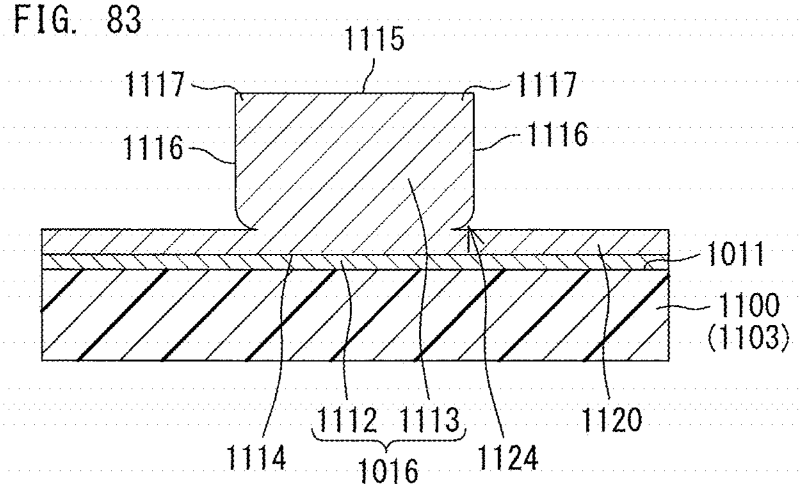
FIG. 83 is a view showing a step subsequent to the step of FIG. 82.

Next, the resist film 1121 is removed as shown in FIG. 83. A gap 1124 that serves as a base of the gap 1119 between the second main body portion 1113 and the second underlayer 1112 is formed in a portion in which the projecting portion 1123 of the resist film 1121 exists.

Figure 84:
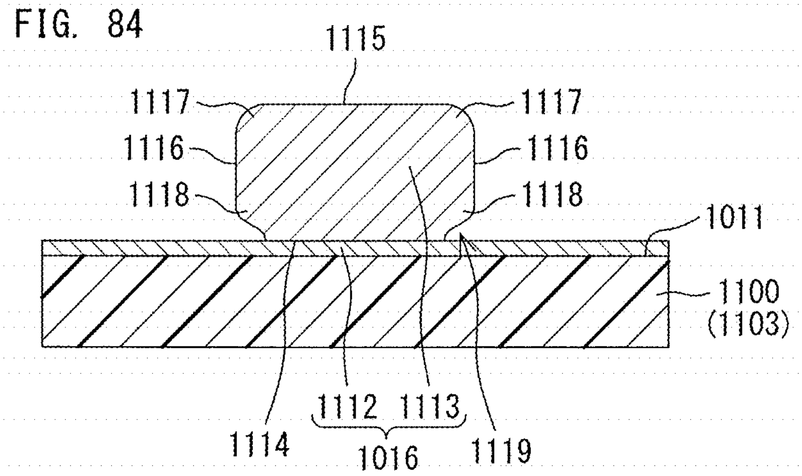
FIG. 84 is a view showing a step subsequent to the step of FIG. 83.

Next, unnecessary portions (portions outside the second main body portion 1113) of the seed layer 1120 are removed as shown in FIG. 84. This step is performed by, for example, wet etching. At this time, the second main body portion 1113 made of the same material as the seed layer 1120 is also put in an etching liquid. Hence, the upper corner portion 1117 and the lower corner portion 1118 of the second main body portion 1113 are rounded, and is changed into a curve shape in a cross-sectional view. The second main body portion 1113 is furthermore inwardly eroded from the gap 1124 between the lower corner portion 1118 and the second underlayer 1112, and, as a result, the gap 1119 is formed.

Figure 85:
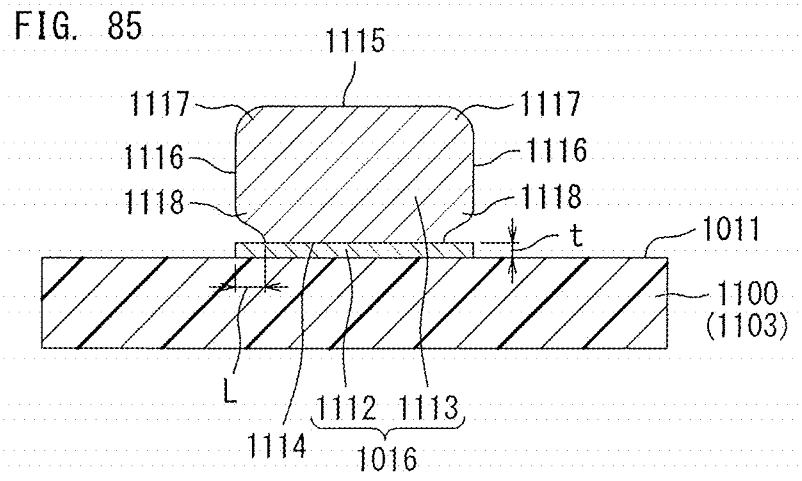
FIG. 85 is a view showing a step subsequent to the step of FIG. 84.

Next, a part exposed from the second main body portion 1113 of the second underlayer 1112 is removed by etching as shown in FIG. 85. Through these steps, the high potential coil 1016 can be formed.

As described above, with the semiconductor device E2, the upper corner portion 1117 of the high potential coil 1016 is formed in a curve shape in a cross-sectional view, and therefore it is possible to suppress the concentration of an electric field on the upper corner portion 1117 of the high potential coil 1016. This makes it possible to suppress the occurrence of a dielectric breakdown between the high potential coil and wirings placed on the low potential side (for example, low potential terminal 1025) while the upper corner portion 1117 of the high potential coil 1016 works as a starting point. As a result, it is possible to provide the semiconductor device E2 having high reliability.

The shape of this high potential coil 1016 may be applied to the high potential-side conductive layer that is formed at the same layer as the high potential coil 1016. For example, the high potential connection wiring 1041 and the dummy pattern 1043 may also have the same shape as the high potential coil 1016.

Additionally, in the description above, the seal conductor 1080 is connected to the semiconductor chip 1001 through the seal via conductor 1083, and is fixed to the ground potential. On the other hand, the seal conductor 1080 is not necessarily required to be fixed to the ground potential by eliminating the seal via conductor 1083 as shown in FIG. 86.

Figure 86:
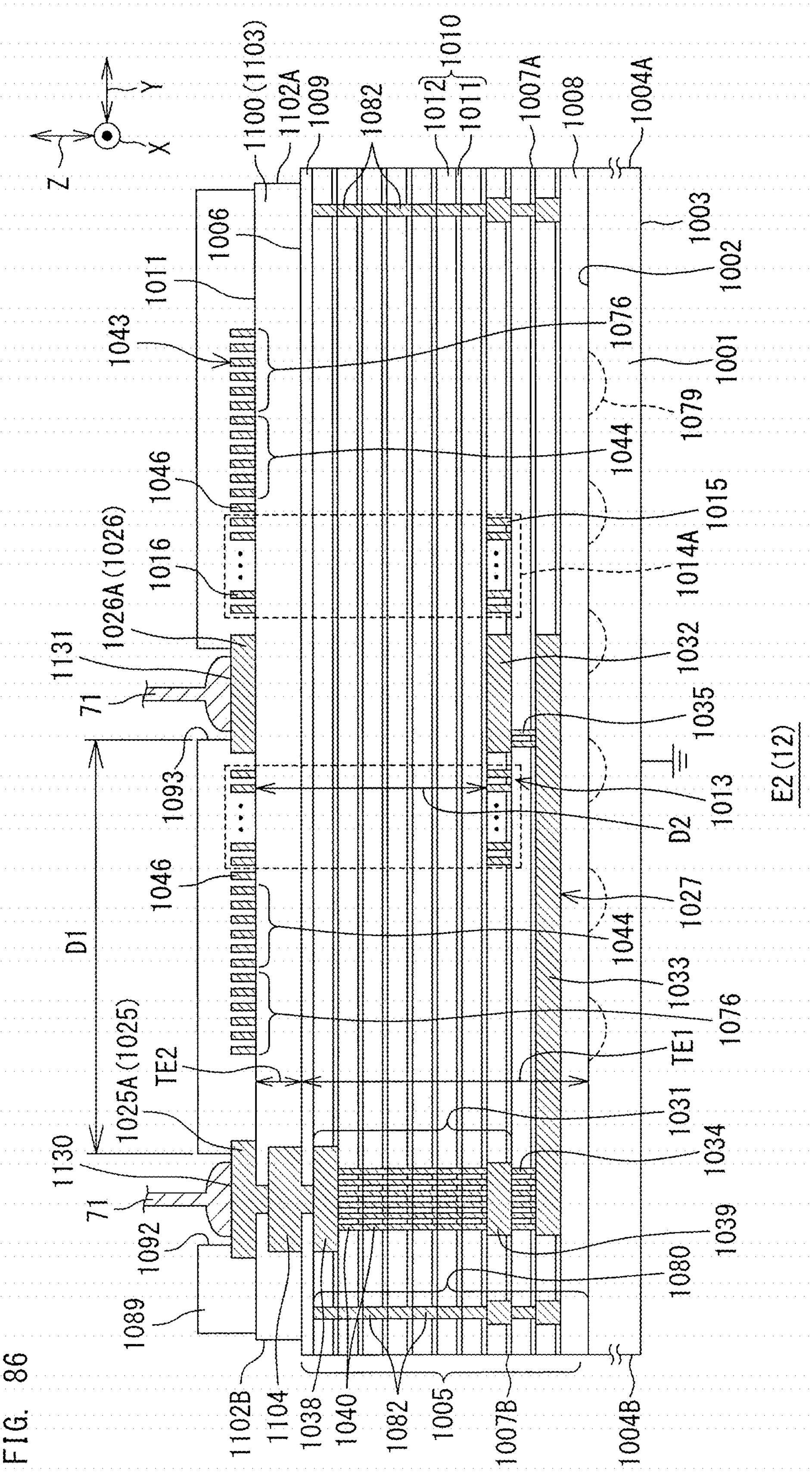
FIG. 86 is a schematic cross-sectional view of a semiconductor device E1 according to one preferred embodiment of the present disclosure.

Additionally, an upper corner portion of the second insulating portion 1100 formed by allowing the insulating principal surface 1101 of the second insulating portion 1100 and the insulating sidewalls 1102A to 1102D to intersect each other may have a certain angle as shown in FIG. 79 and FIG. 86 or may be formed in a round shape so as to be curved in a cross-sectional view. Additionally, the entirety of the insulating principal surface 1101 may be formed in a curved surface shape that swells to the side opposite to the semiconductor chip 1001.

Additionally, the second insulating portion 1100 may have a laminated structure consisting of a plurality of organic insulating layers. In this case, the organic insulating layers may be made of mutually-identical organic insulating materials, or may be made of mutually-different organic insulating materials.

Other Preferred Embodiments

The structures of the semiconductor module 1 and the semiconductor devices A1 to A4, B1 to B4, C1 to C4, D1 and D2, and E1 and E2 have been described as described above, and yet the semiconductor module 1 and the semiconductor devices A1 to A4, B1 to B4, C1 to C4, D1 and D2, and E1 and E2 can also employ the following modifications.

In the following description, with respect to the modifications of the semiconductor devices A1 to A4, B1 to B4, C1 to C4, D1 and D2, and E1 and E2, at least one modification among the semiconductor devices A1 to A4, B1 to B4, C1 to C4, D1 and D2, and E1 and E2 is shown, and yet each of the modifications can also be applied to the semiconductor devices other than the semiconductor device shown in the drawings.

Figure 87:
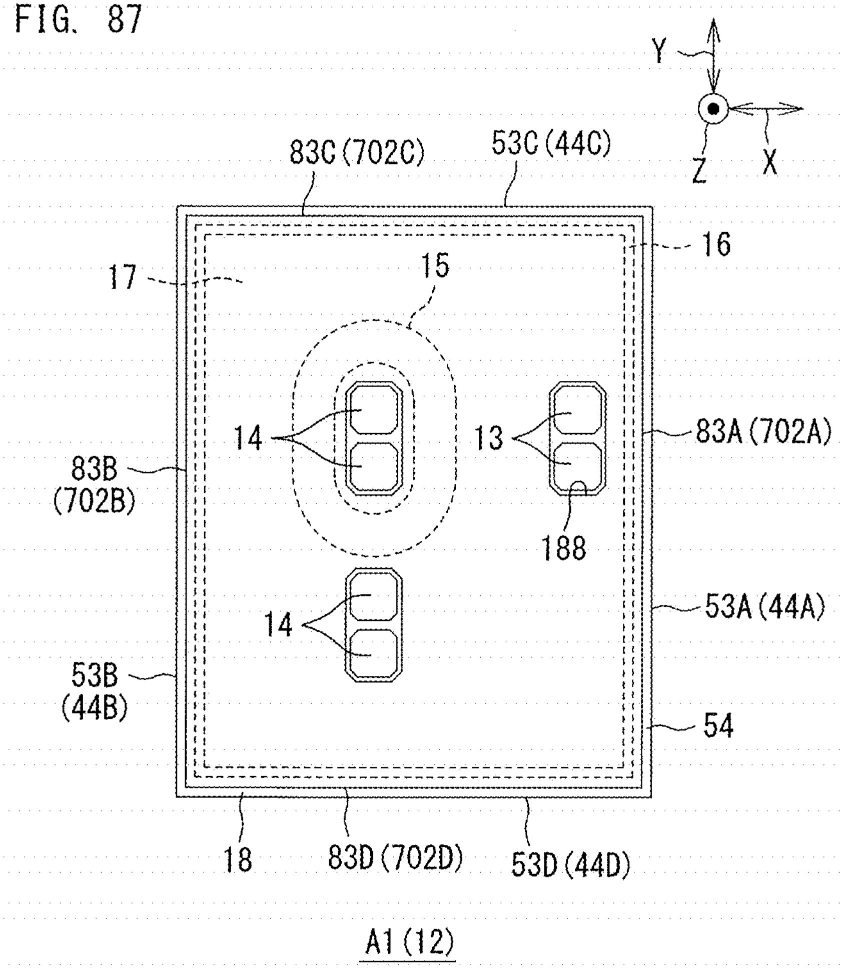
FIG. 87 is a view showing a modification of the preferred embodiment.
Figure 88:
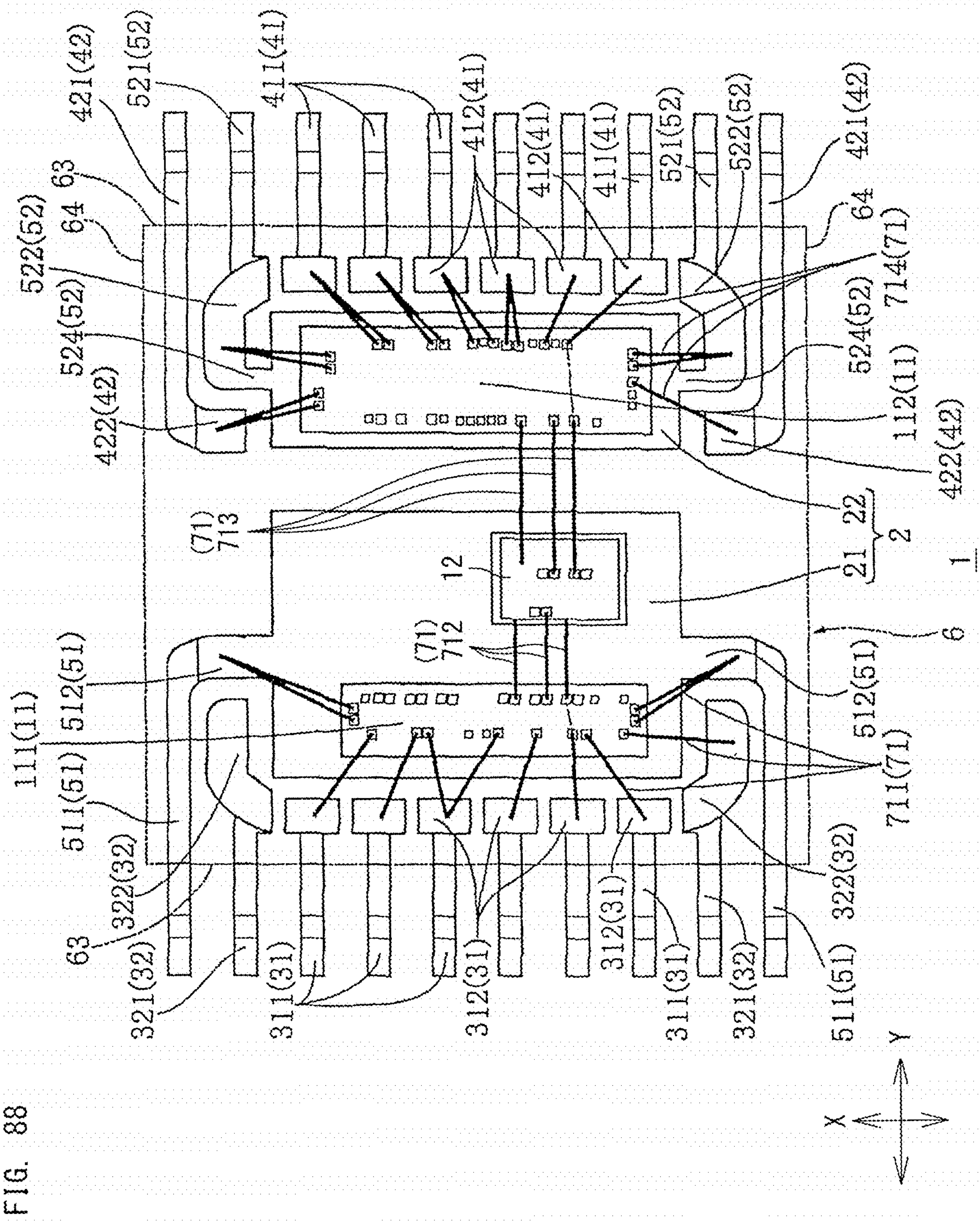
FIG. 88 is a view showing a modification of the preferred embodiment.

(First Modification: FIG. 87, FIG. 88)

The aforementioned semiconductor device A1 includes the transformers 15A to 15D, and yet the semiconductor device A1 may have a configuration including the single transformer 15 as shown in FIG. 87. This makes it possible to reduce the size of the semiconductor device A1. In this case, in the semiconductor module 1, the insulating element 12 (semiconductor device A1) may be smaller than other elements (in this embodiment, the semiconductor elements 11).

Figure 89:
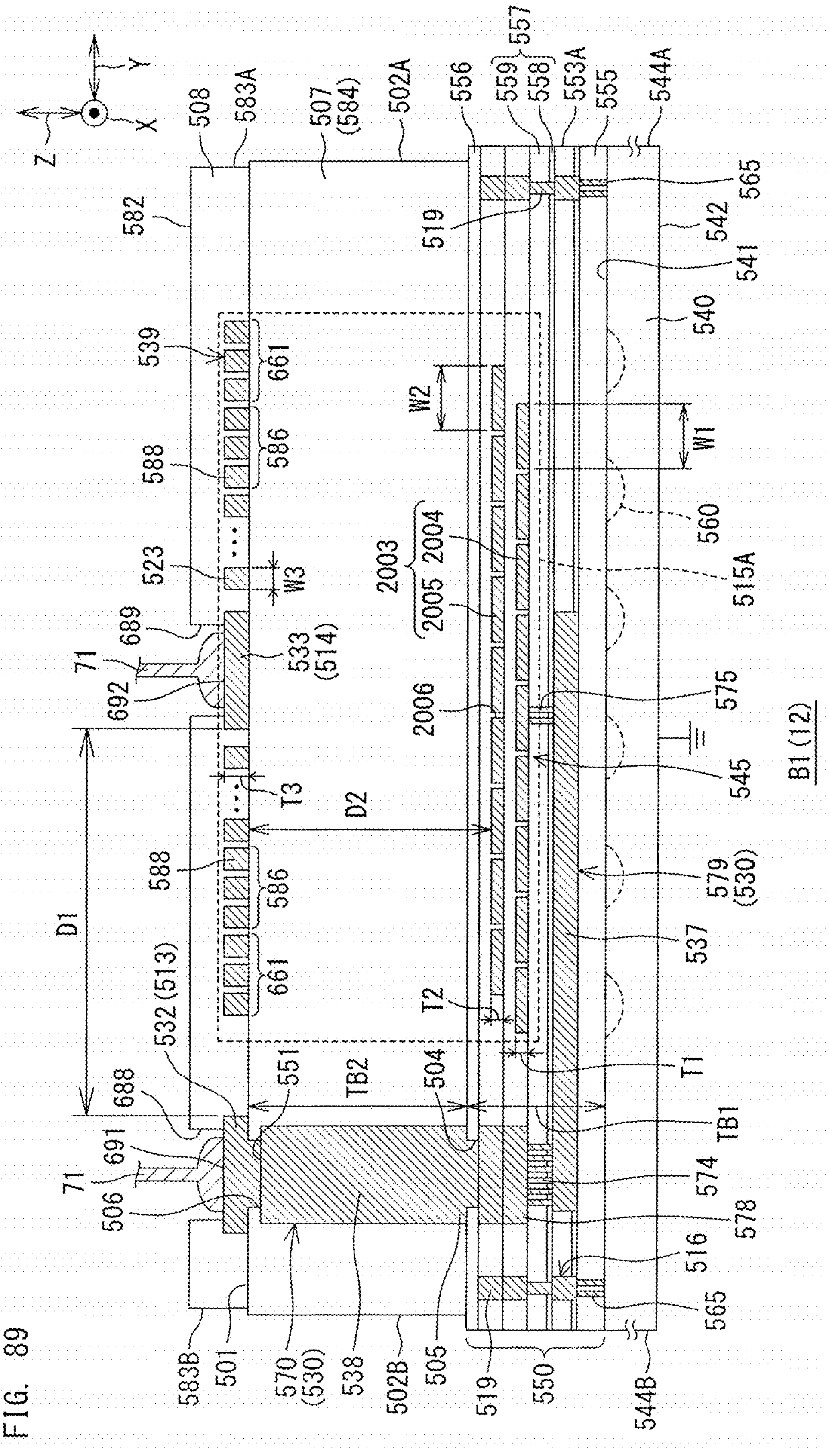
FIG. 89 is a view showing a modification of the preferred embodiment.

(Second Modification: FIG. 89)

In the aforementioned semiconductor device B1, the low potential coil 520 of the transformer 515 is formed in the single interlayer insulating layer 557, and yet the low potential coil 520 may be a low potential coil 2003 formed at layers in the normal direction Z of the semiconductor chip 540 as shown in FIG. 89. For example, the low potential coil 2003 may include a first low potential coil 2004 formed on the semiconductor chip 540 side and a second low potential coil 2005 formed on the second insulating portion 507 side with respect to the first low potential coil 2004.

The first low potential coil 2004 and the second low potential coil 2005 may be formed in mutually-different interlayer insulating layers 557. For example, in a pair of interlayer insulating layers 557 contiguous to each other in the normal direction Z, the first low potential coil 2004 may be formed at the interlayer insulating layer 557 that is on the lower side close to the semiconductor chip 540, and the second low potential coil 2005 may be formed at the interlayer insulating layer 557 that is on the upper side close to the second insulating portion 507.

The first low potential coil 2004 and the second low potential coil 2005 may be formed at mutually-deviated positions. For example, the first low potential coil 2004 may be deviated with respect to the second low potential coil 2005 so that the first low potential coil 2004 faces a gap 2006 (region between adjoining helical portions) of the second low potential coil 2005.

Additionally, the width W1 of the low potential coil 2004 and the width W2 of the second low potential coil 2005 may be larger than the width W3 of the high potential coil 523. For example, each of the widths W1 and W2 may be not less than 1 μm and not more than 20 μm, and the width W3 may be not less than 1 μm and less than 10 μm.

On the other hand, the thickness T1 of the first low potential coil 2004 and the thickness T2 of the second low potential coil 2005 may be smaller than the thickness T3 of the high potential coil 523. For example, each of the thicknesses T1 and T2 may be not less than 0.5 μm and less than 1.5 μm, and the thickness T3 may be not less than 1.5 μm and not more than 5 μm.

Figure 90:
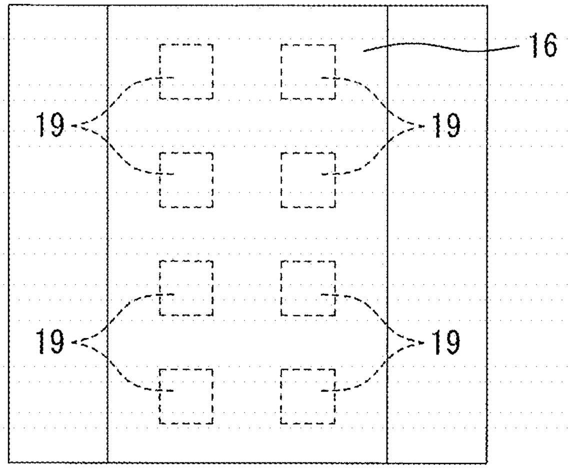
FIG. 90 is a view showing a modification of the preferred embodiment.
Figure 91:
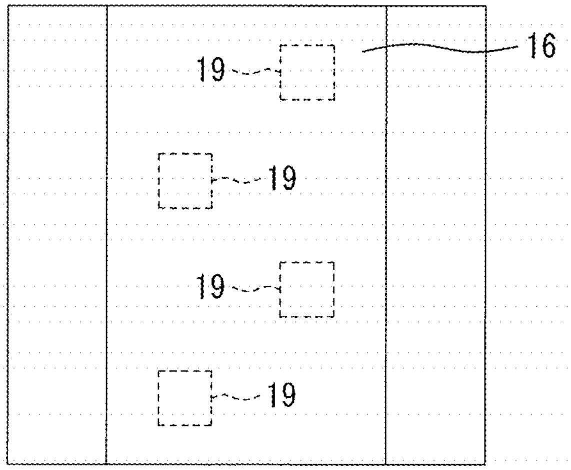
FIG. 91 is a view showing a modification of the preferred embodiment.

(Third Modification: FIG. 90, FIG. 91)

In the aforementioned semiconductor device A1, the seal conductor 16 is formed by stacking the seal plug conductors 19 penetrating through each of the interlayer insulating layers 57, and yet the arrangement pattern of the seal plug conductors 19 may employ various patterns as shown in FIG. 90 and FIG. 91. For example, the seal plug conductors 19 may be arranged at equal intervals therebetween so as to adjoin each other in a plan view as shown in FIG. 90, or may be alternately arranged so as to be alternated with each other in a plan view as shown in FIG. 91.

Figure 92:
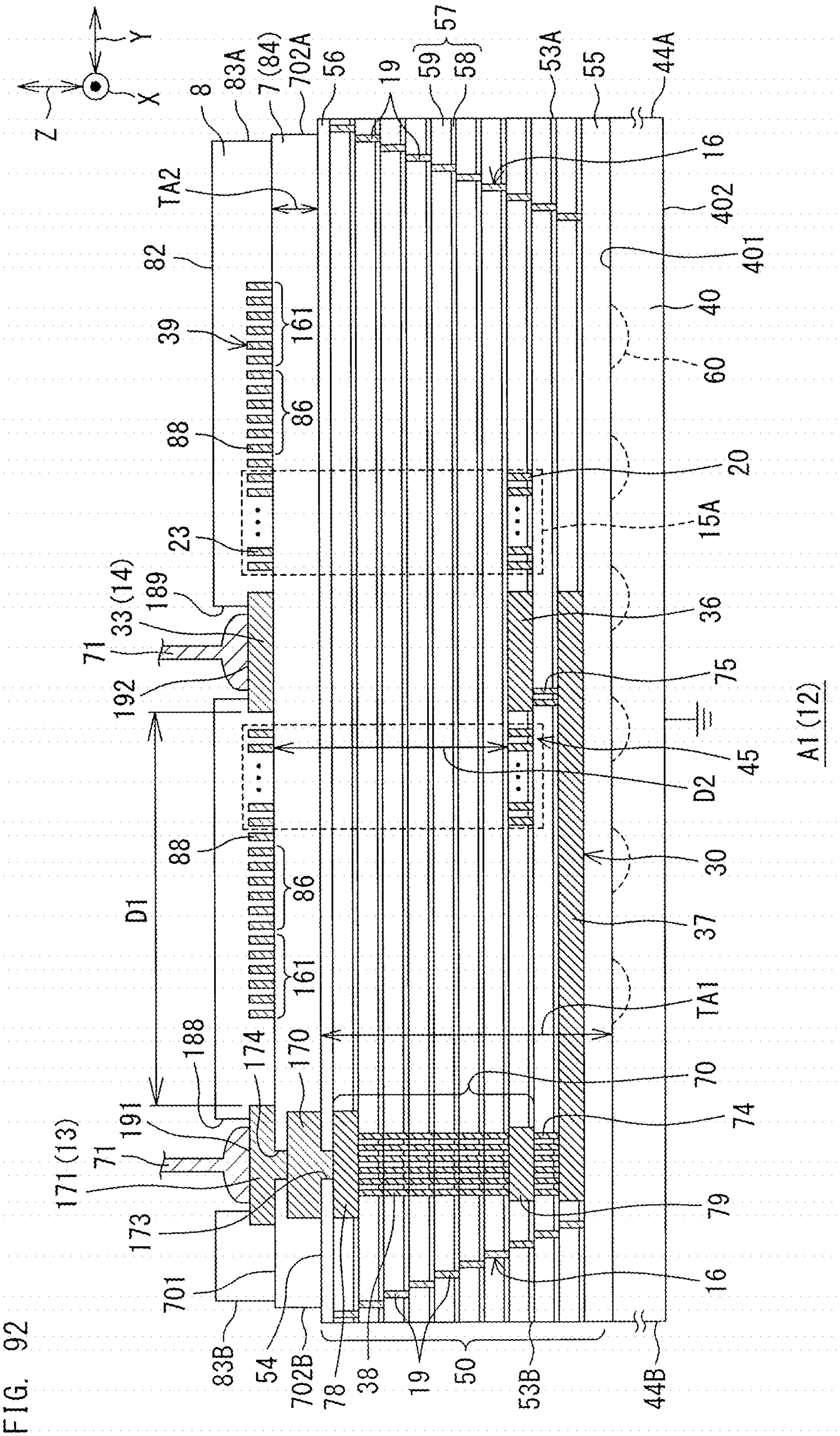
FIG. 92 is a view showing a modification of the preferred embodiment.
Figure 93:
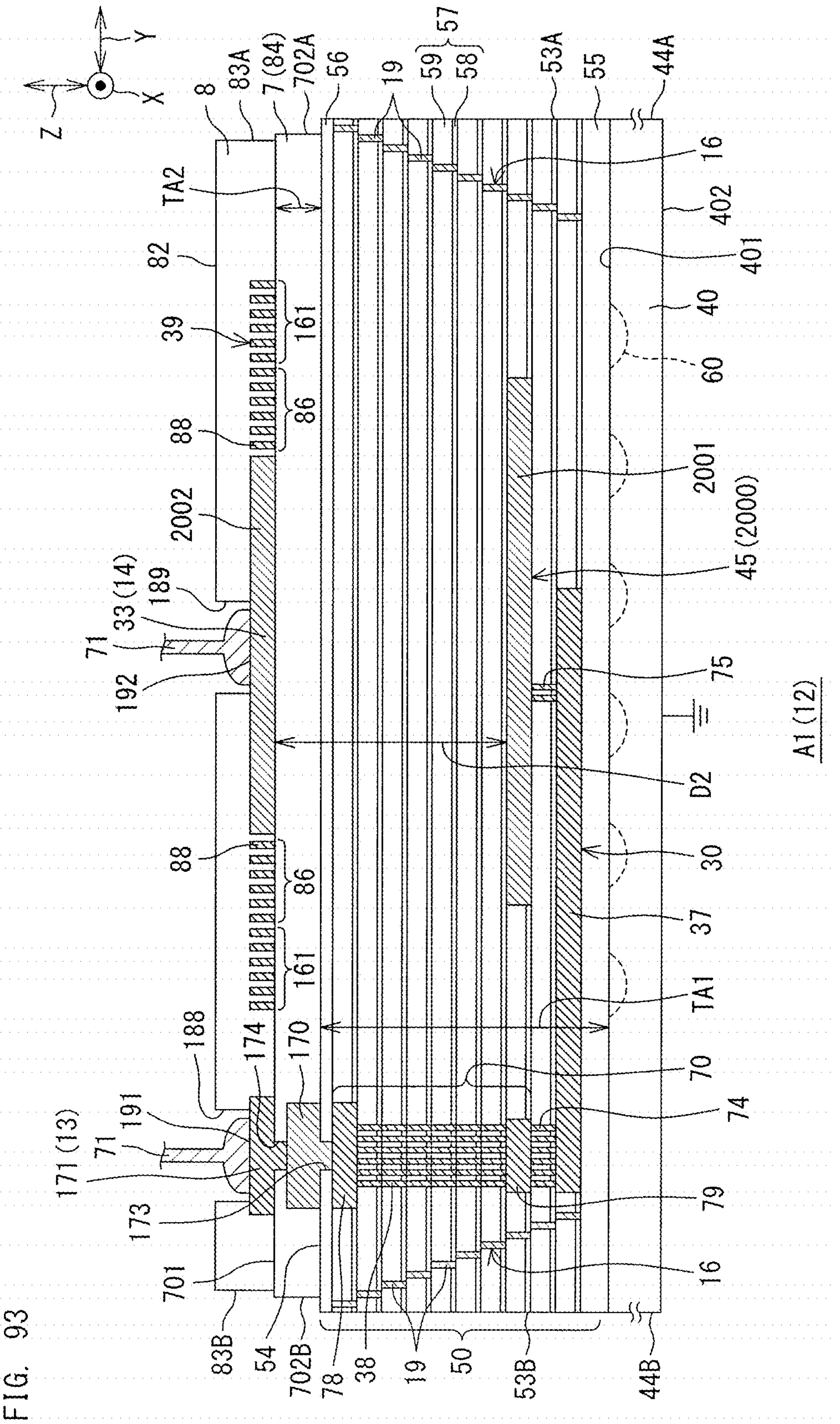
FIG. 93 is a view showing a modification of the preferred embodiment.

(Fourth Modification: FIG. 92, FIG. 93)

In the aforementioned semiconductor device A1, the seal plug conductors 19 are stacked so as to be contiguous to each other, and the seal plug conductors 19 are formed at the same position in a direction along the first principal surface 401 of the semiconductor chip 40. On the other hand, the seal plug conductors 19 may be stacked in a state of being deviated from each other as shown in FIG. 92. In other words, the seal plug conductors 19 may be formed at mutually-different positions in the direction along the first principal surface 401 of the semiconductor chip 40. In this embodiment, the seal plug conductor 19 relatively close to the semiconductor chip 40 is disposed closer to the transformer 15 than to the seal plug conductor 19 relatively close to the insulating principal surface 54. For example, the seal plug conductors 19 may be formed so as to become closer to the transformer 15 in proportion to an approach to the lower layer from the upper layer (in proportion to an approach to the semiconductor chip 40 from the insulating principal surface 54).

Additionally, in the aforementioned semiconductor device A1, the transformer 15 is mounted as the first functional device 45, and yet a capacitor 2000 may be mounted instead of the transformer 15 as shown in FIG. 93. The capacitor 2000 may include, for example, a lower electrode 2001 formed in the first insulating portion 50 and an upper electrode 2002 formed on the second insulating portion 7. The lower electrode 2001 and the upper electrode 2002 may face each other with the first and second insulating portions 50 and 7 between the lower electrode 2001 and the upper electrode 2002.

Figure 94:
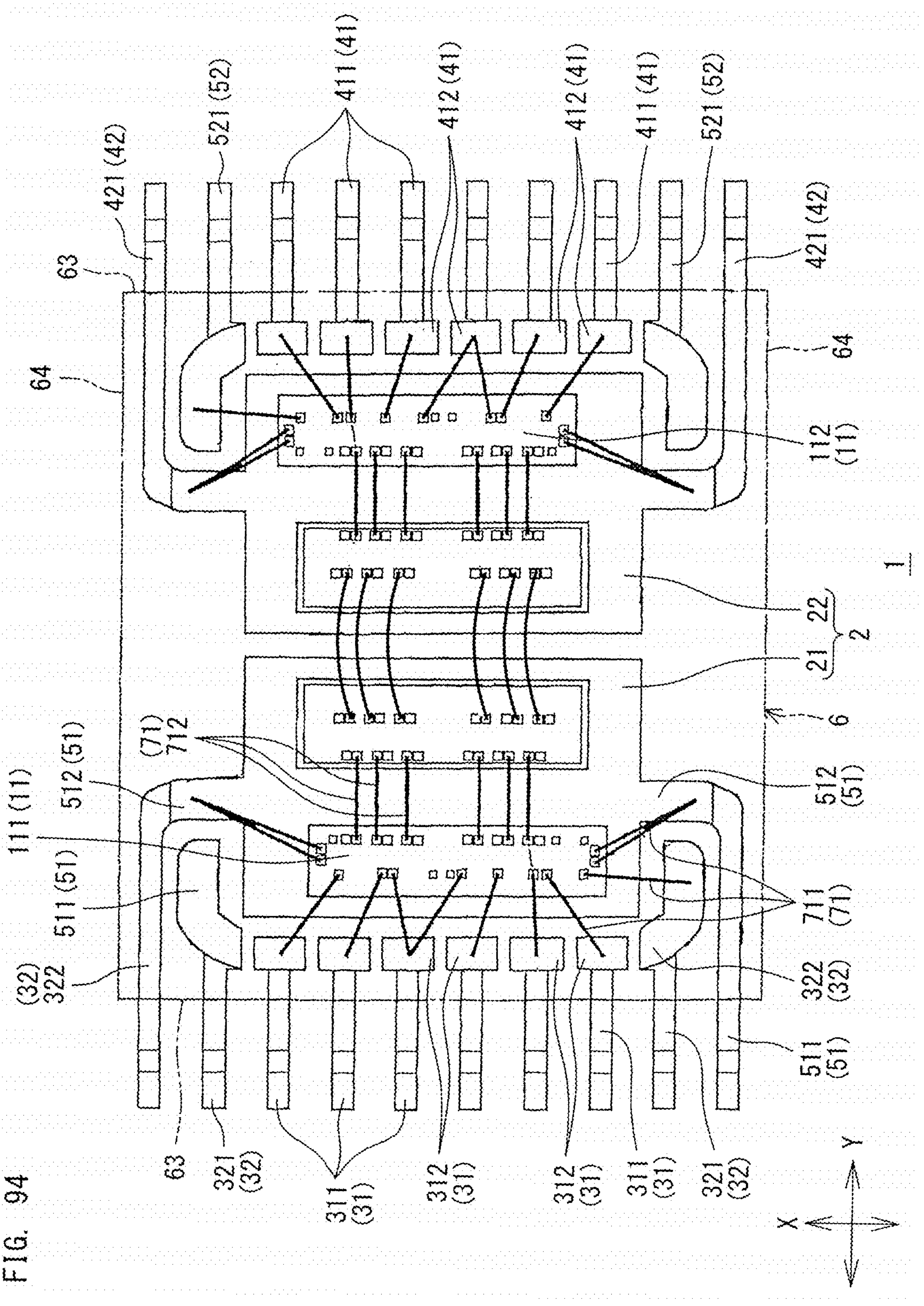
FIG. 94 is a view showing a modification of the preferred embodiment.

(Fifth Modification: FIG. 94)

In the aforementioned semiconductor module 1, the insulating element 12 is mounted in a state of being sandwiched between the semiconductor elements 11 (control element 111 and drive element 112), and yet the insulating elements 12 may be mounted in the same chip, and may face each other as shown in FIG. 94.

The preferred embodiments of the present disclosure have been described as above, and yet the present disclosure can be carried out in other modes.

For example, the aforementioned features understood from the disclosure of each of the preferred embodiments above can be combined even among different preferred embodiments.

Besides, various design changes can be made within the scope of the subject matter described in the claims.

The following features other than the invention described in the claims can be extracted from the present description and the drawings.

[A1]

A semiconductor device including a semiconductor layer that has a principal surface, a first conductive layer that is formed on the principal surface of the semiconductor layer, a first insulating portion that is formed on the principal surface of the semiconductor layer so as to cover the first conductive layer and that includes a first insulating layer of at least three or more layers, a second insulating portion that is formed on the first insulating portion, that has a dielectric constant differing from a dielectric constant of the first insulating layer, and that includes a second insulating layer not included in the first insulating portion, and a second conductive layer that is formed on the second insulating portion, that faces the first conductive layer through the first insulating portion and the second insulating portion, and that is connected to a potential differing from a potential of the first conductive layer.

[A2]

The semiconductor device according to A1, where the first insulating layer includes a first inorganic insulating layer and the second insulating layer includes an organic insulating layer.

[A3]

The semiconductor device according to A2, where the first insulating portion further includes a second inorganic insulating layer laminated on each of the first inorganic insulating layers.

[A4]

The semiconductor device according to A3, where the first inorganic insulating layer includes a tensile stress film and the second inorganic insulating layer includes a compressive stress film.

[A5]

The semiconductor device according to A4, where the compressive stress film and the tensile stress film are alternately laminated.

[A6]

The semiconductor device according to A4 or A5, where the tensile stress film includes a silicon nitride film and the compressive stress film includes a silicon oxide film.

[A7]

A semiconductor device including a semiconductor layer that has a principal surface, a first conductive layer that is formed on the principal surface of the semiconductor layer, a first insulating portion that is formed on the principal surface of the semiconductor layer so as to cover the first conductive layer and that includes a plurality of laminated structures each of which consists of at least a first inorganic insulating layer and a second inorganic insulating layer, a second insulating portion that is formed on the first insulating portion and that includes an organic insulating layer, and a second conductive layer that is formed on the second insulating portion, that faces the first conductive layer through the first insulating portion and the second insulating portion, and that is connected to a potential differing from a potential of the first conductive layer.

[A8]

The semiconductor device according to A7, where the first inorganic insulating layer includes a silicon nitride film and the second inorganic insulating layer includes a silicon oxide film.

[A9]

The semiconductor device according to any one of A2 to A8, where the organic insulating layer includes at least one among a polyimide film, a phenol resin film, and an epoxy resin film.

[A10]

The semiconductor device according to any one of A2 to A9, where the second insulating portion is formed of a single layer of the organic insulating layer.

[A11]

The semiconductor device according to any one of A1 to A10, where the first insulating portion has a thickness of not less than 5 μm and not more than 50 μm and the second insulating portion has a thickness of not less than 2 μm and not more than 100 μm.

[A12]

A semiconductor device including a semiconductor layer that has a principal surface, a first conductive layer that is formed on the principal surface of the semiconductor layer, a first insulating portion that is formed on the principal surface of the semiconductor layer so as to cover the first conductive layer, that includes at least a silicon oxide film, and that has a thickness of not less than 5 μm and not more than 50 μm, a second insulating portion that is formed on the first insulating portion, that has a dielectric constant differing from a dielectric constant of the silicon oxide film, and that includes a second insulating layer not included in the first insulating portion, and a second conductive layer that is formed on the second insulating portion, that faces the first conductive layer through the first insulating portion and the second insulating portion, and that is connected to a potential differing from a potential of the first conductive layer.

[A13]

The semiconductor device according to any one of A1 to A12, including a first pad that is formed on the first insulating portion and that is electrically connected to the first conductive layer and a second pad that is formed on the second insulating portion and that is electrically connected to the second conductive layer.

[A14]

The semiconductor device according to A13, including a first energization member that is connected to the first conductive layer and that extends from the first conductive layer to a boundary portion with the second insulating portion in the first insulating portion, a second energization member that is connected to the first energization member and that extends from the first energization member onto the second insulating portion, and a protective layer that is formed on the second insulating portion so as to cover the second conductive layer and that has a first opening that exposes a part of the second energization member as the first pad.

[A15]

The semiconductor device according to A14, where the protective layer includes a first protective layer with which the second conductive layer is covered and a second protective layer that is formed on the first protective layer and that has the first opening and the second energization member extends from the first energization member to a region on the first protective layer.

[A16]

The semiconductor device according to A14 or A15, where the second insulating portion has a first penetrating hole in which the second energization member is buried, the second energization member includes a lead-out portion that is led out from the first penetrating hole to a region not overlapping with the first penetrating hole in a plan view, and the first pad is formed with a part of the lead-out portion.

[A17]

The semiconductor device according to A13, including a first energization member that is connected to the first conductive layer and that extends from the first conductive layer to a boundary portion with the second insulating portion in the first insulating portion and a protective layer that is formed on the second insulating portion so as to cover the second conductive layer, where a first opening that exposes a part of the first energization member as the first pad is formed in the protective layer and the second insulating portion.

[A18]

The semiconductor device according to any one of A14 to A17, including a third energization member that is connected to the second conductive layer and that is formed on the second insulating portion, where the protective layer that has a second opening that exposes a part of the third energization member as the second pad, further including a concave portion that is formed in a part of the protective layer between the first opening and the second opening.

[A19]

The semiconductor device according to any one of A14 to A18, where the first energization member is connected to a ground potential through the semiconductor layer.

[A20]

The semiconductor device according to any one of A1 to A19, including a seal conductor formed in the first insulating portion so as to surround the first conductive layer.

[A21]

The semiconductor device according to any one of A1 to A20, where the first conductive layer includes a low potential layer connected to a first potential, the second conductive layer includes a high potential layer connected to a second potential higher than the first potential, and including a dummy pattern that is formed around the high potential layer and that shields an electric field around the high potential layer.

[A22]

The semiconductor device according to any one of A1 to A21, where the first conductive layer includes a first coil and the second conductive layer includes a second coil.

[A23]

A semiconductor module including a die pad, the semiconductor device of A22 that is mounted on the die pad, a package main body that seals the die pad and the semiconductor device, and a lead terminal that is electrically connected to the semiconductor device and that is exposed from the package main body.

[A24]

The semiconductor module according to A23, where the semiconductor device includes a signal-transmitting insulating element that transmits a signal to an interval between the first coil and the second coil in an insulated state, further including a second semiconductor device electrically connected to the insulating element.

[A25]

The semiconductor module according to A24, where the second semiconductor device includes a control element electrically connected to one of the first coil and the second coil and a drive element electrically connected to the other of the first coil and the second coil.

[A26]

A motor drive device including the semiconductor module of A25, where drive control of a motor is performed by means of the drive element.

[A27]

A vehicle that has the motor drive device of A26.

[B1]

A semiconductor device including a semiconductor layer that has a principal surface, a first insulating portion that includes a first insulating layer formed on the principal surface of the semiconductor layer, a first conductive layer that is formed in the first insulating portion, a second insulating portion that is formed on the first insulating portion, that has a dielectric constant differing from a dielectric constant of the first insulating layer, and that includes a second insulating layer not included in the first insulating portion, a second conductive layer that is formed on the second insulating portion, that faces the first conductive layer through the second insulating portion, and that is connected to a potential differing from a potential of the first conductive layer, and a first pad that is formed at a layer same as the second conductive layer or at a layer higher than the second conductive layer and that is electrically connected to the first conductive layer.

[B2]

The semiconductor device according to B1, including a first energization member that is connected to the first conductive layer and that extends from the first conductive layer to a boundary portion with the second insulating portion in the first insulating portion, a second energization member that is connected to the first energization member and that extends from the first energization member onto the second insulating portion, and a protective layer that is formed on the second insulating portion so as to cover the second conductive layer and that has a first opening that exposes a part of the second energization member as the first pad.

[B3]

The semiconductor device according to B2, where the protective layer includes a first protective layer with which the second conductive layer is covered and a second protective layer that is formed on the first protective layer and that has the first opening and the second energization member extends from the first energization member to a region on the first protective layer.

[B4]

The semiconductor device according to B2 or B3, where the second insulating portion has a first penetrating hole in which the second energization member is buried, the second energization member includes a lead-out portion that is led out from the first penetrating hole to a region not overlapping with the first penetrating hole in a plan view, and the first pad is formed with a part of the lead-out portion.

[B5]

The semiconductor device according to B2 or B3, where the second energization member includes a pillar-shaped portion buried at a height exceeding a central portion of the second insulating portion in a normal direction of the principal surface of the semiconductor layer and a rewiring portion extending from the pillar-shaped portion to a region on the second insulating portion.

[B6]

A semiconductor device including a semiconductor layer that has a principal surface, a first insulating portion that includes a first insulating layer formed on the principal surface of the semiconductor layer, a first conductive layer that is formed in the first insulating portion, a second insulating portion that is formed on the first insulating portion, that has a dielectric constant differing from a dielectric constant of the first insulating layer, and that includes a second insulating layer not included in the first insulating portion, a second conductive layer that is formed on the second insulating portion, that faces the first conductive layer through the second insulating portion, and that is connected to a potential differing from a potential of the first conductive layer, and a first pad that is formed at a layer same as the first conductive layer and that is electrically connected to the first conductive layer.

[B7]

The semiconductor device according to B6, including a first energization member that is connected to the first conductive layer and that extends from the first conductive layer to a boundary portion with the second insulating portion in the first insulating portion and a protective layer that is formed on the second insulating portion so as to cover the second conductive layer, where a first opening that exposes a part of the first energization member as the first pad is formed in the protective layer and the second insulating portion.

[B8]

The semiconductor device according to any one of B2 to B5 and B7, including a second pad that is formed on the second insulating portion and that is electrically connected to the second conductive layer.

[B9]

The semiconductor device according to B8, including a third energization member that is connected to the second conductive layer and that is formed on the second insulating portion, where the protective layer that has a second opening that exposes a part of the third energization member as the second pad, further including a concave portion that is formed in a part of the protective layer between the first opening and the second opening.

[B10]

The semiconductor device according to any one of B2 to B5 and B7 to B9, where the first energization member is connected to a ground potential through the semiconductor layer.

[B11]

The semiconductor device according to any one of B1 to B10, where the first insulating layer includes a first inorganic insulating layer and the second insulating layer includes an organic insulating layer.

[B12]

The semiconductor device according to B11, where the first insulating portion further includes a second inorganic insulating layer laminated on the first inorganic insulating layer.

[B13]

The semiconductor device according to B12, where the first inorganic insulating layer includes a compressive stress film, and the second inorganic insulating layer includes a tensile stress film.

[B14]

The semiconductor device according to B13, where the compressive stress film and the tensile stress film are alternately laminated.

[B15]

The semiconductor device according to any one of B12 to B14, where the first inorganic insulating layer includes a silicon oxide film and the second inorganic insulating layer includes a silicon nitride film.

[B16]

The semiconductor device according to any one of B11 to B15, where the organic insulating layer includes at least one among a polyimide film, a phenol resin film, and an epoxy resin film.

[B17]

The semiconductor device according to any one of B11 to B16, where the second insulating portion is formed of a single layer of the organic insulating layer.

[B18]

The semiconductor device according to any one of B1 to B17, where the second insulating portion has a thickness of not less than 2 μm and not more than 100 μm.

[B19]

The semiconductor device according to any one of B1 to B18, including a seal conductor formed in the first insulating portion so as to surround the first conductive layer.

[B20]

The semiconductor device according to any one of B1 to B19, where the first conductive layer includes a low potential layer connected to a first potential, the second conductive layer includes a high potential layer connected to a second potential higher than the first potential, and including a dummy pattern that is formed around the high potential layer and that shields an electric field around the high potential layer.

[B21]

The semiconductor device according to any one of B1 to B20, where the first conductive layer includes a first coil and the second conductive layer includes a second coil.

[B22]

A semiconductor module including a die pad, the semiconductor device of B21 that is mounted on the die pad, a package main body that seals the die pad and the semiconductor device, and a lead terminal that is electrically connected to the semiconductor device and that is exposed from the package main body.

[B23]

The semiconductor module according to B22, where the semiconductor device includes a signal-transmitting insulating element that transmits a signal to an interval between the first coil and the second coil in an insulated state, further including a second semiconductor device electrically connected to the insulating element.

[B24]

The semiconductor module according to B23, where the second semiconductor device includes a control element electrically connected to one of the first coil and the second coil and a drive element electrically connected to the other of the first coil and the second coil.

[B25]

A motor drive device including the semiconductor module of B24, where drive control of a motor is performed by means of the drive element.

[B26]

A vehicle that has the motor drive device of B25.

[C1]

A semiconductor device including a semiconductor layer that has a principal surface, a first insulating portion that includes a first organic insulating layer formed on the principal surface of the semiconductor layer, a first conductive layer that is formed on the first insulating portion, a second insulating portion that is formed on the first insulating portion so as to cover the first conductive layer and that includes a second organic insulating layer, and a second conductive layer that is formed on the second insulating portion, that faces the first conductive layer through the second insulating portion, and that is connected to a potential differing from a potential of the first conductive layer.

[C2]

The semiconductor device according to C1, where the first insulating portion includes a plurality of first organic insulating layers.

[C3]

The semiconductor device according to C1 or C2, where the second insulating portion is formed of a single film of the second organic insulating layer.

[C4]

The semiconductor device according to any one of C1 to C3, where the second insulating portion has a thickness of not less than 2 μm and not more than 100 μm.

[C5]

The semiconductor device according to any one of C1 to C4, including a first pad that is formed at a same layer as the first conductive layer and that is electrically connected to the first conductive layer.

[C6]

The semiconductor device according to C5, including a first energization member that is connected to the first conductive layer, that extends through a region below the first conductive layer in the first insulating portion, and that reaches a top of the first insulating portion, and a protective film formed on the second insulating portion so as to cover the second conductive layer, where a first opening that exposes a part of the first energization member as the first pad is formed in the protective film and the second insulating portion.

[C7]

The semiconductor device according to C6, where the first opening includes a space portion opened toward an end surface side of the semiconductor layer.

[C8]

The semiconductor device according to C6 or C7, where the first insulating portion has a first penetrating hole in which the first energization member is buried, and the first energization member includes a first lead-out portion that is led out from the first penetrating hole to a region not overlapping with the first penetrating hole, and the first pad is formed with a part of the first lead-out portion.

[C9]

The semiconductor device according to any one of C1 to C4, including a first pad that is formed at a layer same as the second conductive layer or at a layer higher than the second conductive layer and that is electrically connected to the first conductive layer.

[C10]

The semiconductor device according to C9, including a first energization member that is connected to the first conductive layer and that extends from the first conductive layer to a boundary portion with the second insulating portion in the first insulating portion, a second energization member that is connected to the first energization member and that extends from the first energization member onto the second insulating portion, and a protective film that is formed on the second insulating portion so as to cover the second conductive layer and that has a first opening that exposes a part of the second energization member as the first pad.

[C11]

The semiconductor device according to C10, where the second insulating portion has a second penetrating hole in which the second energization member is buried, and the second energization member includes a second lead-out portion that is led out from the second penetrating hole to a region not overlapping with the second penetrating hole in a plan view, and the first pad is formed with a part of the second lead-out portion.

[C12]

The semiconductor device according to C10 or C11, where the second energization member includes a pillar-shaped portion buried at a height exceeding a central portion of the second insulating portion in a normal direction of the principal surface of the semiconductor layer and a rewiring portion extending from the pillar-shaped portion to a region on the second insulating portion.

[C13]

The semiconductor device according to any one of C5 to C12, including a second pad that is formed at a layer same as the second conductive layer or at a layer higher than the second conductive layer and that is electrically connected to the second conductive layer.

[C14]

The semiconductor device according to C13, including a third energization member that is connected to the second conductive layer and that is formed on the second insulating portion, where the protective film that has a second opening that exposes a part of the third energization member as the second pad, further including a concave portion that is formed in a part of the protective film between the first opening and the second opening.

[C15]

The semiconductor device according to any one of C6 to C8 and C10 to C12, where the first energization member is connected to a ground potential through the semiconductor layer.

[C16]

The semiconductor device according to any one of C1 to C15, where the first organic insulating layer and the second organic insulating layer include at least one among a polyimide film, a phenol resin film, and an epoxy resin film.

[C17]

The semiconductor device according to any one of C1 to C16, where the first organic insulating layer and the second organic insulating layer are made of an identical resin material.

[C18]

The semiconductor device according to any one of C1 to C17, where the first conductive layer includes a low potential layer connected to a first potential, the second conductive layer includes a high potential layer connected to a second potential higher than the first potential, and including a dummy pattern that is formed around the high potential layer and that shields an electric field around the high potential layer.

[C19]

The semiconductor device according to any one of C1 to C18, where the first conductive layer includes a first coil and the second conductive layer includes a second coil.

[C20]

A semiconductor module including a die pad, the semiconductor device of C19 that is mounted on the die pad, a package main body that seals the die pad and the semiconductor device, and a lead terminal that is electrically connected to the semiconductor device and that is exposed from the package main body.

[C21]

The semiconductor module according to C20, where the semiconductor device includes a signal-transmitting insulating element that transmits a signal to an interval between the first coil and the second coil in an insulated state, further including a second semiconductor device electrically connected to the insulating element.

[C22]

The semiconductor module according to C21, where the second semiconductor device includes a control element electrically connected to one of the first coil and the second coil and a drive element electrically connected to the other of the first coil and the second coil.

[C23]

A motor drive device including the semiconductor module of C22, where drive control of a motor is performed by means of the drive element.

[C24]

A vehicle that has the motor drive device of C23.

[D1]

A semiconductor device including a semiconductor layer that has a principal surface, a first conductive layer that is formed on the principal surface of the semiconductor layer, a first insulating portion that is formed on the principal surface of the semiconductor layer so as to cover the first conductive layer, a second conductive layer that is formed on the first insulating portion, that faces the first conductive layer through the first insulating portion, and that is connected to a potential differing from a potential of the first conductive layer, and a first pad that is formed at a same layer as the first conductive layer in the first insulating portion or is formed between the first conductive layer and the second conductive layer in the first insulating portion in a normal direction of the principal surface of the semiconductor layer and that is electrically connected to the first conductive layer.

[D2]

The semiconductor device according to D1, including a first energization member that is connected to the first conductive layer and that extends through a region below the first conductive layer in the first insulating portion, and a first opening that is formed in the first insulating portion and that exposes a part of the first energization member as the first pad.

[D3]

The semiconductor device according to D2, where the first opening includes a space portion that is surrounded and closes by the first insulating portion.

[D4]

The semiconductor device according to D2, where the first opening includes a space portion opened toward an end surface side of the semiconductor layer.

[D5]

The semiconductor device according to any one of D2 to D4, including a second pad that is formed at a layer same as the second conductive layer or at a layer higher than the second conductive layer and that is electrically connected to the second conductive layer.

[D6]

The semiconductor device according to D5, including a second insulating portion that is formed on the first insulating portion so as to cover the second conductive layer, a second energization member that is formed above the second conductive layer in the second insulating portion and that is electrically connected to the second conductive layer, a protective layer that is formed on the second insulating portion, and a second opening that is formed at the protective layer and at the second insulating portion and that exposes a part of the second energization member as the second pad.

[D7]

The semiconductor device according to any one of D12 to D6, where the first energization member is connected to a ground potential through the semiconductor layer.

[D8]

The semiconductor device according to any one of D1 to D7, where the first insulating portion includes a laminated structure consisting of a first inorganic insulating layer and a second inorganic insulating layer that are different from each other.

[D9]

The semiconductor device according to D8, where the laminated structure is formed by alternately laminating the first inorganic insulating layer and the second inorganic insulating layer a plurality of times.

[D10]

The semiconductor device according to D8 or D9, where the first inorganic insulating layer includes a compressive stress film, and the second inorganic insulating layer includes a tensile stress film.

[D11]

The semiconductor device according to any one of D8 to D10, where the first inorganic insulating layer includes a silicon oxide film and the second inorganic insulating layer includes a silicon nitride film.

[D12]

The semiconductor device according to any one of D1 to D11, where the first insulating portion has a thickness of not less than 2 μm and not more than 120 μm.

[D13]

The semiconductor device according to any one of D1 to D12, including a seal conductor formed in the first insulating portion so as to surround the first conductive layer.

[D14]

The semiconductor device according to any one of D1 to D13, where the first conductive layer includes a first coil and the second conductive layer includes a second coil.

[D15]

A semiconductor module including a die pad, the semiconductor device of D14 that is mounted on the die pad, a package main body that seals the die pad and the semiconductor device, and a lead terminal that is electrically connected to the semiconductor device and that is exposed from the package main body.

[D16]

The semiconductor module according to D15, where the semiconductor device includes a signal-transmitting insulating element that transmits a signal to an interval between the first coil and the second coil in an insulated state, further including a second semiconductor device electrically connected to the insulating element.

[D17]

The semiconductor module according to D16, where the second semiconductor device includes a control element electrically connected to one of the first coil and the second coil and a drive element electrically connected to the other of the first coil and the second coil.

[D18]

A motor drive device including the semiconductor module of D17, where drive control of a motor is performed by means of the drive element.

[D19]

A vehicle that has the motor drive device of D18.

[E1]

A semiconductor device including a semiconductor layer that has a principal surface, an insulating portion that is formed on the principal surface of the semiconductor layer, a first conductive layer that is formed in the insulating portion, and a second conductive layer that is separated from the first conductive layer in a first direction along the principal surface of the semiconductor layer in the insulating portion and that is connected to a potential differing from a potential of the first conductive layer, where the second conductive layer has an upper corner portion that is formed in a curve shape in a cross-sectional view.

[E2]

A semiconductor device including a semiconductor layer that has a principal surface, an insulating portion that is formed on the principal surface of the semiconductor layer, a first conductive layer that is formed in the insulating portion, and a second conductive layer that is separated from the first conductive layer in a first direction along the principal surface of the semiconductor layer in the insulating portion and that is connected to a potential differing from a potential of the first conductive layer, where the second conductive layer has a shape in which an upper corner portion at which an upper surface and a side surface intersect each other is chipped off.

[E3]

The semiconductor device according to E1 or E2, where the insulating portion includes an inorganic insulating layer that has a concave portion in which the second conductive layer is buried, and the second conductive layer has a lower corner portion whose front end is pointed in a cross-sectional view.

[E4]

The semiconductor device according to E3, where the second conductive layer includes a first underlayer formed along an inner surface of the concave portion of the inorganic insulating layer and a first main body portion buried in the concave portion through the first underlayer, and the upper corner portion of the second conductive layer is formed so as to straddle between an upper end portion of the first underlayer and an upper end portion of the first main body portion.

[E5]

The semiconductor device according to E4, where the first main body portion includes a plated layer formed by plating growth, and the first underlayer includes a barrier layer that prevents components of the plated layer from being diffused into the inorganic insulating layer.

[E6]

The semiconductor device according to any one of E3 to E5, where the concave portion of the inorganic insulating layer is formed in a tapered shape in which a width becomes smaller in proportion to an approach to a bottom portion of the concave portion in a cross-sectional view.

[E7]

The semiconductor device according to E1 or E2, where the insulating portion includes an organic insulating layer that supports the second conductive layer, and the second conductive layer has a lower corner portion separated from the organic insulating layer in a cross-sectional view.

[E8]

The semiconductor device according to E1 or E2, where the insulating portion includes an organic insulating layer that supports the second conductive layer, and the second conductive layer has a shape in which a lower corner portion at which an upper surface and a side surface intersect each other is chipped off.

[E9]

The semiconductor device according to E7 or E8, where the second conductive layer includes a second underlayer formed on the organic insulating layer and a second main body portion that is formed on the second underlayer and that is thicker than the second underlayer, and the upper corner portion of the second conductive layer is formed at an upper end portion of the second main body portion.

[E10]

The semiconductor device according to E9, where the lower corner portion of the second conductive layer is formed at a lower end portion of the second main body portion.

[E11]

The semiconductor device according to E9 or E10, where the second main body portion includes a plated layer formed by plating growth, and the second underlayer includes a conductive film made of a material differing from a material of the plated layer.

[E12]

The semiconductor device according to any one of E1 to E11, where the insulating portion includes a laminated structure consisting of a first inorganic insulating layer and a second inorganic insulating layer that are different from each other.

[E13]

The semiconductor device according to E12, where the laminated structure is formed by alternately laminating the first inorganic insulating layer and the second inorganic insulating layer a plurality of times.

[E14]

The semiconductor device according to E12 or E13, where the first inorganic insulating layer includes a compressive stress film, and the second inorganic insulating layer includes a tensile stress film.

[E15]

The semiconductor device according to any one of E12 to E14, where the first inorganic insulating layer includes a silicon oxide film and the second inorganic insulating layer includes a silicon nitride film.

[E16]

The semiconductor device according to any one of E1 to E15, where the first conductive layer includes a low potential layer connected to a first potential, the second conductive layer includes a high potential layer connected to a second potential higher than the first potential, and including a dummy pattern that is formed around the high potential layer and that shields an electric field around the high potential layer.

[E17]

The semiconductor device according to any one of E1 to E15, including a first coil that is formed in the insulating portion, that is separated from the second conductive portion in a second direction that is a normal direction of the principal surface of the semiconductor layer, and that is electrically connected to the first conductive layer, where the second conductive layer includes a second coil that faces the first coil through the insulating portion.

[E18]

The semiconductor device according to E17, where the insulating portion has a thickness of not less than 2 μm and not more than 120 μm between the first coil and the second coil.

[E19]

The semiconductor device according to E16 or E17, where the insulating portion includes a protective layer on the first conductive layer and on the second conductive layer, and the first conductive layer includes a first pad exposed from the first opening formed in the protective layer.

[E20]

The semiconductor device according to E18, where the second conductive layer includes a second pad that is electrically connected to the second coil and that is exposed from a second opening formed in the protective layer.

[E21]

A semiconductor module including a die pad, the semiconductor device of any one of E16 to E19 that is mounted on the die pad, a package main body that seals the die pad and the semiconductor device, and a lead terminal that is electrically connected to the semiconductor device and that is exposed from the package main body.

[E22]

The semiconductor module according to E20, where the semiconductor device includes a signal-transmitting insulating element that transmits a signal to an interval between the first coil and the second coil in an insulated state, further including a second semiconductor device electrically connected to the insulating element.

[E23]

The semiconductor module according to E21, where the second semiconductor device includes a control element electrically connected to one of the first coil and the second coil and a drive element electrically connected to the other of the first coil and the second coil.

[E24]

A motor drive device including the semiconductor module of E22, where drive control of a motor is performed by means of the drive element.

[E25]

A vehicle that has the motor drive device of E23.

[E26]

A method of manufacturing a semiconductor device, the method including a step of forming an inorganic insulating layer that has a first region and a second region on a semiconductor layer that has a principal surface and in which the first region and the second region are separated from each other in a first direction along the principal surface of the semiconductor layer, a step of forming a first conductive layer in the first region of the inorganic insulating layer, a step of forming a concave portion by selectively removing the inorganic insulating layer in the second region, a step of burying a conductive material in the concave portion, a step of removing the inorganic insulating layer from an upper surface so that a part of the conductive material projects as a projecting portion after the conductive material is buried, and a step of forming a second conductive layer that has a shape, in which an upper corner portion at which an upper surface and a side surface intersect each other is chipped off, by selectively removing the projecting portion so that a corner portion of the projecting portion of the conductive material is selectively eliminated in a cross-sectional view.

[E27]

The method of manufacturing a semiconductor device according to E25, where the step of burying the conductive material includes a step of forming a first underlayer along an inner surface of the concave portion of the inorganic insulating layer and a step of burying a first main body portion in the concave portion by means of plating growth of a conductive material from the first underlayer.

[E28]

The method of manufacturing a semiconductor device according to E26, where the step of forming the second conductive layer includes a step of selectively removing the projecting portion so that both an upper end portion of the first underlayer and an upper end portion of the first main body portion are chipped off.

[E29]

A method of manufacturing a semiconductor device, the method including a step of forming an organic insulating layer that has a first region and a second region on a semiconductor layer that has a principal surface and in which the first region and the second region are separated from each other in a first direction along the principal surface of the semiconductor layer, a step of forming a first conductive layer in the first region of the organic insulating layer, and a step of forming a conductive material in the second region of the organic insulating layer and forming a second conductive layer that has a shape, in which an upper corner portion at which an upper surface and a side surface intersect each other is chipped off, by selectively removing the conductive material so that a corner portion of the conductive material is selectively eliminated in a cross-sectional view.

[E30]

The method of manufacturing a semiconductor device according to E28, where the step of forming the second conductive layer includes a step of forming a second underlayer on the organic insulating layer and a step of forming a second main body portion on the second underlayer by selectively subjecting a conductive material to plating growth from the second underlayer.

[E31]

The method of manufacturing a semiconductor device according to E29, where the step of selectively removing the second conductive layer includes a step of forming a space at a lower corner portion at which a lower surface and a side surface of the second main body portion intersect each other by selectively removing a lower end portion of the second main body portion, and a width of the space in a cross-sectional view is twice or more a thickness of the second underlayer.

REFERENCE SIGNS LIST

1: semiconductor module
1*c*: first comparison signal
1*d*: first detection signal
2: die pad
2*c*: second comparison signal
2*d*: second detection signal
3: first terminal
4: second terminal:
5: support terminal
6: sealing resin
7: second insulating portion
8: protective layer
9: seed layer:
10: resist film
11: semiconductor element
12: insulating element
12*a*: pad
13: low potential terminal
14: high potential terminal:
15: transformer
16: seal conductor
17: device region
18: outer region
19: seal plug conductor:
20: low potential coil
21: first die pad
22: second die pad
23: high potential coil
24: first inner end:
25: first outer end
26: first helical portion
27: second inner end
28: second outer end
29: second helical portion
30: first low potential wiring
31: first intermediate terminal
32: first side terminal
33: first high potential wiring
34: second high potential wiring
35: second low potential wiring
36: low potential connection wiring
37: lead-out wiring
38: wiring plug electrode
39: dummy pattern
40: semiconductor chip
41: second intermediate terminal
42: second side terminal
43: opening
44: chip sidewall
45: first functional device
46: seed layer
47: resist film
48: opening
49: opening
50: first insulating portion
51: first support terminal
52: second support terminal
53: insulating sidewall
54: insulating principal surface
55: undermost insulating layer
56: uppermost insulating layer
57: interlayer insulating layer
58: first insulating layer
59: second insulating layer
60: second functional device
61: resin upper surface
62: resin lower surface
63: resin first side surface
64: resin second side surface
65: seal via conductor
66: first inner region
67: second inner region
68: first protective layer
69: second protective layer
70: penetrating wiring
71: bonding wire
72: interior plated layer
73: exterior plated layer
74: first connection plug electrode
75: second connection plug electrode
76: penetrating hole
78: first electrode layer
79: second electrode layer
80: conductive support member
81: lead frame
82: protective principal surface
83: protective sidewall
84: organic insulating layer
85: penetrating hole
86: high potential dummy pattern
87: first high potential dummy pattern
88: second high potential dummy pattern
89: first region
90: second region
91: third region
92: first connection portion
93: first pattern
94: second pattern
95: third pattern
96: first outer periphery line
97: second outer periphery line
98: first intermediate line
99: first connection line
100: vehicle
101: motor drive device
102: ECU
103: first transmission portion
103-1: buffer
104: second transmission portion
104-1: buffer
105: first reception portion
106: second reception portion
107: logic portion
107-1: inverter
107-2: inverter
107-3: first pulse generation portion
107-4: second pulse generation portion
107-5: pulse generation portion
107-6: pulse counter
107-7: edge detection portion
107-8: pulse distribution portion

108: first UVLO portion
109: external-error detection portion
111: control element
111*a*: pad
112: drive element
112*a*: pad
120: seed layer
121: third reception portion
121-1: first comparator
121-2: first pulse detection portion
121-3: first counter
122: fourth reception portion
122-1: second comparator
122-2: second pulse detection portion
122-3: second counter
123: third transmission portion
124 fourth transmission portion
125: logic portion
126: driver portion
127: second UVLO portion
128: overcurrent detection portion
129: OCP timer
131: first transformer
132: second transformer
133: third transformer
134: fourth transformer
140: slit
141 first lead-out portion
142: second lead-out portion
143: third outer periphery line
144: second intermediate line
145 second connection line
146: slit
147: third lead-out portion
148: fourth lead-out portion
149: fourth outer periphery line
150: third intermediate line
151: third connection line
152: slit
153: fifth lead-out portion
154: sixth lead-out portion
155: second connection portion
156A: high potential line
156B: high potential line
156C: high potential line
156D: high potential line
156E: high potential line
156F: high potential line
157: slit
161: floating dummy pattern
162A: floating line
162B: floating line
162C: floating line
162D: floating line
162E: floating line
162F: floating line
170: first low potential pad wiring
171: second low potential pad wiring
173: penetrating hole
174: penetrating hole
175: lead-out portion
176: third low potential pad wiring
177: high potential pad wiring
178: uneven structure
179: concave portion
188: low potential terminal opening
189: high potential terminal opening
190: low potential terminal opening
191: low potential pad
192: high potential pad
193: first portion
194: second portion
200: signal transmission device
211: first die-pad upper surface
212: first die-pad lower surface
221: second die-pad upper surface
222: second die-pad lower surface
311: lead portion
312: pad portion
321: lead portion
322: pad portion
401: first principal surface
402: second principal surface
411: lead portion
412: pad portion
421: lead portion
422: pad portion
501: insulating principal surface
502: insulating sidewall
503: first inner end
504: penetrating hole
505: peripheral edge portion
506: penetrating hole
507: second insulating portion
508: protective layer
511: lead portion
512: pad portion
513: low potential terminal
514: high potential terminal
515: transformer
516: seal conductor
517: device region
518: outer region
519: seal plug conductor
520: low potential coil
521: lead portion
522: pad portion
523: high potential coil
524: connection portion
525: first outer end
526: first helical portion
527: second inner end
528: second outer end
529: second helical portion
530: first low potential wiring
532: first low potential pad wiring
533: first high potential wiring
534: second high potential wiring
535: second low potential wiring
536: low potential connection wiring
537: lead-out wiring
538: pillar-shaped wiring
539: dummy pattern
540: semiconductor chip
541: first principal surface
542: second principal surface
544: chip sidewall
545: first functional device
550: first insulating portion
551: top surface
552: lead-out portion
553: insulating sidewall
554: insulating principal surface
555: undermost insulating layer

556: uppermost insulating layer
557: interlayer insulating layer
558: first insulating layer
559: second insulating layer
560: second functional device
565: seal via conductor
566: first inner region
567: second inner region
568: first protective layer
569: second protective layer
570: second wiring
574: first connection plug electrode
575: second connection plug electrode
576: penetrating hole
578: relay pad electrode layer
579: first wiring
582: protective principal surface
583: protective sidewall
584: organic insulating layer
585: penetrating hole
586: high potential dummy pattern
587: first high potential dummy pattern
588: second high potential dummy pattern
631: resin first side surface upper portion
632: resin first side surface central portion
633: resin first side surface lower portion
641: resin second side surface upper portion
642: resin second side surface central portion
643: resin second side surface lower portion
661: floating dummy pattern
676: second low potential pad wiring
677: high potential pad wiring
678: uneven structure
679: concave portion
688: low potential terminal opening
689: high potential terminal opening
690: low potential terminal opening
691: low potential pad
692: high potential pad
693: first portion
694: second portion
701: insulating principal surface
702: insulating sidewall
703: first inner end
704: insulating principal surface
705: insulating sidewall
707: second insulating portion
708: protective layer
711: first bonding wire
712: second bonding wire
713: third bonding wire
714: fourth bonding wire
715: transformer
716: low potential terminal
717: high potential terminal
718: penetrating hole
720: low potential coil
722: third organic insulating layer
723: high potential coil
725: first outer end
726: first helical portion
727: second inner end
728: second outer end
729: second helical portion
730: first low potential wiring
731: first low potential pad electrode layer
732: second low potential pad wiring
733: first high potential wiring
734: second high potential wiring
735: second low potential wiring
736: low potential connection wiring
737: lead-out wiring
738: pillar-shaped wiring
739: dummy pattern
740: semiconductor chip
741: first principal surface
742: second principal surface
744: chip sidewall
745: first functional device
750: first insulating portion
751: top surface
752: lead-out portion
753: insulating sidewall
754: insulating principal surface
755: first organic insulating layer
756: second organic insulating layer
757: pad region
758: space portion
760: second functional device
766: first inner region
767: second inner region
768: first protective layer
769: second protective layer
770: second wiring
774: plug portion
775: plug portion
778: first low potential pad wiring
779: first wiring
782: protective principal surface
783: protective sidewall
784: organic insulating layer
785: penetrating hole
786: high potential dummy pattern
787: first high potential dummy pattern
788: second high potential dummy pattern
801: penetrating hole
802: peripheral edge portion
803: penetrating hole
804: lead-out portion
811: outer frame
812: island portion
**812*a***: first island portion
**812*b***: second island portion
813: first lead
**813*a***: first intermediate lead
**813*b***: first side lead
814: second lead
**814*a***: second intermediate lead
**814*b***: second side lead
815: support lead
**815*a***: first support lead
**815*b***: second support lead
816: dam-bar
861: floating dummy pattern
877: high potential pad wiring
878: uneven structure
879: concave portion
888: low potential terminal opening
889: high potential terminal opening
891: low potential pad
892: high potential pad
901: semiconductor chip
902: first principal surface
903: second principal surface

904: chip sidewall
905: first insulating portion
906: insulating principal surface
906A: first insulating principal surface
906B: second insulating principal surface
907: insulating sidewall
908: undermost insulating layer
909: uppermost insulating layer
910: interlayer insulating layer
911: first insulating layer
912: second insulating layer
913: first functional device
914: transformer
915: low potential coil
916: high potential coil
917: first inner end
918: first outer end
919: first helical portion
920: first inner region
921: second inner end
922: second outer end
923: second helical portion
924: second inner region
925: low potential terminal
926: high potential terminal
927: first low potential wiring
928: second low potential wiring
929: first high potential wiring
930: second high potential wiring
931: first low potential pad electrode layer
932: low potential connection wiring
933: lead-out wiring
934: first connection plug electrode
935: second connection plug electrode
937: high potential connection wiring
938: pad plug electrode
939: dummy pattern
940: high potential dummy pattern
941: first high potential dummy pattern
942: second high potential dummy pattern
972: floating dummy pattern
974: second functional device
975: second insulating portion
976: first inorganic insulating layer
977: second inorganic insulating layer
978: low potential pad opening
979: high potential pad opening
980: penetrating hole
981: protective layer
982: first portion
983: second portion
984: low potential terminal opening
985: high potential terminal opening
986: opening
987: mask
988: space portion
989: opening
990: mask
991: seal conductor
992: device region
993: outer region
994: seal plug conductor
995: seal via conductor
996: low potential pad
997: high potential pad
1001: semiconductor chip
1002: first principal surface
1003: second principal surface
1004: chip sidewall
1005: first insulating portion
1006: insulating principal surface
1007: insulating sidewall
1008: undermost insulating layer
1009: uppermost insulating layer
1010: interlayer insulating layer
1011: insulating principal surface
1012: second insulating layer
1013: first functional device
1014: transformer
1015: low potential coil
1016: high potential coil
1017: first inner end
1018: first outer end
1019: first helical portion
1020: first inner region
1021: second inner end
1022: second outer end
1023: second helical portion
1024: second inner region
1025: low potential terminal
1026: high potential terminal
1027: first low potential wiring
1028: second low potential wiring
1029: first high potential wiring
1030: second high potential wiring
1031: penetrating wiring
1032: low potential connection wiring
1033: lead-out wiring
1034: first connection plug electrode
1035: second connection plug electrode
1036: pad plug electrode
1038: first electrode layer
1039: second electrode layer
1040: wiring plug electrode
1041: high potential connection wiring
1042: pad plug electrode
1043: dummy pattern
1044: high potential dummy pattern
1045: first high potential dummy pattern
1046: second high potential dummy pattern
1076: floating dummy pattern
1078: device region
1079: second functional device
1080: seal conductor
1081: outer region
1082: seal plug conductor
1083: seal via conductor
1084: second insulating portion
1085: first inorganic insulating layer
1086: second inorganic insulating layer
1087: low potential pad opening
1088: high potential pad opening
1089: protective layer
1090: first portion
1091: second portion
1092: low potential terminal opening
1093: high potential terminal opening
1094: concave portion
1095: bottom portion
1096: side portion
1097: intersection vertex
1098: first underlayer
1099: first main body portion
1100: second insulating portion

1101: insulating principal surface
1103: organic insulating layer
1104: first low potential pad wiring
1105: projecting portion
1106: bottom surface
1107: side surface
1108: upper surface
1109: corner portion
1110: upper corner portion
1111: lower corner portion
1112: second underlayer
1113: second main body portion
1114: lower surface
1115: upper surface
1116: side surface
1117: upper corner portion
1118: lower corner portion
1119: gap
1120: seed layer
1121: resist film
1122: opening
1123: projecting portion
1124: gap
1130: low potential pad
1131: high potential pad
1135: first region
1136: second region
2000: capacitor
2001: lower electrode
2002: upper electrode
2003: low potential coil
2004: first low potential coil
2005: second low potential coil
2006: gap

The invention claimed is:

1. A semiconductor device, comprising:

a semiconductor layer that has a principal surface;

a first conductive layer that is formed on the principal surface of the semiconductor layer;

a first insulating portion that is formed on the principal surface of the semiconductor layer so as to cover the first conductive layer and that includes at least a silicon oxide film;

a second insulating portion that is formed on the first insulating portion and that includes a second insulating layer having a dielectric constant differing from a dielectric constant of the silicon oxide film;

a second conductive layer that is formed on the second insulating portion, that faces the first conductive layer through the first insulating portion and the second insulating portion, and that is connected to a potential differing from a potential of the first conductive layer;

a first pad that is electrically connected to the first conductive layer;

a second pad that is formed on the second insulating portion, the second pad being electrically connected to the second conductive layer and the second conductive layer being located between the first pad and the second pad in a first direction parallel to the principal surface of the semiconductor layer;

a first protective layer that is formed on the second insulating portion so as to cover the second conductive layer and at least a part of the second pad; and a second protective layer formed on the first protective layer so as to cover the first protective layer, the second protective layer overlapping with a part of the second pad in a second direction perpendicular to the principal surface of the semiconductor layer, wherein the first protective layer and the second protective layer include different organic insulating materials.

2. The semiconductor device according to claim 1, wherein the first insulating portion includes a laminate of a silicon nitride film and the silicon oxide film.

3. The semiconductor device according to claim 1, wherein the first pad is formed on the second insulating portion.

4. The semiconductor device according to claim 1, wherein the organic insulating materials includes at least one among a polyimide, a phenol resin, and an epoxy resin.

5. The semiconductor device according to claim 1, wherein the second protective layer includes at least one among a polyimide film, a phenol resin film, and an epoxy resin film.

6. The semiconductor device according to claim 1, wherein the first insulating portion has a thickness of not less than 5 μm and not more than 50 μm, and the second insulating portion has a thickness of not less than 2 μm and not more than 100 μm.

7. The semiconductor device according to claim 1, wherein a distance between the first pad and the second pad is greater than a sum of thicknesses of the first insulating portion and the second insulating portion.

8. The semiconductor device according to claim 1, wherein the first conductive layer includes a first coil and the second conductive layer includes a second coil.

9. The semiconductor device according to claim 1, further comprising:

a first energization member that is connected to the first conductive layer and that extends from the first conductive layer to a boundary portion with the second insulating portion in the first insulating portion; and a second energization member that is connected to the first energization member and that extends from the first energization member onto the second insulating portion.

10. The semiconductor device according to claim 9, wherein the first protective layer has a first opening that exposes a part of the second energization member as the first pad.

11. The semiconductor device according to claim 9, wherein the first energization member is connected to a ground potential through the semiconductor layer.

12. The semiconductor device according to claim 1, comprising a seal conductor formed in the first insulating portion so as to surround the first conductive layer.

13. A semiconductor module, comprising:

a die pad;

the semiconductor device of claim 1 that is mounted on the die pad;

a package main body that seals the die pad and the semiconductor device; and a lead terminal that is electrically connected to the semiconductor device and that is exposed from the package main body.

14. The semiconductor module according to claim 13, wherein the first conductive layer of the semiconductor device includes a first coil, the second conductive layer of the semiconductor device includes a second coil, the semiconductor device includes a signal-transmitting insulating element that transmits a signal to an interval between the first coil and the second coil in an insulated state, and the semiconductor module further comprises a second semiconductor device electrically connected to the insulating element.

15. The semiconductor module according to claim 14, wherein the second semiconductor device includes a control element electrically connected to one of the first coil and the second coil and a drive element electrically connected to the other of the first coil and the second coil.

* * * * *